US012757525B2

(12) United States Patent
Kim et al.

(10) Patent No.: US 12,757,525 B2
(45) Date of Patent: Oct. 6, 2026

(54) LIGHT EMITTING DEVICE WITH LED STACK FOR DISPLAY AND DISPLAY APPARATUS HAVING THE SAME

(71) Applicant: SEOUL VIOSYS CO., LTD., Gyeonggi-do (KR)

(72) Inventors: Chang Yeon Kim, Gyeonggi-do (KR); Jong Hyeon Chae, Gyeonggi-do (KR); Jong Ming Jang, Gyeonggi-do (KR); Ho Joon Lee, Gyeonggi-do (KR); Seong Gyu Jang, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 604 days.

(21) Appl. No.: 18/218,386

(22) Filed: Jul. 5, 2023

(65) Prior Publication Data

US 2023/0343810 A1 Oct. 26, 2023

Related U.S. Application Data

(63) Continuation of application No. 17/521,754, filed on Nov. 8, 2021, now Pat. No. 11,804,511, which is a (Continued)

(51) Int. Cl.
*H10H 20/813* (2025.01)
*G02B 5/26* (2006.01)
(Continued)

(52) U.S. Cl.
CPC ........... *H10H 20/8131* (2025.01); *G02B 5/26* (2013.01); *H10H 20/813* (2025.01); (Continued)

(58) Field of Classification Search
CPC .. H10H 20/8131; H10H 20/813; H10H 20/82; H10H 20/831; H10H 20/833; (Continued)

(56) References Cited

U.S. PATENT DOCUMENTS 5,583,349 A 12/1996 Norman et al.
5,583,350 A 12/1996 Norman et al.
(Continued)

FOREIGN PATENT DOCUMENTS

CN 1423345 6/2003
CN 102593290 7/2012
(Continued)

OTHER PUBLICATIONS

Notice of Allowance issued on Sep. 7, 2021, in U.S. Appl. No. 16/789,877.

(Continued)

*Primary Examiner* — Scott B Geyer
(74) *Attorney, Agent, or Firm* — LaBatt, LLC

(57) ABSTRACT

A light emitting device including a first LED sub-unit, a second LED sub-unit disposed under the first LED sub-unit, a third LED sub-unit disposed under the second LED sub-unit, a first ohmic electrode interposed between the first LED sub-unit and the second LED sub-unit, and in ohmic contact with the first LED sub-unit, a second ohmic electrode interposed between the second LED sub-unit and the third LED sub-unit, and in ohmic contact with the second LED sub-unit, a third ohmic electrode interposed between the second ohmic electrode and the third LED sub-unit, and in ohmic contact the third LED sub-unit, a plurality of electrode pads disposed on the first LED sub-unit, in which at least one of the first ohmic electrode, the second ohmic electrode, and the third ohmic electrode has a patterned structure.

20 Claims, 108 Drawing Sheets

Related U.S. Application Data continuation of application No. 16/789,877, filed on Feb. 13, 2020, now Pat. No. 11,289,461, which is a continuation of application No. 16/207,881, filed on Dec. 3, 2018, now Pat. No. 10,748,881.

(60) Provisional application No. 62/657,575, filed on Apr. 13, 2018, provisional application No. 62/651,585, filed on Apr. 2, 2018, provisional application No. 62/650,920, filed on Mar. 30, 2018, provisional application No. 62/649,500, filed on Mar. 28, 2018, provisional application No. 62/608,006, filed on Dec. 20, 2017, provisional application No. 62/594,754, filed on Dec. 5, 2017.

(51) Int. Cl.

*H10H 20/82* (2025.01)
*H10H 20/831* (2025.01)
*H10H 20/832* (2025.01)
*H10H 20/833* (2025.01)
*H10H 20/841* (2025.01)
*H10H 20/857* (2025.01)
*H10H 20/858* (2025.01)
*H10H 29/10* (2025.01)
*H10W 90/00* (2026.01)
*H10H 20/01* (2025.01)

(52) U.S. Cl.

CPC .......... *H10H 20/82* (2025.01); *H10H 20/831* (2025.01); *H10H 20/833* (2025.01); *H10H 20/835* (2025.01); *H10H 20/857* (2025.01); *H10H 29/10* (2025.01); *H10W 90/00* (2026.01); *H10H 20/032* (2025.01); *H10H 20/034* (2025.01); *H10H 20/0364* (2025.01); *H10H 20/0365* (2025.01); *H10H 20/8312* (2025.01); *H10H 20/841* (2025.01); *H10H 20/8586* (2025.01)

(58) Field of Classification Search

CPC .... H10H 20/835; H10H 20/857; H10H 29/10; H10H 20/032; H10H 20/034; H10H 20/0364; H10H 20/0365; H10H 20/8312; H10H 20/841; H10H 20/8586; H10H 20/8316; H10H 29/142

See application file for complete search history.

(56) References Cited

U.S. PATENT DOCUMENTS 5,696,389 A 12/1997 Ishikawa et al.
5,703,436 A 12/1997 Forrest et al.
5,707,745 A 1/1998 Forrest et al.
5,739,552 A 4/1998 Kimura et al.
6,046,543 A 4/2000 Bulovic et al.
6,100,103 A 8/2000 Shim et al.
6,365,270 B2 4/2002 Forrest et al.
6,717,358 B1 4/2004 Iao et al.
6,888,305 B2 5/2005 Weaver
6,934,309 B2 8/2005 Nishikawa et al.
7,282,741 B2 10/2007 Kim et al.
7,514,720 B2 4/2009 Kim et al.
7,570,310 B2 8/2009 Harada et al.
7,732,803 B2 6/2010 Shum et al.
7,745,986 B2 6/2010 Ito et al.
7,808,005 B1 10/2010 Fattal et al.
7,982,228 B2 7/2011 Choi et al.
8,017,955 B2 9/2011 Wang et al.
8,022,421 B2 9/2011 Hsueh et al.
8,035,115 B2 10/2011 Ogihara et al.
8,058,663 B2 11/2011 Fan et al.
8,089,074 B2 1/2012 Kim et al.
8,269,229 B2 9/2012 Suzuki et al.
8,283,191 B2 10/2012 Rode et al.
8,324,803 B2 12/2012 Forrest et al.
8,390,020 B2 3/2013 Tanaka et al.
8,436,346 B2 5/2013 Ushikubo et al.
8,466,542 B2 6/2013 Kriman et al.
8,546,836 B2 10/2013 Kamiya et al.
8,563,144 B2 10/2013 Kim et al.
8,618,551 B2 12/2013 Nishikawa et al.
8,624,274 B2 1/2014 Hsueh et al.
8,766,295 B2 7/2014 Kim
8,835,948 B2 9/2014 Chang et al.
8,884,316 B2 11/2014 Weaver et al.
8,941,566 B2 1/2015 Haase
9,006,752 B2 4/2015 So et al.
9,018,834 B2 4/2015 Ide
9,052,096 B2 6/2015 Nishimura et al.
9,076,929 B2 7/2015 Katsuno et al.
9,099,631 B2 8/2015 Yang et al.
9,136,498 B2 9/2015 Skipor
9,142,748 B2 9/2015 Ohmae et al.
9,153,750 B2 10/2015 Seo et al.
9,202,994 B2 12/2015 Hashimoto et al.
9,252,380 B2 2/2016 Seo et al.
9,281,446 B2 3/2016 Suh et al.
9,312,249 B2 4/2016 Choi et al.
9,337,400 B2 5/2016 Hashimoto et al.
9,362,335 B2 6/2016 Von Malm
9,406,908 B2 8/2016 Kim et al.
9,419,031 B1 8/2016 Or-Bach et al.
9,443,833 B2 9/2016 Draw
9,515,278 B2 12/2016 Suzuki et al.
9,559,263 B2 1/2017 Matsui et al.
9,577,012 B2 2/2017 Ooki et al.
9,748,313 B2 8/2017 Tsuji et al.
9,786,817 B2 10/2017 Kim et al.
9,786,859 B2 10/2017 Yamae et al.
9,847,051 B2 12/2017 Choi et al.
9,853,187 B2 12/2017 Kim
9,893,233 B2 2/2018 Kong et al.
9,905,725 B2 2/2018 Lee
9,960,212 B2 5/2018 Gee et al.
9,960,390 B2 5/2018 Hofle et al.
9,966,369 B2 5/2018 Kim et al.
10,056,535 B2 8/2018 Chang et al.
10,069,036 B2 9/2018 Atanackovic
10,079,265 B1 9/2018 Wu et al.
10,134,813 B2 11/2018 Choi
10,170,666 B2 1/2019 Cha et al.
10,205,058 B2 2/2019 Lee
10,304,811 B2 5/2019 Zhang et al.
10,326,056 B2 6/2019 Jung et al.
10,381,519 B2 8/2019 Seo et al.
10,388,978 B2 8/2019 Morris-Cohen et al.
10,418,577 B2 9/2019 Yoo et al.
10,475,957 B2 11/2019 Cha et al.
10,515,580 B2 12/2019 Henry et al.
10,559,557 B2 2/2020 Chang et al.
10,686,099 B2 6/2020 Huppmann et al.
10,686,149 B2 6/2020 Park et al.
10,811,475 B2 10/2020 Zhang et al.
2002/0154259 A1 10/2002 Freidhoff et al.
2003/0047742 A1 3/2003 Hen
2003/0168989 A1 9/2003 Hen
2003/0213967 A1 11/2003 Forrest et al.
2004/0232433 A1 11/2004 Doverspike et al.
2005/0067627 A1 3/2005 Shen et al.
2005/0140278 A1 6/2005 Kato
2005/0189551 A1 9/2005 Peng et al.
2005/0264550 A1 12/2005 Ohshima et al.
2006/0027820 A1 2/2006 Cao
2006/0231852 A1 10/2006 Kususe et al.
2007/0069220 A1 3/2007 Ogihara
2007/0170444 A1 7/2007 Cao
2007/0222922 A1 9/2007 Jin et al.
2008/0068315 A1 3/2008 Kurosaki et al.
2008/0099770 A1 5/2008 Mendendorp et al.
2008/0128728 A1 6/2008 Nemchuk et al.
2008/0130278 A1 6/2008 Ushikubo et al.

(56) References Cited

U.S. PATENT DOCUMENTS

| | | | |
|---|---|---|---|
| 2008/0251799 | A1 | 10/2008 | Ikezawa |
| 2008/0308819 | A1 | 12/2008 | Louwsma et al. |
| 2009/0009101 | A1 | 1/2009 | Kang et al. |
| 2009/0078955 | A1 | 3/2009 | Fan et al. |
| 2009/0114931 | A1 | 5/2009 | Eh et al. |
| 2009/0272989 | A1 | 11/2009 | Shum et al. |
| 2010/0032691 | A1 | 2/2010 | Kim |
| 2010/0045175 | A1 | 2/2010 | Mathai et al. |
| 2010/0051975 | A1 | 3/2010 | Suzuki et al. |
| 2010/0065867 | A1 | 3/2010 | Unno |
| 2010/0066239 | A1 | 3/2010 | Spindler et al. |
| 2010/0076527 | A1 | 3/2010 | Hammond et al. |
| 2010/0084668 | A1 | 4/2010 | Choi et al. |
| 2010/0144073 | A1 | 6/2010 | Louwsma et al. |
| 2010/0159792 | A1 | 6/2010 | Visser et al. |
| 2010/0224860 | A1 | 9/2010 | Bbetson et al. |
| 2010/0276706 | A1 | 11/2010 | Herrmann |
| 2011/0057211 | A1 | 3/2011 | Lee et al. |
| 2011/0086486 | A1 | 4/2011 | Lee et al. |
| 2011/0156114 | A1 | 6/2011 | Park et al. |
| 2011/0204376 | A1 | 8/2011 | Su et al. |
| 2011/0215714 | A1 | 9/2011 | Seo et al. |
| 2012/0034714 | A1 | 2/2012 | Tsai et al. |
| 2012/0094414 | A1 | 4/2012 | Or-Bach et al. |
| 2012/0223875 | A1 | 9/2012 | Lau et al. |
| 2012/0231572 | A1 | 9/2012 | Or-Bach et al. |
| 2012/0236532 | A1 | 9/2012 | Koo et al. |
| 2012/0305959 | A1 | 12/2012 | Yu et al. |
| 2013/0020589 | A1 | 1/2013 | Yu et al. |
| 2013/0056717 | A1 | 3/2013 | Ishihara et al. |
| 2013/0069191 | A1 | 3/2013 | Or-Bach et al. |
| 2013/0264587 | A1 | 10/2013 | Chang |
| 2013/0270514 | A1 | 10/2013 | Saxler |
| 2013/0285076 | A1 | 10/2013 | Liu et al. |
| 2013/0292711 | A1 | 11/2013 | Ogihara et al. |
| 2014/0014895 | A1 | 1/2014 | Tanaka |
| 2014/0184062 | A1 | 7/2014 | Kolodin |
| 2014/0191243 | A1 | 7/2014 | Singh et al. |
| 2014/0252382 | A1 | 9/2014 | Hashimoto et al. |
| 2014/0284633 | A1 | 9/2014 | Tsay et al. |
| 2015/0001561 | A1 | 1/2015 | Katsuno et al. |
| 2015/0001572 | A1 | 1/2015 | Katsuno et al. |
| 2015/0099728 | A1 | 4/2015 | Frank et al. |
| 2015/0221627 | A1 | 8/2015 | Nielson et al. |
| 2015/0325555 | A1 | 11/2015 | Hashimoto et al. |
| 2015/0340348 | A1 | 11/2015 | Katsuno et al. |
| 2015/0362165 | A1 | 12/2015 | Chu et al. |
| 2016/0005375 | A1 | 1/2016 | Naijo et al. |
| 2016/0043290 | A1 | 2/2016 | Sogo et al. |
| 2016/0064439 | A1 | 3/2016 | Or-Bach et al. |
| 2016/0099384 | A1 | 4/2016 | Kim et al. |
| 2016/0149075 | A1 | 5/2016 | Alanackovic |
| 2016/0155378 | A1 | 6/2016 | Hack et al. |
| 2016/0155892 | A1 | 6/2016 | Li et al. |
| 2016/0163940 | A1 | 6/2016 | Huang et al. |
| 2016/0315068 | A1 | 10/2016 | Lee et al. |
| 2016/0322293 | A1 | 11/2016 | Kimura et al. |
| 2016/0336482 | A1 | 11/2016 | Lu et al. |
| 2016/0359143 | A1 | 12/2016 | Osawa et al. |
| 2017/0012173 | A1 | 1/2017 | Lee et al. |
| 2017/0025593 | A1 | 1/2017 | Bower et al. |
| 2017/0062680 | A1 | 3/2017 | Yoo et al. |
| 2017/0064785 | A1 | 3/2017 | Kim et al. |
| 2017/0069612 | A1 | 3/2017 | Zhang et al. |
| 2017/0084876 | A1 | 3/2017 | Suzuki |
| 2017/0104035 | A1 | 4/2017 | Lee et al. |
| 2017/0117259 | A1 | 4/2017 | Xu |
| 2017/0133357 | A1 | 5/2017 | Kuo et al. |
| 2017/0162746 | A1 | 6/2017 | Cha et al. |
| 2017/0194298 | A1 | 7/2017 | Negley et al. |
| 2017/0194535 | A1 | 7/2017 | Park et al. |
| 2017/0213502 | A1 | 7/2017 | Henry et al. |
| 2017/0236866 | A1 | 8/2017 | Lee et al. |
| 2017/0250329 | A1 | 8/2017 | Takeya et al. |
| 2017/0286044 | A1 | 10/2017 | Kim et al. |
| 2017/0288088 | A1 | 10/2017 | Won Cheol |
| 2017/0288093 | A1 | 10/2017 | Cha et al. |
| 2017/0309676 | A1 | 10/2017 | Odnoblyudov et al. |
| 2017/0309677 | A1 | 10/2017 | Kuroki et al. |
| 2017/0331009 | A1 | 11/2017 | Shioji |
| 2017/0331021 | A1 | 11/2017 | Chae et al. |
| 2017/0338275 | A1 | 11/2017 | Banna et al. |
| 2017/0345801 | A1 | 11/2017 | Lin et al. |
| 2018/0019362 | A1 | 1/2018 | Jogan et al. |
| 2018/0083170 | A1 | 3/2018 | Shepherd |
| 2018/0151548 | A1 | 5/2018 | Pfeuffer et al. |
| 2018/0156965 | A1 | 6/2018 | El-Ghoroury et al. |
| 2018/0158808 | A1 | 6/2018 | Zhang et al. |
| 2018/0166499 | A1 | 6/2018 | Pfeuffer et al. |
| 2018/0233492 | A1 | 8/2018 | Liu et al. |
| 2018/0240952 | A1 | 8/2018 | Moon et al. |
| 2018/0283642 | A1 | 10/2018 | Liao et al. |
| 2019/0006413 | A1 | 1/2019 | Jacob et al. |
| 2019/0053347 | A1 | 2/2019 | Lee et al. |
| 2019/0074324 | A1 | 3/2019 | Kim et al. |
| 2019/0097088 | A1 | 3/2019 | Huppmann et al. |
| 2019/0148612 | A1 | 5/2019 | Lee et al. |
| 2019/0165207 | A1 | 5/2019 | Kim et al. |
| 2019/0181181 | A1 | 6/2019 | Yeon et al. |
| 2019/0229149 | A1 | 7/2019 | Yoo |
| 2019/0229234 | A1 | 7/2019 | Zou et al. |
| 2019/0267436 | A1 | 8/2019 | Zhang et al. |
| 2019/0333964 | A1 | 10/2019 | Lee et al. |
| 2020/0063920 | A1 | 2/2020 | Vampola |
| 2020/0212017 | A1 | 7/2020 | Oh et al. |
| 2020/0212262 | A1 | 7/2020 | Jang et al. |
| 2020/0219858 | A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |

(56) References Cited

FOREIGN PATENT DOCUMENTS

| | | |
|---|---|---|
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

Notice of Allowance issued on Sep. 14, 2021, in U.S. Appl. No. 16/899,522.
Final Office Action issued on Sep. 30, 2021, in U.S. Appl. No. 16/198,850.
Notice of Allowance issued on Sep. 22, 2021, in U.S. Appl. No. 16/200,036.
Final Office Action issued on Sep. 27, 2021, in U.S. Appl. No. 16/915,384.
Final Office Action issued on Sep. 30, 2021, in U.S. Appl. No. 16/228,601.
Extended European Search Report issued on Aug. 9, 2021, in European Patent Application No. 18890359.5.
Extended European Search Report issued on Sep. 6, 2021, in European Patent Application No. 19736098.5.
Extended European Search Report issued on Sep. 29, 2021, in European Patent Application No. 18891199.4.
Extended European Search Report issued on Oct. 5, 2021, in European Patent Application No. 18882087.2.
Extended European Search Report issued on Sep. 14, 2021, in European Patent Application No. 18881496.6.
Extended European Search Report issued on Oct. 5, 2021, in European Patent Application No. 19736023.3.
Extended European Search Report issued on Oct. 7, 2021, in European Patent Application No. 21182984.1.
Notice of Reasons for Refusal drafted on Sep. 14, 2021, in Japanese Patent Application No. 2020-532747.
Final Office Action issued on Dec. 2, 2021, in U.S. Appl. No. 16/228,621.
Notice of Allowance issued on Dec. 9, 2021, in U.S. Appl. No. 16/915,384.
Final Office Action issued on Dec. 24, 2021, in U.S. Appl. No. 16/198,873.
Non-Final Office Action issued on Jan. 12, 2022, in U.S. Appl. No. 16/988,272.
Non-Final Office Action issued on Jan. 21, 2022, in U.S. Appl. No. 16/673,114.
Final Office Action issued on Nov. 12, 2021, in U.S. Appl. No. 16/673,184.
Notice of Allowance issued on Aug. 26, 2021, in U.S. Appl. No. 16/789,877.
Ex Parte Quayle Action issued on Apr. 12, 2023, U.S. Appl. No. 17/521,754.
Notice of Allowance issued on Jun. 28, 2023, U.S. Appl. No. 17/521,754.
Notice of Allowance issued in U.S. Appl. No. 16/228,621 on Feb. 17, 2022.
Notice of Allowance issued in U.S. Appl. No. 16/673,184 on Mar. 15, 2022.
Notice of Allowance issued in U.S. Appl. No. 16/198,873 on Mar. 16, 2022.
Notice of Allowance issued in U.S. Appl. No. 16/228,601 on Mar. 17, 2022.
Notice of Allowance issued in U.S. Appl. No. 16/198,850 on Mar. 30, 2022.
Search Report issued in European Patent Application 21182998.1 on Oct. 12, 2021.
Search Report issued in European Patent Application 21182996.5 on Oct. 22, 2021.
Examination Report issued in Indian Patent Application 202037026000 on Mar. 25, 2022.
Examination Report issued in Indian Patent Application 202037028070 on Mar. 30, 2022.
Extended European Search Report issued in European Patent Application 18886954.9 on Aug. 3, 2021.
Examination Report issued in Indian Patent Application 202037026094 on Mar. 28, 2022.
Notice of Allowance issued in U.S. Appl. No. 16/915,384 on Apr. 21, 2022.
Non-Final Office Action mailed May 11, 2022, in U.S. Appl. No. 17/164,829.
Notice of Allowance issued in U.S. Appl. No. 16/988,272 on Jun. 8, 2022.
Notice of Allowance issued in U.S. Appl. No. 16/228,621 on Jun. 15, 2022.
Substantive Examination Report Notice mailed Jun. 15, 2022, in Saudi Arabian Patent Application No. 520412046.
Notice of Allowance issued in U.S. Appl. No. 16/673,184 on Jun. 23, 2022.
Office Action dated Jul. 19, 2022 for Japanese Patent Application No. 2020-528916 (with English Translation).
Notice of Allowance issued in U.S. Appl. No. 16/673,114 on Jul. 27, 2022.
Office Action dated Aug. 2, 2022 for Japanese Patent Application No. 2020-5291 53(with English Translation).
Office Action dated Aug. 2, 2022 for Japanese Patent Application No. 2020-527964(with English Translation).
Notice of Allowance issued in U.S. Appl. No. 16/198,873 on Aug. 9, 2022.
Notice of Allowance issued in U.S. Appl. No. 16/228,601 on Aug. 9, 2022.
Non-Final Office Action mailed Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice mailed Aug. 29, 2022, in Saudi Arabian Patent Application No. 520412047.
Notice of Allowance issued in U.S. Appl. No. 16/198,850 on Sep. 8, 2022.
Substantive Examination Report Notice mailed Aug. 28, 2022, in Saudi Arabian Patent Application No. 520412187.
Takatoshi Tsuji Mura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 on Sep. 26, 2022.
Office Action dated Jul. 5, 2022 for Japanese Patent Application No. 2020-536804 (with English Translation).
Non-Final Office Action for U.S. Appl. No. 16/228,621 dated Sep. 29, 2020.
Final Office Action for U.S. Appl. No. 16/198,873 dated Oct. 15, 2020.
Non-Final Office Action for U.S. Appl. No. 16/200,036 dated Sep. 24, 2020.
Non-Final Office Action issued on Feb. 19, 2021, in U.S. Appl. No. 16/198,850.
Final Office Action issued on Feb. 23, 2021, in U.S. Appl. No. 16/228,621.
Non-Final Office Action issued on Mar. 1, 2021, in U.S. Appl. No. 16/899,522.
Final Office Action issued on Mar. 4, 2021, in U.S. Appl. No. 16/673,114.

(56) References Cited

OTHER PUBLICATIONS

Non-Final Office Action issued on Mar. 18, 2021 in U.S. Appl. No. 16/228,601.
Final Office Action issued on Apr. 21, 2021, in U.S. Appl. No. 16/198,784.
Non-Final Office Action issued on Apr. 7, 2021, in U.S. Appl. No. 16/915,384.
Non-Final Office Action issued on Apr. 15, 2021, in U.S. Appl. No. 16/673,184.
Final Office Action issued on Mar. 25, 2021 in U.S. Appl. No. 16/200,036.
Non-Final Office Action issued on Jun. 10, 2021, in U.S. Appl. No. 16/198,873.
Notice of Allowance issued on Jul. 12, 2021, in U.S. Appl. No. 16/198,784.
Non-Final Office Action issued on Jul. 8, 2021, in U.S. Appl. No. 16/228,621.
Non-Final Office Action issued on Oct. 24, 2019, in U.S. Appl. No. 16/228,621.
Non-Final Office Action issued on Nov. 4, 2019, in U.S. Appl. No. 16/198,784.
Non-Final Office Action issued on Nov. 19, 2019, in U.S. Appl. No. 16/198,792.
Ex Parte Quayle Action issued on Nov. 19, 2019, in U.S. Appl. No. 16/198,796.
Non-Final Office Action issued on Oct. 31, 2019, in U.S. Appl. No. 16/198,850.
Non-Final Office Action issued on Jan. 9, 2020, in U.S. Appl. No. 16/673,184.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT /KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance issued on Nov. 7, 2019, in U.S. Appl. No. 16/207,881.
Notice of Allowance issued on Feb. 10, 2020, in U.S. Appl. No. 16/198,796.
Non-Final Office Action issued on Mar. 5, 2020, in U.S. Appl. No. 16/228,601.
Notice of Allowance issued on Mar. 31, 2020, in U.S. Appl. No. 16/234,541.
Notice of Allowance issued on Apr. 9, 2020, in U.S. Appl. No. 16/198,792.
Non-Final Office Action issued on Apr. 15, 2020, in U.S. Appl. No. 16/198,873.
Final Office Action issued on Apr. 20, 2020, in U.S. Appl. No. 16/228,621.
Notice of Allowance issued on Mar. 12, 2020, in U.S. Appl. No. 16/198,784.
Non-Final Office Action issued on Mar. 23, 2020, in U.S. Appl. No. 16/219,716.
Final Office Action issued on May 29, 2020, in U.S. Appl. No. 16/198,850.
Final Office Action for U.S. Appl. No. 16/673,184 dated Jul. 23, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/236,737 dated Jun. 24, 2020.
Final Office Action for U.S. Appl. No. 16/228,601 dated Jun. 25, 2020.
Notice of Allowance for U.S. Appl. No. 16/236,737 dated Oct. 28, 2020.
Non-Final Office Action for U.S. Appl. No. 16/198,784 dated Nov. 19, 2020.

LIGHT EMITTING DEVICE WITH LED STACK FOR DISPLAY AND DISPLAY APPARATUS HAVING THE SAME

CROSS-REFERENCE TO RELATED APPLICATIONS

This application is a continuation of U.S. patent application Ser. No. 17/521,754, filed on Nov. 8, 2021, which is a continuation of U.S. patent application Ser. No. 16/789,877, filed on Feb. 13, 2020, which is a continuation of U.S. patent application Ser. No. 16/207,881, filed on Dec. 3, 2018, now issued as U.S. Pat. No. 10,748,881, issued on Aug. 18, 2020, each of which claims priority from and the benefit of U.S. Provisional Application No. 62/594,754, filed on Dec. 5, 2017, U.S. Provisional Application No. 62/608,006, filed on Dec. 20, 2017, U.S. Provisional Application No. 62/649,500, filed on Mar. 28, 2018, U.S. Provisional Application No. 62/650,920, filed on Mar. 30, 2018, U.S. Provisional Application No. 62/651,585, filed on Apr. 2, 2018, U.S. Provisional Application No. 62/657,575, filed on Apr. 13, 2018, each of which is hereby incorporated by reference for all purposes as if fully set forth herein.

BACKGROUND

Field

Exemplary implementations of the invention relate generally to a light emitting device for a display and a display apparatus and, more specifically, to a micro light emitting device having a stacked structure and a display apparatus having the same.

Discussion of the Background

A light emitting diode (LED) has been widely used as an inorganic light source in various fields such as a display apparatus, an automobile lamp, and general lighting. A light emitting diode has a longer lifetime, lower power consumption, and quicker response time than an existing light source, and thus, LEDs are rapidly replacing the existing light sources.

To date, conventional LEDs have been mainly used as a backlight light source in a display apparatus. However, recently, an LED display that directly generates an image using light emitting diodes have been developed.

A display apparatus generally emits various colors through mixture of blue, green, and red color light. In order to generate various images, and each pixel has blue, green, and red subpixels. The color of a specific pixel is determined through the colors of the subpixels, and an image is generated by a combination of such pixels.

Since LEDs may emit light of various colors depending on the materials used therein, individual LED chips emitting blue, green, and red light may be arranged on a two-dimensional plane of a display apparatus. However, when one LED chip forms each subpixel, the number of LED chips required to form a display apparatus can exceed millions, thereby causing excessive time consumption for a mounting process.

In addition, since the subpixels are arranged on a two-dimensional plane, a relatively large area is occupied by one pixel including the subpixels for blue, green, and red light. Therefore, there is a need for reducing the area of each subpixel, such that the subpixels may be formed in a limited area. However, such would cause deterioration in brightness from reduced luminous area, as well as increasing manufacturing complexity in the process of mounting the LED chip.

Furthermore, reducing the area of each subpixel would also cause deterioration in luminous efficiency of the LED from heat generated in an LED chip.

The above information disclosed in this Background section is only for understanding of the background of the inventive concepts, and, therefore, it may contain information that does not constitute prior art.

SUMMARY

Light emitting diodes constructed according to the principles and some exemplary implementations of the invention and displays using the same are capable of increasing an area of each subpixel without increasing the pixel area.

Light emitting diodes and display using the light emitting diodes, e.g., micro LEDs, constructed according to the principles and some exemplary implementations of the invention are capable of reducing the amount of time associated with mounting a light emitting device onto a circuit board during manufacture.

Light emitting diodes and display using the light emitting diodes, e.g., micro LEDs, constructed according to the principles and some exemplary implementations of the invention include one or more structures for increasing current distribution.

Light emitting diodes and display using the light emitting diodes, e.g., micro LEDs, constructed according to the principles and some exemplary implementations of the invention include a structure to improve heat dissipation.

Light emitting diodes and display using the light emitting diodes, e.g., micro LEDs, constructed according to the principles and some exemplary implementations of the invention include a mesh structure to improve light efficiency.

Additional features of the inventive concepts will be set forth in the description which follows, and in part will be apparent from the description, or may be learned by practice of the inventive concepts.

Alight emitting device for a display according to an exemplary embodiment includes a first LED sub-unit, a second LED sub-unit disposed below the first LED sub-unit, a third LED sub-unit disposed below the second LED sub-unit, and electrode pads electrically connected to the first, second, and third LED sub-units, in which the electrode pads include a common electrode pad electrically connected in common to the first, second, and third LED sub-units, and first, second, and third electrode pads connected to the first, second, and third LED sub-units, respectively, the first, second, and third LED sub-units are configured to be independently driven, light generated in the first LED sub-unit is configured to be emitted to the outside of the light emitting device through the second LED sub-unit and the third LED sub-unit, and light generated in the second LED sub-unit is configured to be emitted to the outside of the light emitting device through the third LED sub-unit.

The first, second, and third LED sub-units may include first, second, and third LED stacks configured to emit red light, green light, and blue light, respectively.

The light emitting device may further include a first reflective electrode disposed between the electrode pads and the first LED sub-unit and in ohmic contact with the first LED sub-unit, in which the common electrode pad is connected to the first reflective electrode.

The first reflective electrode may include an ohmic contact layer in ohmic contact with an upper surface of the first LED sub-unit, and a reflective layer covering at least a portion of the ohmic contact layer.

The first reflective electrode may be in ohmic contact with the upper surface of the first LED sub-unit in a plurality of regions.

The light emitting device may further include a second transparent electrode interposed between the second and third LED sub-units and in ohmic contact with a lower surface of the second LED sub-unit, and a third transparent electrode in ohmic contact with an upper surface of the third LED sub-unit, in which wherein the common electrode pad is electrically connected to the second transparent electrode and the third transparent electrode.

The light emitting device may further include a first metal current distributing layer connected to a lower surface of the second transparent electrode, and a third metal current distributing layer connected to an upper surface of the third transparent electrode, in which the common electrode pad is connected to the first metal current distributing layer and the third metal current distributing layer.

The first metal current distributing layer and the third metal current distributing layer each may have a pad region for connecting the common electrode pad and a projection extending from the pad region.

The common electrode pad may be connected to an upper surface of the first metal current distributing layer and an upper surface of the third metal current distributing layer.

The light emitting device may further include a first color filter disposed between the third transparent electrode and the second LED sub-unit, in which the third metal current distributing layer is disposed between the first color filter and the second LED sub-unit to be connected to the third transparent electrode through the first color filter.

The light emitting device may further include a second color filter disposed between the first and second LED sub-units, and a second metal current distributing layer disposed between the second color filter and the first LED sub-unit to be connected to the second transparent electrode through the second color filter, in which the second electrode pad is connected to the second metal current distributing layer.

The second metal current distributing layer may have a pad region for connecting the second electrode pad and a projection extending portion extending from the pad region.

The first and the third LED sub-units may each include a first conductivity type semiconductor layer and a second conductivity type semiconductor layer disposed on a partial region of the first conductivity type semiconductor layer, and the first electrode pad and the third electrode pad may be electrically connected to the first conductivity type semiconductor layer of the first LED sub-unit and the first conductivity type semiconductor layer of the third LED sub-unit, respectively.

The light emitting device may further include a first ohmic electrode disposed on the first conductivity type semiconductor layer of the first LED sub-unit, and a third ohmic electrode disposed on the first conductivity type semiconductor layer of the third LED sub-unit, in which the first electrode pad is connected to the first ohmic electrode, and the third electrode pad is connected to the third ohmic electrode.

The light emitting device may further include a substrate connected to a lower surface of the third LED sub-unit.

The substrate may be a sapphire substrate or a gallium nitride substrate.

The light emitting device may further include an upper insulation layer disposed between the first LED sub-unit and the electrode pads, in which the electrode pads are electrically connected to the first, second, and third LED sub-units through the upper insulation layer.

The upper insulation layer may include at least one of a distributed Bragg reflector, a reflective organic material, and a light blocking material.

The light emitting device may include a micro LED having a surface area less than about 10,000 square μm, the first LED sub-unit may be configured to emit any one of red, green, and blue light, the second LED sub-unit may be configured to emit a different one of red, green, and blue light from the first LED sub-unit, and the third LED sub-unit may be configured to emit a different one of red, green, and blue light from the first and second LED sub-units.

A display apparatus may include a circuit board, and a plurality of light emitting devices arranged on the circuit board, at least one of the light emitting devices may include the light emitting device according to an exemplary embodiment, in which the electrode pads of the light emitting devices may be electrically connected to the circuit board, the light emitting devices may further include substrates coupled to the corresponding third LED sub-unit, and the substrates may be spaced apart from each other.

Alight emitting device for a display according to an exemplary embodiment includes a first LED sub-unit, a second LED sub-unit disposed on the first LED sub-unit, a third LED sub-unit disposed on the second LED sub-unit, electrode pads disposed below the first LED sub-unit, and a filler disposed between the electrode pads, in which the electrode pads include a common electrode pad electrically connected in common to the first, second, and third LED sub-units, and first, second, and third electrode pads connected to the first, second, and third LED sub-units, respectively, the first, second, and third LED sub-units are independently drivable, light generated in the first LED sub-unit is configured to be emitted to the outside of the light emitting device through the second and third LED sub-units, and light generated in the second LED sub-unit is configured to be emitted to the outside through the third LED sub-unit.

The first, second, and third LED sub-units may include first, second, and third LED stacks configured to emit red light, green light, and blue light, respectively.

The light emitting device may further include a first ohmic electrode in ohmic contact with a first conductivity type semiconductor layer of the first LED sub-unit, and a first reflective electrode disposed between the electrode pads and the first LED sub-unit to be in ohmic contact with the first LED sub-unit, in which the first electrode pad is electrically connected to the first ohmic electrode, and the common electrode pad is electrically connected to the first reflective electrode below the first reflective electrode.

The first reflective electrode may include an ohmic contact layer in ohmic contact with a second conductivity type semiconductor layer of the first LED sub-unit, and a reflective layer covering at least a portion of the ohmic contact layer.

The first reflective electrode may be in ohmic contact with an upper surface of the first LED sub-unit in a plurality of regions.

The light emitting device may further include a second transparent electrode interposed between the first and second LED sub-units to be in ohmic contact with a lower surface of the second LED sub-unit, a third transparent electrode interposed between the second and third LED sub-units to be in ohmic contact with a lower surface of the third LED sub-unit, and a common connector electrically connecting the second transparent electrode and the third transparent electrode to the first reflective electrode, in which the common connector is disposed on the first reflective electrode and is electrically connected to the common electrode pad through the first reflective electrode.

The light emitting device may further include a second metal current spreading layer connected to a lower surface of the second transparent electrode; and a third metal current spreading layer connected to a lower surface of the third transparent electrode, in which the common connector is connected to at least one of the second transparent electrode and the second metal current spreading layer, and at least one of the third transparent electrode and the third metal current spreading layer.

The second metal current spreading layer and the third metal current spreading layer may each have a pad region for connecting the common connector and a projection extending from the pad region.

The common connector may be connected to an upper surface of the second metal current spreading layer and an upper surface of the third metal current spreading layer.

The common connector may include a first common connector for electrically connecting the second transparent electrode and the first reflective electrode to each other, and a second common connector for electrically connecting the third transparent electrode and the first common connector to each other.

The light emitting device may further include a first color filter disposed between the first LED sub-unit and the second transparent electrode, and a second color filter disposed between the second LED sub-unit and the third transparent electrode, in which the second metal current spreading layer is disposed between the first color filter and the first LED sub-unit to be connected to the second transparent electrode through the first color filter, and the third metal current spreading layer is disposed between the second color filter and the second LED sub-unit to be connected to the third transparent electrode through the second color filter.

The light emitting device may further include a second connector for electrically connecting the second LED sub-unit and the second electrode pad to each other, and a third connector for electrically connecting the third LED sub-unit and the third electrode pad to each other, in which each of the second and third LED sub-units may include a first conductivity type semiconductor layer and a second conductivity type semiconductor layer disposed below the first conductivity type semiconductor layer, the second connector is electrically connected to the first conductivity type semiconductor layer of the second LED sub-unit, and the third connector is electrically connected to the first conductivity type semiconductor layer of the third LED sub-unit.

At least one of the second connector and the third connector may contact the first conductivity type semiconductor layer.

The light emitting device may further include a second ohmic electrode in ohmic contact with the first conductivity type semiconductor layer of the second LED sub-unit, and a third ohmic electrode in ohmic contact with the first conductivity type semiconductor layer of the third LED sub-unit, in which the second connector is connected to the second ohmic electrode, and the third connector is connected to the third ohmic electrode.

The second and third connectors may be connected to upper surfaces of the second ohmic electrode and the third ohmic electrode, respectively.

The third connector may include a lower connector penetrating through the second LED sub-unit, and an upper connector penetrating through the third LED sub-unit and connected to an intermediate connector, in which the lower connector has a pad region for connection of the upper connector.

The light emitting device may further include an insulating layer covering side surfaces of the first, second, and third LED sub-units, in which the insulating layer may include a distributed Bragg reflector.

The light emitting device may further include connection pads disposed below the first LED sub-unit, and connectors disposed on the connection pads and electrically connecting the second and third LED sub-units to the connection pads, respectively, in which the second electrode pad and the third electrode pad are connected to the connection pads, respectively, below the connection pads.

The light emitting device may further include connectors for electrically connecting the second and third LED sub-units to the electrode pads, in which the connectors may include materials different from the electrode pads.

A display apparatus may include a circuit board, and a plurality of light emitting devices arranged on the circuit board, at least one of the light emitting devices may include the light emitting device according to an exemplary embodiments, in which the electrode pads of the light emitting device are electrically connected to the circuit board.

Alight emitting device for a display according to an exemplary embodiment includes a first substrate, a first LED sub-unit disposed under the first substrate, a second LED sub-unit disposed under the first LED sub-unit, a third LED sub-unit disposed under the second LED sub-unit, a first transparent electrode interposed between the first and second LED sub-units, and in ohmic contact with a lower surface of the first LED sub-unit, a second transparent electrode interposed between the second and third LED sub-units, and in ohmic contact with a lower surface of the second LED sub-unit, a third transparent electrode interposed between the second transparent electrode and the third LED sub-unit, and in ohmic contact with an upper surface of the third LED sub-unit, at least one current spreader connected to at least one of the first, second, and third LED sub-units, electrode pads disposed on the first substrate, and through-hole vias formed through the first substrate to electrically connect the electrode pads to the first, second, and third LED sub-units, in which at least one of the through-hole vias is formed through the first substrate, the first LED sub-unit, and the second LED sub-unit.

The first, second, and third LED sub-units may include first, second, and third LED stacks configured to emit red light, green light and blue light, respectively.

The light emitting device may further include a distributed Bragg reflector interposed between the first substrate and the first LED sub-unit.

The first substrate may include GaAs.

The light emitting device may further include a second substrate disposed under the third LED sub-unit.

The second substrate may be a sapphire substrate or a GaN substrate.

The first LED sub-unit, the second LED sub-unit, and the third LED sub-unit may be independently drivable, light generated from the first LED sub-unit may be configured to be emitted to the outside of the light emitting device through the second LED sub-unit, the third LED sub-unit, and the second substrate, and light generated from the second LED sub-unit may be configured to be emitted to the outside of the light emitting device through the third LED sub-unit and the second substrate.

The electrode pads may include a common electrode pad commonly electrically connected to the first, second, and third LED sub-units, and a first electrode pad, a second electrode pad, and a third electrode pad electrically connected to the first LED sub-unit, the second LED sub-unit, and the third LED sub-unit, respectively.

The common electrode pad may be electrically connected to a plurality of through-hole vias.

The second electrode pad may be electrically connected to the second LED sub-unit through a first through-hole via formed through the first substrate and the first LED sub-unit, and the third electrode pad may be electrically connected to the third LED sub-unit through a second through-hole via formed through the first substrate, the first LED sub-unit, and the second LED sub-unit.

The first electrode pad may be electrically connected to the first substrate.

The first electrode pad may be electrically connected to the first LED sub-unit through a third through-hole via formed through the first substrate.

The at least one current spreader may include a first current spreader connected to the first LED sub-unit, a second current spreader connected to the second LED sub-unit, and a third current spreader connected to the third LED sub-unit, and the first, second, and third current spreaders may be separated from the first, second, and third transparent electrodes, respectively.

One of the electrode pads disposed on the first substrate may be electrically connected to the first, second, and third transparent electrodes through a plurality of through-hole vias.

One of the electrode pads disposed on the first substrate may be connected to the first substrate.

The light emitting device may further include a first color filter disposed between the third transparent electrode and the second transparent electrode, and a second color filter disposed between the second LED sub-unit and the first transparent electrode.

The first color filter and the second color filter may include insulation layers having different refractive indices.

The light emitting device may include an insulation layer disposed between the first substrate and the electrode pads, and covering side surfaces of the first, second, and third LED sub-units.

The at least one current spreader may have a body at least partially surrounding one of the through-hole via, and a projection extending outwardly from the body.

The body may have a substantially annular shape and the projection may have a width less than the diameter of the body.

A display apparatus according to an exemplary embodiment includes a circuit board, and a plurality of light emitting devices arranged on the circuit board, at least one of the light emitting devices include includes a first substrate, a first LED sub-unit disposed under the first substrate, a second LED sub-unit disposed under the first LED sub-unit, a third LED sub-unit disposed under the second LED sub-unit, a first transparent electrode interposed between the first and second LED sub-units, and in ohmic contact with a lower surface of the first LED sub-unit, a second transparent electrode interposed between the second and third LED sub-units, and in ohmic contact with a lower surface of the second LED sub-unit, a third transparent electrode interposed between the second transparent electrode and the third LED sub-unit, and in ohmic contact with an upper surface of the third LED sub-unit, at least one current spreader connected to at least one of the first, second, and third LED sub-units, electrode pads disposed on the first substrate, and through-hole vias formed through the first substrate to electrically connect the electrode pads to the first, second, and third LED sub-units, in which at least one of the through-hole vias is formed through the first substrate, the first LED sub-unit, and the second LED sub-unit, and the electrode pads of the light emitting device are electrically connected to the circuit board.

Each of the light emitting devices may further include a second substrate coupled to the third LED sub-unit.

Alight emitting device for a display according to an exemplary embodiment includes a first substrate, a first LED sub-unit disposed under the first substrate, a second LED sub-unit disposed under the first LED sub-unit, a third LED sub-unit disposed under the second LED sub-unit, electrode pads disposed over the first substrate, through-hole vias passing through the first substrate to electrically connect the electrode pads to the first, second, and third LED sub-units, and heat exchange elements disposed over the first LED sub-unit, each exchange element having at least a portion thereof disposed inside the first substrate, in which at least one of the through-hole vias passes through the first substrate, the first LED sub-unit, and the second LED sub-unit.

The first, second, and third LED sub-units may include first, second, and third LED stacks configured to emit red light, green light and blue light, respectively, and the heat exchange elements may include heat pipes.

The light emitting device may include a distributed Bragg reflector interposed between the first substrate and the first LED sub-unit, in which the heat exchange elements may be disposed on the distributed Bragg reflector.

The first substrate may be a GaAs substrate.

The light emitting device may further include a second substrate disposed under the third LED sub-unit.

The second substrate may be a sapphire substrate or a GaN substrate.

The first LED sub-unit, the second LED sub-unit, and the third LED sub-unit may be independently drivable, light generated from the first LED sub-unit may be configured to be emitted to the outside of the light emitting device through the second LED sub-unit, the third LED sub-unit, and the second substrate, and light generated from the second LED sub-unit may be configured to be emitted to the outside of the light emitting device through the third LED sub-unit and the second substrate.

The electrode pads may include a common electrode pad commonly electrically connected to the first, second, and third LED sub-unit, and a first electrode pad, a second electrode pad, and a third electrode pad electrically connected to the first LED sub-unit, the second LED sub-unit, and the third LED sub-unit, respectively.

The common electrode pad may be electrically connected to a plurality of through-hole vias.

The second electrode pad may be electrically connected to the second LED sub-unit through a through-hole via formed through the first substrate and the first LED sub-unit, and the third electrode pad may be electrically connected to the third LED sub-unit through a through-hole via formed through the first substrate, the first LED sub-unit, and the second LED sub-unit.

The first electrode pad may be electrically connected to the first substrate, and the heat exchange elements may be electrically insulated from the common electrode pad, the second electrode pad, and the third electrode pad.

The first electrode pad may be electrically connected to the first LED sub-unit through a through-hole via passing through the first substrate, and the heat exchange elements may be electrically connected to the common electrode pad, and are electrically insulated from the first electrode pad.

The through-hole vias may be insulated from the substrate by an insulation layer inside the substrate, and the heat exchange elements may contact the substrate inside the substrate.

The through-hole vias and the heat exchange elements may be insulated from the substrate by the insulation layer inside the substrate.

The light emitting device may further include a first transparent electrode interposed between the first LED sub-unit and the second LED sub-unit, and being in ohmic contact with a lower surface of the first LED sub-unit, a second transparent electrode interposed between the second LED sub-unit and the third LED sub-unit, and being in ohmic contact with a lower surface of the second LED, a third transparent electrode interposed between the second transparent electrode and the third LED sub-unit, and being in ohmic contact with an upper surface of the third LED sub-unit, and at least one current spreader connected to at least one of the first, second, and third LED sub-units.

The at least one current spreader may include a first current spreader connected to the first LED sub-unit, a second current spreader connected to the second LED sub-unit, and a third current spreader connected to the third LED sub-unit, and the first, second, and third current spreaders may be separated from the first, second, and third transparent electrodes, respectively.

One of the electrode pads disposed on the first substrate may be electrically connected to the first, second, and third transparent electrodes through the through-hole vias.

The light emitting device may further include a first color filter disposed between the third transparent electrode and the second transparent electrode, and a second color filter disposed between the second LED sub-unit and the first transparent electrode.

The light emitting device may further include an insulation layer interposed between the first substrate and the electrode pads, and covering side surfaces of the first to third LED sub-units.

Alight emitting device for a display according to an exemplary embodiment includes a first substrate, a first LED sub-unit disposed under the first substrate, a second LED sub-unit disposed under the first LED sub-unit, a third LED sub-unit disposed under the second LED sub-unit, and heat exchange elements each having at least a portion thereof disposed inside the first substrate, in which the heat exchange elements are disposed over the first LED sub-unit.

The light emitting device may further include electrode pads disposed on the first substrate, and through-hole vias to electrically connect the electrode pads to the first, second, and third LED sub-unit, in which the heat exchange elements include heat pipes.

The light emitting device may further include a second substrate disposed under the third LED sub-unit, in which the first substrate may be a GaAs substrate, and the second substrate may be a sapphire substrate or a GaN substrate.

The light emitting device may further include a first transparent electrode interposed between the first LED sub-unit and the second LED sub-unit, and being in ohmic contact with a lower surface of the first LED sub-unit, a second transparent electrode interposed between the second LED sub-unit and the third LED sub-unit, and being in ohmic contact with a lower surface of the second LED sub-unit, a third transparent electrode interposed between the second transparent electrode and the third LED sub-unit, and being in ohmic contact with an upper surface of the third LED sub-unit, and at least one current spreader connected to at least one of the first, second, and third LED sub-units.

The light emitting device may include a micro LED having a surface area less than about 10,000 square μm, the first LED sub-unit may be configured to emit any one of red, green, and blue light, the second LED sub-unit may be configured to emit a different one of red, green, and blue light from the first LED sub-unit, and the third LED sub-unit may be configured to emit a different one of red, green, and blue light from the first and second LED sub-units.

A display apparatus may include a circuit board, and a plurality of light emitting devices arranged on the circuit board, at least one of the light emitting devices may include the light emitting device according to an exemplary embodiment.

The electrode pads may be electrically connected to the circuit board.

Each of the light emitting devices may further include a second substrate coupled to the third LED sub-unit.

Alight emitting device for a display according to an exemplary embodiment includes a first substrate, a first LED sub-unit disposed under the first substrate, a second LED sub-unit disposed under the first LED sub-unit, a third LED sub-unit disposed under the second LED sub-unit, a first ohmic electrode interposed between the first LED sub-unit and the second LED sub-unit, and being in ohmic contact with a lower surface of the first LED sub-unit, a second ohmic electrode interposed between the second LED sub-unit and the third LED sub-unit, and being in ohmic contact with a lower surface of the second LED sub-unit, a third ohmic electrode interposed between the second ohmic electrode and the third LED sub-unit, and being in ohmic contact with an upper surface of the third LED sub-unit, electrode pads disposed on the first substrate, and through-hole vias formed through the first substrate to electrically connect the electrode pads to the first, second, and third LED sub-unit, in which at least one of the through-hole vias is formed through the first substrate, the first LED sub-unit, and the second LED sub-unit, and at least one of the first ohmic electrode, the second ohmic electrode, and the third electrode has a mesh structure.

The first, second, and third LED sub-units may include first, second, and third LED stacks configured to emit red light, green light, and blue light, respectively.

The light emitting device may further include a distributed Bragg reflector interposed between the first substrate and the first LED sub-unit.

The first substrate may be a GaAs substrate.

The light emitting device may further include a second substrate disposed under the third LED sub-unit.

The second substrate may be a sapphire substrate or a GaN substrate.

The first LED sub-unit, the second LED sub-unit, and the third LED sub-unit may be independently drivable, light generated from the first LED sub-unit may be configured to be emitted to the outside of the light emitting device through the second LED sub-unit, the third LED sub-unit, and the second substrate, and light generated from the second LED sub-unit may be configured to be emitted to the outside of the light emitting device through the third LED sub-unit and the second substrate.

The electrode pads may include a common electrode pad commonly electrically connected to the first, second, and third LED sub-unit, and a first electrode pad, a second electrode pad, and a third electrode pad electrically connected to the first LED sub-unit, the second LED sub-unit, and the third LED sub-unit, respectively.

The common electrode pad may be electrically connected to a plurality of through-hole vias.

The second electrode pad may be electrically connected to the second LED sub-unit through a through-hole via formed through the first substrate and the first LED sub-unit, and the third electrode pad may be electrically connected to the third LED sub-unit through a through-hole via formed through the first substrate, the first LED sub-unit, and the second LED sub-unit.

The first electrode pad may be electrically connected to the first substrate.

The first electrode pad may be electrically connected to the first LED sub-unit through a through-hole via formed through the first substrate.

The first ohmic electrode may have the mesh structure and include Au—Zn or Au—Be, and the second ohmic electrode may have the mesh structure and include Pt or Rh.

One of the electrode pads disposed on the first substrate may be electrically connected to the first, second, and third ohmic electrodes through a plurality of through-hole vias.

One of the electrode pads disposed on the first substrate may be connected to the first substrate.

The light emitting device may further include a first color filter disposed between the third ohmic electrode and the second ohmic electrode, and a second color filter disposed between the second LED sub-unit and the first ohmic electrode.

The first color filter and the second color filter may include insulation layers having different refractive indices.

The light emitting device may further include an insulation layer disposed between the first substrate and the electrode pads, and covering side surfaces of the first, second, and third LED sub-units.

A display apparatus may include a circuit board, and a plurality of light emitting devices arranged on the circuit board, at least one of the light emitting devices may include the light emitting device according to an exemplary embodiment, in which the electrode pads may be electrically connected to the circuit board.

Each of the light emitting devices may further include a second substrate coupled to the third LED sub-unit.

Alight emitting device for a display according to an exemplary embodiment includes a first substrate, a first LED sub-unit disposed under the first substrate, a second LED sub-unit disposed under the first LED sub-unit, a third LED sub-unit disposed under the second LED sub-unit, a first ohmic electrode interposed between the first LED sub-unit and the second LED sub-unit, and being in ohmic contact with a lower surface of the first LED sub-unit, a second ohmic electrode interposed between the second LED sub-unit and the third LED sub-unit, and being in ohmic contact with a lower surface of the second LED sub-unit, a third ohmic electrode interposed between the second ohmic electrode and the third LED sub-unit, and being in ohmic contact with an upper surface of the third LED sub-unit, a second substrate disposed under the third LED sub-unit, in which at least one of the first ohmic electrode, the second ohmic electrode, and the third electrode has a mesh structure.

The first substrate may be a GaAs substrate, and the second substrate may be a sapphire substrate or a GaN substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
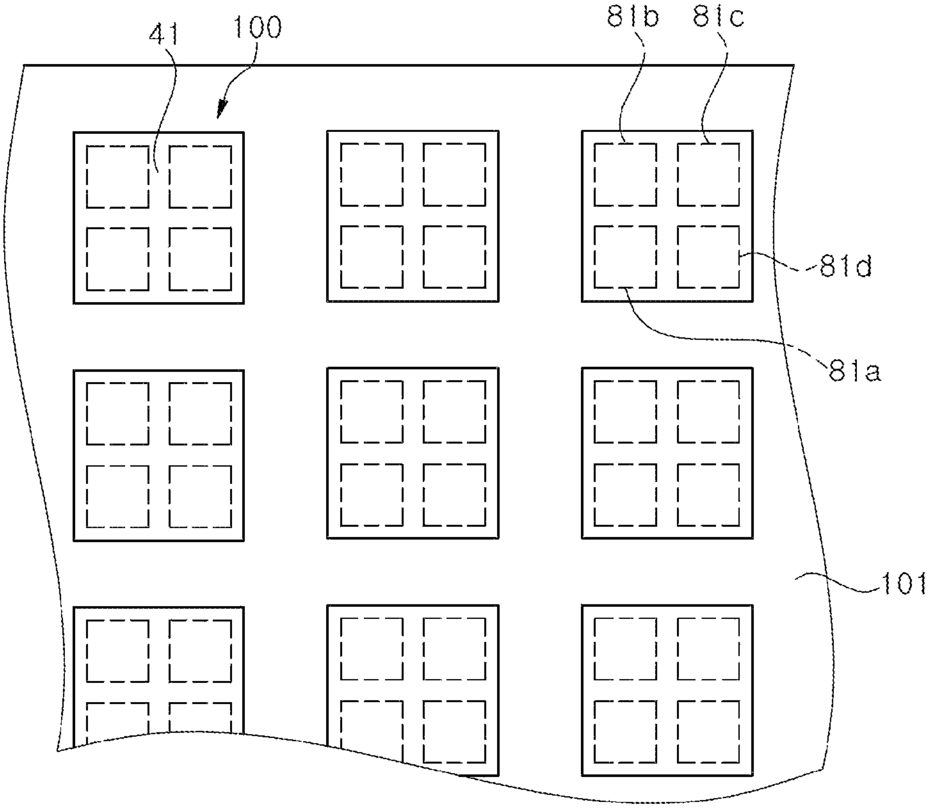
FIG. 1 is a schematic plan view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms “substantially,” “about,” and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the drawings. As used herein, a light emitting device or a light emitting diode according to exemplary embodiments may include a micro LED, which has a surface area less than about 10,000 square m as known in the art. In other exemplary embodiments, the micro LED’s may have a surface area of less than about 4,000 square μm, or less than about 2,500 square μm, depending upon the particular application. In addition, a light emitting device may be mounted in various configurations, such as flip bonding, and thus, the inventive concepts are not limited to a particular stacked sequence of the first, second, and third LED stacks.

FIG. 1 is a schematic plan view illustrating a display apparatus according to an exemplary embodiment.

Referring to FIG. 1, the display apparatus includes a circuit board 101 and a plurality of light emitting devices 100.

The circuit board 101 may include a circuit for passive matrix driving or active matrix driving. In one exemplary embodiment, the circuit board 101 may include wires and resistors disposed therein. In another exemplary embodiment, the circuit board 101 may include wires, transistors, and capacitors. The circuit board 101 may also have pads disposed on an upper surface thereof in order to allow electrical connection to circuits disposed therein.

The plurality of light emitting devices 100 are arranged on the circuit board 101. Each light emitting device 100 may constitute one pixel. The light emitting device 100 has electrode pads 81*a*, 81*b*, 81*c*, and 81*d* electrically connected to the circuit board 101. The light emitting device 100 may also include a substrate 41 disposed on an upper surface thereof. The light emitting devices 100 are spaced apart from each other, such that the substrates 41 disposed on the upper surfaces of the light emitting devices 100 are also spaced apart from each other.

Figure 2A:
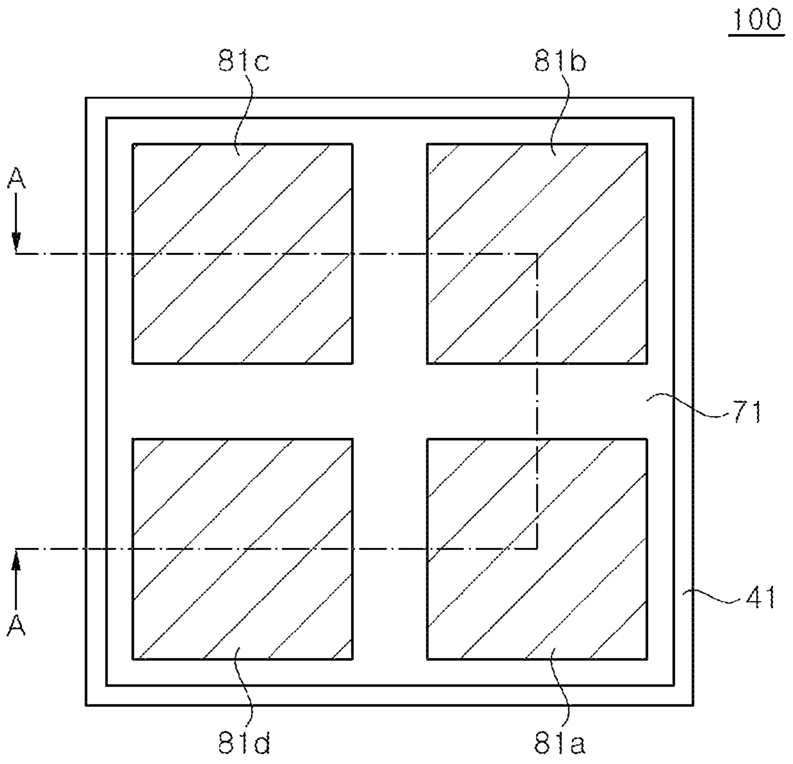
FIG. 2A is a schematic plan view of a light emitting device according to an exemplary embodiment.
Figure 2B:
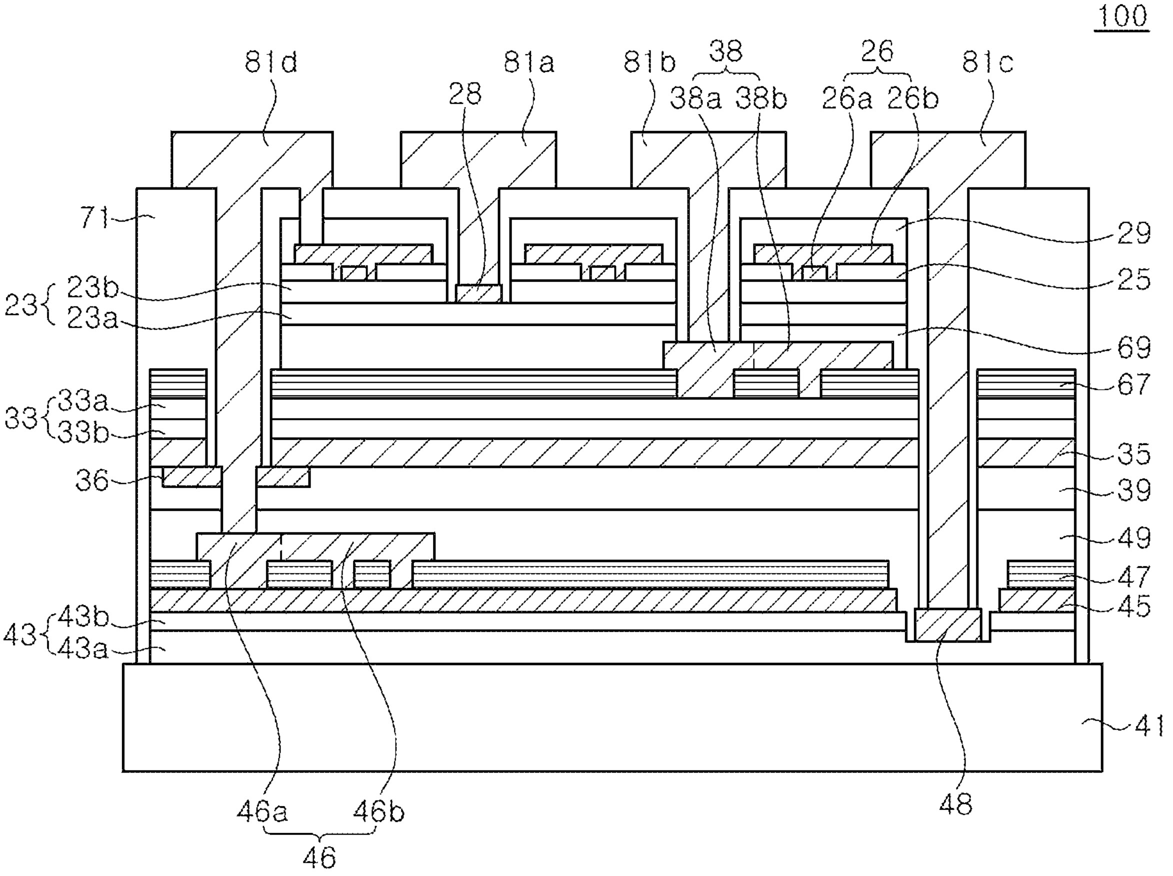
FIG. 2B is a schematic cross-sectional view taken along line A-A of FIG. 2A.

A configuration of the light emitting device 100 according to an exemplary embodiment will be described in detail with reference to FIGS. 2A and 2B. FIG. 2A is a schematic plan view of a light emitting device 100 according to an exemplary embodiment, and FIG. 2B is a cross-sectional view taken along line A-A of FIG. 2A. Although the electrode pads 81*a*, 81*b*, 81*c*, and 81*d* are shown as being arranged on an upper side of the light emitting device 100, however, the inventive concepts are not limited thereto. For example, the light emitting device 100 may be flip-bonded onto the circuit board 101, and in this case, the electrode pads 81*a*, 81*b*, 81*c*, and 81*d* may arranged on a lower side of the light emitting device 100.

Referring to FIGS. 2A and 2B, the light emitting device 100 includes the substrate 41, the electrode pads 81*a*, 81*b*, 81*c*, and 81*d*, a first LED stack 23, a second LED stack 33, a third LED stack 43, an insulation layer 25, a protective layer 29, a first reflective electrode 26, a second transparent electrode 35, a third transparent electrode 45, first and third ohmic electrodes 28 and 48, a 2-1-th current distributing layer 36, a 2-2-th current distributing layer 38, a third current distributing layer 46, a first color filter 47, a second color filter 67, a first bonding layer 49, a planarization layer 39, a second bonding layer 69, and an upper insulation layer 71.

The substrate 41 may support the LED stacks 23, 33, and 43. The substrate 41 may be a growth substrate on which the third LED stack 43 is grown. For example, the substrate 41 may be a sapphire substrate or a gallium nitride substrate, in particular, a patterned sapphire substrate. The first, second, and third LED stacks 23, 33, and 43 are arranged on the substrate 41 in the order of the third LED stack 43, the second LED stack 33, and the first LED stack 23. A single third LED stack may be disposed on one substrate 41, and thus, the light emitting device 100 may have a single-chip structure of a single pixel. In some exemplary embodiments, the substrate 41 may be omitted, and a lower surface of the third LED stack 43 may be exposed. In this case, a rough surface may be formed on the lower surface of the third LED stack 43 by surface texturing.

The first LED stack 23, the second LED stack 33, and the third LED stack 43 include first conductivity type semiconductor layers 23*a*, 33*a*, and 43*a*, second conductivity type semiconductor layers 23*b*, 33*b*, and 43*b*, and active layers interposed between the first conductivity type semiconductor layers 23*a*, 33*a*, and 43*a* and the second conductivity type semiconductor layers 23*b*, 33*b*, and 43*b*, respectively. The active layer may have a multiple quantum well structure.

According to an exemplary embodiment, an LED stack may emit light having a shorter wavelength as being disposed closer to the substrate 41. For example, the first LED stack 23 may be an inorganic light emitting diode emitting red light, the second LED stack 33 may be an inorganic light emitting diode emitting green light, and the third LED stack 43 may be an inorganic light emitting diode emitting blue light. The first LED stack 23 may include a GaInP based well layer, and the second LED stack 33 and the third LED stack 43 may include a GaInN based well layer. However, the inventive concepts are not limited thereto. When the light emitting device 100 includes a micro LED, which has a surface area less than about 10,000 square μm as known in the art, or less than about 4,000 square μm or 2,500 square μm in other exemplary embodiments, the first LED stack 23 may emit any one of red, green, and blue light, and the second and third LED stacks 33 and 43 may emit a different one of red, green, and blue light, without adversely affecting operation, due to the small form factor of a micro LED.

The first conductivity type semiconductor layers 23*a*, 33*a*, and 43*a* of the respective LED stacks 23, 33, and 43 may be n-type semiconductor layers, and the second conductivity type semiconductor layers 23*b*, 33*b*, and 43*b* of the respective LED stacks 23, 33, and 43 may be p-type semiconductor layers. In the illustrated exemplary embodiment, an upper surface of the first LED stack 23 may be a p-type semiconductor layer 23*b*, an upper surface of the second LED stack 33 may be an n-type semiconductor layer 33*a*, and an upper surface of the third LED stack 43 may be a p-type semiconductor layer 43*b*. More particularly, an order of the semiconductor layers may be reversed only in the second LED stack 33. According to an exemplary embodiment, the first LED stack 23 and the third LED stack 43 may have the first conductivity type semiconductor layers 23*a* and 43*a* with textured surfaces, respectively, to improve light extraction efficiency. In some exemplary embodiments, the second LED stack 33 may also have the first conductivity type semiconductor layer 33*a* with a textured surface, however, since the first conductivity type semiconductor layer 33*a* is disposed farther from the substrate 41 than the second conductivity type semiconductor layer 33*b*, effects from the surface texturing may not be significant. In particular, when the second LED stack 33 emits green light, the green light has higher visibility than red light or blue light. Therefore, the first LED stack 23 and the third LED stack 43 may be formed to have higher luminous efficiency than the second LED stack 33. In this manner, luminous intensities of red light, green light, and blue light may be adjusted to be substantially uniform with each other by applying surface texturing to the greater extent in the first LED stack 23 and the third LED stack 43 than the second LED stack 33.

Furthermore, in the first LED stack 23 and the third LED stack 43, the second conductivity type semiconductor layers 23*b* and 43*b* may be disposed on partial regions of the first conductivity type semiconductor layer 23*a* and 43*a*, and thus, the first conductivity type semiconductor layers 23*a* and 43*a* are partially exposed. Alternatively, in the case of the second LED stack 33, the first conductivity type semiconductor layer 33*a* and the second conductivity type semiconductor layer 33*b* may be completely overlapped with each other.

The first LED stack 23 is disposed apart from the substrate 41, the second LED stack 33 is disposed below the first LED stack 23, and the third LED stack 43 is disposed below the second LED stack 33. According to an exemplary embodiment, since the first LED stack 23 emits light having a longer wavelength than that of the second and third LED stacks 33 and 43, light generated in the first LED stack 23 may be emitted to the outside through the second and third LED stacks 33 and 43 and the substrate 41. In addition, since the second LED stack 33 emits light having a longer wavelength than that of the third LED stack 43, the light generated in the second LED stack 33 may be emitted to the outside through the third LED stack 43 and the substrate 41.

The insulation layer 25 is disposed on the first LED stack 23, and has at least one opening exposing the second conductivity type semiconductor layer 23*b* of the first LED stack 23. The insulation layer 25 may have a plurality of openings distributed over on the first LED stack 23. The insulation layer 25 may be a transparent insulation layer having a refractive index lower than that of the first LED stack 23.

The first reflective electrode 26 is in ohmic contact with the second conductivity type semiconductor layer 23*b* of the first LED stack 23, and reflects light generated in the first LED stack 23 toward the substrate 41. The first reflective electrode 26 is disposed on the insulation layer 25, and is connected to the first LED stack 23 through the opening of the insulation layer 25.

The first reflective electrode 26 may include an ohmic contact layer 26*a* and a reflective layer 26*b*. The ohmic contact layer 26*a* is in partial contact with the second conductivity type semiconductor layer 23*b*, for example, a p-type semiconductor layer. The ohmic contact layer 26*a* may be formed in a limited area to prevent absorption of light by the ohmic contact layer 26*a*. The ohmic contact layers 26*a* may be formed on the second conductivity type semiconductor layer 23*b* exposed in the openings of the insulation layer 25. The ohmic contact layers 26*a* spaced apart from each other may be formed in multiple regions of the first LED stack 23 to assist current distribution in the second conductivity type semiconductor layer 23*b*. The ohmic contact layer 26*a* may be formed of a transparent conductive oxide or an Au alloy, such as Au(Zn) or Au(Be).

The reflective layer 26*b* covers the ohmic contact layer 26*a* and the insulation layer 25. The reflective layer 26*b* covers the insulation layer 25, such that an omnidirectional reflector may be formed by a stacked structure of the first LED stack 23 having a relatively high refractive index, the insulation layer 25 having a relatively low refractive index, and the reflective layer 26*b*. The reflective layer 26*b* may include a reflective metal layer such as Al, Ag, or Au. In addition, the reflective layer 26*b* may include an adhesive metal layer, such as Ti, Ta, Ni, or Cr on upper and lower surfaces of the reflective metal layer to improve adhesion of the reflective metal layer. Au is particularly suitable for the reflective layer 26*b* formed in the first LED stack 23 due to its high reflectance to red light and low reflectance to blue or green light. The reflective layer 26*b* may cover 50% or more of an area of the first LED stack 23, and in some exemplary embodiments, may cover most of the first LED stack 23 to improve light efficiency.

The ohmic contact layer 26*a* and the reflective layer 26*b* may be formed of a metal layer including Au. The reflective layer 26*b* may be formed of a metal layer having a high reflectance to light generated in the first LED stack 23, for example, red light. The reflective layer 26*b* may have a low reflectance to light generated in the second LED stack 33 and the third LED stack 43, for example, green light or blue light. Therefore, the reflective layer 26*b* may absorb light generated in the second and third LED stacks 33 and 43 and incident on the reflective layer 26*b* to reduce or prevent optical interference.

The first ohmic electrode 28 is disposed on the exposed first conductivity type semiconductor layer 23*a*, and is in ohmic contact with the first conductivity type semiconductor layer 23*a*. The first ohmic electrode 28 may also be formed of a metal layer including Au.

The protective layer 29 may protect the first reflective electrode 26 by covering the first reflective electrode 26. However, the protective layer 29 may expose the first ohmic electrode 28.

The second transparent electrode 35 is in ohmic contact with the second conductivity type semiconductor layer 33*b* of the second LED stack 33. The second transparent electrode 35 may contact a lower surface of the second LED stack 33 between the second LED stack 33 and the third LED stack 43. The second transparent electrode 35 may be formed of a metal layer or a conductive oxide layer that is transparent to red light and green light.

The third transparent electrode 45 is in ohmic contact with the second conductivity type semiconductor layer 43*b* of the third LED stack 43. The third transparent electrode 45 may be disposed between the second LED stack 33 and the third LED stack 43, and may contact the upper surface of the third LED stack 43. The third transparent electrode 45 may be formed of a metal layer or a conductive oxide layer that is transparent to red light and green light. The third transparent electrode 45 may also be transparent to blue light. The second transparent electrode 35 and the third transparent electrode 45 may be in ohmic contact with the p-type semiconductor layer of each LED stack to assist current distribution. Examples of the conductive oxide layer used for the second and third transparent electrodes 35 and 45 may include $SnO_2$, $InO_2$, ITO, ZnO, IZO, or others.

The first color filter 47 may be disposed between the third transparent electrode 45 and the second LED stack 33, and the second color filter 67 may be disposed between the second LED stack 33 and the first LED stack 23. The first color filter 47 may transmit light generated in the first and second LED stacks 23 and 33, and reflect light generated in the third LED stack 43. The second color filter 67 may transmit light generated in the first LED stack 23, and reflect light generated in the second LED stack 33. Therefore, light generated in the first LED stack 23 may be emitted to the outside through the second LED stack 33 and the third LED stack 43, and the light generated in the second LED stack 33 may be emitted to the outside through the third LED stack 43. Furthermore, light generated in the second LED stack 33 may be prevented from being lost by being incident on the first LED stack 23, or light generated in the third LED stack 43 may be prevented from being lost by being incident on the second LED stack 33.

In some exemplary embodiments, the second color filter 67 may reflect the light generated in the third LED stack 43.

The first and second color filters 47 and 67 may be, for example, a low pass filter that passes only a low frequency range, that is, a long wavelength band, a band pass filter that passes only a predetermined wavelength band, or a band stop filter that blocks only a predetermined wavelength band. In particular, the first and second color filters 47 and 67 may be formed by alternately stacking insulation layers having refractive indices different from each other, for example, may be formed by alternately stacking $TiO_2$ and $SiO_2$ insulation layers. In particular, the first and second color filters 47 and 67 may include a distributed Bragg reflector (DBR). A stop band of the distributed Bragg reflector may be controlled by adjusting thicknesses of $TiO_2$ and $SiO_2$. The low pass filter and the band pass filter may also be formed by alternately stacking insulation layers having refractive indices different from each other.

The 2-1-th current distributing layer 36 may be disposed on a lower surface of the second transparent electrode 35. The 2-1-th current distributing layer 36 may be electrically connected to the second conductivity type semiconductor layer 33*b* of the second LED stack 33 through the second transparent electrode 35.

The 2-2-th current distributing layer 38 may be disposed on the second color filter 67, penetrate through the second color filter 67, and be electrically connected to the first conductivity type semiconductor layer 33*a* of the second LED stack 33. The second color filter 67 may have an opening exposing the second LED stack 33, and the 2-2-th current distributing layer 38 may be connected to the second LED stack 33 through the opening of the second color filter 67.

The third current distributing layer 46 may be disposed on the first color filter 47, penetrate through the first color filter 47, and be connected to the second conductivity type semiconductor layer 43*b* of the third LED stack 43. The first color filter 47 may have an opening exposing the third LED stack 43, and the third current distributing layer 46 may be connected to the third LED stack 43 through the opening of the first color filter 47.

The current distributing layers 36, 38, and 46 may be formed of a metal layer to assist current distribution. For example, the 2-1-th current distributing layer 36 may include a pad region 36*a* and an extending portion 36*b* extending from the pad region 36*a* (see FIG. 4A). The 2-2-th current distributing layer 38 includes a pad region 38*a* and an extending portion 38*b* extending from the pad region 38*a*, and the third current distributing layer 46 includes a pad region 46*a* and an extending portion 46*b* extending from the pad region 46*a*. The pad regions 36*a*, 38*a*, and 46*a* are regions to which the electrode pads 81*d* and 81*b* may be connected, and the extending portions 36*b*, 38*b*, and 46*b* may assist current distribution. The extending portions 36*b*, 38*b*, and 46*b* may be formed in various shapes so that a current may be uniformly distributed in the second and third stacks 33 and 43.

The planarization layer 39 covers the 2-1-th current distributing layer 36 below the second LED stack 33, and provides a flat surface. The planarization layer 39 may be formed of a transparent layer, and may be formed of $SiO_2$, spin on glass (SOG), or the like.

The first bonding layer 49 couples the second LED stack 33 to the third LED stack 43. The first bonding layer 49 covers the first color filter 47, and is bonded to the planarization layer 39. The planarization layer 39 may also be used as a bonding layer. For example, the first bonding layer 49 and the planarization layer 39 may be a transparent organic layer or a transparent inorganic layer, and be bonded to each other. Examples of the organic layer may include SUB, poly(methylmethacrylate) (PMMA), polyimide, parylene, benzocyclobutene (BCB), or others, and examples of the inorganic layer include $Al_2O_3$, $SiO_2$, $SiN_x$, or the like. The organic layers may be bonded at a high vacuum and a high pressure, and the inorganic layers may be bonded under a high vacuum when the surface energy is lowered by using plasma or the like, after flattening surfaces by, for example, a chemical mechanical polishing process.

The second bonding layer 69 couples the second LED stack 33 to the first LED stack 23. As illustrated in the drawing, the second bonding layer 69 may cover the second color filter 67 and the 2-2-th current distributing layer 38. The second bonding layer 69 may be in contact with the first LED stack 23, but is not limited thereto. In some exemplary embodiments, another planarization layer may be disposed on a lower surface of the first LED stack 23, and the second bonding layer 69 may be bonded to the another planarization layer. The second bonding layer 69 and the another planarization layer may be formed of the same material as that of the first bonding layer 49 and the planarization layer 39 described above.

The upper insulation layer 71 covers side surfaces and upper regions of the first, second, and third LED stacks 23, 33, and 43. The upper insulation layer 71 may be formed of $SiO_2$, $Si_3N_4$, SOG, or others. In some exemplary embodiments, the upper insulation layer 71 may include a light reflecting material or a light blocking material to prevent optical interference with an adjacent light emitting device. For example, the upper insulation layer 71 may include a distributed Bragg reflector that reflects red light, green light, and blue light, or an $SiO_2$ layer with a reflective metal layer or a highly reflective organic layer deposited thereon. Alternatively, the upper insulation layer 71 may include a black epoxy, as the light blocking material, for example. A light blocking material may prevent optical interference between light emitting devices and increase a contrast of an image.

The upper insulation layer 71 has openings exposing the first ohmic electrode 28, the first reflective electrode 26, the third ohmic electrode 48, the 2-1-th current distributing layer 36, the 2-2-th current distributing layer 38, and the third current distributing layer 46.

The electrode pads 81*a*, 81*b*, 81*c*, and 81*d* are disposed above the first LED stack 23, and are electrically connected to the first, second, and third LED stacks 23, 33, and 43. The electrode pads 81*a*, 81*b*, 81*c*, and 81*d* are disposed on the upper insulation layer 71, and may be connected to the first ohmic electrode 28, the first reflective electrode 26, the third ohmic electrode 48, the 2-1-th current distributing layer 36, the 2-2-th current distributing layer 38, and the third current distributing layer 46 exposed through the openings of the upper insulation layer 71.

For example, the first electrode pad 81*a* may be connected to the first ohmic electrode 28 through the opening of the upper insulation layer 71. The first electrode pad 81*a* may be electrically connected to the first conductivity type semiconductor layer 23*a* of the first LED stack 23.

The second electrode pad 81*b* may be connected to the 2-2-th current distributing layer 38 through the opening of the upper insulation layer 71. The second electrode pad 81*b* may be electrically connected to the first conductivity type semiconductor layer 33*a* of the second LED stack 33.

The third electrode pad 81*c* may be connected to the third ohmic electrode 48 through the opening of the upper insulation layer 71, and may be electrically connected to the first conductivity type semiconductor layer 43*a* of the third LED stack 43.

The common electrode pad 81*d* may be connected in common to the 2-1-th current distributing layer 36, the third current distributing layer 46, and the first reflective electrode 26 through the openings. The common electrode pad 81*d* may be electrically connected in common to the second conductivity type semiconductor layer 23*b* of the first LED stack 23, the second conductivity type semiconductor layer 33*b* of the second LED stack 33, and the second conductivity type semiconductor layer 43*b* of the third LED stack 43.

As illustrated in FIG. 2, the common electrode pad 81*d* may be connected to an upper surface of the third current distributing layer 46 and an upper surface of the 2-1-th current distributing layer 36. As such, the 2-1-th current distributing layer 36 may have substantially an annular shape, and the common electrode pad 81*d* may be connected to the third current distributing layer 46 through a central region of the 2-1-th current distributing layer 36.

According to the illustrated exemplary embodiment, the first LED stack 23 is electrically connected to the electrode pads 81*d* and 81*a*, the second LED stack 33 is electrically connected to the electrode pads 81*d* and 81*b*, and the third LED stack 43 is electrically connected to the electrode pads 81*d* and 81*c*. As such, anodes of the first LED stack 23, the second LED stack 33, and the third LED stack 43 are electrically connected in common to the common electrode pad 81*d*, and cathodes of the first LED stack 23, the second LED stack 33, and the third LED stack 43 are electrically connected to the first, second, and third electrode pads 81*a*, 81*b*, and 81*c*, respectively. In this manner, the first, second, and third LED stacks 23, 33, and 43 may be independently driven.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, and 13B are schematic plan views and cross-sectional views illustrating a method of manufacturing a light emitting device 100 according to an exemplary embodiment. In the drawings, each plan view is illustrated corresponding to a plan view of FIG. 1, and each cross-sectional view (except FIG. 4B) is taken along line A-A of corresponding plan view. FIG. 4B is a cross-sectional view taken along line B-B of FIG. 4A.

Figure 3A:
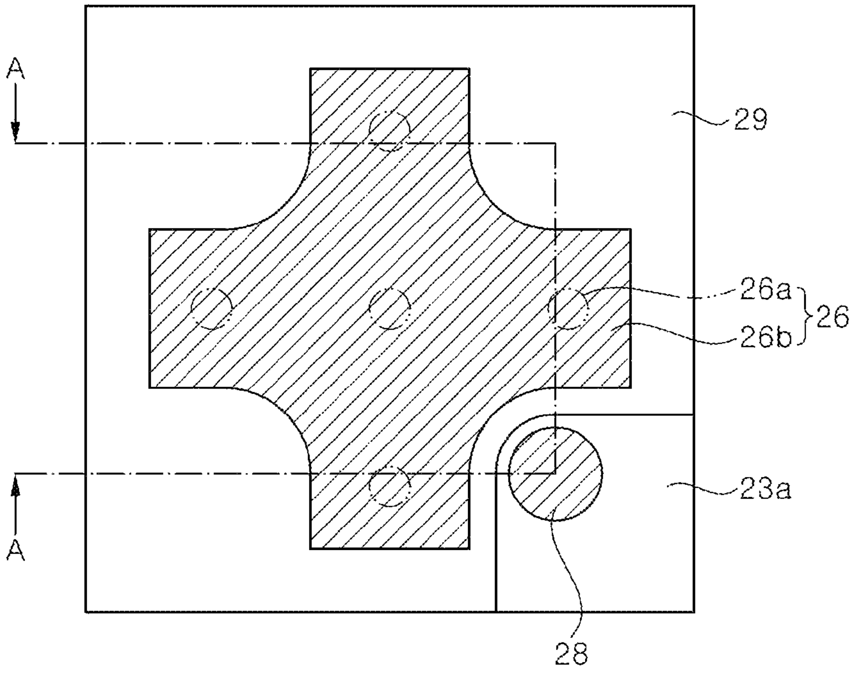
FIGS. 3A, 3B, 4A, 4B, 5A, 5B, 6A, 6B, 7A, 7B, 8A, 8B, 9A, 9B, 10A, 10B, 11A, 11B, 12A, 12B, 13A, and 13B are schematic plan views and cross-sectional views illustrating a method of manufacturing a light emitting device according to an exemplary embodiment.
Figure 3B:
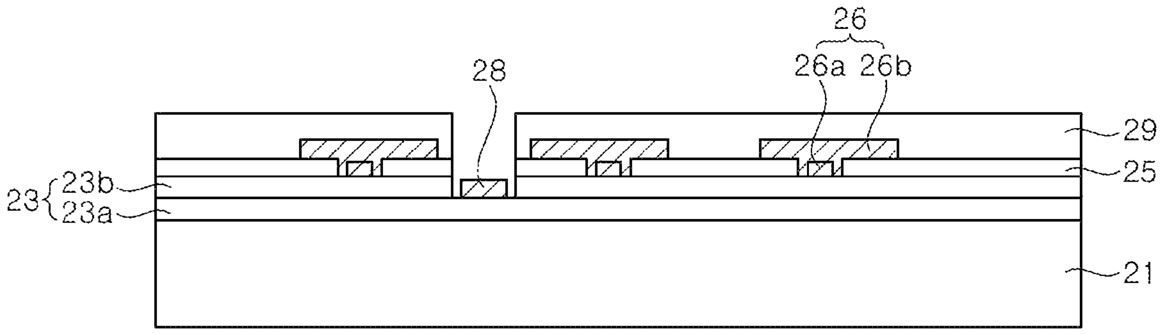

Referring to FIGS. 3A and 3B, the first LED stack 23 is grown on a first substrate 21. The first substrate 21 may be, for example, a GaAs substrate. The first LED stack may be formed of AlGaInP based semiconductor layers, and includes the first conductivity type semiconductor layer 23*a*, the active layer, and the second conductivity type semiconductor layer 23*b*. The first conductivity type may be an n-type and the second conductivity type may be a p-type.

The insulation layer 25 is formed on the first LED stack 23, and openings may be formed thereon by patterning the insulation layer 25. For example, $SiO_2$ is formed on the first LED stack 23, a photoresist is applied to $SiO_2$, and a photoresist pattern is then formed using photolithography and development. Then, $SiO_2$ may be patterned using the photoresist pattern as an etching mask to form the insulation layer 25 having the openings.

Then, the ohmic contact layer 26*a* is formed in the openings of the insulation layer 25. The ohmic contact layer 26*a* may be formed by a lift-off technology or the like. After the ohmic contact layer 26*a* is formed, the reflective layer 26*b* covering the ohmic contact layer 26*a* and the insulation layer 25 is formed. The reflective layer 26*b* may be formed of, for example, Au, and may be formed using a lift-off technique or the like. The first reflective electrode 26 may be formed by the ohmic contact layer 26*a* and the reflective layer 26*b*.

The first reflective electrode 26 may have a shape in which four corner portions are removed from one rectangular light emitting device region, as illustrated in the drawing. The ohmic contact layers 26*a* may be widely distributed at a lower portion of the first reflective electrode 26. While FIGS. 3A and 3B show one light emitting device region, a plurality of light emitting device regions may be provided on the first substrate 21, and the first reflective electrode 26 may be formed in each light emitting device region.

The protective layer 29 may cover the first reflective electrode 26. The protective layer 29 may protect the first reflective electrode 26 from an external environment. The protective layer 29 may be formed of, for example, $SiO_2$, $Si_3N_4$, SOG, or others.

Then, the protective layer 29 and the second conductivity type semiconductor layer 23*b* may be etched to expose the first conductivity type semiconductor layer 23*a*, and the first ohmic electrode 28 is formed on the exposed first conductivity type semiconductor layer 23*a*. The first ohmic electrode 28 is in ohmic contact with the first conductivity type semiconductor layer 23*a*.

Figure 4A:
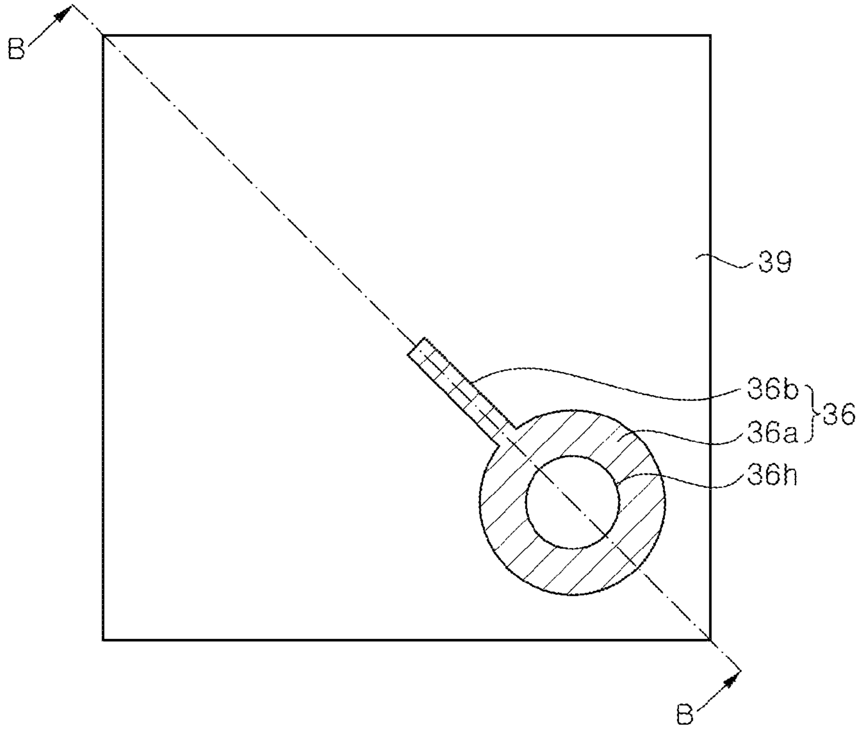
Figure 4B:
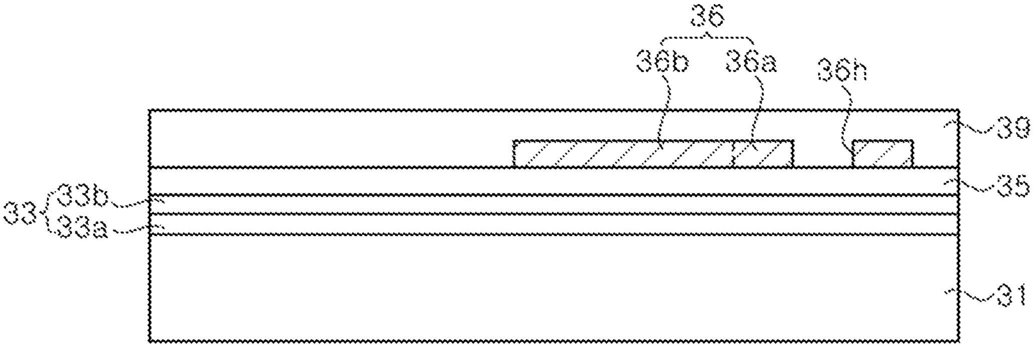

Referring to FIGS. 4A and 4B, the second LED stack 33 is grown on a second substrate 31, and the second transparent electrode 35 is formed on the second LED stack 33. The second LED stack 33 may be formed of gallium nitride based semiconductor layers, and may include the first conductivity type semiconductor layer 33*a*, the active layer, and the second conductivity type semiconductor layer 33*b*. The active layer may include a GaInN well layer. The first conductivity type may be an n-type and the second conductivity type may be a p-type.

The second substrate 31 is a substrate on which a gallium nitride based semiconductor layer may be grown, and may be different from the first substrate 21. A composition ratio of the GaInN well layer may be determined such that the second LED stack 33 may emit green light, for example. The second transparent electrode 35 is in ohmic contact with the second conductivity type semiconductor layer 33*b*.

The 2-1-th current distributing layer 36 is formed on the second transparent electrode 35. The 2-1-th current distributing layer 36 may be formed of a metal layer. The 2-1-th current distributing layer 36 may include the pad region 36*a* and the extending portion 36*b*. The pad region 36*a* may have an opening 36*h* having substantially an annular shape and exposing the second transparent electrode 35. The extending portion 36*b* extends from the pad region 36*a*, and may extend substantially in a diagonal direction as illustrated in the drawing, but is not limited thereto. The extending portion 36*b* may have various shapes. Although FIGS. 4A and 4B show one light emitting device region, a plurality of light emitting device regions may be provided on the second substrate 31, and the 2-1-th current distributing layer 36 may be formed in each light emitting device region.

The planarization layer 39 covering the 2-1-th current distributing layer 36 and the second transparent electrode 35 is formed. The planarization layer 39 provides a flat surface on the 2-1-th current distributing layer 36. The planarization layer 39 may be formed of a light-transmissive SOG, or the like, and the planarization layer 39 may be used as a bonding layer.

Figure 5A:
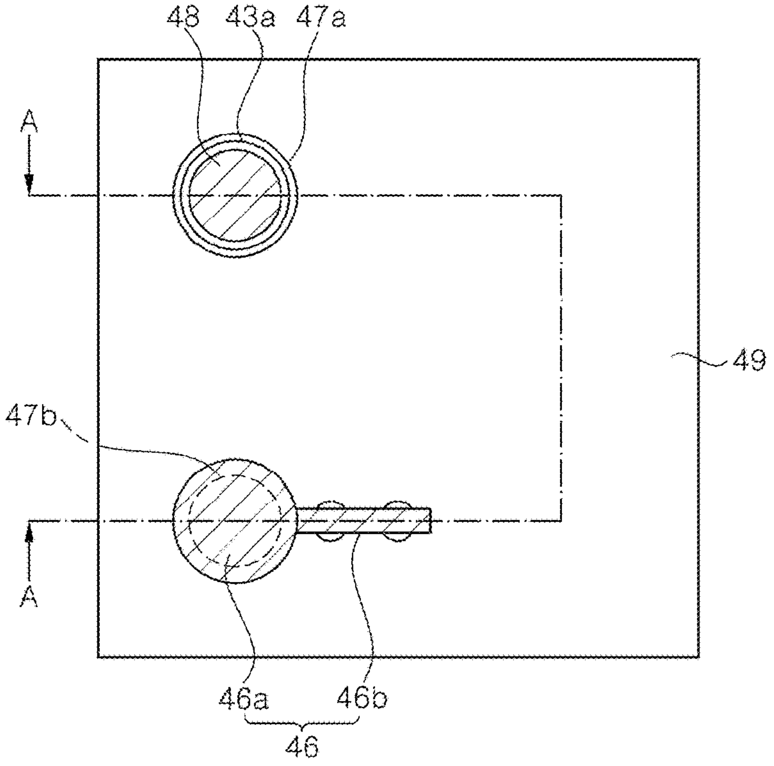
Figure 5B:
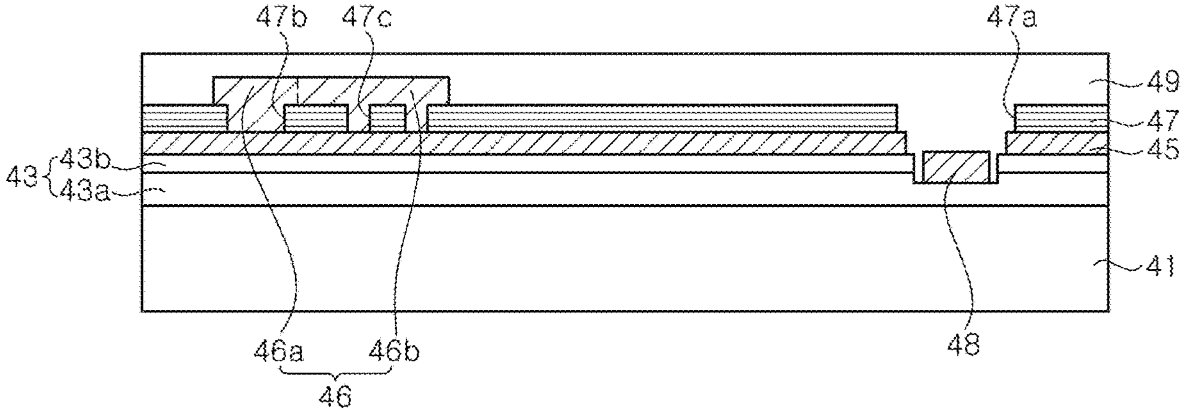

Referring to FIGS. 5A and 5B, the third LED stack 43 is grown on a third substrate 41, and the third transparent electrode 45 and the first color filter 47 are formed on the third LED stack 43. The third LED stack 43 may be formed of gallium nitride based semiconductor layers, and may include the first conductivity type semiconductor layer 43*a*, the active layer, and the second conductivity type semiconductor layer 43*b*. The active layer may also include a GaInN well layer.

The first conductivity type may be an n-type and the second conductivity type may be a p-type. The third substrate 41 is a substrate on which a gallium nitride based semiconductor layer may be grown, and may be different from the first substrate 21. A composition ratio of GaInN may be determined such that the third LED stack 43 emits blue light, for example. The third transparent electrode 45 is in ohmic contact with the second conductivity type semiconductor layer 43*b*.

Since the first color filter 47 is substantially the same as that described with reference to FIGS. 2A and 2B, detailed descriptions thereof will be omitted to avoid redundancy.

The first color filter 47 may be patterned to form openings 47*a*, 47*b*, and 47*c* exposing the third transparent electrode 45. In addition, the third transparent electrode 45 and the second conductivity type semiconductor layer 43*b* exposed in the opening 47*a* may be sequentially patterned to expose the first conductivity type semiconductor layer 43*a*.

The third ohmic electrode 48 is formed on the exposed first conductivity type semiconductor layer 43*a*, and the third current distributing layer 46 is formed. The third current distributing layer 46 is in contact with the third transparent electrode 45 through the openings 47*b* and 47*c*. The third current distributing layer 46 may include the pad region 46*a* and the extending portion 46*b*. The pad region 46*a* may be in contact with the third transparent electrode 45 through the opening 47*b*, and the extending portion 46*b* may be in contact with the third transparent electrode 45 through the opening 47*c*. The third current distributing layer 46 and the third ohmic electrode 48 may include the same material, such as metal.

The planarization layer or the first bonding layer 49 is formed on the third current distributing layer 46 and the third ohmic electrode 48. The first bonding layer 49 may be formed of light-transmissive SOG.

Figure 6A:
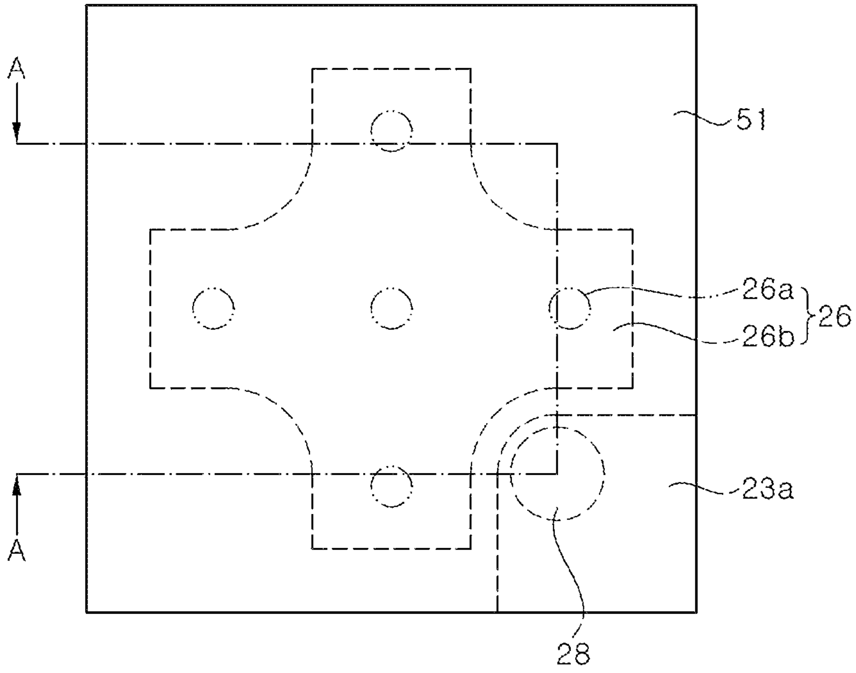
Figure 6B:
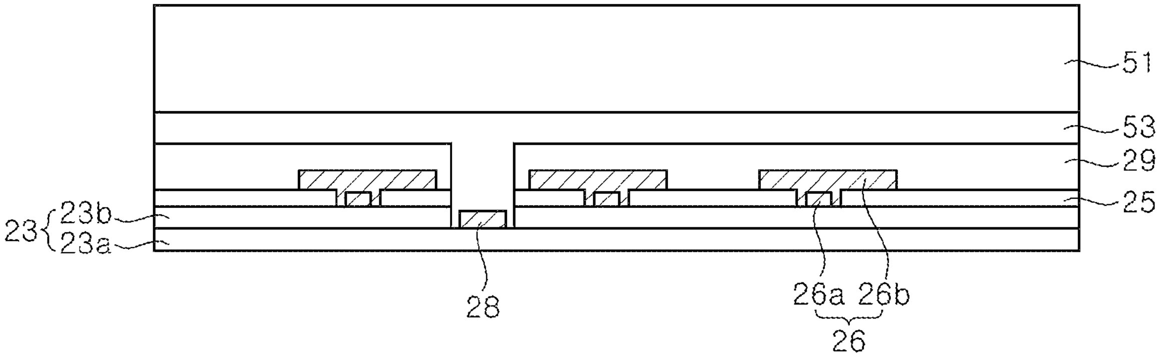

Referring to FIGS. 6A and 6B, the first LED stack 23 of FIGS. 3A and 3B is bonded onto a carrier substrate 51. The first LED stack 23 may be bonded to the carrier substrate 51 through an adhesive layer 53. In particular, the protective layer 29 may be disposed to face the carrier substrate 51. Then, the first substrate 21 is removed from the first LED stack 23. As such, the first conductivity type semiconductor layer 23*a* is exposed. In order to improve light extraction efficiency, a surface of the exposed first conductivity type semiconductor layer 23*a* may be textured.

Hereinafter, processes of manufacturing a light emitting device by coupling the first, second, and third LED stacks 23, 33, and 43 manufactured by the above processes to each other, and patterning the first, second, and third LED stacks 23, 33, and 43 will be described.

Figure 7A:
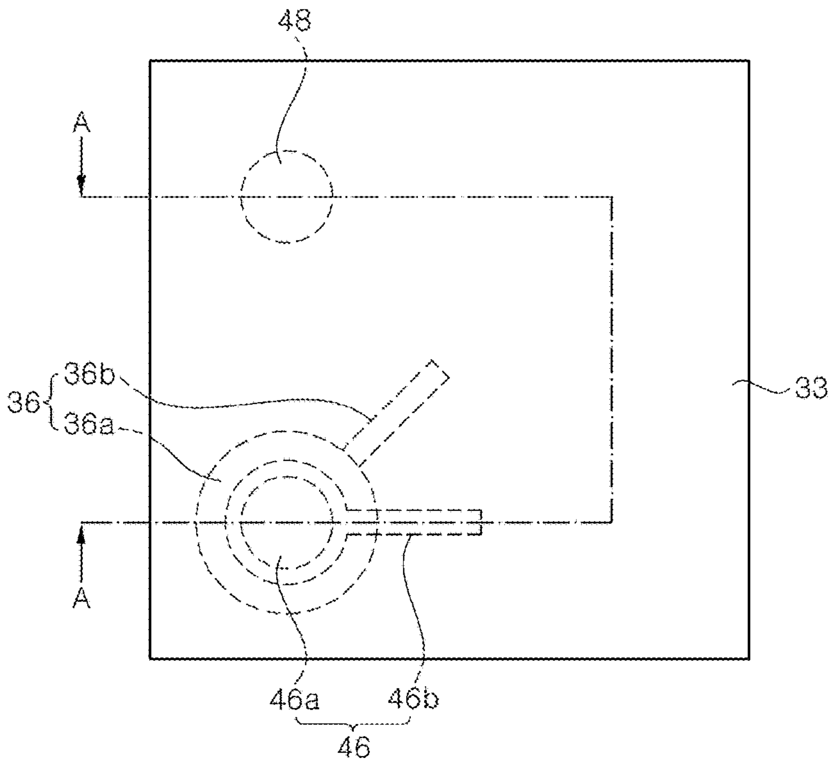
Figure 7B:
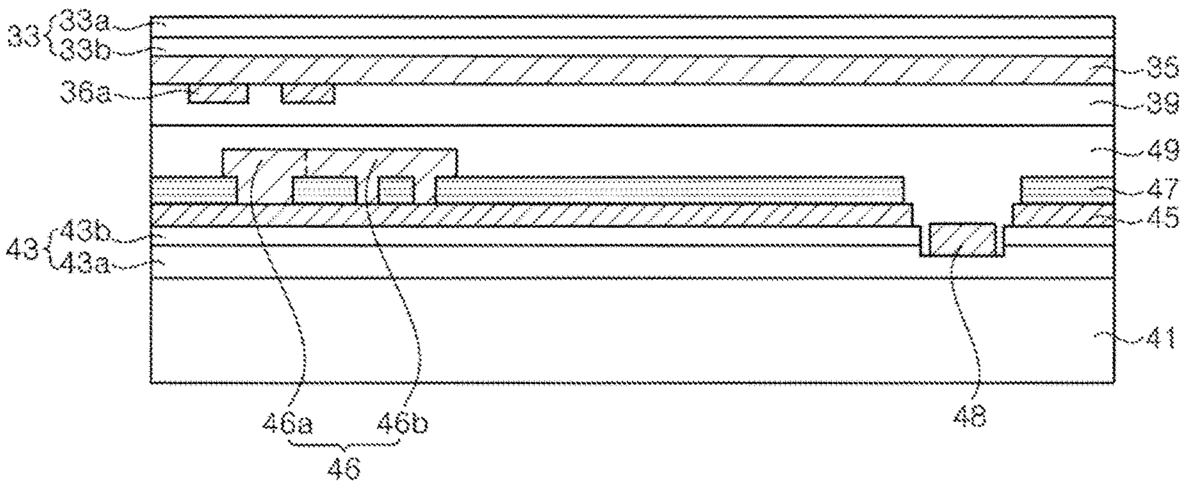

Referring to FIGS. 7A and 7B, the second LED stack 33 of FIGS. 4A and 4B is bonded onto the third LED stack 43 of FIGS. 5A and 5B.

The first bonding layer 49 and the planarization layer 39 are disposed to face each other to align the third current distributing layer 46 and the 2-1-th current distributing layer 36. In particular, a central portion of the pad region 36*a* of the 2-1-th current distributing layer 36 is aligned above the pad region 46*a* of the third current distributing layer 46.

Then, the second substrate 31 is removed from the second LED stack 33 by a technique, such as a laser lift-off, a chemical lift-off, or others. As such, the first conductivity type semiconductor layer 33*a* of the second LED stack 33 is exposed from the above. In some exemplary embodiments, a surface of the exposed first conductivity type semiconductor layer 33*a* may be textured.

Figure 8A:
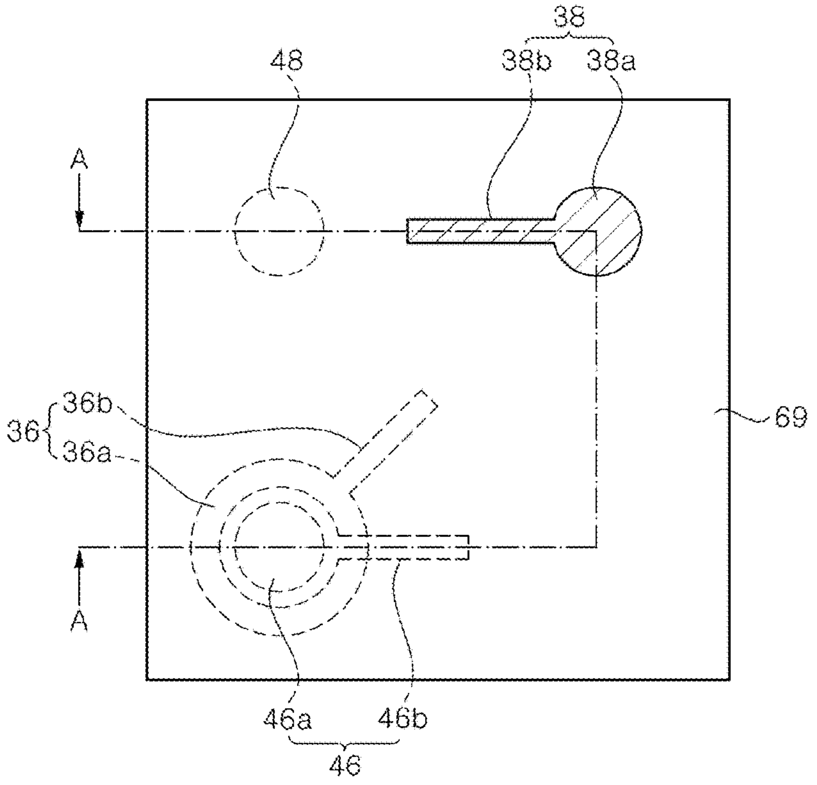
Figure 8B:
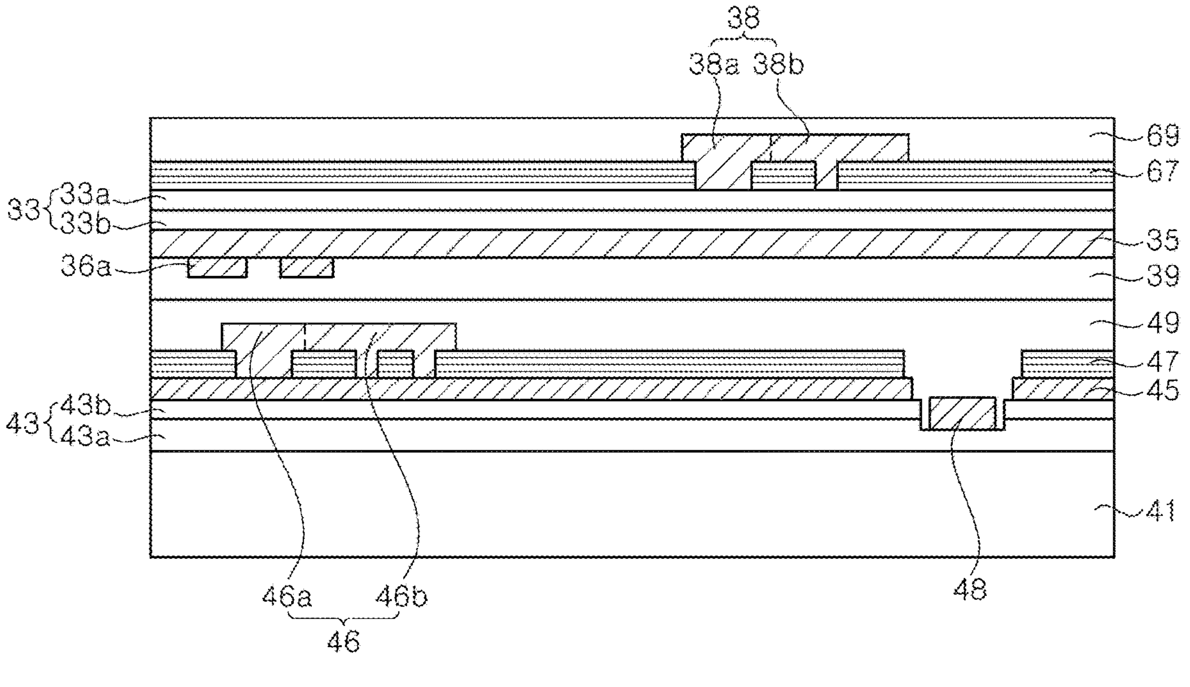

Referring to FIGS. 8A and 8B, the second color filter 67 is formed on the exposed first conductivity type semiconductor layer 33*a*. Since the second color filter 67 is substantially the same as that described with reference to FIGS. 2A and 2B, detailed descriptions thereof will be omitted to avoid redundancy.

Then, the second color filter 67 may be patterned to form openings exposing the second LED stack 33, and the 2-2-th current distributing layer 38 is formed on the second color filter 67. The 2-2-th current distributing layer 38 is formed to correspond to each light emitting device region, and includes the pad region 38*a* and the extending portion 38*b* extending from the pad region 38*a*. A specific shape of the extending portion 38*b* is not particularly limited, and may have various shapes for current distribution in the second LED stack 33.

Then, the second bonding layer 69 covers the 2-2-th current distributing layer 38 and the second color filter 67. The second bonding layer 69 may be light-transmissive organic layer or inorganic layer. As such, a flat surface may be provided on an upper surface of the second LED stack 33.

Figure 9A:
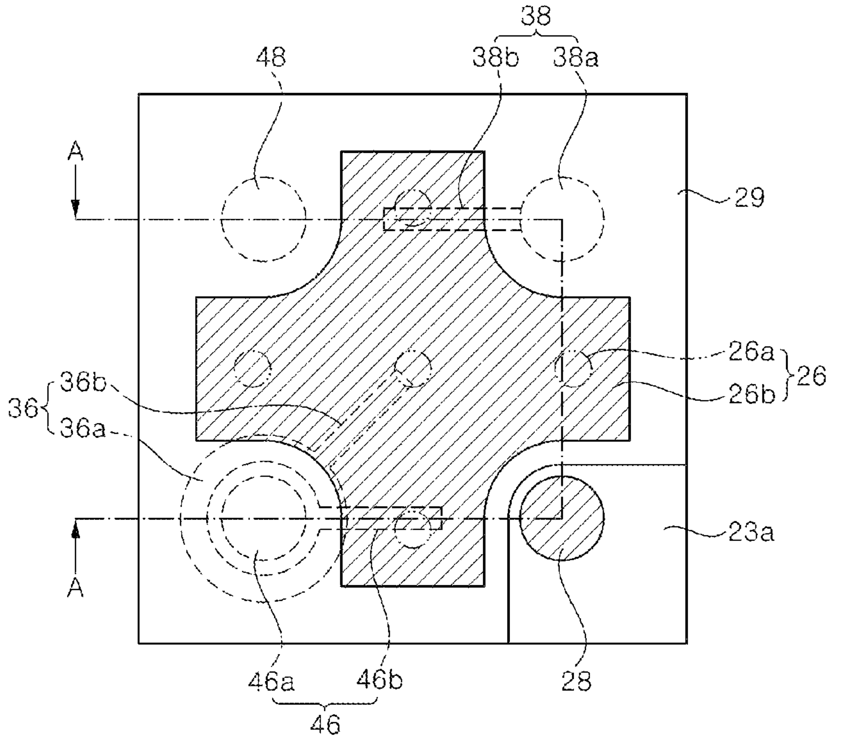
Figure 9B:
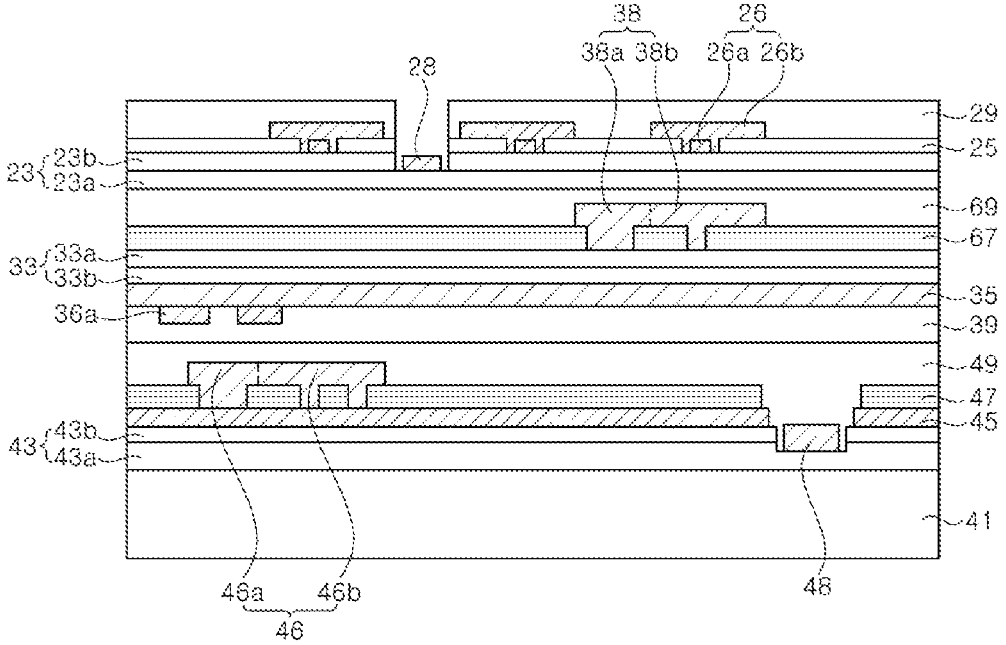

Then, referring to FIGS. 9A and 9B, the first LED stack 23 of FIGS. 6A and 6B is bonded onto the second LED stack 33. The exposed first conductivity type semiconductor layer 23*a* of the first LED stack 23 may be bonded to the second bonding layer 69. Alternatively, another planarization layer may be additionally formed on the first conductivity type semiconductor layer 23*a*, and the another planarization layer and the second bonding layer 69 may be bonded to each other.

Then, the carrier substrate 51 and the adhesive layer 53 are removed. As such, the protective layer 29 and the first ohmic electrode 28 may be exposed.

Figure 10A:
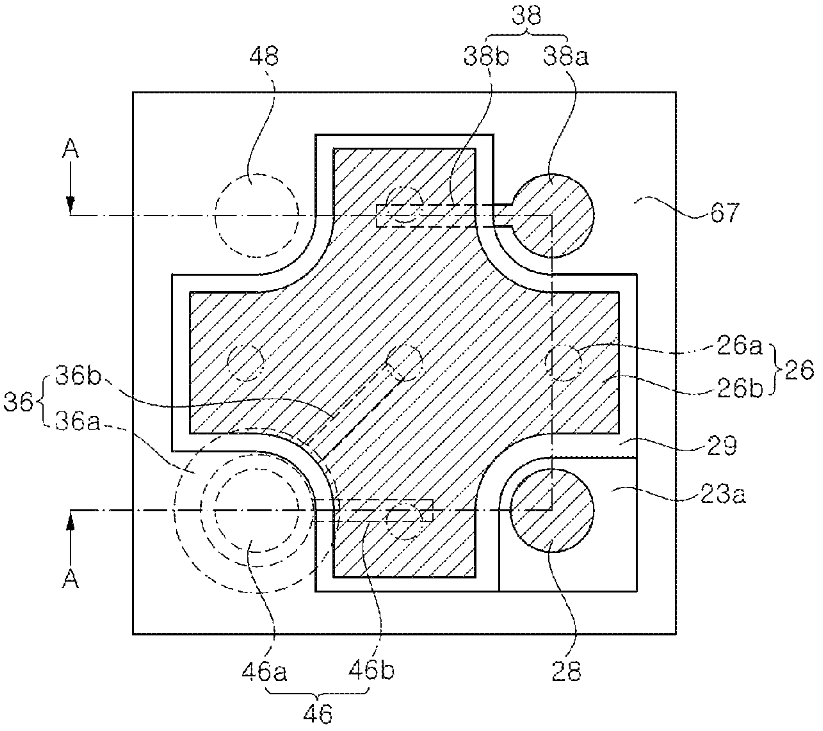
Figure 10B:
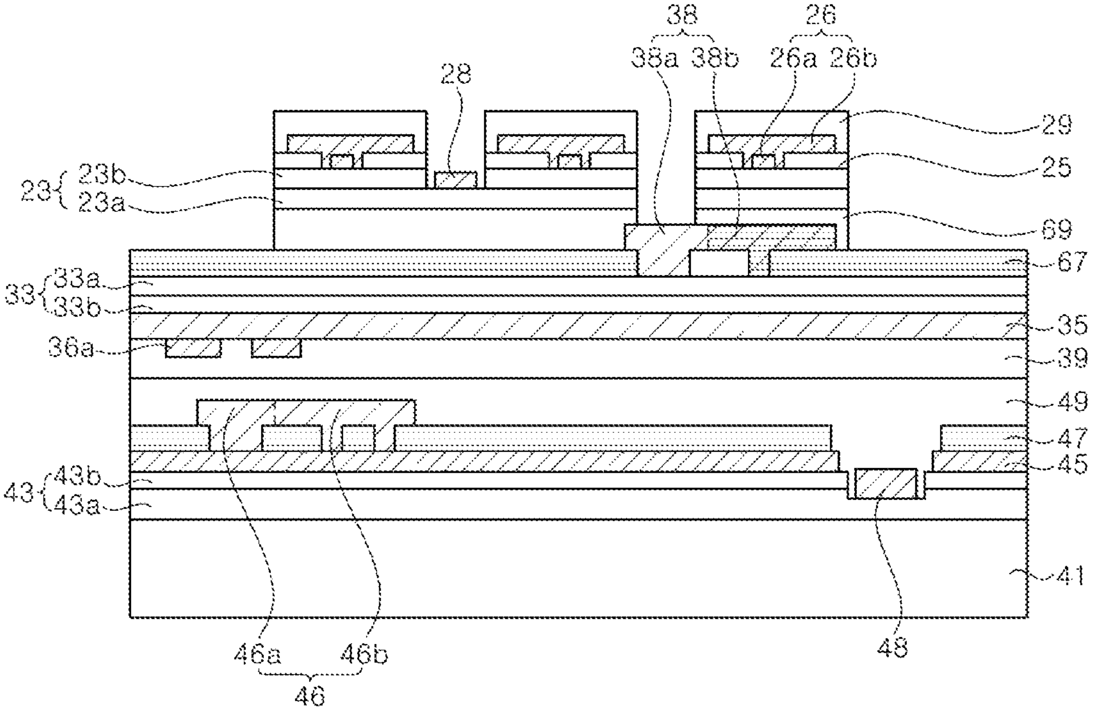

Referring to FIGS. 10A and 10B, the protective layer 29 and the insulation layer 25 may be patterned, such that the first LED stack 23 is exposed around the first reflective electrode 26, and the first LED stack 23 and the second bonding layer 69 may then be sequentially patterned, such that the 2-2-th current distributing layer 38 is exposed. In addition, the second color filter 67 may be exposed around the first reflective electrode 26. The pad region 38*a* and the extending portion 36*b* of the 2-2-th current distributing layer 38 may be partially exposed.

Meanwhile, a portion of the first conductivity type semiconductor layer 23*a*, on which the first ohmic electrode 28 is disposed at one corner portion of the light emitting device region, may be remained.

Figure 11A:
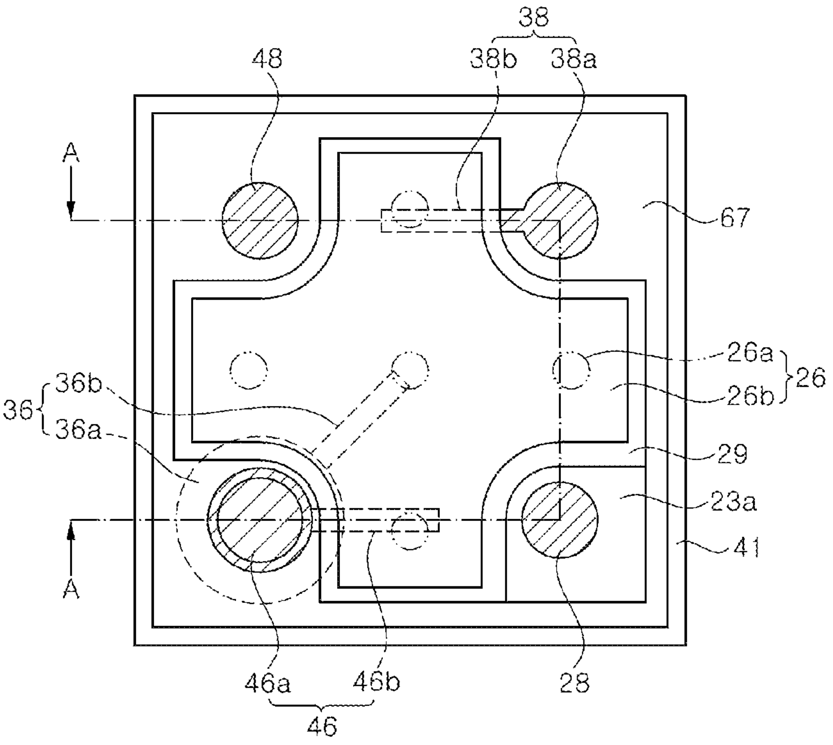
Figure 11B:
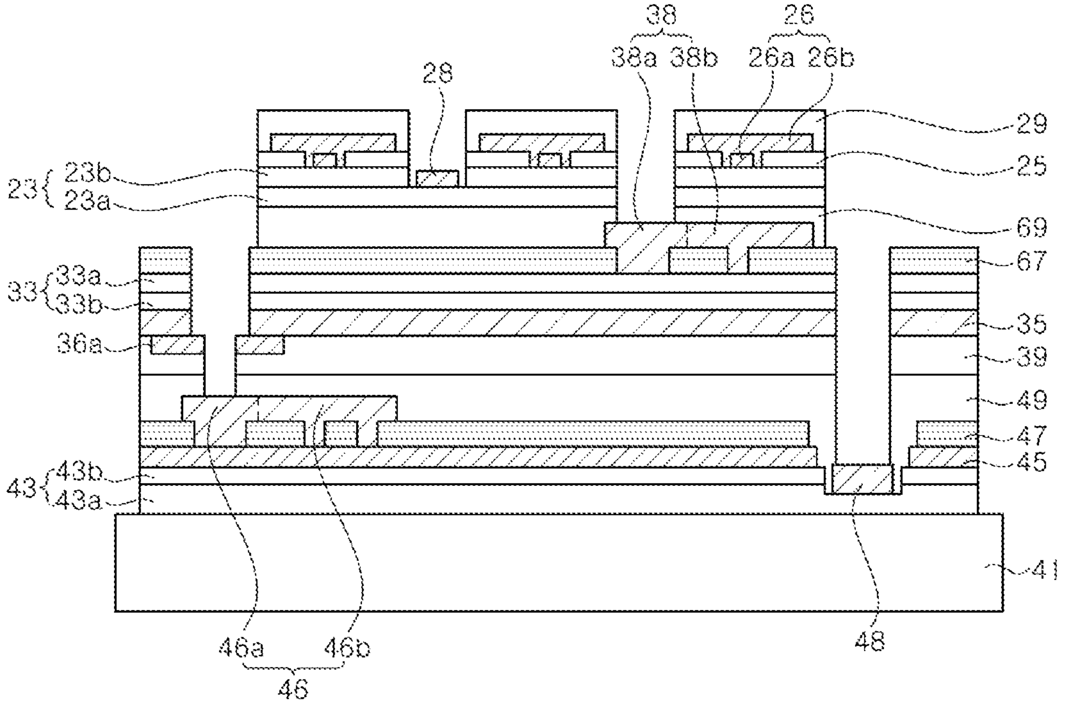

Referring to FIGS. 11A and 11B, the second color filter 67, the second LED stack 33, the second transparent electrode 35, the planarization layer 39, the first bonding layer 49 may be sequentially patterned, such that the third current distributing layer 46 and the third ohmic electrode 48 are exposed. In addition, the pad region 36*a* of the 2-1-th current distributing layer 36 is exposed, and a through-hole penetrating through a central portion of the pad region 36*a* is formed.

Through-holes exposing the third current distributing layer 46 and the third ohmic electrode 48 may be formed. The second color filter 67, the second LED stack 33, the second transparent electrode 35, the planarization layer 39, and the first bonding layer 49 are sequentially removed in edge portions of the light emitting device regions, and the third transparent electrode 45 and the third LED stack 43 are removed, such that an upper surface of the substrate 41 may be exposed. The exposed region of the substrate 41 may be a dicing region for dicing the substrate 41 into multiple the light emitting devices.

Although the third current distributing layer 46 and the third ohmic electrode 48 are described as being exposed through the through-holes, in some exemplary embodiments, the second color filter 67, the second LED stack 33, the second transparent electrode 35, the planarization layer 39, and the first bonding layer 49 disposed around the first reflective electrode 26 may be sequentially removed, and the third current distributing layer 46 and the third ohmic electrode 48 may thus be disposed adjacent to a side surface of the second LED stack 33.

Figure 12A:
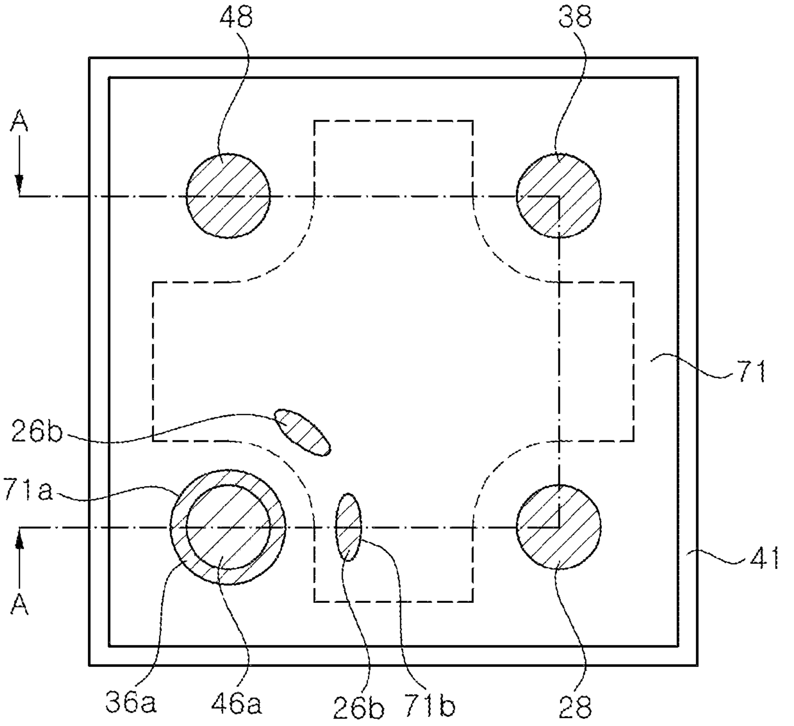
Figure 12B:
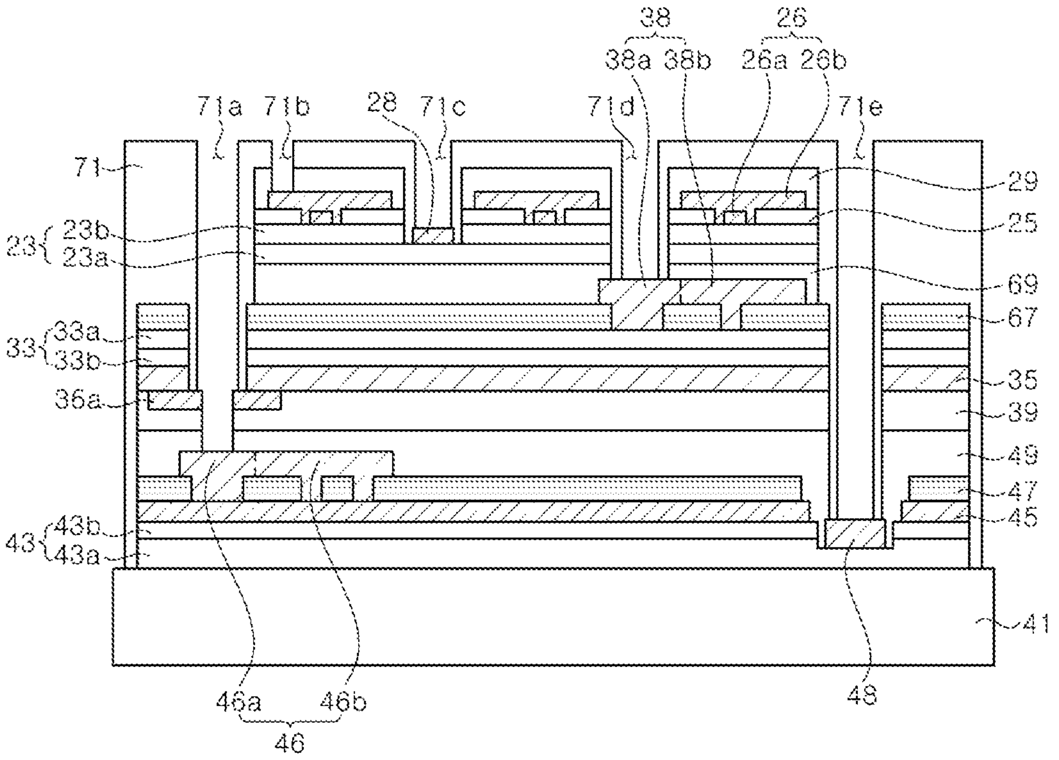

Referring to FIGS. 12A and 12B, the upper insulation layer 71 is formed to cover the side surfaces and the upper regions of the first, second, and third LED stacks 23, 33, and 43. The upper insulation layer 71 may be formed of a single layer or multiple layers of $SiO_2$, $Si_3N_4$, SOG, or others. Alternatively, the upper insulation layer 71 may include a distributed Bragg reflector formed by alternately depositing $SiO_2$ and $TiO_2$.

Then, the upper insulation layer 71 is patterned using photolithography and etching techniques to form openings 71*a*, 71*b*, 71*c*, 71*d*, and 71*e*. The opening 71*a* exposes the third current distributing layer 46 and the 2-1-th current distributing layer 36. The opening 71*b* exposes the first reflective electrode 26. The opening 71*a* and the opening 71*b* may be disposed adjacent to each other. In addition, the first reflective electrode 26 may be exposed by a plurality of openings 71*a*, 71*b*, 71*c*, 71*d*, and 71*e*.

The opening 71*c* exposes the first ohmic electrode 28, the opening 71*d* exposes the 2-2-th current distributing layer 38, and the opening 71*e* exposes the third ohmic electrode 48.

The upper insulation layer 71 may be removed at an edge of the light emitting device region. As such, the upper surface of the substrate 41 may be exposed in the dicing region.

Figure 13A:
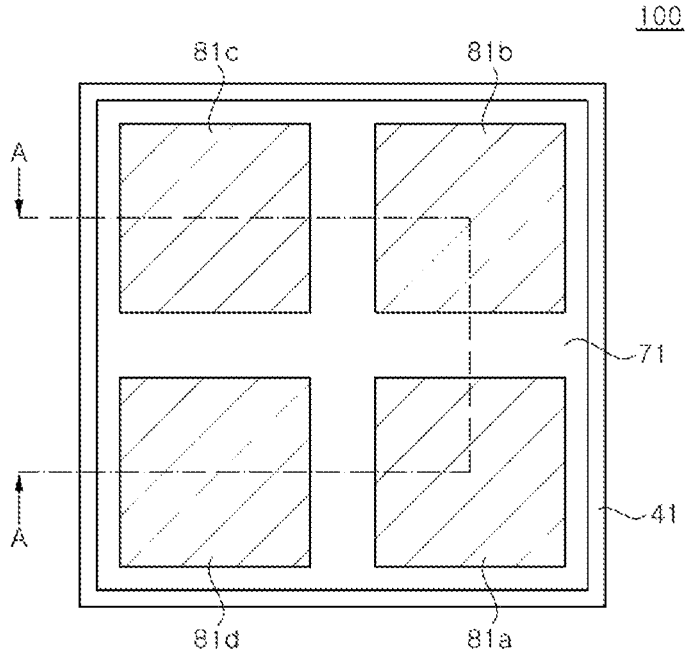
Figure 13B:
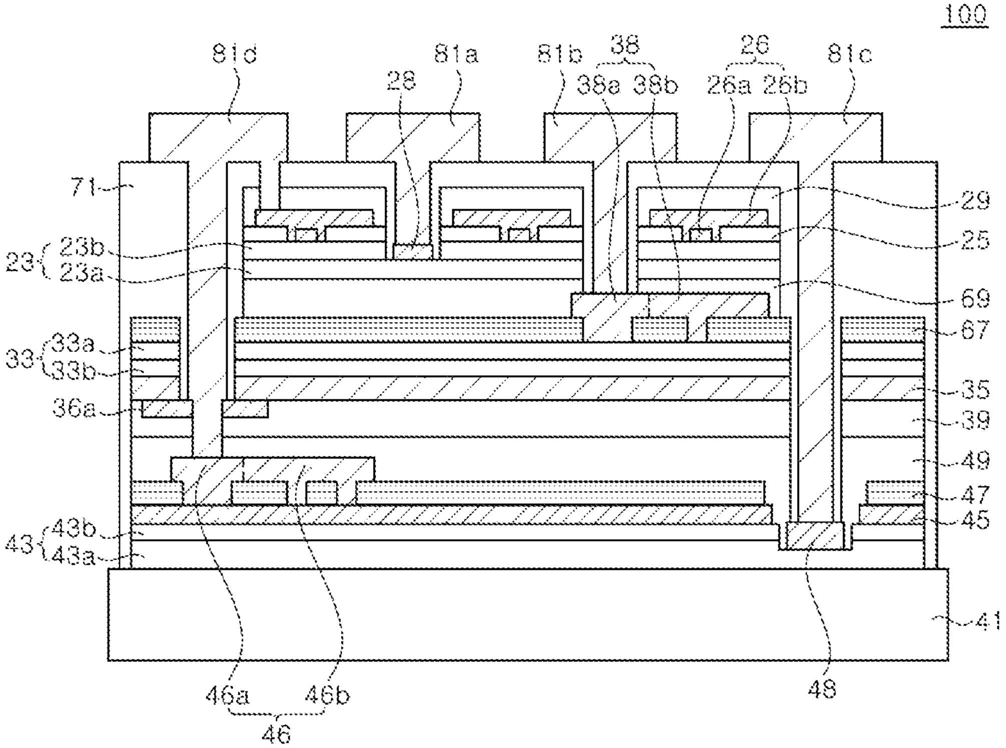

Referring to FIGS. 13A and 13B, the electrode pads 81*a*, 81*b*, 81*c*, and 81*d* are formed on the upper insulation layer 71. The electrode pads 81*a*, 81*b*, 81*c*, and 81*d* include the first electrode pad 81*a*, the second electrode pad 81*b*, the third electrode pad 81*c*, and the common electrode pad 81*d*.

The common electrode pad 81*d* is connected to the 2-1-th current distributing layer 36 and the third current distributing layer 46 through the opening 71*a*, and is connected to the first reflective electrode 26 through the opening 71*b*. As such, the common electrode pad 81*d* is electrically connected in common in the anodes of the first, second, and third LED stacks 23, 33, and 43.

The first electrode pad 81*a* is connected to the first ohmic electrode 28 through the opening 71*c*, to be electrically connected to the cathode of the first LED stack 23, e.g., the first conductivity type semiconductor layer 23*a*. The second electrode pad 81*b* is connected to the 2-2-th current distributing layer 38 through the opening 71*d* to be electrically connected to the cathode of the second LED stack 33, e.g., the first conductivity type semiconductor layer 33*a*, and the third electrode pad 81*c* is connected to the third ohmic electrode 48 through the opening 71*e* to be electrically connected to the cathode of the third LED stack 43, e.g., the first conductivity type semiconductor layer 43*a*.

The electrode pads 81*a*, 81*b*, 81*c*, and 81*d* are electrically separated from each other, such that each of the first, second, and third LED stacks 23, 33, and 43 is electrically connected to two electrode pads to be independently driven.

Then, the light emitting device 100 may be formed by dividing the substrate 41 into multiple light emitting device regions. As illustrated in FIG. 13A, the electrode pads 81*a*, 81*b*, 81*c*, and 81*d* may be disposed at four corners of each light emitting device 100. In addition, the electrode pads 81*a*, 81*b*, 81*c*, and 81*d* may have substantially a rectangular shape, but the inventive concepts are not limited thereto.

Although the substrate 41 is described as being divided, in some exemplary embodiments, the substrate 41 may be removed, and the surface of the exposed first conductivity type semiconductor layer 43*a* may thus be textured. The substrate 41 may be removed after the first LED stack 23 is bonded onto the second LED stack 33 or may be removed after the electrode pads 81*a*, 81*b*, 81*c*, and 81*d* are formed.

According to the exemplary embodiments, a light emitting device includes the first, second, and third LED stacks 23, 33, and 43, in which the anodes of the LED stacks are electrically connected in common, and cathodes thereof are independently connected. However, the inventive concepts are not limited thereto, and the anodes of the first, second, and third LED stacks 23, 33, and 43 may be independently connected to the electrode pads, and the cathodes thereof may be electrically connected in common.

The light emitting device 100 may include the first, second, and third LED stacks 23, 33, and 43 to emit red, green, and blue light, and may thus be used as a single pixel in a display apparatus. As described with reference to FIG. 1, a display apparatus may be provided by arranging a plurality of light emitting devices 100 on the circuit board 101. Since the light emitting device 100 includes the first, second, and third LED stacks 23, 33, and 43, an area of the subpixel in one pixel may be increased. Further, the first, second, and third LED stacks 23, 33, and 43 may be mounted by mounting one light emitting device 100, thereby reducing the number of mounting processes.

As described with reference to FIG. 1, the light emitting devices 100 mounted on the circuit board 101 may be driven by a passive matrix method or an active matrix method.

Figure 14:
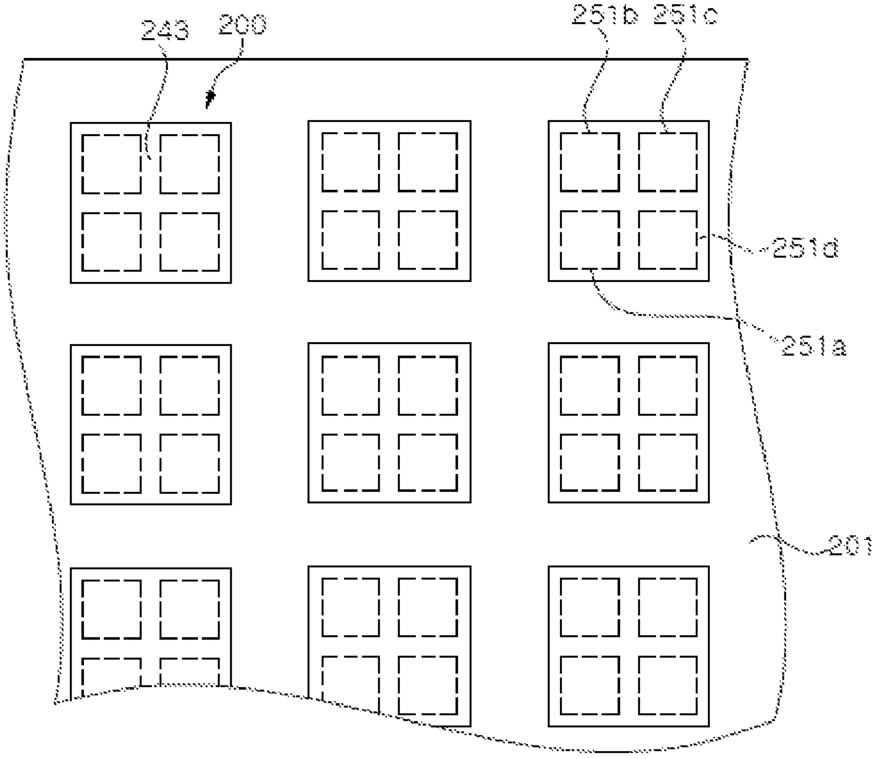
FIG. 14 is a schematic plan view of a display apparatus according to an exemplary embodiment.

FIG. 14 is a schematic plan view of a display apparatus according to an exemplary embodiment.

Referring to FIG. 14, a display apparatus includes a circuit board 201 and a plurality of light emitting devices 200.

The circuit board 201 may include a circuit for passive matrix driving or active matrix driving. In an exemplary embodiment, the circuit board 201 may include wires and resistors disposed therein. In another exemplary embodiment, the circuit board 201 may include wires, transistors, and capacitors. The circuit board 201 may have pads disposed on an upper surface thereof to allow electrical connection to circuits disposed therein.

The plurality of light emitting devices 200 are arranged on the circuit board 201. Each light emitting device 200 may constitute one pixel. The light emitting device 200 has bump pads 251*a*, 251*b*, 251*c*, and 251*d*, and the bump pads 251*a*, 251*b*, 251*c*, and 251*d* are electrically connected to the circuit board 201. The light emitting devices 200 are disposed on the circuit board 201 as separate chips and are spaced apart from each other. An upper surface of each light emitting device 200 may be a surface of an LED stack 243, for example, a surface of an n-type semiconductor layer. Further, the surface of the LED stack 243 may include a roughened surface formed by a surface texturing.

However, in some exemplary embodiments, the surface of the LED stack 243 may be covered with a light-transmissive insulating layer.

A specific configuration of the light emitting device 200 will be described in detail with reference to FIGS. 15A and 15B. In addition, a light emitting device 2000 of FIGS. 27A and 27B, or a light emitting device 2001 of FIGS. 36A and 36B may also be arranged on the circuit board 201 instead of the light emitting device 200.

Figure 15A:
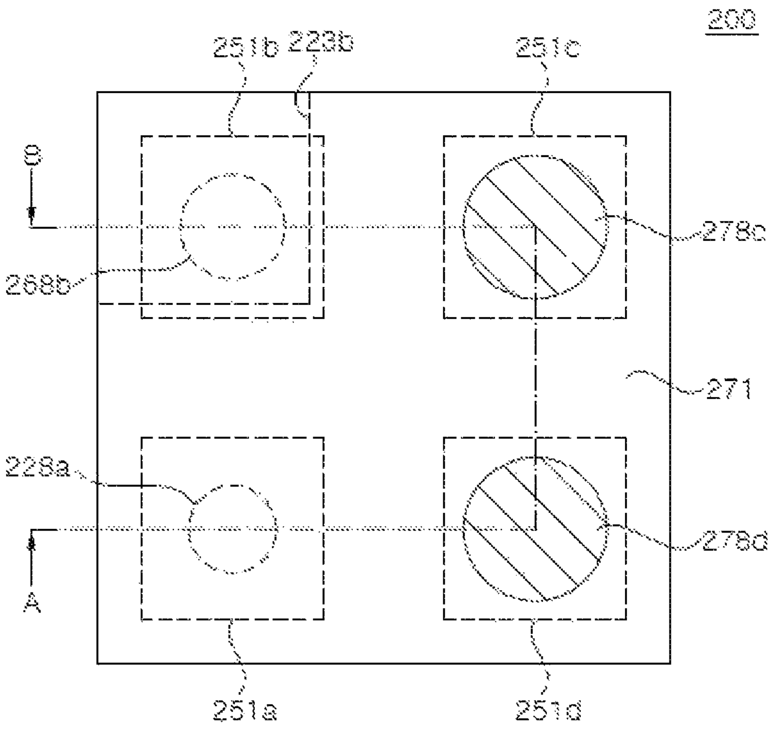
FIG. 15A is a schematic plan view of a light emitting device according to an exemplary embodiment.
Figure 15B:
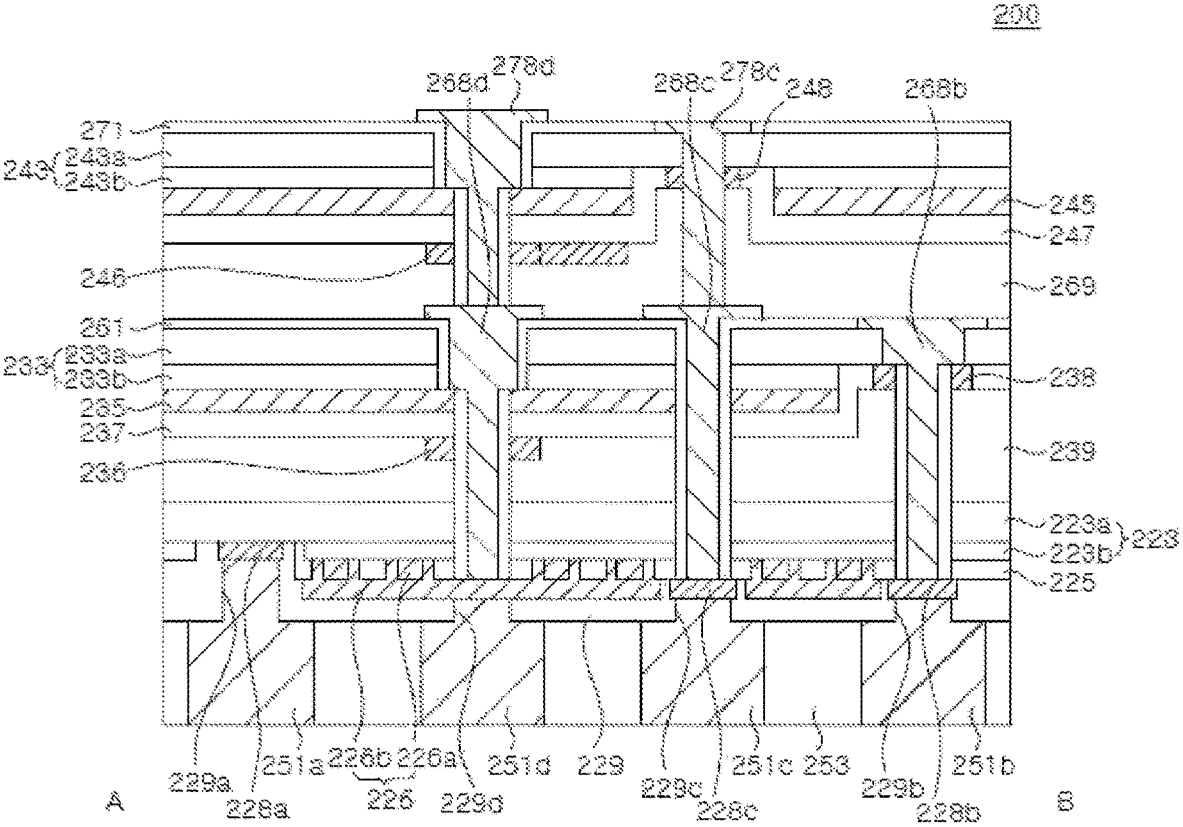
FIG. 15B is a schematic cross-sectional view taken along line A-B of FIG. 15A.

FIG. 15A is a schematic plan view of a light emitting device 200 according to an exemplary embodiment, and FIG. 15B is a cross-sectional view taken along line A-B of FIG. 15A.

Referring to FIGS. 15A and 15B, the light emitting device 200 may include bump pads 251*a*, 251*b*, 251*c*, and 251*d*, a filler 253, a first LED stack 223, a second LED stack 233, a third LED stack 243, insulating layers 225, 229, 261, and 271, a first reflective electrode 226, a second transparent electrode 235, a third transparent electrode 245, first, second, and third ohmic electrodes 228*a*, 238, and 248, connection pads 228*b* and 228*c*, a second current spreading layer 236, a third current spreading layer 246, a first color filter 237, a second color filter 247, a first bonding layer 239, a second bonding layer 269, and connectors 268*b*, 268*c*, 268*d*, 278*c*, and 278*d*.

The bump pads (or electrode pads) 251*a*, 251*b*, 251*c*, and 251*d* and the filler 253 are disposed below the first LED stack 223, and support the first, second, and third LED stacks 223, 233, and 243. The bump pads 251*a*, 251*b*, 251*c*, and 251*d* may include metal, such as copper (Cu), titanium (Ti), nickel (Ni), tantalum (Ta), platinum (Pt), palladium (Pd), chromium (Cr), or others. In some exemplary embodiments, a multilayer solder barrier layer may be formed on the upper surface of the bump pad, and a gold (Au) or silver (Ag) surface layer may be provided on a surface of the bump pad to improve solder wettability. The filler 253 is formed of an insulating material. Since the bump pads 251*a*, 251*b*, 251*c*, and 251*d* and the filler 253 may function as a supporting structure, a separate support substrate may be omitted. An electrical connection of the bump pads 251*a*, 251*b*, 251*c*, and 251*d* will be described below in detail.

The LED stacks are disposed in the order of the first LED stack 223, the second LED stack 233 and the third LED stack 243 on the bump pads 251*a*, 251*b*, 251*c*, and 251*d*. The first to third LED stacks 223, 233, and 243 may be sequentially stacked one over another, and thus, the light emitting device 200 has a single chip structure of a single pixel.

The first LED stack 223, the second LED stack 233, and the third LED stack 243 include first conductivity type semiconductor layers 223*a*, 233*a*, and 243*a*, second conductivity type semiconductor layers 223*b*, 233*b*, and 243*b*, and active layers interposed between the first conductivity type semiconductor layers 223*a*, 233*a*, and 243*a* and the second conductivity type semiconductor layers 223*b*, 233*b*, and 243*b*, respectively. In particular, the active layer may have a multiple quantum well structure. As illustrated, the second conductivity type semiconductor layers 223*b*, 233*b*, and 243*b* are disposed below some regions of the first conductivity type semiconductor layers 223*a*, 233*a*, and 243*a*, respectively, and therefore, the lower surfaces of the first conductivity type semiconductor layers 223*a*, 233*a*, and 243*a* are partially exposed.

The first to third LED stacks 222, 233, and 243 may emit light having a longer wavelength as being disposed closer to the bump pads 251*a*, 251*b*, 251*c*, and 251*d*. For example, the first LED stack 223 may be an inorganic light emitting diode emitting red light, the second LED stack 233 may be an inorganic light emitting diode emitting green light, and the third LED stack 243 may be an inorganic light emitting diode emitting blue light. The first LED stack 223 may include a GaInP based well layer, and the second LED stack 233 and the third LED stack 243 may include a GaInN based well layer. However, the inventive concepts are not limited thereto. When the light emitting device 200 includes a micro LED, which has a surface area less than about 10,000 square μm as known in the art, or less than about 4,000 square μm or 2,500 square μm in other exemplary embodiments, the first LED stack 223 may emit any one of red, green, and blue light, and the second and third LED stacks 233 and 243 may emit a different one of red, green, and blue light, without adversely affecting operation, due to the small form factor of a micro LED.

Since the first LED stack 223 may emit light having a longer wavelength than that of the second and third LED stacks 233 and 243, light generated in the first LED stack 223 may be emitted to the outside through the second and third LED stacks 233 and 243, and the third substrate 241. In addition, since the second LED stack 233 may emit light having a longer wavelength than that of the third LED stack 243, light generated in the second LED stack 233 may be emitted to the outside through the third LED stack 243 and the third substrate 241.

In addition, the first conductivity type semiconductor layers 223*a*, 233*a*, and 243*a* of the respective LED stacks 223, 233, and 243 may be n-type semiconductor layers, and the second conductivity type semiconductor layers 223*b*, 233*b*, and 243*b* of the respective LED stacks 223, 233, and 243 may be p-type semiconductor layers. In the illustrated exemplary embodiment, an upper surface of the first LED stack 223 is an n-type semiconductor layer 223*b*, an upper surface of the second LED stack 233 is an n-type semiconductor layer 233*a*, and an upper surface of the third LED stack 243 is an n-type semiconductor layer 243*b*. In an exemplary embodiment, the first LED stack 223, the second LED stack 233, and the third LED stack 243 may have the first conductivity type semiconductor layers 223*a*, 233*a*, and 243*a* with textured surfaces, respectively, so as to improve light extraction efficiency. However, when the second LED stack 233 emits green light, since the green light has higher visibility than red light or blue light, it is preferable to make luminous efficiency of the first LED stack 223 and the third LED stack 243 higher than that of the second LED stack 233. As such, luminous intensities of red light, green light, and blue light may be adjusted to be substantially uniform by applying surface texturing to the greater extent in the first LED stack 223 and the third LED stack 243 than the second LED stack 233.

The insulating layer 225 is disposed below the first LED stack 223, and has at least one opening exposing the second conductivity type semiconductor layer 223*b* of the first LED stack 223. The insulating layer 225 may have a plurality of openings widely distributed over the first LED stack 223. The insulating layer 225 may be a transparent insulating layer having a refractive index lower than that of the first LED stack 223.

The first reflective electrode 226 is in ohmic contact with the second conductivity type semiconductor layer 223*b* of the first LED stack 223, and reflects light generated in the first LED stack 223 toward the second LED stack 233. The first reflective electrode 226 is disposed on the insulating layer 225, and is connected to the first LED stack 223 through the openings of the insulating layer 225.

The first reflective electrode 226 may include an ohmic contact layer 226*a* and a reflective layer 226*b*. The ohmic contact layer 226*a* is in partial contact with the second conductivity type semiconductor layer 223*b*, for example, a p-type semiconductor layer. The ohmic contact layer 226*a* may be formed in a limited area to prevent absorption of light by the ohmic contact layer 226*a*. The ohmic contact layers 226*a* may be formed on the second conductivity type semiconductor layer 223*b* exposed in the openings of the insulating layer 225. The ohmic contact layers 226*a* spaced apart from each other are formed in a plurality of regions on the first LED stack 223 to assist current distribution in the second conductivity type semiconductor layer 223*b*. The ohmic contact layer 226*a* may be formed of a transparent conductive oxide or an Au alloy such as Au(Zn) or Au(Be).

The reflective layer 226*b* covers the ohmic contact layer 226*a* and the insulating layer 225. The reflective layer 226*b* covers the insulating layer 225, such that an omnidirectional reflector may be formed by a stacked structure of the first LED stack 223 having a relatively high refractive index, and the insulating layer 225 and the reflective layer 226 layer 226*b* having a relatively low refractive index. The reflective layer 226*b* may include a reflective metal layer, such as Al, Ag, or Au. In addition, the reflective layer 226*b* may include an adhesive metal layer, such as Ti, Ta, Ni, or Cr on upper and lower surfaces of the reflective metal layer to improve adhesion of the reflective metal layer. Au may be particularly suitable for the reflective layer 226*b* formed in the first LED stack 223 due to high reflectance to red light and low reflectance to blue light or green light. The reflective layer 226*b* may cover 50% or more of an area of the first LED stack 223, and in some exemplary embodiment, may cover most of the area of the first LED stack 223 to improve light efficiency.

The reflective layer 226*b* may be formed of a metal layer having a high reflectance for light generated in the first LED stack 223, for example, the red light. The reflective layer 226*b* may have a relatively low reflectance for light generated in the second LED stack 233 and the third LED stack 243, for example, the green light or the blue light. Therefore, the reflective layer 226*b* may absorb light generated in the second and third LED stacks 233 and 243 and incident on the reflective layer 226*b* to decrease optical interference.

The first ohmic electrode 228*a* is disposed on the exposed first conductivity type semiconductor layer 223*a*, and is in ohmic contact with the first conductivity type semiconductor layer 223*a*. The first ohmic electrode 228*a* may be disposed between the first conductivity type semiconductor layer 223*a* and the first bump pad 251*a* pad 251*a*, as illustrated in FIG. 15B. The first ohmic electrode 228*a* may also be formed of a metal layer containing Au.

The connection pads 228*b* and 228*c* may be formed together when the first reflective electrode 226 is formed, but the inventive concepts are not limited thereto. For example, the connection pads 228*b* and 228*c* may be formed together when the first ohmic electrode 228*a* is formed, or through a separate process from the above mentioned processes.

The connection pads 228*b* and 228*c* are electrically insulated from the first reflective electrode 226 and the first ohmic electrode 228*a*. For example, the connection pads 228*b* and 228*c* may be disposed below the insulating layer 225 and insulated from the first LED stack 223.

The insulating layer 229 covers the first reflective electrode 226 to separate the first reflective electrode 226 from the bump pads 251*a*, 251*b*, 251*c*, and 251*d*. The insulating layer 229 includes openings 229*a*, 229*b*, 229*c*, and 229*d*. The opening 229*a* exposes the first ohmic electrode 228*a*, the opening 229*b* exposes the connection pad 228*b*, the opening 229*c* exposes the connection pad 29*c*, and the opening 229*d* exposes the first reflective electrode 226.

A material of the insulating layer 229 may be $SiO_2$, $Si_3N_4$, SOG, or the like, but is not limited thereto, and may include light transmissive or light non-transmissive material.

The second transparent electrode 235 is in ohmic contact with the second conductivity type semiconductor layer 233*b* of the second LED stack 233. As illustrated in the drawing, the second transparent electrode 235 is in contact with a lower surface of the second LED stack 233 between the first LED stack 223 and the second LED stack 233. The second transparent electrode 235 may be formed of a metal layer or a conductive oxide layer that is transparent to red light. The second transparent electrode 235 may also be transparent to green light.

The third transparent electrode 245 is in ohmic contact with the second conductivity type semiconductor layer 243*b* of the third LED stack 243. The third transparent electrode 245 may be disposed between the second LED stack 233 and the third LED stack 243, and is in contact with a lower surface of the third LED stack 243. The third transparent electrode 245 may be formed of a metal layer or a conductive oxide layer that is transparent to red light and green light. The third transparent electrode 245 may also be transparent to blue light. The second transparent electrode 235 and the third transparent electrode 245 may be in ohmic contact with the p-type semiconductor layer of each LED stack to assist current distribution. Examples of the conductive oxide layer used for the second and third transparent electrodes 235 and 245 may include $SnO_2$, $InO_2$, ITO, ZnO, IZO, or others.

The first color filter 237 may be disposed between the second transparent electrode 235 and the first LED stack 223, and the second color filter 247 may be disposed between the second LED stack 233 and the third LED stack 243. The first color filter 237 transmits light generated in the first LED stack 223, and reflects the light generated in the second LED stack 233. The second color filter 247 transmits light generated in the first LED stack 223 and the second LED stack 233, and reflects light generated in the third LED stack 243. Therefore, light generated in the first LED stack 223 may be emitted to the outside through the second LED stack 233 and the third LED stack 243, and light generated in the second LED stack 233 may be emitted to the outside through the third LED stack 243. Furthermore, light generated in the second LED stack 233 may be prevented from being lost by being incident on the first LED stack 223, or light generated in the third LED stack 243 may be prevented from being lost by being incident on the second LED stack 233.

In some exemplary embodiments, the first color filter 237 may also reflect the light generated in the third LED stack 243.

The first and second color filters 237 and 247 may be, for example, a low pass filter that passes only a low frequency range, that is, a long wavelength band, a band pass filter that passes only a predetermined wavelength band, or a band stop filter that blocks only a predetermined wavelength band. In particular, the first and second color filters 237 and 247 may be formed by alternately stacking insulating layers having refractive indices different from each other, and for example, may be formed by alternately stacking $TiO_2$ and $SiO_2$ insulating layers, $Ta_2O_5$ and $SiO_2$ insulating layers, $Nb_2O_5$ and $SiO_2$ insulating layers, $HfO_2$ and $SiO_2$ insulating layers, or $ZrO_2$ and $SiO_2$ insulating layers. In particular, the first and second color filters 237 and 247 may include a distributed Bragg reflector (DBR). A stop band of the distributed Bragg reflector may be controlled by adjusting the thicknesses of $TiO_2$ and $SiO_2$. The low pass filter and the band pass filter may also be formed by alternately stacking insulating layers having refractive indices different from each other.

The second current spreading layer 236 may be electrically connected to the second conductivity type semiconductor layer **233*b* of the second LED stack 233 through the second transparent electrode 235. The second current spreading layer 236 may be disposed on the lower surface of the first color filter 237 and connected to the second transparent electrode 235 through the first color filter 237. The first color filter 237 may have an opening exposing the second LED stack 233, and the second current spreading layer 236 may be connected to the second transparent electrode 235 through the opening of the first color filter 237**.

Figure 17A:
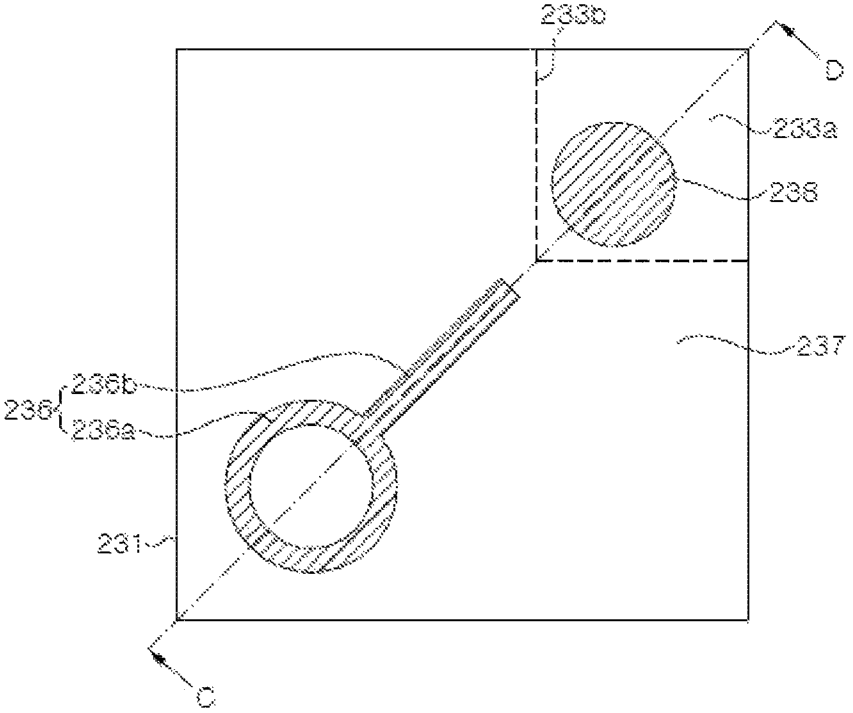

The second current spreading layer 236 may include a pad region **236*a* and an extension 236*b* extending from the pad region 236*a* (see FIGS. 17A and 11*i*). In addition, the pad region 236*a* may have substantially a ring shape including a hollow portion. FIG. 17A shows the extension 236*b* being extended in a diagonal direction of the light emitting device 200, but the inventive concepts are not limited thereto, and the extension 236*b*** may have various shapes.

The second current spreading layer 236 is formed of a metal layer having sheet resistance lower than that of the second transparent electrode 235, and thus, assists current distribution in the second LED stack 233. Furthermore, the second current spreading layer 236 is disposed below the first color filter 237, such that the first color filter 237 reflects light generated in the second LED stack 233 and traveling toward the second current spreading layer 236 to prevent light loss.

The second ohmic electrode 238 is in ohmic contact with the exposed lower surface of the first conductivity type semiconductor layer **233*a*. The second ohmic electrode 238 may have substantially a ring shape having a hollow portion (see FIG. 17A). In some exemplary embodiment, the second ohmic electrode 238 may include an extension together with a pad region for current distribution. The first color filter 237 may cover the first conductivity type semiconductor layer 233*a* around the second ohmic electrode 238**.

The third current spreading layer 246 may be electrically connected to the second conductivity type semiconductor layer **243*b* of the third LED stack 243 through the third transparent electrode 245. The third current spreading layer 246 may be disposed on the lower surface of the second color filter 247 and connected to the third transparent electrode 245 through the second color filter 247. The second color filter 247 may have an opening exposing the third LED stack 243, and the third current spreading layer 246 may be connected to the third transparent electrode 245 through the opening of the second color filter 247**.

Figure 18A:
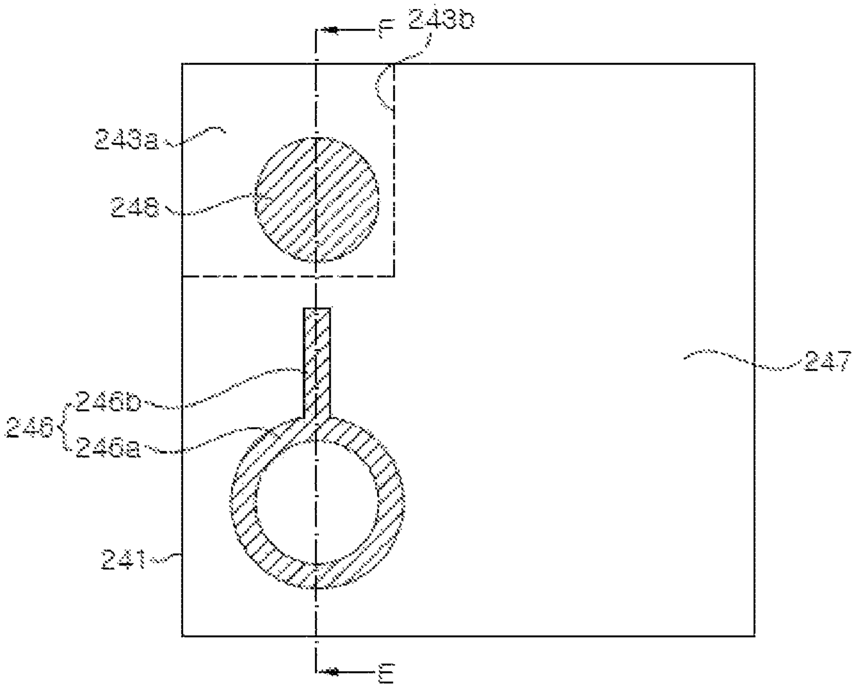
Figure 18B:
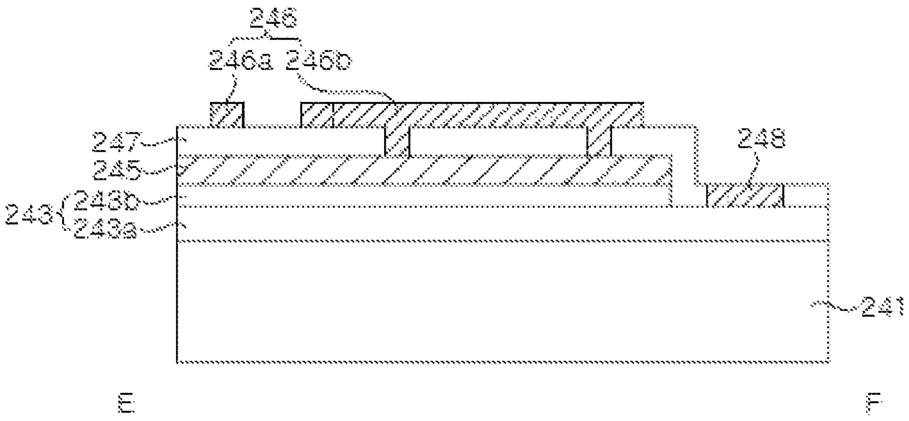

The third current spreading layer 246 may include a pad region **246*a* and an extension 246*b* extending from the pad region 246*a* (see FIGS. 18A and 18B). In addition, the pad region 246*a* may have substantially a ring shape including a hollow portion. FIG. 18A shows the extension 246*b* as being extended along an edge of one side of the light emitting device 200, but the inventive concepts are not limited thereto, and the extension 246*b*** may have various shapes.

The third current spreading layer 246 is formed of a metal layer having sheet resistance lower than that of the third transparent electrode 245, and thus assists current distribution in the third LED stack 243. The third current spreading layer 246 is disposed below the second color filter 247, such that the second color filter 247 reflects light generated in the third LED stack 243 and traveling toward the third current spreading layer 246 to prevent light loss.

The third ohmic electrode 248 is in ohmic contact with the exposed lower surface of the first conductivity type semiconductor layer **243*a*. The third ohmic electrode 248 may have substantially a ring shape having a hollow portion. In some exemplary embodiments, the third ohmic electrode 248 may include an extension together with a pad region for current distribution. The second color filter 247 may cover the first conductivity type semiconductor layer 243*a* around the third ohmic electrode 248**.

The first bonding layer 239 couples the second LED stack 233 to the first LED stack 223. The first bonding layer 239 may bond the first LED stack 223 and the first color filter 237 to each other. The first bonding layer 239 may be formed of a transparent organic layer, or may be formed of a transparent inorganic layer. Examples of the organic layer may include SUB, poly(methylmethacrylate) (PMMA), polyimide, parylene, benzocyclobutene (BCB), or others, and examples of the inorganic layer may include $Al_2O_3$, $SiO_2$, $SiN_x$, or others. The organic layers may be bonded at a high vacuum and a high pressure, and the inorganic layers may be bonded under a high vacuum when the surface energy is adjusted by using plasma or others, after flattening surfaces by, for example, a chemical mechanical polishing process.

The second bonding layer 269 couples the third LED stack 243 to the second LED stack 233. As illustrated in the drawing, the second bonding layer 269 may bond the second LED stack 233 and the second color filter 247 to each other. The second bonding layer 269 may be in contact with the second LED stack 233, but is not limited thereto. As illustrated in the drawing, the insulating layer may be disposed on the second LED stack 233, and the second bonding layer 269 may also be in contact with the insulating layer 261. The second bonding layer 269 may be formed of a transparent organic layer or a transparent inorganic layer.

The bump pads 251*a*, 251*b*, 251*c*, and 251*d* may be disposed below the insulating layer 229. The bump pads 251*a*, 251*b*, 251*c*, and 251*d* include first to third bump pads 251*a*, 251*b*, and 251*c*, and a common bump pad 251*d*.

The first bump pad 251*a* is electrically connected to the first conductivity type semiconductor layer 223*a* of the first LED stack 223. The first bump pad 251*a* may be connected to the first ohmic electrode 228*a* through the opening 229*a*.

The second bump pad 251*b* is electrically connected to the first conductivity type semiconductor layer 233*a* of the second LED stack 233. The second bump pad 251*b* may be connected to the connection pad 228*b* through the opening 229*b*.

The third bump pad 251*c* is electrically connected to the first conductivity type semiconductor layer 243*a* of the third LED stack 243. The third bump pad 251*c* may be connected to the connection pad 228*c* through the opening 229*c*.

The common bump pad 251*d* is electrically connected to the second conductivity type semiconductor layers 223*a*, 233*a*, and 243*a* of the first LED stack 223, the second LED stack 233, and the third LED stack 243. The common bump pad 251*d* may be connected to the first reflective electrode 226 through the opening 229*d*.

The connectors 268*b*, 268*c*, 268*d*, 278*c*, and 278*d* are disposed to electrically connect the second LED stack 233 and the third LED stack 243 to the bump pads 251*b*, 251*c*, and 251*d*.

The second connector 268*b* electrically connects the first conductivity type semiconductor layer 233*a* of the second LED stack 233 to the second bump pad 251*b*. The second connector 268*b* may be connected to the upper surface of the second ohmic electrode 238 and the connection pad 228*b*. The second connector 268*b* and the second bump pad 251*b* may be disposed above and below the connection pad 228*b* while having the connection pad 228*b* interposed therebetween to be electrically connected to each other through the connection pad 228*b*. However, the inventive concepts are not limited thereto. For example, the connection pad 228 may be omitted and the second connector 268*b* may be directly connected to the second bump pad 251*b*. However, the second bump pad 251*b* and the second connector 268*b* may be formed by separate processes, and may include materials different from each other.

The second connector 268*b* may penetrate through the first conductivity type semiconductor layer 233*a* of the second LED stack 233, and may be in contact with the first conductivity type semiconductor layer 233*a*. The second connector 268*b* is spaced apart from the second conductivity type semiconductor layer 233*b* and is insulated from the first LED stack 223. To this end, the insulating layer 261 may cover a side wall of a through hole in which the second connector 268*b* is formed.

The third connector electrically connects the first conductivity type semiconductor layer 243*a* of the third LED stack 243 to the third bump pad 251*c*. The third connector may include a 3-1-th connector 268*c* and a 3-2-th connector 278*c*.

The 3-1-th connector 268*c* may penetrate through the first LED stack 223 and the second LED stack 233, and may be connected to the connection pad 228*c*. The 3-1-th connector 268*c* is insulated from the first LED stack 223 and the second LED stack 233, and to this end, the insulating layer 261 insulates the 3-1-th connector 268*c* from the first and second LED stacks 223 and 233.

According to an exemplary embodiment, the 3-1-th connector 268*c* may include a pad region on the second LED stack 233.

The 3-2-th connector 278*c* may penetrate through the first conductivity type semiconductor layer 243*a* of the third LED stack 243 to be connected to the third ohmic electrode 248 and the pad region of the 3-1-th connector 268*c*. The 3-2-th connector 278*c* may be in contact with the upper surface of the third ohmic electrode 248, and with the first conductivity type semiconductor layer 243*a*.

The common connectors 268*d* and 278*d* electrically connect the second conductivity type semiconductor layer 233*b* of the second LED stack 233 and the second conductivity type semiconductor layer 243*b* of the third LED stack 243 to the common bump pad 251*d*.

The first common connector 268*d* may be connected to the second transparent electrode 235 and the first reflective electrode 226, and is thus electrically connected to the common bump pad 251*d*. The first common connector 268*d* may penetrate through the second current spreading layer 236. For example, when the second current spreading layer 236 includes the hollow portion, the first common connector 268*d* may pass through the hollow portion of the second current spreading layer 236. In the illustrated exemplary embodiment, the first common connector 268*d* is connected to the second transparent electrode 235 and is spaced apart from the second current spreading layer 236, but is also electrically connected to the second current spreading layer 236 through the second transparent electrode 235. In some exemplary embodiments, the first common connector 268*d* may be directly connected to the second current spreading layer 236. For example, the upper surface of the second current spreading layer 236 may be exposed through the second transparent electrode 235 and the first color filter 237, and the first common connector 268*d* may be connected to the exposed upper surface of the second current spreading layer 236.

The first common connector 268*d* may include a pad region to which the second common connector 278*d* may be connected. The pad region of the first common connector 268*d* may be provided on the first conductivity type semiconductor layer 233*a* of the second LED stack 233. However, since the first common connector 268*d* needs to be insulated from the first conductivity type semiconductor layer 233*a*, the insulating layer 261 may be interposed between the first common connector 268*d* and the first conductivity type semiconductor layer 233*a*.

The second common connector 278*d* may be connected to the third transparent electrode 245 and the first common connector 268*d*. The second common connector 278*d* may penetrate through the third LED stack 243 to be connected to the third transparent electrode 245, and may thus be connected to the upper surface of the third transparent electrode 245. The second common connector 278*d* is insulated from the first conductivity type semiconductor layer 243*a*, and to this end, the insulating layer 271 may be interposed between the second common connector 278*d* and the first conductivity type semiconductor layer 243*a*.

The second common connector 278*d* may penetrate through the third current spreading layer 246. For example, when the third current spreading layer 246 includes the hollow portion, the second common connector 278*d* may pass through the hollow portion of the third current spreading layer 246. In the illustrated exemplary embodiment, the second common connector 278*d* is connected to the third transparent electrode 245 and is spaced apart from the third current spreading layer 246, but is also electrically connected to the third current spreading layer 246 through the third transparent electrode 245. In some exemplary embodiments, the second common connector 278*d* may be directly connected to the third current spreading layer 246. For example, the upper surface of the third current spreading layer 246 may be exposed through the third transparent electrode 245 and the second color filter 247, and the second common connector 278*d* may be directly connected to the exposed upper surface of the third current spreading layer 246.

According to exemplary embodiments, the first LED stack 223 is electrically connected to the bump pads 251*d* and 251*a*, the second LED stack 233 is electrically connected to the bump pads 251*d* and 251*b*, and the third LED stack 243 is electrically connected to the bump pads 251*d* and 251*c*. As such, anodes of the first LED stack 223, the second LED stack 233, and the third LED stack 243 are electrically connected in common to the bump pad 251*d*, and cathodes of the first LED stack 223, the second LED stack 233, and the third LED stack 243 are electrically connected to the first, second, and third bump pads 251*a*, 251*b*, and 251*c*, respectively. In this manner, the first, second, and third LED stacks 223, 233, and 243 may be independently driven.

FIGS. 16A, 16B, 17A, 17B, 18A, 18B, 19A, 19B, 20A, 20B, 21A, 21B, 22A, 22B, 23A, 23B, 24A, 24B, 25A, 25B, 26A, and 26B are schematic plan views and cross-sectional views illustrating a method of manufacturing a light emitting device 200 according to an exemplary embodiment. In the drawings, each plan view corresponds to a plan view of FIG. 14A, and each cross-sectional view is a cross-sectional view taken along illustrated line of corresponding plan view.

Figure 16A:
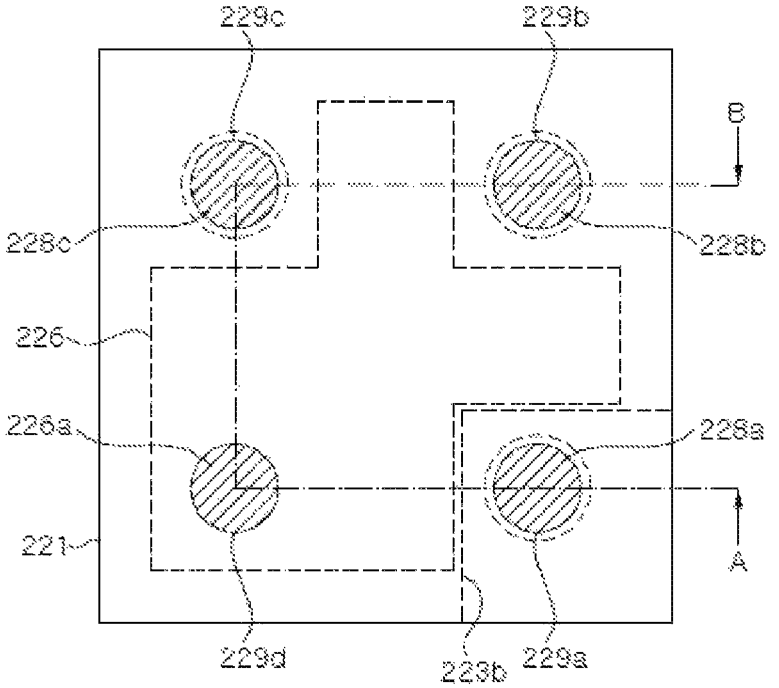
FIGS. 16A, 16B, 17A, 17B, 18A, 18B, 19A, 19B, 20A, 20B, 21A, 21B, 22A, 22B, 23A, 23B, 24A, 24B, 25A, 25B, 26A, and 26B are schematic plan views and cross-sectional views illustrating a method of manufacturing a light emitting device according to an exemplary embodiment.
Figure 16B:
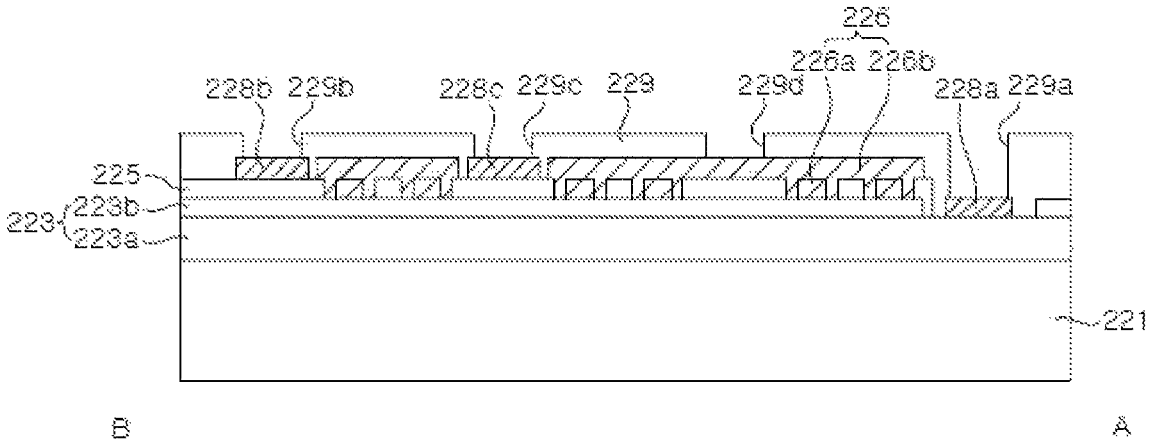

Referring to FIGS. 16A and 16B, the first LED stack 223 is grown on a first substrate 221. The first substrate 221 may be, for example, a GaAs substrate. The first LED stack 223 may be formed of AlGaInP based semiconductor layers, and includes the first conductivity type semiconductor layer 223*a*, an active layer, and the second conductivity type semiconductor layer 223*b*. The first conductivity type may be an n-type and the second conductivity type may be a p-type.

Next, the second conductivity type semiconductor layer 223*b* is partially removed to expose the first conductivity type semiconductor layer 223*a*.

The insulating layer 225 is formed on the first LED stack 223, and openings may be formed by patterning the insulating layer 225. For example, $SiO_2$ is formed on the first LED stack 223, a photoresist is applied to $SiO_2$, and a photoresist pattern is then formed using photolithography and development. Then, $SiO_2$ may be patterned using the photoresist pattern as an etching mask to form openings.

Then, the ohmic contact layer 226*a* may be formed in each opening of the insulating layer 225. The ohmic contact layer 226*a* may be formed using a lift-off technology or the like. After the ohmic contact layer 226*a* is formed, the reflective layer 226*b* covering the ohmic contact layer 226*a* and the insulating layer 225 is formed. The reflective layer 226*b* may be formed of, for example, Au, and may be formed using a lift-off technique or the like. The first reflective electrode 226 is formed by the ohmic contact layer 226*a* and the reflective layer 226*b*.

The first reflective electrode 226 may have a shape in which three corner portions are removed from one rectangular light emitting device region, as illustrated in the drawing. In addition, the ohmic contact layers 226*a* may be widely distributed at a lower portion of the first reflective electrode 226. Although FIG. 16A shows one light emitting device region, a plurality light emitting device regions may be provided on the first substrate 221, and the first reflective electrode 226 is formed in each light emitting device region.

The first ohmic electrode 228*a* is formed on the exposed first conductivity type semiconductor layer 223*a*. The first ohmic electrode 228*a* is in ohmic contact with the first conductivity type semiconductor layer 223*a*, and is insulated from the second conductivity type semiconductor layer 223*b*.

The connection pads 228*b* and 228*c* may be formed on the insulating layer 225. The connection pads 228*b* and 228*c* may be formed together with the reflective layer 226*b*, or be formed together with the first ohmic electrode 228*a*, but the inventive concepts are not limited thereto, and may be formed by separate processes.

An insulating layer 229 is formed on the first reflective layer 226, the first ohmic electrode 228*a*, and the connection pads 228*c* and 228*d*. The insulating layer 229 has openings 229*a*, 229*b*, 229*c*, and 229*d* that expose the first ohmic electrode 228*a*, the connection pads 228*c* and 228*d*, and the first reflective electrode 226, respectively. The insulating layer 229 may be formed of, for example, $SiO_2$, $Si_3N_4$, SOG, or others.

Figure 17B:
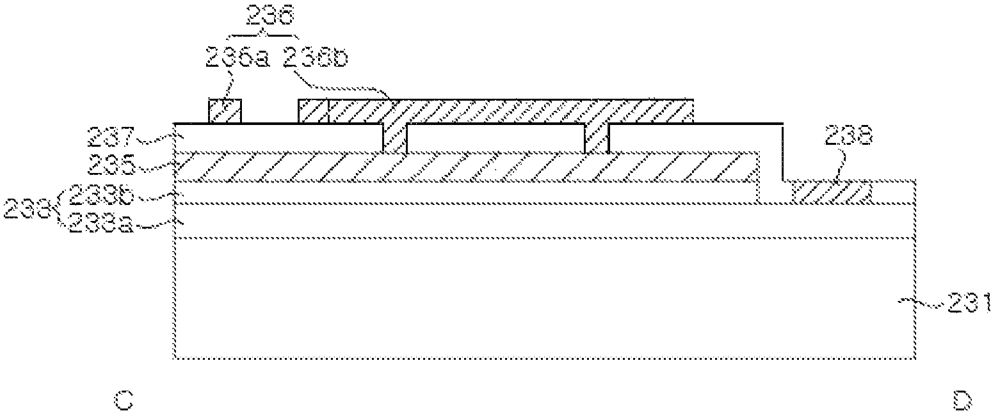

Referring to FIGS. 17A and 17B, the second LED stack 233 is grown on a second substrate 231, and the second transparent electrode 235 is formed on the second LED stack 233. The second LED stack 233 may be formed of gallium nitride based semiconductor layers, and may include the first conductivity type semiconductor layer 233*a*, an active layer, and the second conductivity type semiconductor layer 233*b*. The active layer may include a GaInN well layer. The first conductivity type may be an n-type and the second conductivity type may be a p-type.

The second substrate 231 is a substrate on which a gallium nitride based semiconductor layer may be grown, and may be different from the first substrate 221. A composition ratio of the GaInN well layer may be determined so that the second LED stack 233 may emit green light, for example. The second transparent electrode 235 is in ohmic contact with the second conductivity type semiconductor layer 233*b*.

The second transparent electrode 235 and the second conductive semiconductor layer 233*b* are partially removed to expose the first conductivity type semiconductor layer 233*a*. The exposed region of the first conductivity type semiconductor layer 233*a* may be selected so as not to overlap the exposed region of the first conductivity type semiconductor layer 223*a*.

The first color filter 237 is formed on the second transparent electrode 235. The first color filter 237 may cover the exposed first conductivity type semiconductor layer 233*a*. Since the material forming the first color filter 237 is substantially the same as that described with reference to FIGS. 15A and 15B, detailed descriptions thereof will be omitted to avoid redundancy.

The first color filter 237 is patterned to form openings exposing the second transparent electrode 235 and an opening exposing the first conductivity type semiconductor layer 233*a*.

Then, the second current spreading layer 236 is formed on the first color filter 237. The second current spreading layer 236 is formed of a metal layer. The second current spreading layer 236 may include the pad region 236*a* and the extension 236*b*. The pad region 236*a* may be formed to have substantially a ring shape and have a hollow region exposing the first color filter 237 at the center thereof. The extension 236*b* may extend from the pad region 236*a*, and may be connected to the second transparent electrode 235 exposed through the opening of the first color filter 237. The extension 236*b* may extend substantially in a diagonal direction, but is not limited thereto. The extension 236*b* may have various shapes. Although FIG. 17A shows one light emitting device region, a plurality light emitting device regions may be provided on the second substrate 231, and the second current spreading layer 236 may be formed in each light emitting device region.

The second ohmic electrode 238 is formed on the first conductivity type semiconductor layer 233*a*. The second ohmic electrode 238 is in ohmic contact with the first conductivity type semiconductor layer 233*a*, and may be formed of, for example, Ti/Al. A side surface of the second ohmic electrode 238 may be in contact with the first color filter 237, and therefore, it is possible to prevent light from being leaked into a region between the second ohmic electrode 238 and the first color filter 237. The second ohmic electrode 238 and the second current spreading layer 236 may also be formed together with each other by the same process, or may be formed to include different materials from each other through a separate process.

Referring to FIGS. 18A and 18B, the third LED stack 243 is grown on a third substrate 241, and the third transparent electrode 245 is formed on the third LED stack 243. The third LED stack 243 may be formed of gallium nitride based semiconductor layers, and may include the first conductivity type semiconductor layer 243*a*, an active layer, and the second conductivity type semiconductor layer 243*b*. The active layer may also include a GaInN well layer. The first conductivity type may be an n-type and the second conductivity type may be a p-type.

The third substrate 241 is a substrate on which a gallium nitride based semiconductor layer may be grown, and may be different from the first substrate 221. A composition ratio of GaInN may be determined so that the third LED stack 243 may emit blue light, for example. The third transparent electrode 245 is in ohmic contact with the second conductivity type semiconductor layer 243*b*.

The third transparent electrode 245 and the second conductive semiconductor layer 243*b* are partially removed to expose the first conductivity type semiconductor layer 243*a*. The exposed region of the first conductivity type semiconductor layer 243*a* may be selected so as not to overlap the exposed regions of the first conductivity type semiconductor layers 223*a* and 233*a*.

The second color filter 247 is formed on the third transparent electrode 245. The second color filter 247 may also cover the exposed first conductivity type semiconductor layer 243*a*. Since the material forming the second color filter 247 is substantially the same as that described with reference to FIGS. 15A and 15B, detailed descriptions thereof will be omitted to avoid redundancy.

The second color filter 247 may be patterned to form openings exposing the third transparent electrode 245 and an opening exposing the first conductivity type semiconductor layer 243*a*.

Then, the third current spreading layer 246 is formed on the second color filter 247. The third current spreading layer 246 is formed of a metal layer. The third current spreading layer 246 may include the pad region 246*a* and the extension 246*b*. The pad region 246*a* may be formed to have substantially a ring shape and have a hollow region exposing the second color filter 247 at the center thereof. A process of patterning the third current spreading layer 246 may be omitted in a subsequent process by forming the hollow portion in the third current spreading layer 246 in advance, to simplify the process of manufacturing the light emitting device 200. However, the inventive concepts are not limited thereto, and the pad region 246*a* may be formed without the hollow portion, and the hollow portion may be formed by patterning the pad region 246*a* in a later process.

The extension 246*b* may extend from the pad region 246*a*, and may be connected to the third transparent electrode 245 exposed through the opening of the second color filter 247. The extension 246*b* may extend substantially along an edge as illustrated in the drawing, but is not limited thereto. The extension 246*b* may have various shapes. Although FIG. 18A shows one light emitting device region, a plurality light emitting device regions may be provided on the third substrate 241, and the third current spreading layer 246 is formed in each light emitting device region.

The third ohmic electrode 248 is formed on the first conductivity type semiconductor layer 243*a*. The third ohmic electrode 248 is in ohmic contact with the first conductivity type semiconductor layer 243*a*, and may be formed of, for example, Ti/Al. A side surface of the third ohmic electrode 248 may be in contact with the second color filter 247, and therefore, it is possible to prevent light from being leaked into a region between the third ohmic electrode 248 and the second color filter 247. The third ohmic electrode 248 and the third current spreading layer 246 may also be formed together with each other by the same process, or may be formed to include different materials from each other through a separate process.

Figure 19A:
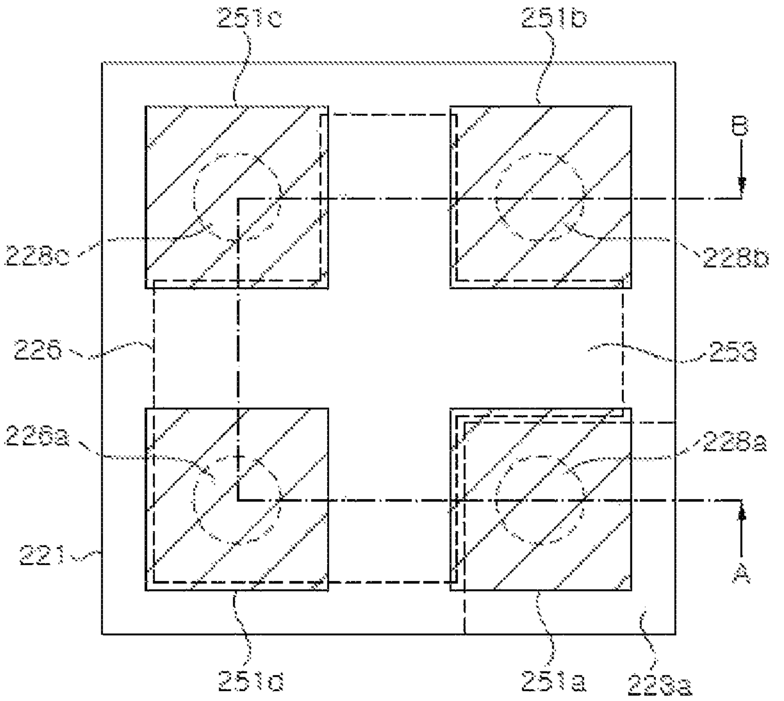
Figure 19B:
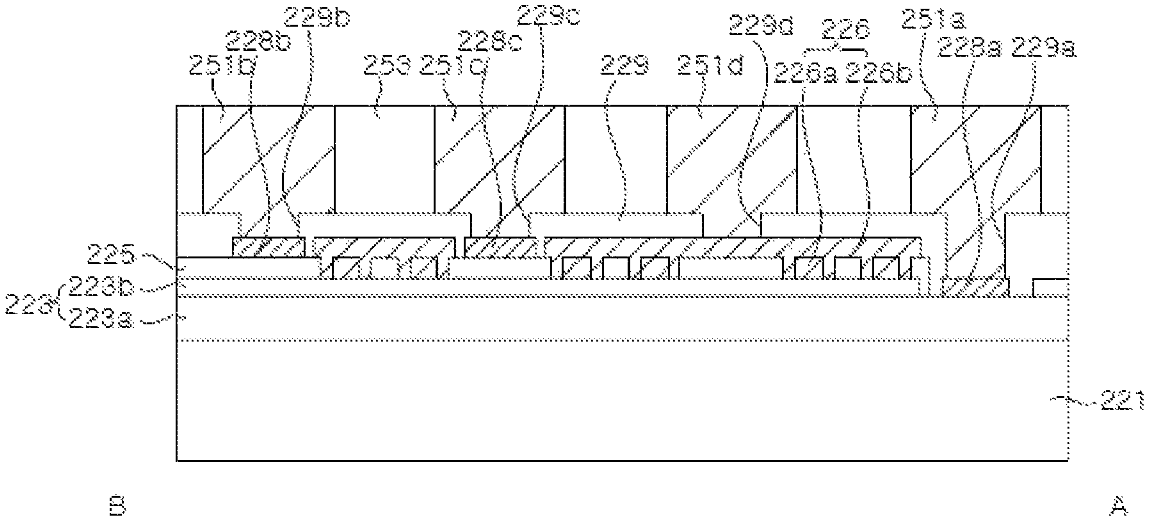

Referring to FIGS. 19A and 19B, the bump pads 251*a*, 251*b*, 251*c*, and 251*d* are formed on the first LED stack 223 of FIGS. 16A and 16B. The bump pads 251*a*, 251*b*, 251*c*, and 251*d* are formed on the insulating layer 229. The bump pads 251*a*, 251*b*, 251*c*, and 251*d* may include, for example, a solder barrier layer, a body, and a surface layer. The solder barrier layer may be formed of, for example, a single layer or a multilayer including at least one of Ti, Ni, Ta, Pt, Pd, Cr, and the like, the body may be formed of Cu, and the surface layer may be formed of Au or Ag. The surface layer may improve wettability of a solder and assist in the mounting of the bump pads 251*a*, 251*b*, 251*c*, and 251*d*, and the solder barrier layer may prevent diffusion of metal material, such as Sn, in the solder to improve reliability of the light emitting device 200.

The first bump pad 251*a* is connected to the first ohmic electrode 228*a* through the opening 229*a*, the second bump pad 251*b* is connected to the connection pad 228*b* through the opening 229*b*, the third bump pad 251*c* is connected to the connection pad 228*c* through the opening 229*c*, and the common bump pad 251*d* is connected to the first reflective electrode 226 through the opening 229*d*.

The filler 253 may fill regions between the bump pads 251*a*, 251*b*, 251*c*, and 251*d*. The bump pads 251*a*, 251*b*, 251*c*, and 251*d* are formed for each of the light emitting devices on the first substrate 221, and the filler 253 fills the regions between these bump pads 251*a*, 251*b*, 251*c*, and 251*d*.

Figure 20A:
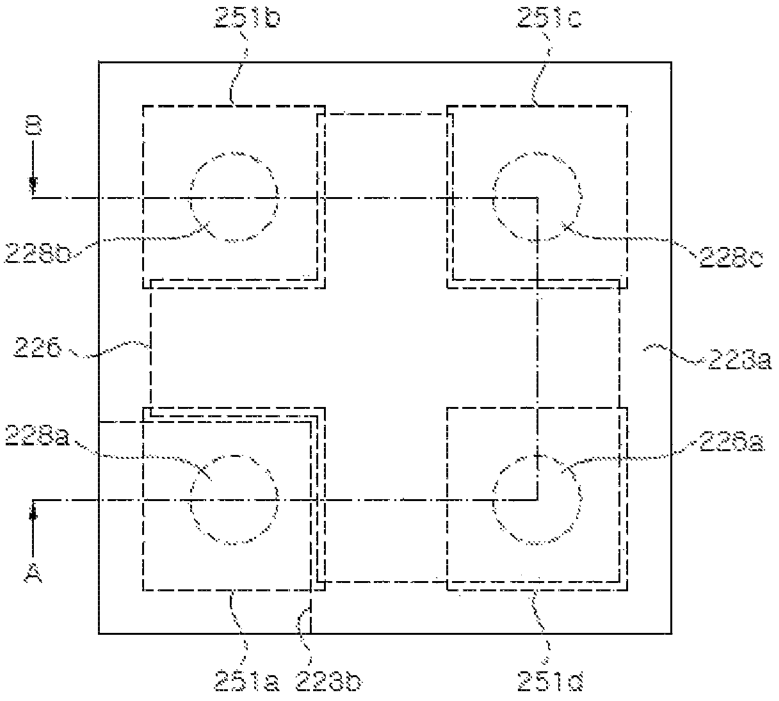
Figure 20B:
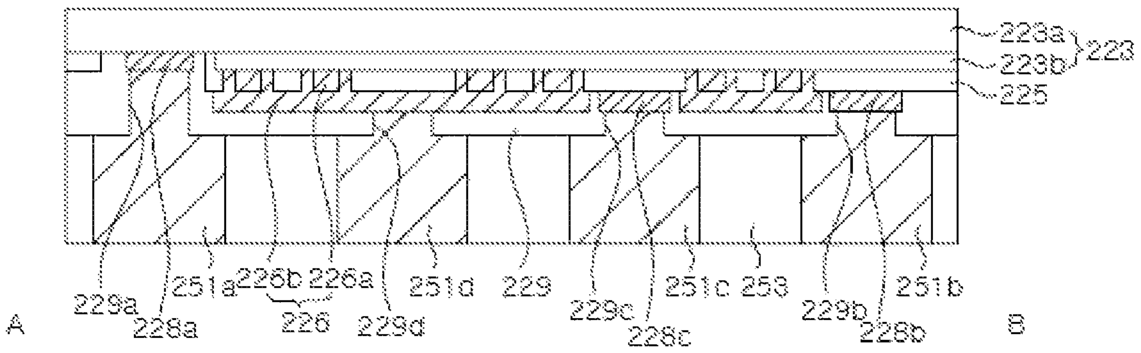

Referring to FIGS. 20A and 20B, the first substrate 221 is then removed from the first LED stack 223. FIG. 20B illustrates an inverted view of FIG. 19B. The bump pads 251*a*, 251*b*, 251*c*, and 251*d* and the filler 253 may function as a supporting structure, and the first substrate 221 may be removed from the first LED stack 223 through chemical etching or the like. Therefore, the first conductivity type semiconductor layer 223*a* is exposed. In order to improve light extraction efficiency, a surface of the exposed first conductivity type semiconductor layer 223*a* may be textured.

Figure 21A:
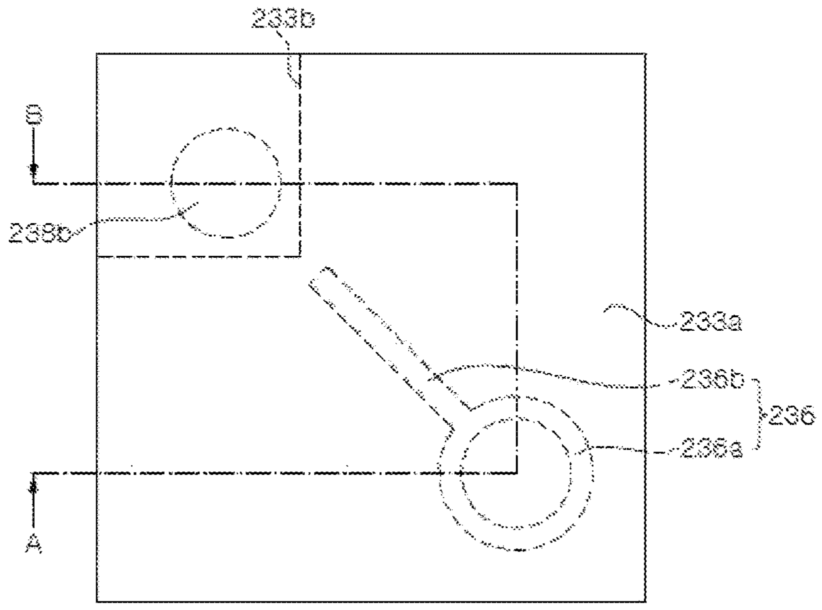
Figure 21B:
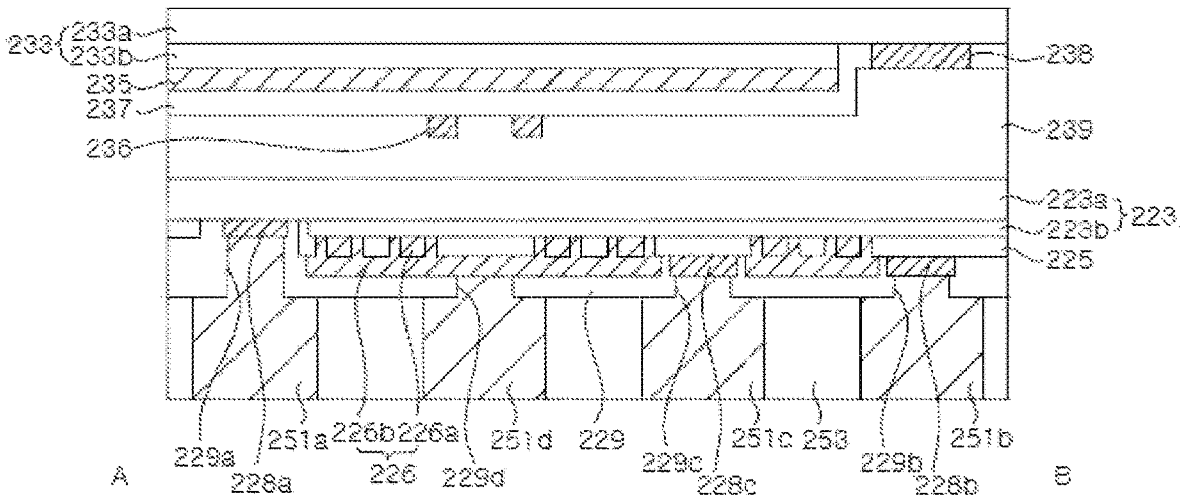

Referring to FIGS. 21A and 21B, the second LED stack 233 of FIGS. 17A and 17B is bonded onto the first LED stack 223. Bonding material layers are formed on the first LED stack 223 and the first color filter 237, respectively, and are bonded to each other to form the first bonding layer 239.

The second current spreading layer 236 and the bump pads 251*b* and 251*d* are bonded to each other to be aligned with each other. In particular, a central portion of the pad region 236*a* of the second current spreading layer 236 may be aligned to be positioned on the first reflective electrode 226, and the second ohmic electrode 238 may be aligned to be positioned on the connection pad 228*b*.

Then, the second substrate 231 is removed from the second LED stack 233 using a technology such as a laser lift-off technology, a chemical lift-off technology, or the like. Therefore, the first conductivity type semiconductor layer 233*a* of the second LED stack 233 is exposed from the above. In some exemplary embodiments, a surface of the exposed first conductivity type semiconductor layer 233*a* is textured to form a roughened surface.

Figure 22A:
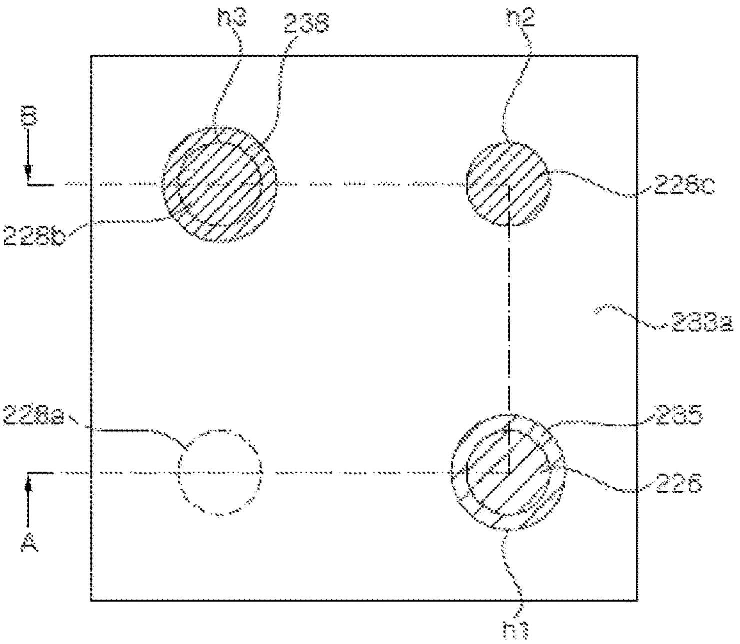
Figure 22B:
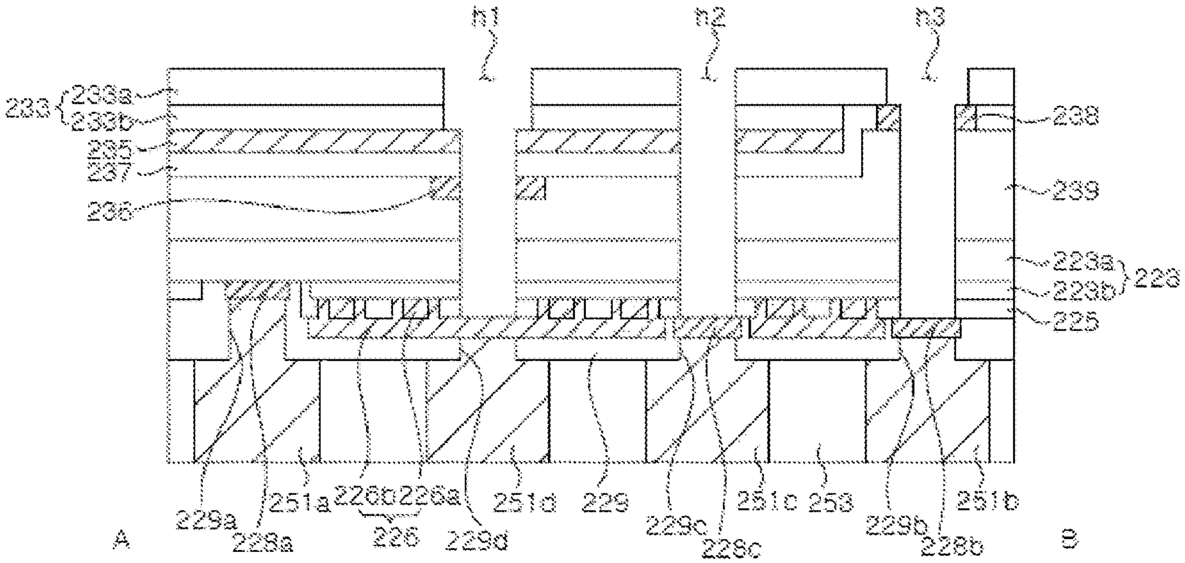

Referring to FIGS. 22A and 22B, holes h1, h2, and h3 penetrating through the second LED stack 233 and the first LED stack 223 are then formed. The hole h1 and the hole h2 may sequentially penetrate through the second LED stack 233, the second transparent electrode 235, the first color filter 237, the first bonding layer 239, the first LED stack 223, and the insulating layer 225. When the hollow portion is not formed in the second current spreading layer 236, the second current spreading layer 236 is patterned when the hole h1 is formed, thereby forming the hollow portion. Meanwhile, the hole h1 may partially expose the upper surface of the second transparent electrode 235, and exposes the upper surface of the first reflective electrode 226. Although FIGS. 22A and 22B show that the upper surface of the second transparent electrode 235 is exposed by the hole h1, the upper surface of the second current spreading layer 236 may also be exposed. The hole h2 exposes the upper surface of the connection pad 228*c*.

The hole h3 may penetrate through the first conductivity type semiconductor layer 233*a* to expose the upper surface of the second ohmic electrode 238, and may penetrate through the first bonding layer 239, the first LED stack 223, and the insulating layer 225 to expose the connection pad 228*b*.

Figure 23A:
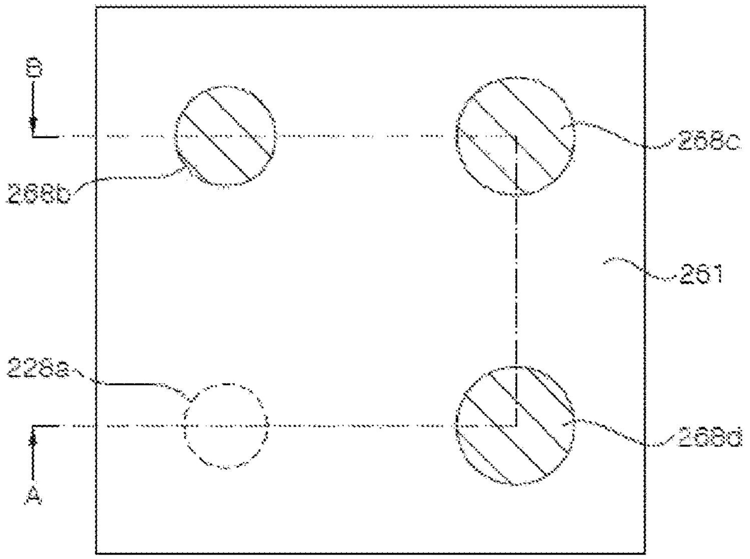
Figure 23B:
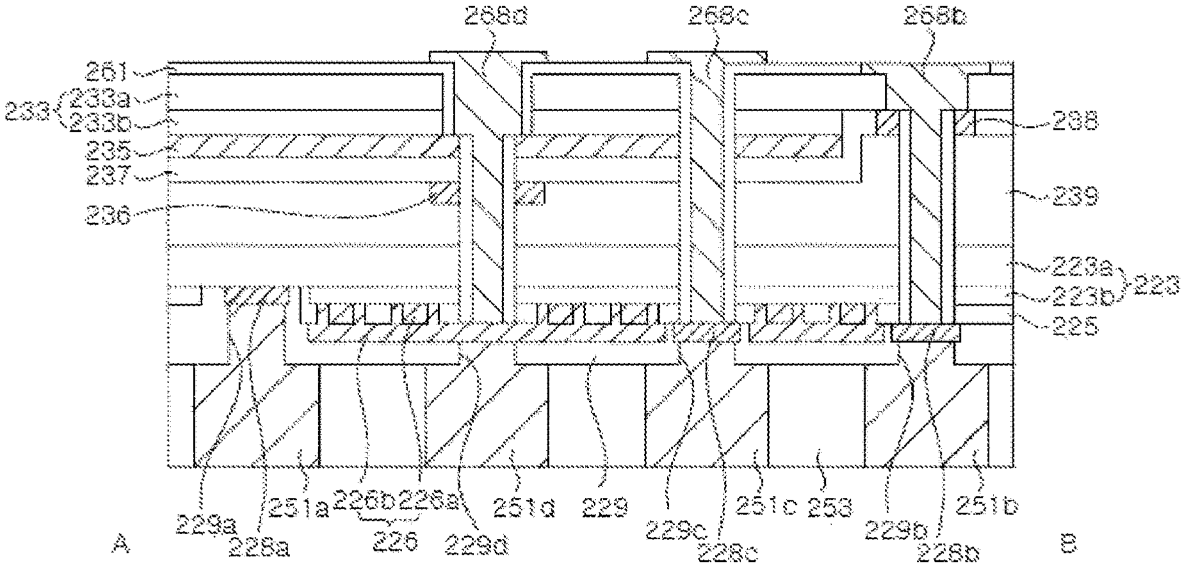

Referring to FIGS. 23A and 23B, the insulating layer 261 may be formed to cover side walls of the holes h1, h2, and h3. The insulating layer 261 may also cover the upper surface of the second LED stack 233.

Next, the connectors 268*b*, 268*c*, and 268*d* are formed. The connector 268*b* connects the exposed second ohmic electrode 238 to the connection pad 228*b*. The connector 268*b* connects the second ohmic electrode 238 and the connection pad 228*b*. Furthermore, the connector 268*b* may be connected to the first conductivity type semiconductor layer 233*a*. The connector 268*b* is electrically insulated from the first LED stack 223 by the insulating layer 261.

The connector 268*c* is connected to the exposed connection pad 228*c* through the hole h2. The connector 268*c* is electrically insulated from both the second LED stack 233 and the first LED stack 223 by the insulating layer 261. The connector 268*c* may have a pad region on the second LED stack 233.

The connector 268*d* is connected to the second transparent electrode 235 exposed through the hole h3 and the first reflective electrode 226, and electrically connects the second transparent electrode 235 and the first reflective electrode 226 to each other. The connector 268*d* is insulated from the first conductivity type semiconductor layer 233*a* of the second LED stack 233 and the first conductivity type semiconductor layer 223*a* of the first LED stack 223. In another exemplary embodiment, the connector 268*d* may be connected to the second current spreading layer 236. The connector 268*d* may also include the pad region.

Figure 24A:
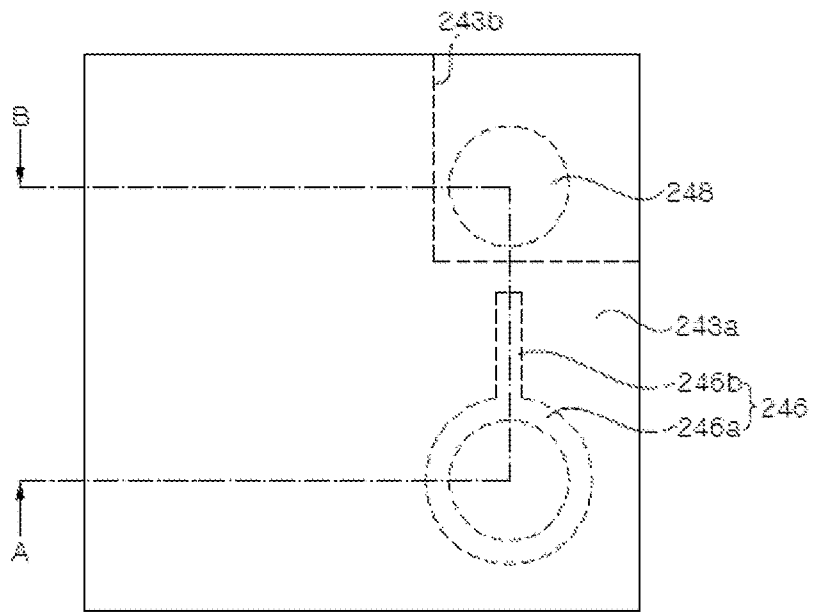
Figure 24B:
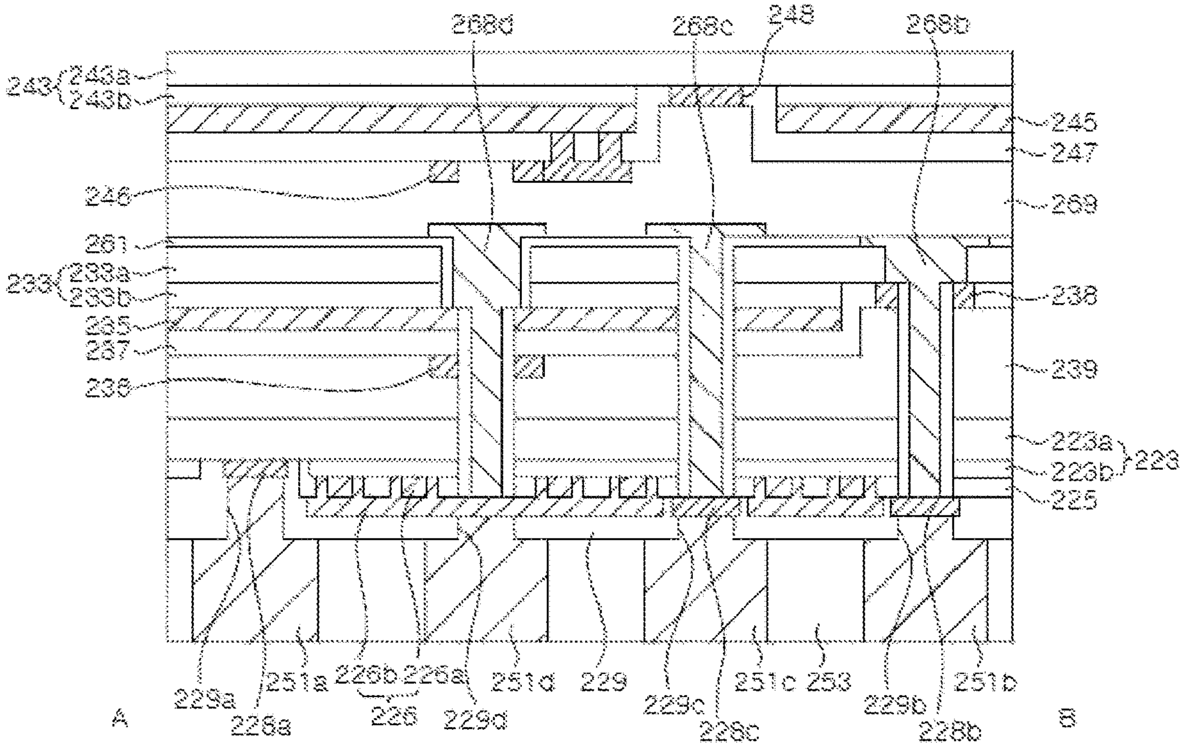

Referring to FIGS. 24A and 24B, the third LED stack 243 of FIGS. 18A and 18B is bonded onto the second LED stack 233.

A bonding material layer may be formed on the second LED stack 233 on which is the connectors 268*b*, 268*c*, and 268*d* are formed, and another bonding material layer may be formed on the second color filter 247. The second bonding layer 269 may be formed by bonding the bonding material layers to each other. Furthermore, the third substrate 241 may be removed from the third LED stack 243 using a technology, such as a laser lift-off technology, a chemical lift-off technology, or others. Therefore, the first conductivity type semiconductor layer 243*a* may be exposed, and a surface roughened by a surface texturing may be formed on a surface of the exposed first conductivity type semiconductor layer 243*a*.

The second bonding layer 269 may also be in contact with the upper surface of the second LED stack 233, but may also be in contact with the insulating layer 261 as illustrated in the drawing.

Figure 25A:
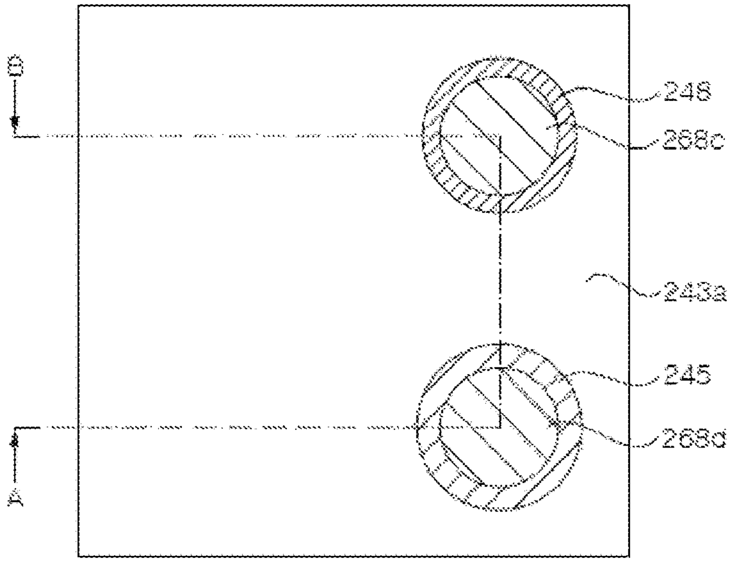
Figure 25B:
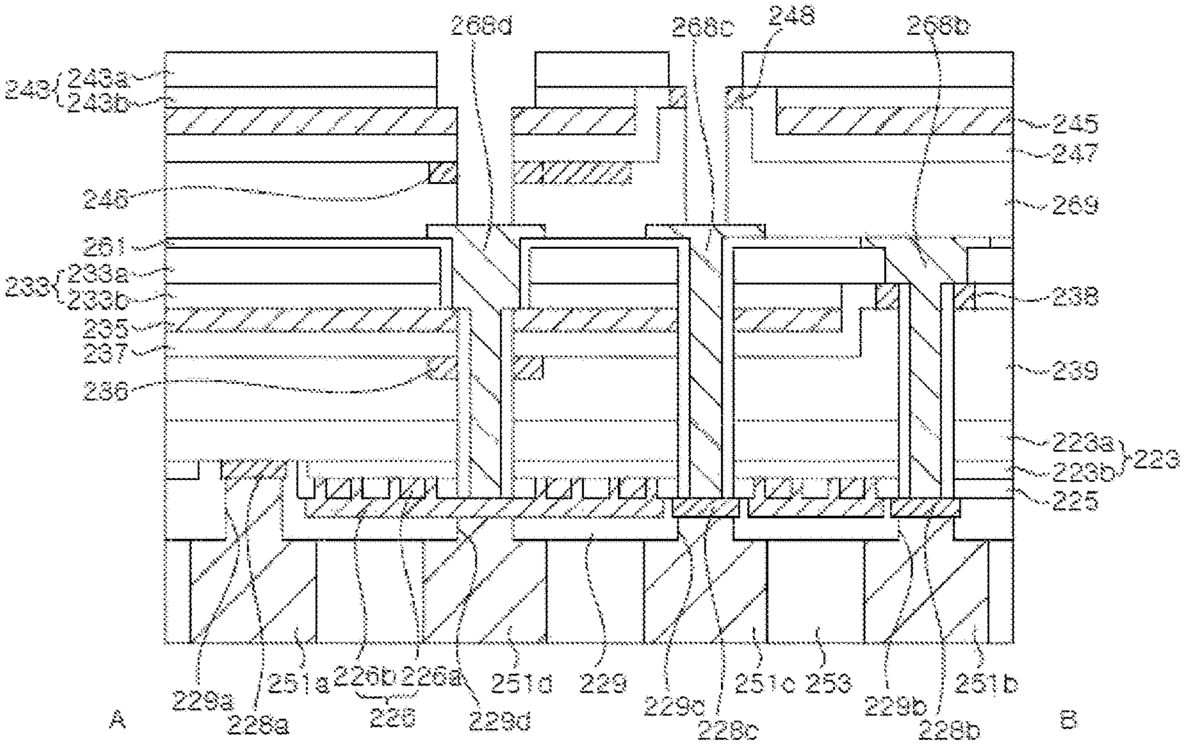

Referring to FIGS. 25A and 25B, holes penetrating through the third LED stack 243 are formed to expose the connectors 268*c* and 268*d*. The holes penetrate through the second bonding layer 269. The upper surface of the third ohmic electrode 248 is exposed by the hole exposing the connector 268*c*, and the upper surface of the third transparent electrode 245 is partially exposed by the hole exposing the connector 268*d*. Although the upper surface of the third transparent electrode 245 is described as being exposed by the hole exposing the connector 268*d*, in some exemplary embodiments, the third transparent electrode 245 and the second color filter 247 may be removed and the upper surface of the third current spreading layer 246 may also be exposed.

Figure 26A:
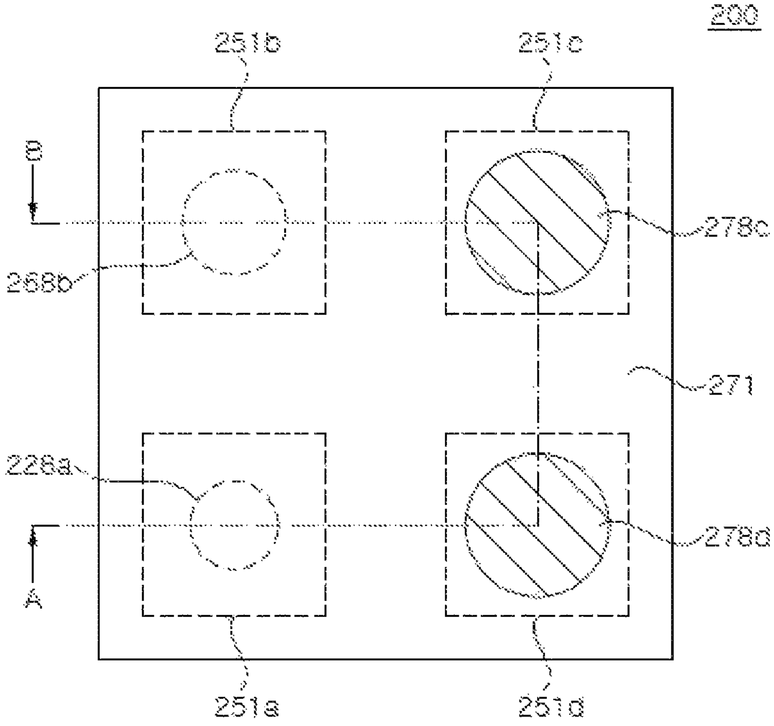
Figure 26B:
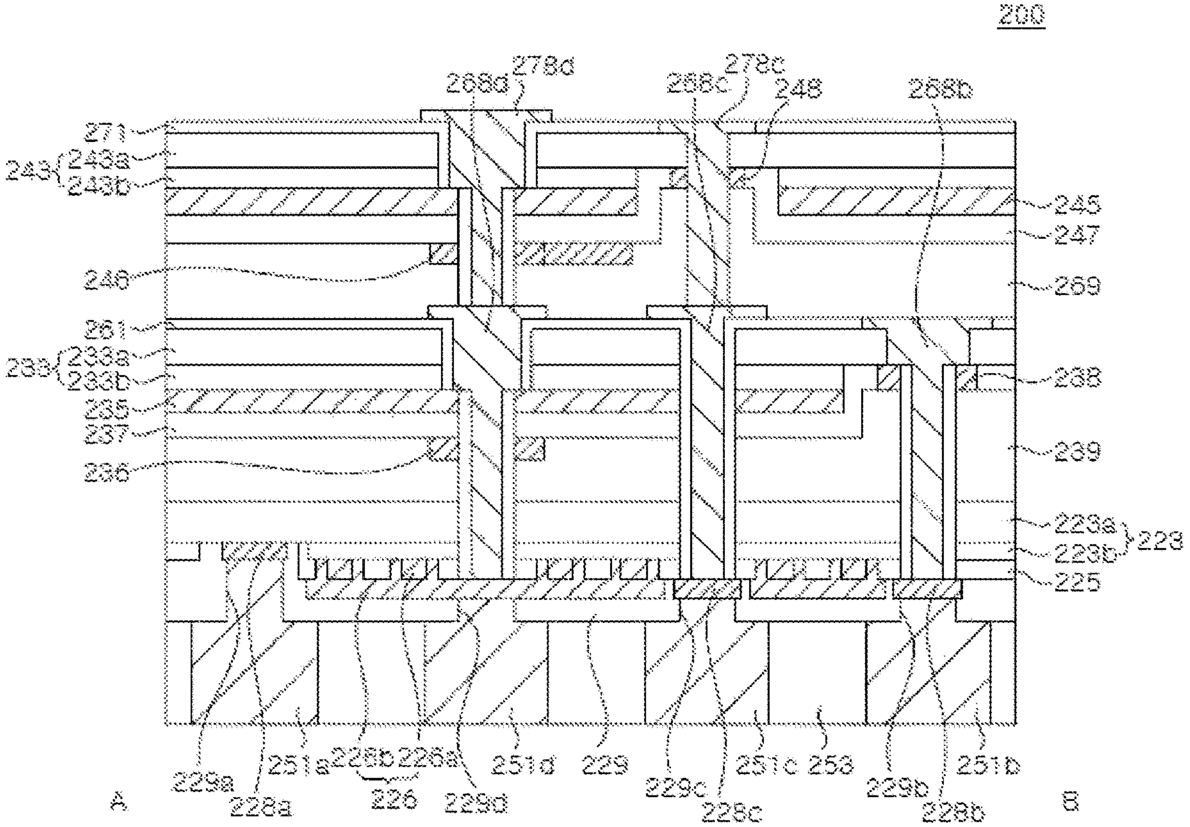

Referring to FIGS. 26A and 26B, the insulating layer 271 may be formed to cover the side walls of the holes. The insulating layer 271 may also cover the upper surface of the third LED stack 243.

Next, the connectors 278*c* and 278*d* are formed. The connector 2278*c* connects the exposed third ohmic electrode 248 to the connector 268*c*. The connector 2278*c* connects the third ohmic electrode 248 and the connector 268*c* to each other. Furthermore, the connector 2278*c* may be connected to the first conductivity type semiconductor layer 243*a*.

The connector 278*d* may be connected to the third transparent electrode 245 and the connector 268*d*. Therefore, the second conductivity type semiconductor layer 243*b* of the third LED stack 243 is electrically connected to the common bump pad 251*d*. The connector 278*d* is electrically insulated from the first conductivity type semiconductor layer 243*a* by the insulating layer 271. The connector 278*d* may pass through the hollow portion of the third current spreading layer 246. In another exemplary embodiment, the upper surface of the third current spreading layer 246 may be exposed, and the connector 278*d* may be connected to the upper surface of the third current spreading layer 246.

Then, the light emitting device 200 is completed by dividing the substrate into light emitting device regions. As illustrated in FIG. 26A, the bump pads 251*a*, 251*b*, 251*c*, and 251*d* may be disposed at four corners of each light emitting device 200. In addition, the bump pads 251*a*, 251*b*, 251*c*, and 251*d* may have substantially a rectangular shape, but the inventive concepts are not limited thereto. In some exemplary embodiments, an insulating layer covering a side surface of each light emitting device may be additionally formed. The insulating layer may include a distributed Bragg reflector, a transparent insulating film, or a reflective metal layer or an organic reflective layer of a multilayer structure formed thereon to reflect light, or may include a light absorbing layer such as a black epoxy to block the light. In this manner, light directed to the side surface from the first, second, and third LED stacks 223, 233, and 243 may be reflected or absorbed to prevent light interference between the pixels. In addition, light efficiency may be improved by reflecting light directed to the side surface using the reflective layer, and alternatively, a contrast ratio of the display apparatus may be improved by blocking the light using the light absorbing layer.

According to exemplary embodiments, alight emitting device includes the first, second, and third LED stacks 223, 233, and 243, in which anodes thereof are electrically connected in common, and cathodes thereof are independently connected. However, the inventive concepts are not limited thereto, and the anodes of the first, second, and third LED stacks 223, 233, and 243 may be independently connected to the bump pads, and the cathodes thereof may be electrically connected in common.

The light emitting device 200 may include the first, second, and third LED stacks 223, 233, and 243 to emit red, green, and blue light, and may thus be used as a single pixel in a display apparatus. As described with reference to FIG. 14, a display apparatus may be provided by arranging a plurality of light emitting devices 200 on the circuit board 201. Since the light emitting device 200 includes the first, second, and third LED stacks 223, 233, and 243, an area of the subpixel in one pixel may be increased. Further, the first, second, and third LED stacks 223, 233, and 243 may be mounted by mounting one light emitting device 200, thereby reducing the number of mounting processes.

Meanwhile, as described with reference to FIG. 14, the light emitting devices 200 mounted on the circuit board 201 may be driven by a passive matrix method or an active matrix method.

Figure 27A:
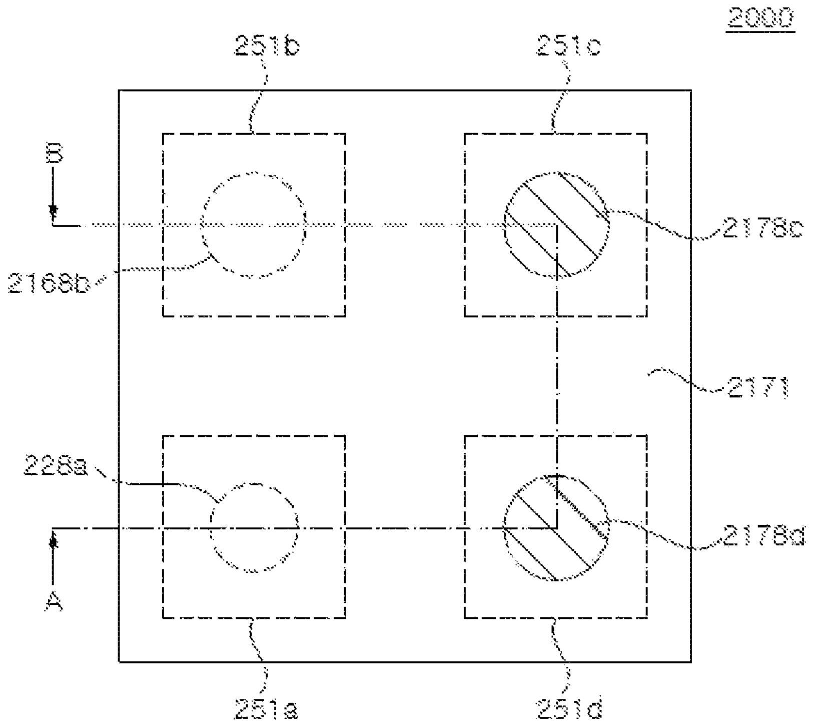
FIG. 27A is a schematic plan view of a light emitting device for a display according to another exemplary embodiment.
Figure 27B:
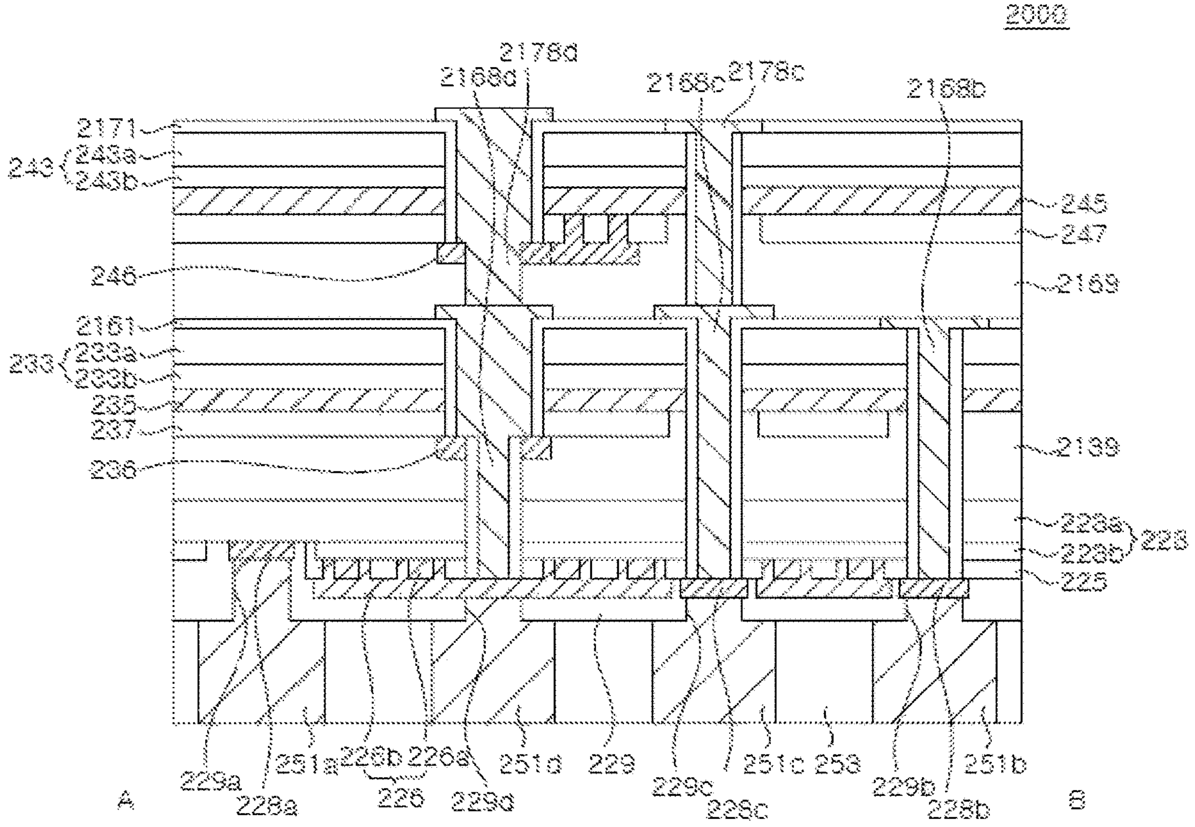
FIG. 27B is a schematic cross-sectional view taken along line A-B of FIG. 27A.

FIGS. 27A and 27B are schematic plan view and cross-sectional view of a light emitting device 2000 according to another exemplary embodiment.

Referring to FIGS. 27A and 27B, the light emitting device 2000 according to an exemplary embodiment may include the bump pads 251*a*, 251*b*, 251*c*, and 251*d*, the filler 253, the first LED stack 223, the second LED stack 233, the third LED stack 243, insulating layers 225, 229, 2161, and 2171, the first reflective electrode 226, the second transparent electrode 235, the third transparent electrode 245, the first ohmic electrode 228*a*, the connection pads 228*b* and 228*c*, the second current spreading layer 236, the third current spreading layer 246, the first color filter 237, the second color filter 247, a first bonding layer 2139, a second bonding layer 2169, and connectors 2168*b*, 2168*c*, 2168*d*, 2178*c*, and 2178*d*.

The light emitting device 2000 according to the illustrated exemplary embodiment is substantially similar to the light emitting device 200 described above, except that the second ohmic electrode 238 and the third ohmic electrode 248 are omitted. As such, detailed descriptions of the same or similar items to those of the light emitting device 200 will be omitted to avoid redundancy.

The second LED stack 233 includes the first conductivity type semiconductor layer 233*a*, an active layer, and the second conductivity type semiconductor layer 233*b*. The second conductivity type semiconductor layer 233*b* may cover substantially the entire lower surface of the first conductivity type semiconductor layer 233*a*, and thus, the lower surface of the first conductivity type semiconductor layer 233*a* may not be exposed. The third LED stack 243 includes the first conductivity type semiconductor layer 243*a*, an active layer, and the second conductivity type semiconductor layer 243*b*. The second conductivity type semiconductor layer 243*b* may cover substantially the entire lower surface of the first conductivity type semiconductor layer 243*a*, and thus, the lower surface of the first conductivity type semiconductor layer 243*a* may not be exposed. As such, the second ohmic electrode 238 and the third ohmic electrode 248 of the light emitting device 200 are omitted in the light emitting device 2000.

The first color filter 237 may be patterned in advance, and the through hole for connecting the connectors to each other may be easily formed later. However, the inventive concepts are not limited thereto, and the through hole may penetrate through the first color filter 237.

The connector 2168*b* may penetrate through the first and second conductivity type semiconductor layers 233*a* and 233*b* of the second LED stack 233 and the second transparent electrode 235 to be connected to the connection pad 228*b*. The connector 2168*b* may be connected to the upper surface of the first conductivity type semiconductor layer 233*a*.

The connector 2168*c* is substantially similar to the connector 268*c* of FIG. 15B, but the first color filter 237 may be patterned in advance and thus, is not exposed to an inner wall of the hole where the connector 2168*c* is formed. However, the inventive concepts are not limited thereto, and the connector 2168*c* may be exposed to the inner wall of the hole.

The connector 2168*d* is connected to the second current spreading layer 236 and is connected to the first reflective electrode 226. The connector 2168*d* may be spaced apart from the second transparent electrode 235, and may be electrically connected to the second transparent electrode 235 through the second current spreading layer 236. The connector 2168*d* may include a pad region on the second LED stack 233. The pad region may be disposed in the hole penetrating through the second LED stack 233.

The insulating layer 2161 insulates the connector 2168*b* from the second conductivity type semiconductor layer 233*b* of the second LED stack 233 and the second transparent electrode 235. The insulating layer 2161 electrically insulates the connector 2168*c* from the first and second LED stacks 223 and 233, and also insulates the connector 2168*d* from the first conductivity type semiconductor layer 223*a* of the first LED stack 223.

The first bonding layer 2139 may bond the first LED stack 223 and the first color filter 237 to each other, and may also be in contact with a portion of the second transparent electrode 235. In addition, the second bonding layer 2169 may be in contact with the second color filter 247 and the third transparent electrode 245.

The connector 2178*c* is connected to the first conductivity type semiconductor layer 243*a* of the third LED stack 243, and also is connected to the connector 2168*c*. The connector 2178*c* may be connected to the upper surface of the first conductivity type semiconductor layer 243*a*. The connector 2178*c* is insulated from the second conductivity type semiconductor layer 243*b* and the third transparent electrode 245 by the insulating layer 2171.

The connector 2178*d* connects the third current spreading layer 246 and the connector 168 to each other. An upper surface of the connector 2178*d* may be positioned on the third LED stack 243. However, the position of the upper surface of the connector 2178*d* is not necessarily limited thereto, and the upper surface of the connector 2178*d* may be positioned in the hole formed in the third LED stack 243.

The insulating layer 2171 may cover a side wall of the hole formed in the third LED stack 243, and insulates the connector 2178*c* from the second conductivity type semiconductor layer 243*b* and the third transparent electrode 245. In addition, the insulating layer 2171 may insulate the connector 2178*d* from the first conductivity type semiconductor layer 243*a*.

FIGS. 28A, 28B, 29A, 29B, 30A, 30B, 31A, 31B, 32A, 32B, 33A, 33B, 34A, and 34B are plan views and cross-sectional views illustrating a method of manufacturing a light emitting device 2000 according to an exemplary embodiment.

Figure 28A:
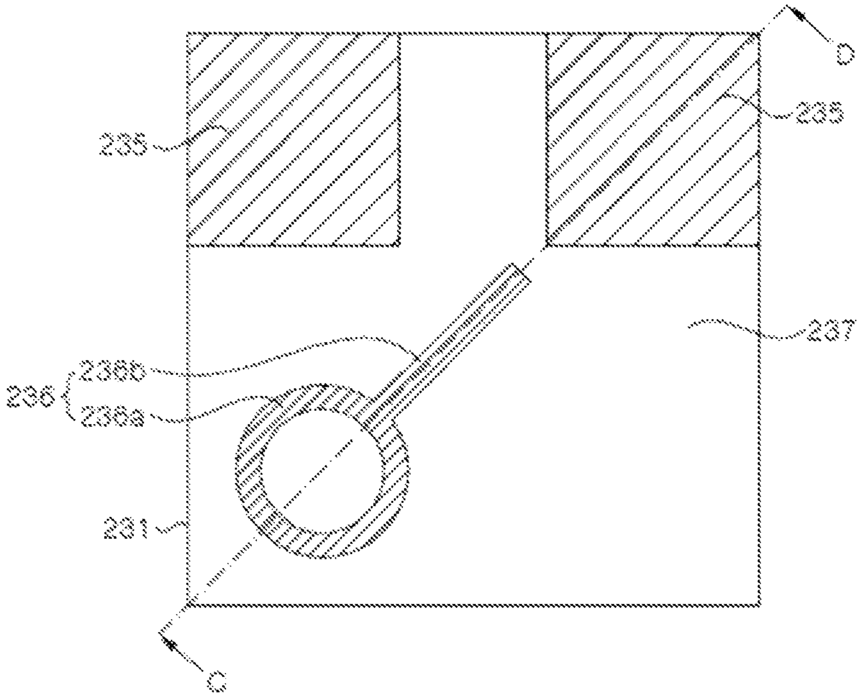
FIGS. 28A, 28B, 29A, 29B, 30A, 30B, 31A, 31B, 32A, 32B, 33A, 33B, 34A, and 34B are schematic plan views and cross-sectional views illustrating a method of manufacturing a light emitting device according to another exemplary embodiment.
Figure 28B:
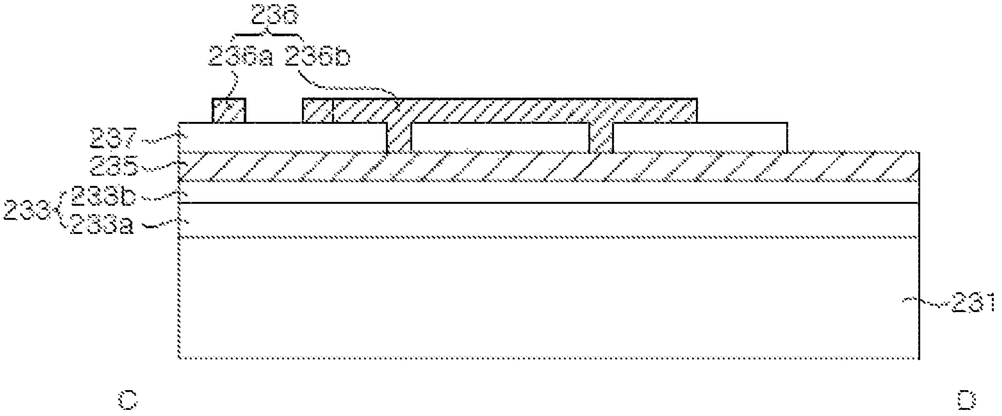

Referring to FIGS. 28A and 28B, the second LED stack 233 is grown on the second substrate 231, and the second transparent electrode 235 is formed on the second LED stack 233. According to the illustrated exemplary embodiment, the process of partially removing the second transparent electrode 235 and the second conductivity type semiconductor layer 233*b* described with reference to FIGS. 17A and 17B is omitted.

The first color filter 237 is formed on the second transparent electrode 235. Since the material forming the first color filter 237 is substantially the same as that described with reference to FIGS. 15A and 15B, detailed descriptions thereof will be omitted to avoid redundancy. Then, the first color filter 237 is patterned to expose the second transparent electrode 235. Regions exposing the second transparent electrode 235 may include regions to which the extension 236*b* is to be connected, and may also include regions in which the through holes are to be formed.

Then, the second current spreading layer 236 is formed on the first color filter 237. Since the second current spreading layer 236 is substantially the same as that described with reference to FIGS. 17A and 17B, detailed descriptions thereof will be omitted.

Figure 29A:
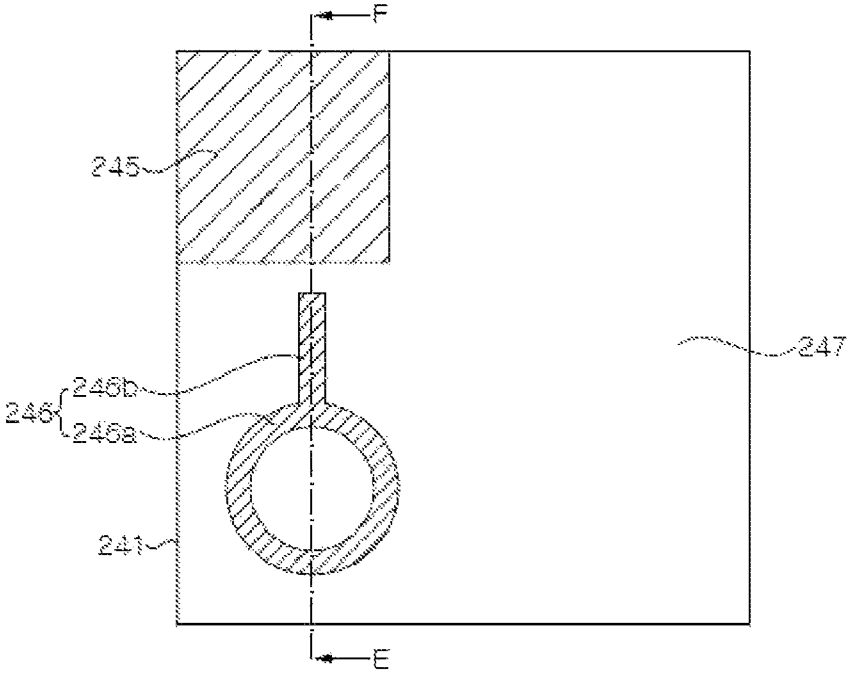
Figure 29B:
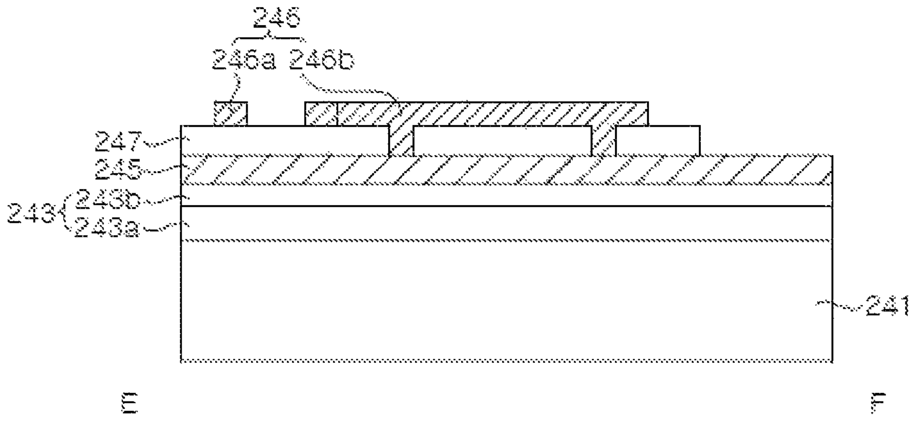

Referring to FIGS. 29A and 29B, the third LED stack 243 is grown on the third substrate 241, and the third transparent electrode 245 is formed on the third LED stack 243. According to the illustrated exemplary embodiment, the process of partially removing the third transparent electrode 245 and the second conductivity type semiconductor layer 243*b* described with reference to FIGS. 18A and 18B is omitted.

The second color filter 247 is formed on the third transparent electrode 245. Since the material forming the second color filter 247 is substantially the same as that described with reference to FIGS. 15A and 15B, detailed descriptions thereof will be omitted to avoid redundancy.

The second color filter 247 is patterned to expose the third transparent electrode 245. Regions exposing the third transparent electrode 245 may include regions to which the extension 246*b* is to be connected, and may also include regions in which the through holes are to be formed.

Then, the third current spreading layer 246 is formed on the second color filter 247. Since the third current spreading layer 246 is substantially the same as that described with reference to FIGS. 18A and 18B, detailed descriptions thereof will be omitted.

Figure 30A:
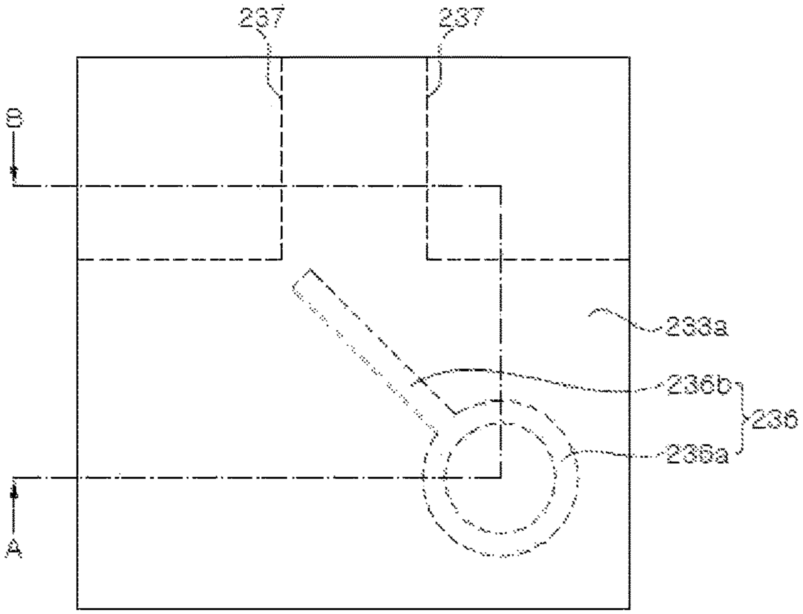
Figure 30B:
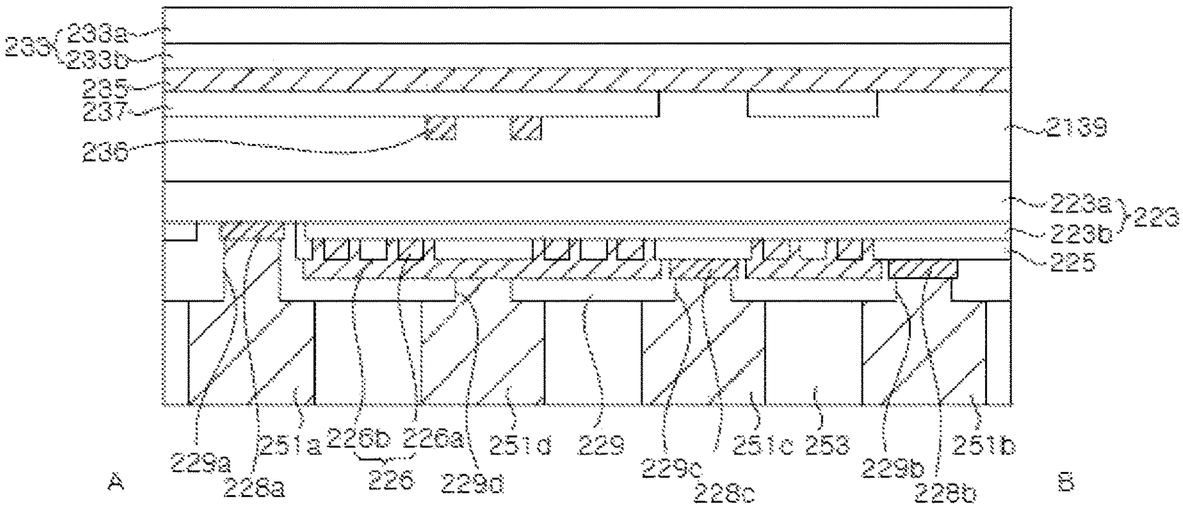

Referring to FIGS. 30A and 30B, the bump pads 251*a*, 251*b*, 251*c*, and 251*d* are formed on the first LED stack 223, and the substrate 221 is removed to expose the upper surface of the first LED stack 223. The surface roughened by the surface texturing may be formed on the exposed upper surface of the first LED stack 223.

Then, the second LED stack 233 of FIGS. 28A and 28B is bonded to the first LED stack 223 using the first bonding layer 2139, and the second substrate 231 is removed.

Figure 31A:
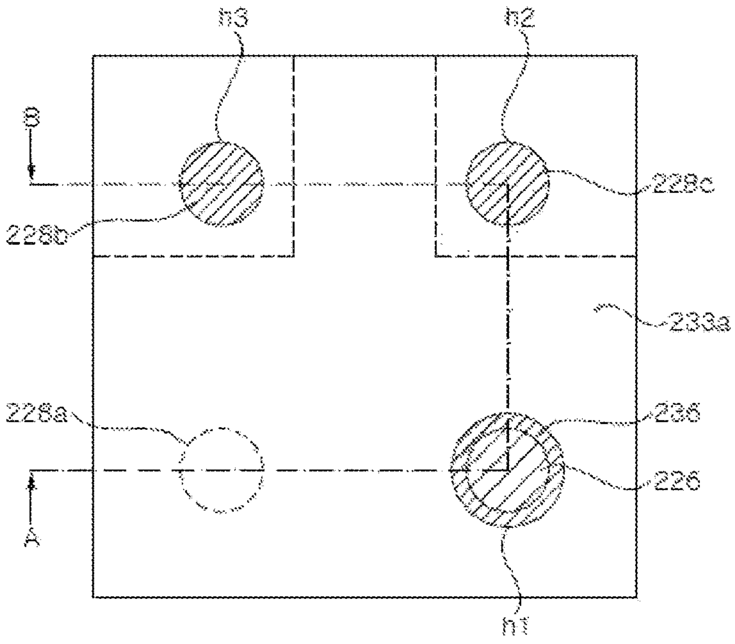
Figure 31B:
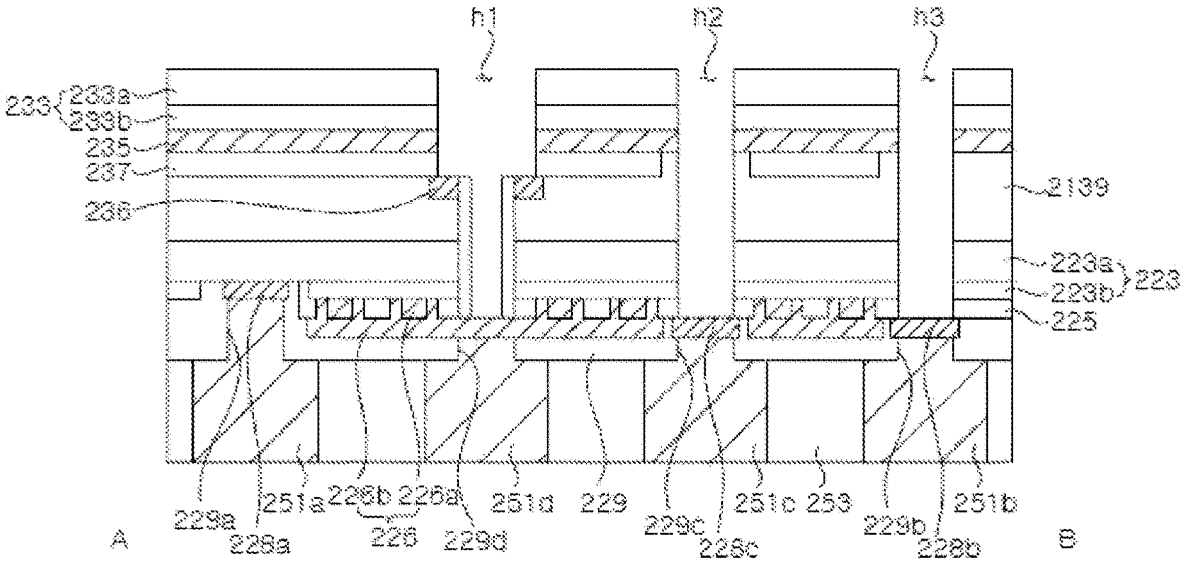

Referring to FIGS. 31A and 31B, the holes h1, h2, and h3 penetrating through the second LED stack 233 and the first LED stack 223 are formed. The holes h1, h2, and h3 also penetrate through the first bonding layer 2139.

The hole h1 exposes the second current spreading layer 236 and also exposes the first reflective layer 226. The second LED stack 233, the second transparent electrode 235, the first color filter 237, the first LED stack 223, the insulating layer 225, and the like may be exposed onto a side wall of the hole h1.

The hole h2 exposes the connection pad 228*c*. In addition, the second LED stack 233, the second transparent electrode 235, the first LED stack 223, and the insulating layer 225 may be exposed onto a side wall of the hole h2. The first color filter 237 may be spaced apart from the hole h2, but the inventive concepts are not limited thereto, and the first color filter 237 may be exposed onto the side wall of the hole h2.

The hole h3 exposes the connection pad 228*b*. In addition, the second LED stack 233, the second transparent electrode 235, the first LED stack 223, and the insulating layer 225 may be exposed onto a side wall of the hole. The first color filter 237 may be spaced apart from the hole h3, but the inventive concepts are not limited thereto, and the first color filter 237 may be exposed onto the side wall of the hole h3.

Figure 32A:
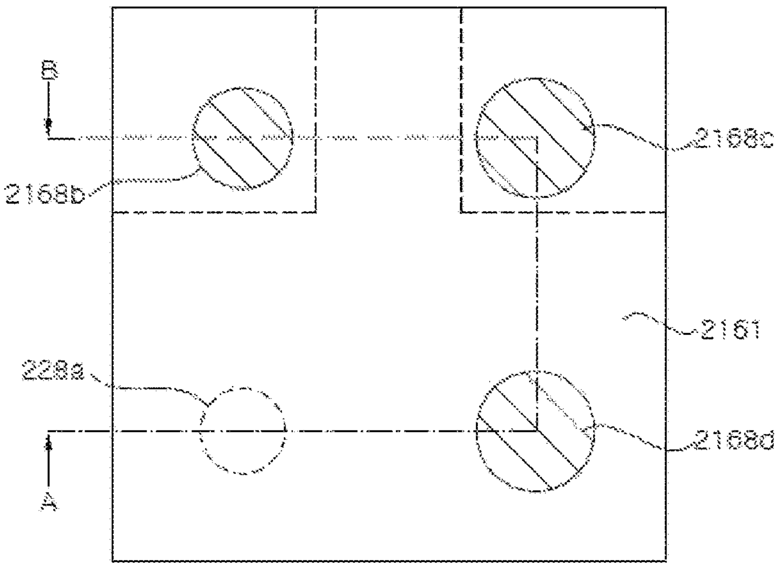
Figure 32B:
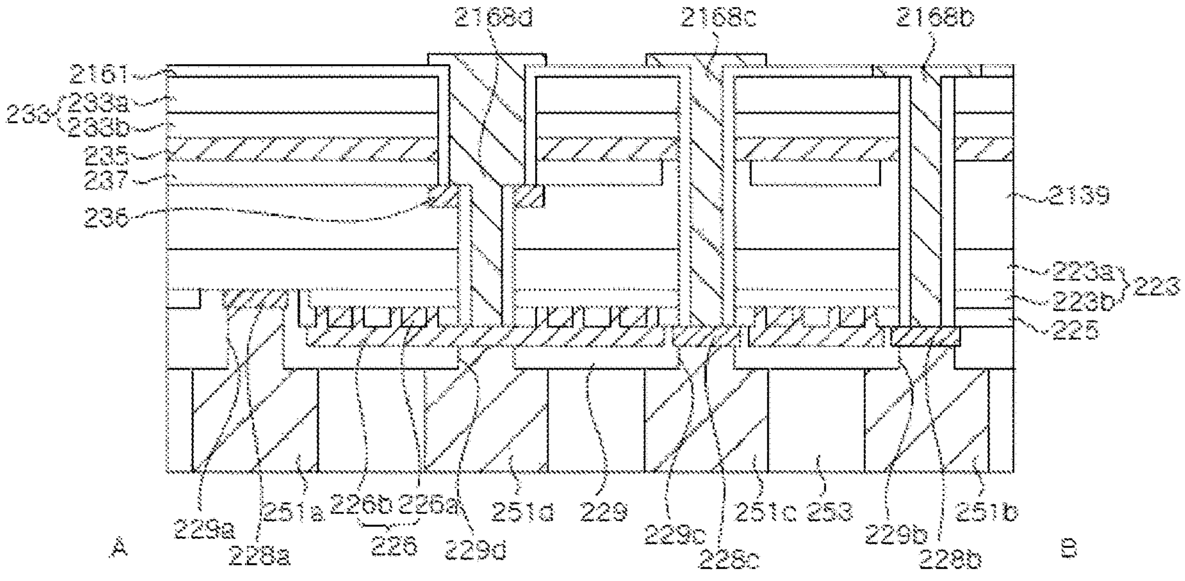

Referring to FIGS. 32A and 32B, the insulating layer 2161 covering the side walls of the holes h1, h2, and h3 is then formed. The insulating layer 2161 may also cover the upper surface of the second LED stack 233.

The insulating layer 2161 exposes the first reflective electrode 226 and the connection pads 228*b* and 228*c*, and further exposes the second current spreading layer 236.

The connectors 2168*d*, 2168*c*, and 2168*b* are formed in the holes h1, h2, and h3. The connector 2168*b* is connected to the first conductivity type semiconductor layer 233*a* and is connected to the connection pad 228*b*. The connector 2168*c* is insulated from the second LED stack 233 and is connected to the connection pad 228*c*. The connector 2168*d* is connected to the second current spreading layer 236 and is connected to the first reflective electrode 226.

Figure 33A:
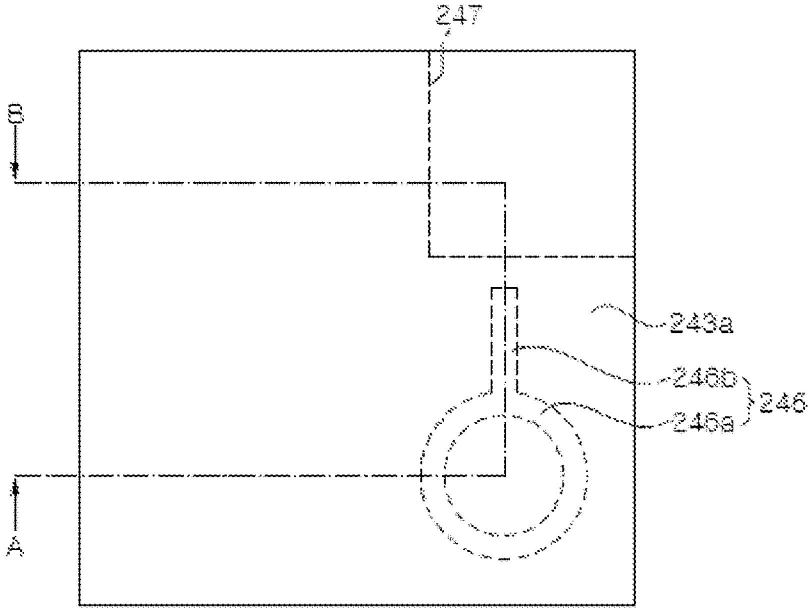
Figure 33B:
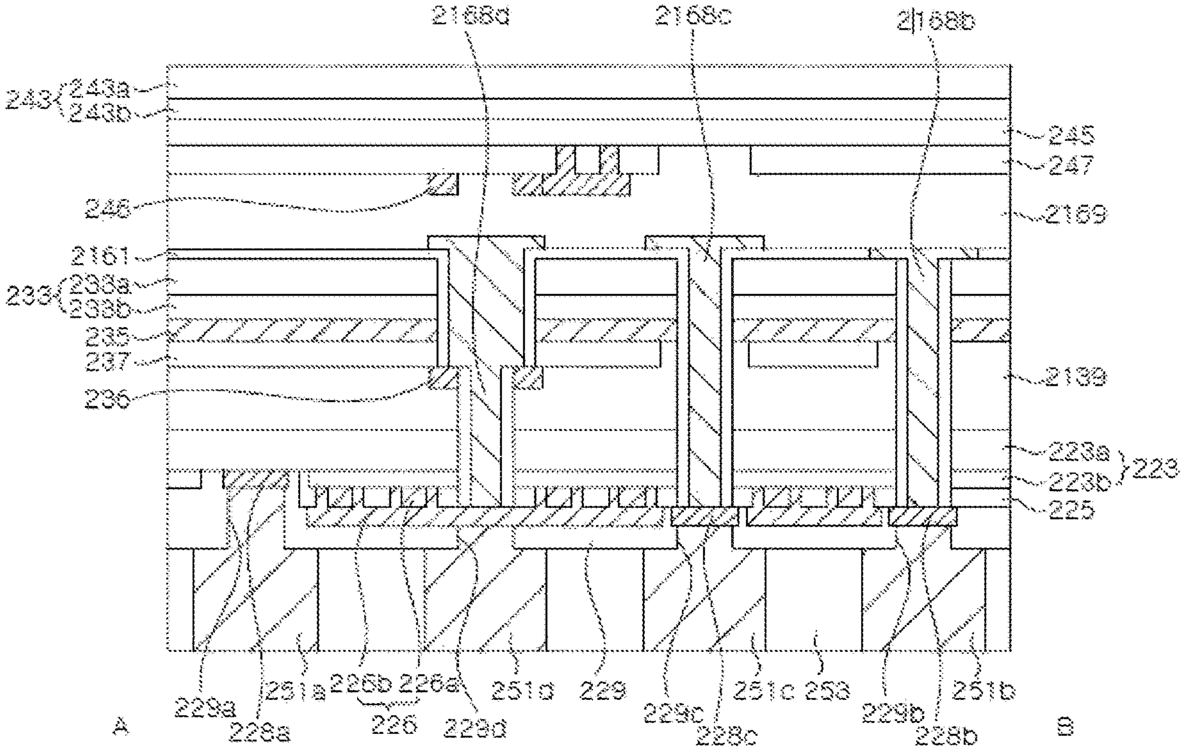

Then, referring to FIGS. 33A and 33B, the third LED stack 243 of FIGS. 29A and 29B is bonded onto the second LED stack 233, and the third substrate 241 is removed. The third LED stack 243 may be bonded onto the second LED stack 233 through the second bonding layer 2169.

Figure 34A:
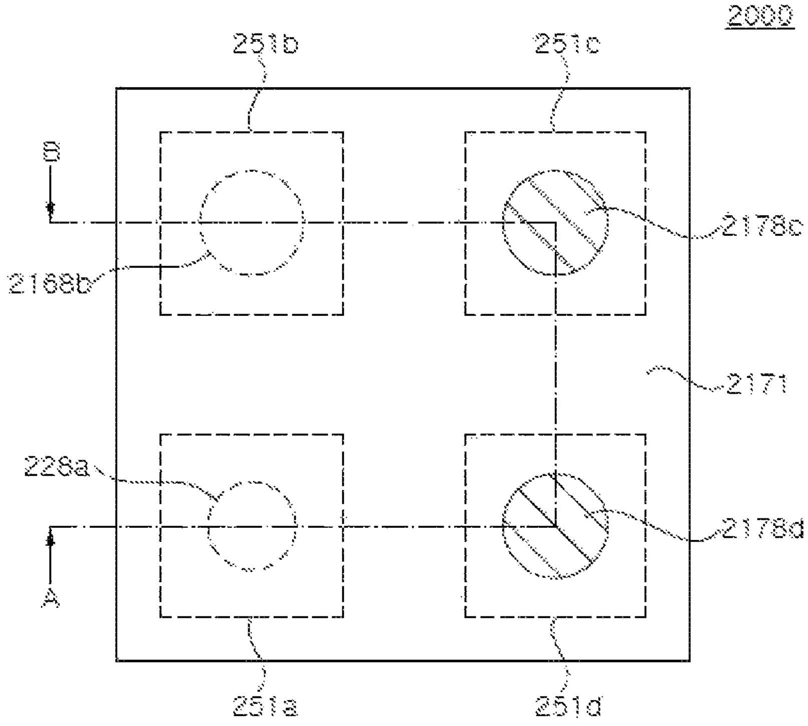
Figure 34B:
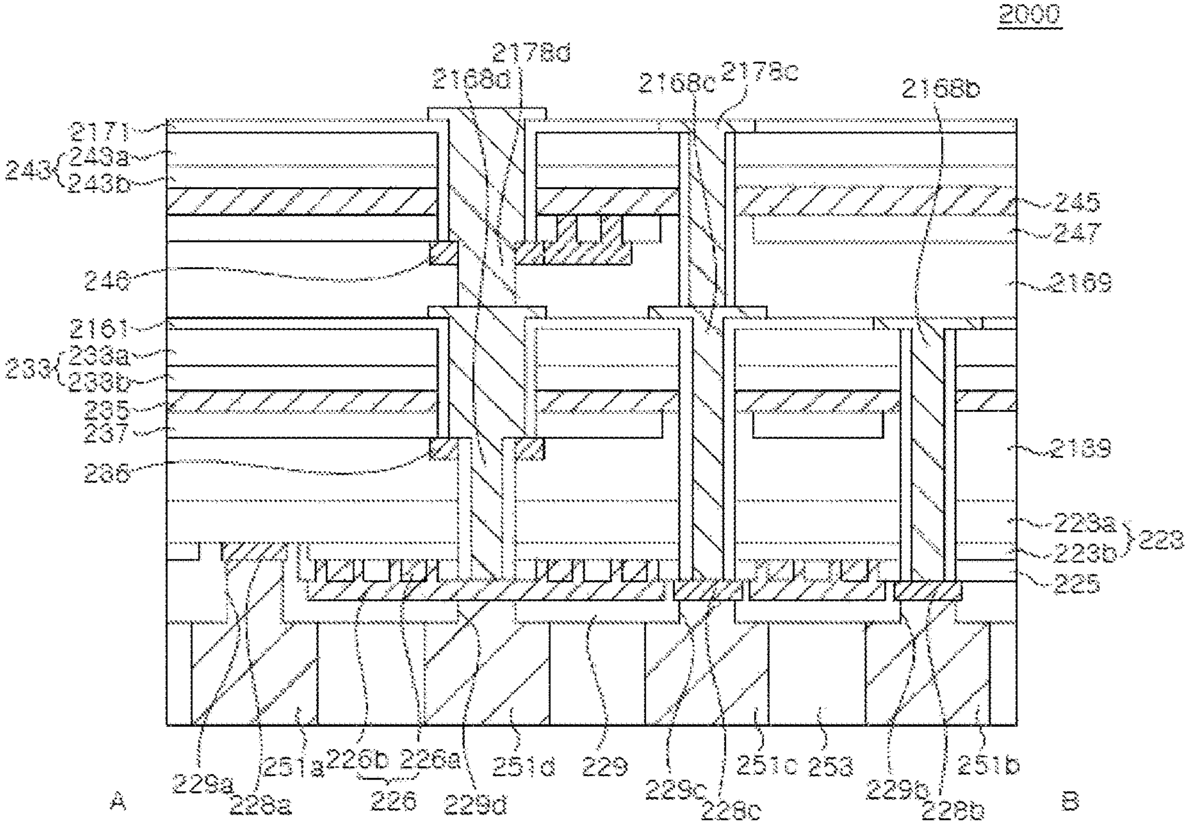

Referring to FIGS. 34A and 34B, holes penetrating through the third LED stack 243 to expose the connectors 2168*c* and 2168*d* are formed, the insulating layer 2171 covering the side walls of the holes are formed, and the connectors 2178*c* and 2178*d* are then formed.

The connector 2178*c* may be connected to the upper surface of the second conductivity type semiconductor layer 243*a*, and may also be connected to a pad region of the connector 2168*c*. The pad region of the connector 2168*c* may be wider than a width of the hole penetrating through the third LED stack 243. Meanwhile, the connector 2178*d* is connected to the upper surface of the third current spreading layer 246 and is also connected to the connector 2168*d*.

Then, the light emitting device 2000 is completed by dividing the substrate into light emitting device regions. As illustrated in FIG. 34A, the bump pads 251*a*, 251*b*, 251*c*, and 251*d* may be disposed at four corners of each light emitting device 2000. In addition, the bump pads 251*a*, 251*b*, 251*c*, and 251*d* may have substantially a rectangular shape, but are not necessarily limited thereto. In some exemplary embodiments, an insulating layer covering a side surface of each light emitting device may be additionally formed, and the insulating layer may include the reflective layer reflecting light or the absorbing layer absorbing light as described above. Therefore, light directed to the side surface from the first, second, and third LED stacks 223, 233, and 243 may be reflected or absorbed to block light interference between the pixels, and light efficiency of the light emitting device may be improved or the contrast ratio of the display apparatus may be improved.

Meanwhile, the processes of forming the through holes and forming the connectors are described as being performed whenever the second LED stack 233 and the third LED stack 243 are bonded to each other. However, the processes for connecting the connectors may also be performed after both the second LED stack 233 and the third LED stack 243 are bonded. In addition, the connector is described as being formed using the through hole, but the inventive concepts are not limited thereto. For example, the side surface of the light emitting device may be etched and the connector may be formed along the side surface of the light emitting device.

Figure 35A:
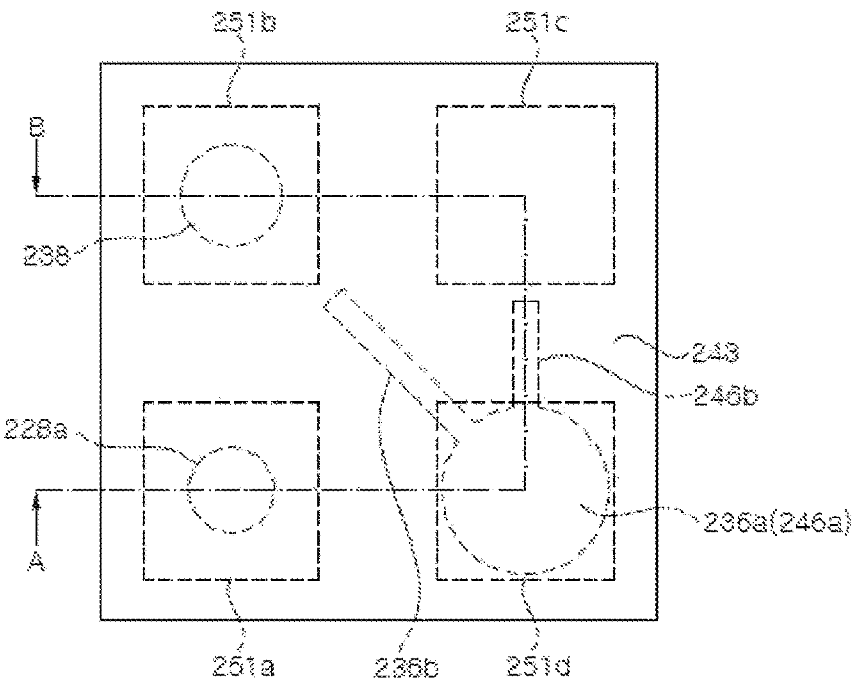
FIG. 35A is a plan view of a light emitting diode stack structure according to another exemplary embodiment.
Figure 35B:
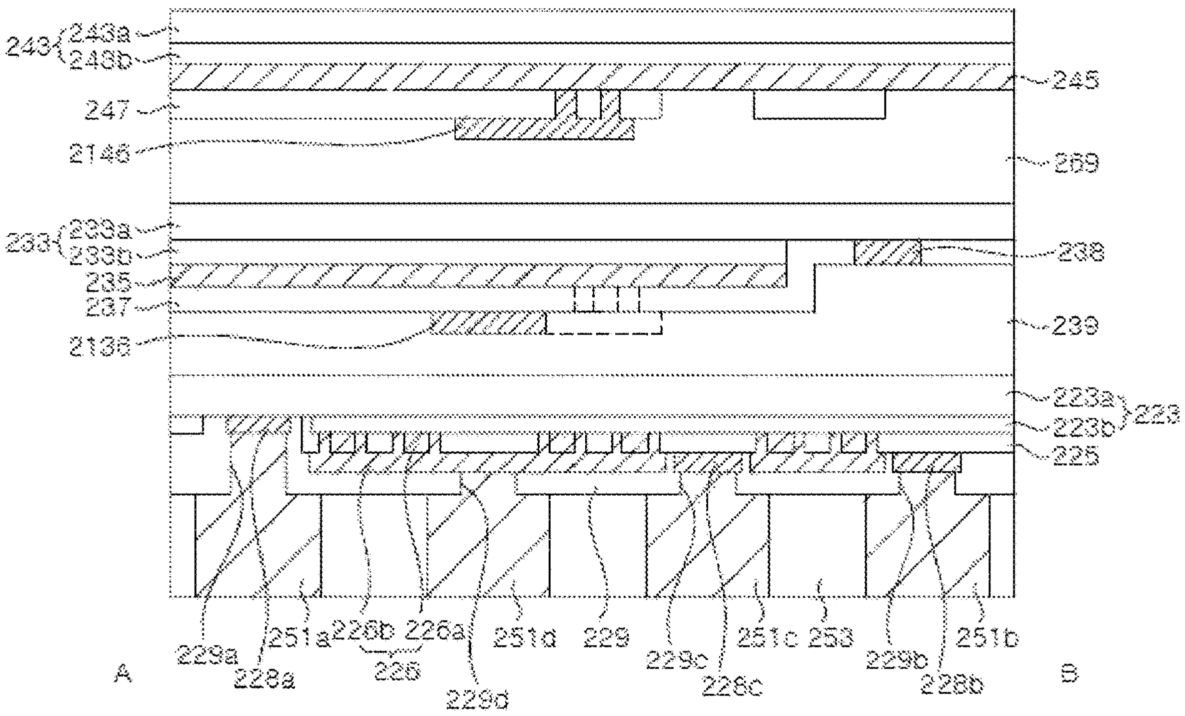
FIG. 35B is a schematic cross-sectional view taken along line A-B of FIG. 35A.

FIGS. 35A and 35B are a plan view and a cross-sectional view illustrating a light emitting diode stack structure according to another exemplary embodiment. A light emitting diode stack structure according to an exemplary embodiment includes the second LED stack 233 and the third LED stack 243 that are bonded, which may be used to form a light emitting device 2001 shown in FIGS. 36A and 36B.

Referring to FIGS. 35A and 35B, the light emitting diode stack structure may include the bump pads 251*a*, 251*b*, 251*c*, and 251*d*, the filler 253, the first LED stack 223, the second LED stack 233, the third LED stack 243, the insulating layers 225 and 229, the first reflective electrode 226, the second transparent electrode 235, the third transparent electrode 245, the first ohmic electrode 228*a*, the second ohmic electrode 238, the connection pads 228*b* and 228*c*, a second current spreading layer 2136, a third current spreading layer 2146, the first color filter 237, the second color filter 247, the first bonding layer 239, and the second bonding layer 269. Although FIG. 35A shows only one light emitting device region, a plurality of light emitting device regions may be continuously connected to each other.

The structure from the bump pads 251*a*, 251*b*, 251*c* and 251*d* and the filler 253 to the second LED stack 233 is substantially the same as the structure of FIGS. 21A and 21B, and thus, detailed descriptions thereof will be omitted.

However, while the second current spreading layer 236 of FIGS. 21A and 21B has the hollow portion in the pad region 236*a*, the second current spreading layer 2136 according to the illustrated exemplary embodiment may obviate the need for the hollow portion.

In addition, the second ohmic electrode 238 is illustrated as being formed on some regions of the first conductivity type semiconductor layer 233*a*, but in some exemplary embodiments, the bonding may also be performed when the second ohmic electrode 238 is omitted, as described with reference to FIGS. 30A and 30B.

Meanwhile, referring back to FIGS. 21A to 22B, the second LED stack 233 is bonded onto the first LED stack 223 and the through holes h1, h2, and h3 are then formed. However, the process of forming the through holes is omitted in the illustrated exemplary embodiment, and the third LED stack 243 is bonded onto the second LED stack 233 using the second bonding layer 269.

The third LED stack 243, the second color filter, and the third current spreading layer 2146 according to the illustrated exemplary embodiment may be manufactured by the method described with reference to the FIGS. 29A and 29B, and after the third LED stack 243 is bonded, the third substrate 241 is removed. However, the third current spreading layer 2146 may not require the hollow portion unlike the third current spreading layer 246 shown in FIG. 24A.

In addition, the third LED stack 243 is illustrated as being bonded onto the second LED stack 233 when the third ohmic electrode 248 is omitted on the first conductivity type semiconductor layer 243*a*, but the inventive concepts are not limited thereto. For example, as described with reference to FIGS. 18A and 18B, a portion of the first conductivity type semiconductor layer 243*a* may be exposed, the third ohmic electrode 248 may be formed on the exposed first conductivity type semiconductor layer 243*a*, and the third LED stack 243 may be bonded onto the second LED stack 233 when the third ohmic electrode 248 is formed.

Therefore, the light emitting diode stack structure as shown in FIG. 35B may be provided to form the light emitting device 2001.

Figure 36A:
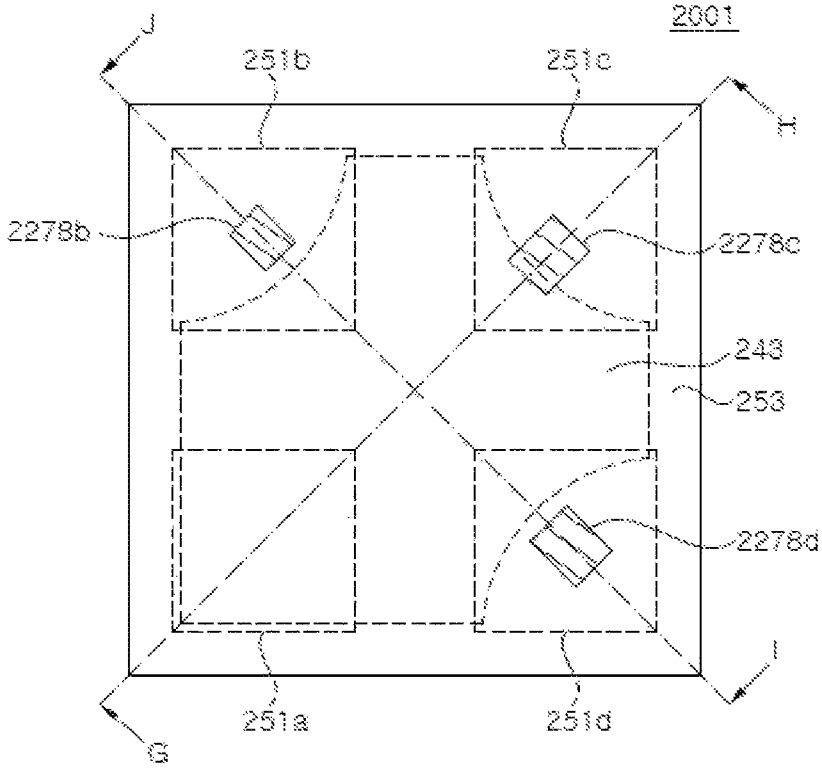
FIG. 36A is a schematic plan view of a light emitting device according to still another exemplary embodiment.
Figure 36B:
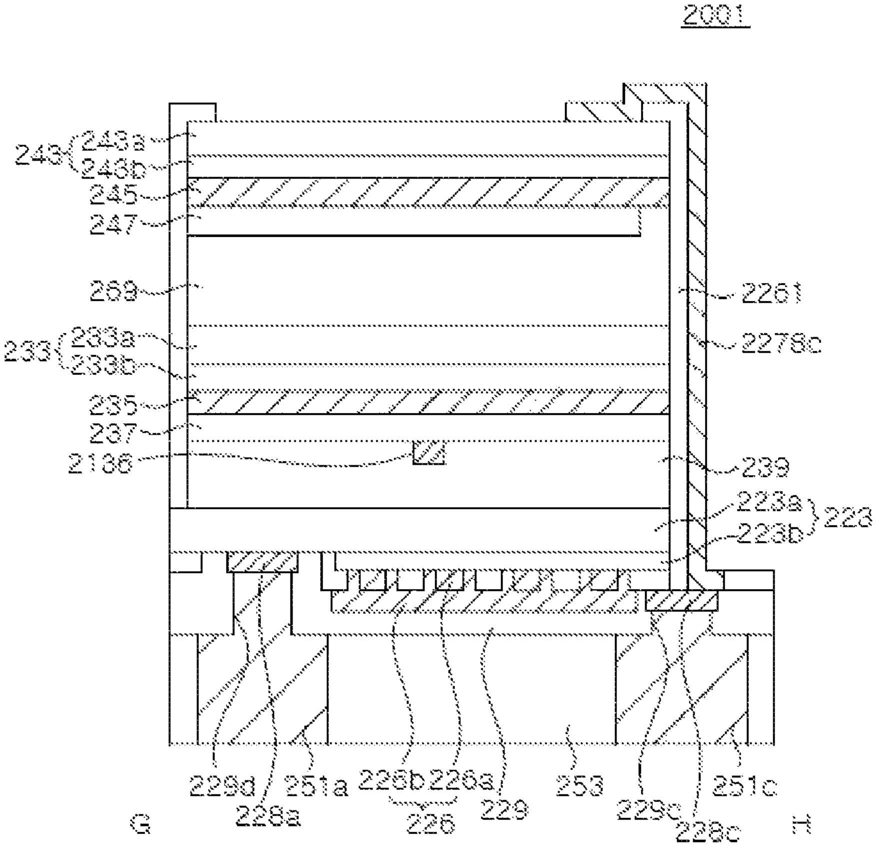
FIGS. 36B and 36C are schematic cross-sectional views taken along lines G-H and I-J of FIG. 36A, respectively.
Figure 36C:
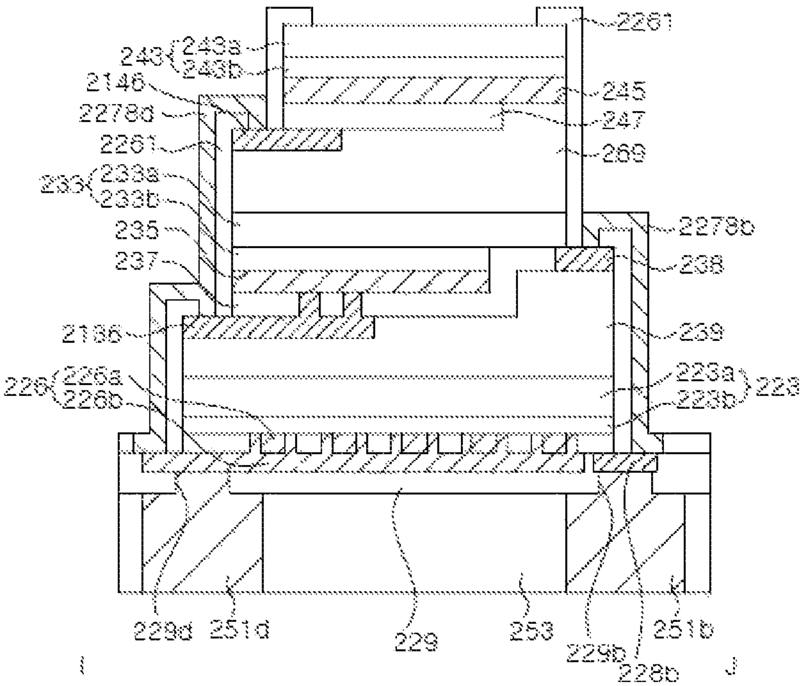

FIG. 36A is a plan view of the light emitting device 2001, and FIGS. 36B and 36C are schematic cross-sectional views taken along lines G-H and I-J of FIG. 36A, respectively.

Referring to FIGS. 36A, 36B, and 36C, since a stack structure of the light emitting device 2001 is substantially the same as that described with reference to FIGS. 35A and 35B, detailed descriptions thereof are omitted, and hereinafter, an insulating layer 2261 and connectors 2278*b*, 2278*c*, and 2278*d* having a changed shape by patterning will be described.

The third LED stack 243, the third transparent electrode 245, and the second color filter 247 are partially removed to expose the third current spreading layer 2146, and the second LED stack 233, the second transparent electrode 235, and the first color filter 237 are removed to expose the second ohmic electrode 238 and the second current spreading layer 2136.

Further, the first bonding layer 239, the first LED stack 223, and the insulating layer 225 are partially removed to expose the connection pads 228*b* and 228*c* and the first reflective electrode 226.

In addition, the patterning may also be performed for a dicing region for separating the light emitting devices by exposing an upper surface of the insulating layer 229 or the filler 253.

The insulating layer 2261 covers side surfaces of the first, second, and third LED stacks 223, 233, and 243 and other layers. The insulating layer 2261 has openings that expose the third current spreading layer 2146, the second ohmic electrode 238, the second current spreading layer 2136, the first reflective electrode 226, and the connection pads 228*b* and 228*c*. The insulating layer 2261 may be formed of a single layer or multiple layers of a light-transmissive material, such as $SiO_2$, $Si_3N_4$, or others. The insulating layer 2261 may also cover substantially the entire upper surface of the third LED stack 243. In addition, the insulating layer 2261 may include a distributed Bragg reflector that reflects light emitted from the first LED stack 223, the second LED stack 233, and the third LED stack 243, thereby preventing light from being emitted to the side surface of the light emitting device 2001. Alternatively, the insulating layer 2261 may include a transparent insulating film and a reflective metal layer, or an organic reflective layer of a multilayer structure formed thereon to thereby reflect light, or may include a light absorbing layer such as a black epoxy to block light. The insulating layer 2261 may include the reflective layer or the absorbing layer, thereby making it possible to prevent light interference between pixels and to improve a contrast ratio of the display apparatus. When the insulating layer 2261 includes the reflective layer or the absorbing layer, the insulating layer 2261 has an opening that exposes the upper surface of the third LED stack 243.

The connectors **2278*b*, 2278*c*, and 2278*d* are disposed on the insulating layer 2261 along the side surface of the light emitting device 2001. As illustrated in FIG. 36B, the connector 2278*c* connects the first conductivity type semiconductor layer 243*a* of the third LED stack 243 to the connection pad 228*c*. Therefore, the first conductivity type semiconductor layer 243*a* of the third LED stack 243 is electrically connected to the third bump pad 251*c*. The connector 2278*c* may directly connect the third LED stack 243 to the connection pad 228*c*. In this case, the connector 2278*c* may include an extension on the second LED stack 233 for current distribution. In some exemplary embodiments, when the third ohmic electrode 248 is formed, the connector 2278*c* may be connected to the third ohmic electrode 248. In this case, the third ohmic electrode 248** may include an extension together with a pad region.

Referring to FIG. 36C, the connector **2278*b* connects the second ohmic electrode 238 to the connection pad 228*b*. Therefore, the first conductivity type semiconductor layer 233*a* of the second LED stack 233 is electrically connected to the second bump pad 251*b*. When the second ohmic electrode 238 is omitted in some exemplary embodiments, the connector 2278*b* may be connected to the first conductivity type semiconductor layer 233*a*. The connector 2278*c* is connected to the third current spreading layer 2146, the second current spreading layer 2136, and the first reflective electrode 226. Therefore, the second conductivity type semiconductor layer 243*b* of the third LED stack 243, the second conductivity type semiconductor layer 233*a* of the second LED stack 233, and the second conductivity type semiconductor layer 223*b* of the first LED stack 223 are electrically connected in common to the common bump pad 251*d*.**

In the illustrated exemplary embodiment, one connector **278*d* is described as connecting the third current spreading layer 2146, the second current spreading layer 2136, and the first reflective electrode 226 to each other, however, the inventive concepts are not limited thereto, and a plurality of connectors may be used. For example, the third current spreading layer 2146 and the second current spreading layer 2136 may be connected to each other by one connector, and the second current spreading layer 2136 and the first reflective electrode 226** may also be connected to each other by another connector.

The light emitting device 2001 may be manufactured by patterning the light emitting diode stack structure described with reference to FIGS. 35A and 35B and dividing it into a separate unit.

More particularly, the third LED stack 243, the third transparent electrode 245, and the second color filter 247 are patterned and are partially removed. The third LED stack 243, the third transparent electrode 245, and the second color filter 247 are removed to expose the third current spreading layer 2146, as illustrated in FIG. 36C. The third LED stack 243, the third transparent electrode 245, and the second color filter 247 are removed from the dicing region for separately dividing the light emitting devices, and a periphery of upper regions of the connection pads **228*b* and 228*c* and a portion of an upper region of the first reflective electrode 226 are also removed. Meanwhile, when the third ohmic electrode 248 is formed on the third LED stack 243, the third ohmic electrode 248** is also exposed.

Then, the second bonding layer 269 and the second LED stack 233 are patterned to expose the second ohmic electrode 238. In addition, the second transparent electrode 235 and the first color filter 237 are removed to expose the second current spreading layer 2136. The second bonding layer 269, the second LED stack 233, the second transparent electrode 235, and the first color filter 237 are removed from the dicing region for separately dividing the light emitting devices.

Then, the first bonding layer 239, the first LED stack 223, and the insulating layer 225 are patterned to expose the connection pads **228*b* and 228*c* and the first reflective electrode 226. The first bonding layer 239, the first LED stack 223, and the insulating layer 225** are removed from the dicing region for separately dividing the light emitting devices.

Then, the insulating layer 2261 that covers the exposed side surfaces of the light emitting devices is formed. The insulating layer 2261 is patterned using photolithography and etching processes or the like, and therefore, the openings that expose the second and third current spreading layers 236 and 246, the second ohmic electrode 238, the connection pads **228*b* and 228*c*, and the first reflective electrode 226** are formed.

Then, the connectors **2278*b*, 2278*c*, and 2278*d* are formed to electrically connect the second and third current spreading layers 236 and 246, the second ohmic electrode 238, the connection pads 228*b* and 228*c*, and the first reflective electrode 226**, which are exposed.

Figure 37:
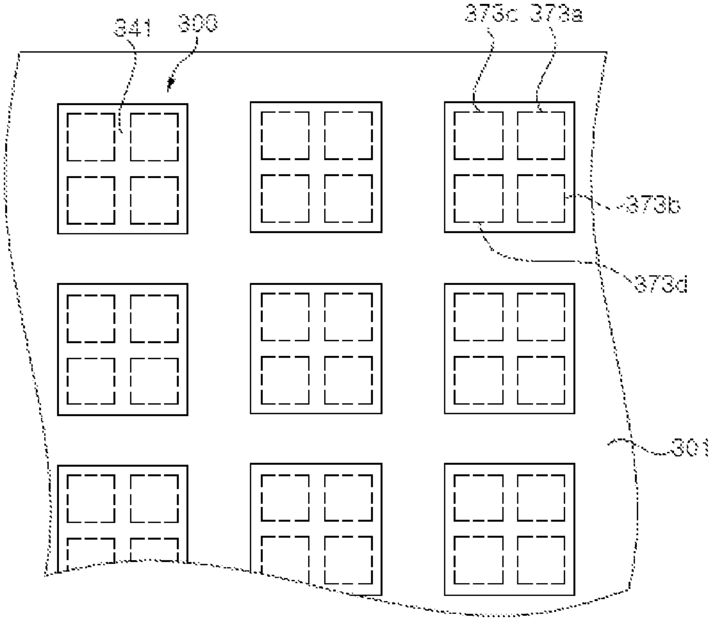
FIG. 37 is a schematic plan view of a display apparatus according to an exemplary embodiment.

FIG. 37 is a schematic plan view of a display apparatus according to an exemplary embodiment.

Referring to FIG. 37, the display apparatus according to an exemplary embodiment includes a circuit board 301 and a plurality of light emitting devices 300.

The circuit board 301 may include a circuit for passive matrix driving or active matrix driving. In one exemplary embodiment, the circuit board 301 may include interconnection lines and resistors. In another exemplary embodiment, the circuit board 301 may include interconnection lines, transistors and capacitors. The circuit board 301 may also have electrode pads disposed on an upper surface thereof to allow electrical connection to the circuit therein.

The light emitting devices 300 are arranged on the circuit board 301. Each of the light emitting devices 300 may constitute one pixel. The light emitting device 300 includes electrode pads **373*a*, 373*b*, 373*c*, 373*d*, which are electrically connected to the circuit board 301. In addition, the light emitting device 300 may include a substrate 341 at an upper surface thereof. Since the light emitting devices 300 are separated from one another, the substrates 341 disposed at the upper surfaces of the light emitting devices 300** are also separated from one another.

Figure 38A:
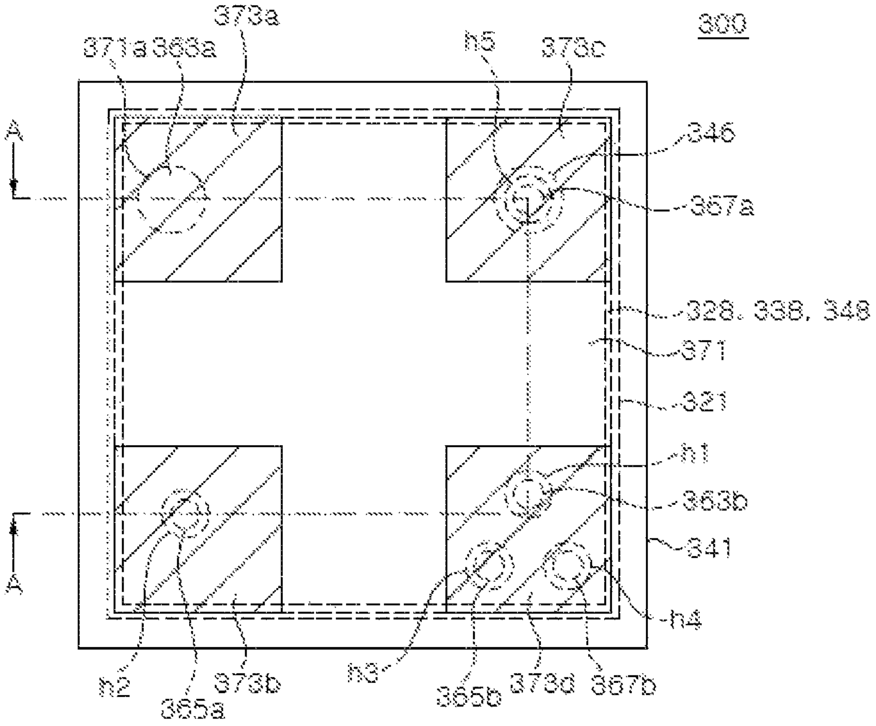
FIG. 38A is a schematic plan view of a light emitting device for a display according to an exemplary embodiment.
Figure 38B:
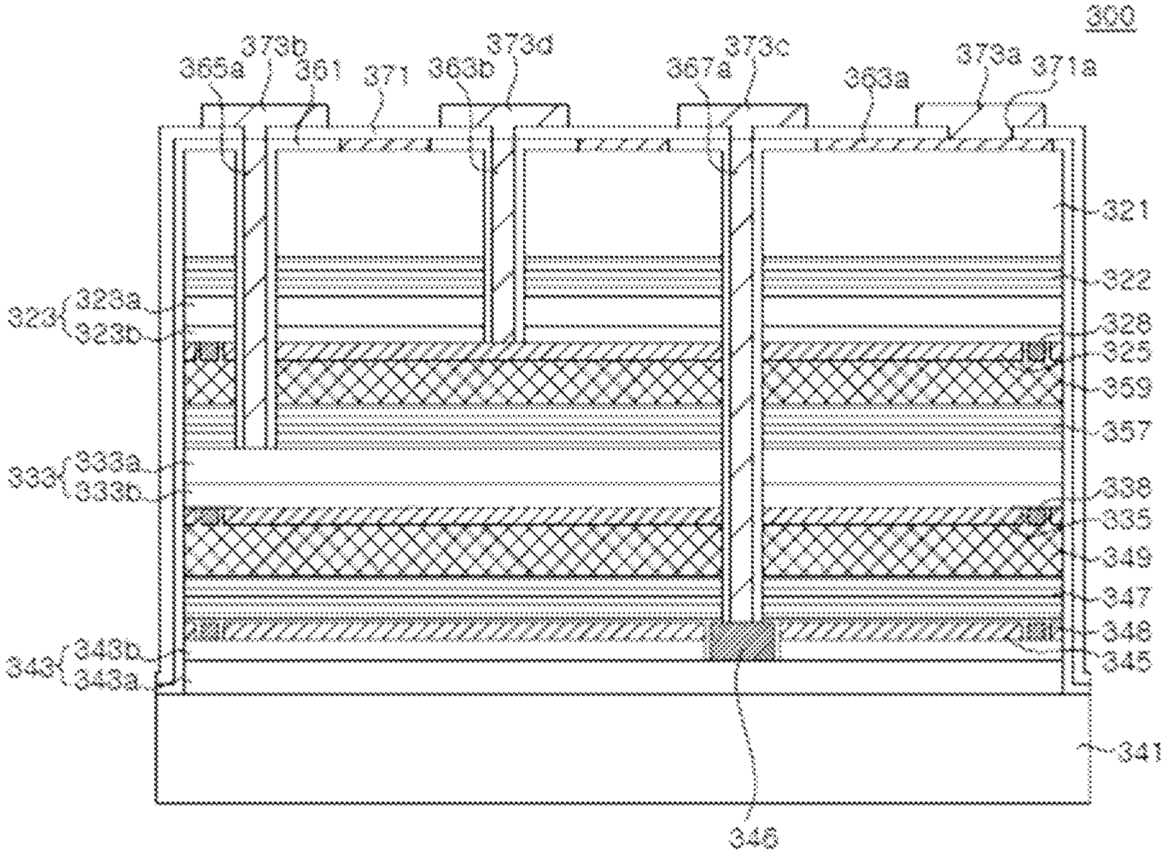
FIG. 38B is a schematic cross-sectional view taken along line A-A of FIG. 38A.

Details of the light emitting device 300 will be described with reference to FIG. 38A and FIG. 38B. FIG. 38A is a schematic plan view of the light emitting device 300 for a display according to an exemplary embodiment, and FIG. 38B is a schematic cross-sectional view taken along line A-A of FIG. 38A. Although the electrode pads **373*a*, 373*b*, 373*c*, 373*d* are illustrated and described as being disposed at an upper side of the light emitting device 300, the light emitting device 300 may be flip-bonded on the circuit board 301 of FIG. 37, and the electrode pads 373*a*, 373*b*, 373*c*, 373*d*** may be disposed at a lower side.

Referring to FIG. 38A and FIG. 38B, the light emitting device 300 may include a first substrate 321, a second substrate 341, a distributed Bragg reflector 322, a first LED stack 323, a second LED stack 333, a third LED stack 343, a first transparent electrode 325, a second transparent electrode 335, a third transparent electrode 345, an ohmic electrode 346, a first current spreader 328, a second current spreader 338, a third current spreader 348, a first color filter 347, a second color filter 357, a first bonding layer 349, a second bonding layer 359, a lower insulation layer 361, an upper insulation layer 371, an ohmic electrode 363*a*, through-hole vias 363*b*, 365*a*, 365*b*, 367*a*, 367*b*, and electrode pads 373*a*, 373*b*, 373*c*, 373*d*.

The first substrate 321 may support the LED stacks 323, 333, 343. The first substrate 321 may be a growth substrate for the first LED stack 323, for example, a GaAs substrate. In particular, the first substrate 321 may have conductivity.

The second substrate 341 may support the LED stacks 323, 333, 343. The LED stacks 323, 333, 343 are disposed between the first substrate 321 and the second substrate 341. The second substrate 341 may be a growth substrate for the third LED stack 343. For example, the second substrate 341 may be a sapphire substrate or a GaN substrate, more particularly, a patterned sapphire substrate. The first to third LED stacks are disposed on the second substrate 341 in the order of the third LED stack 343, the second LED stack 333, and the first LED stack 323 from the second substrate 341. In an exemplary embodiment, a single third LED stack 343 may be disposed on single second substrate 341. The second LED stack 333, the first LED stack 323, and the first substrate 321 are disposed on the third LED stack 343. Accordingly, the light emitting device 300 may have a single chip structure of a single pixel.

In another exemplary embodiment, a plurality of third LED stacks 343 may be disposed on a single second substrate 341. The second LED stack 333, the first LED stack 323, and the first substrate 321 are disposed on each of the third LED stacks 343, whereby the light emitting device 300 has a single chip structure of a plurality of pixels.

In some exemplary embodiments, the second substrate 341 may be omitted and a lower surface of the third LED stack 343 may be exposed. In this case, a roughened surface may be formed on the lower surface of the third LED stack 343 by surface texturing.

Each of the first LED stack 323, the second LED stack 333, and the third LED stack 343 includes a first conductivity type semiconductor layer 323*a*, 333*a*, and 343*a*, a second conductivity type semiconductor layer 323*b*, 333*b*, and 343*b*, and an active layer interposed therebetween, respectively. The active layer may have a multi-quantum well structure.

The LED stacks emitting light having a shorter wavelength may be disposed closer to the second substrate 341. For example, the first LED stack 323 may be an inorganic light emitting diode adapted to emit red light, the second LED stack 333 may be an inorganic light emitting diode adapted to emit green light, and the third LED stack 343 may be an inorganic light emitting diode adapted to emit blue light. The first LED stack 323 may include an AlGaInP-based well layer, the second LED stack 333 may include an AlGaInP or AlGaInN-based well layer, and the third LED stack 343 may include an AlGaInN-based well layer. However, the inventive concepts are not limited thereto. When the light emitting device 300 includes a micro LED, which has a surface area less than about 10,000 square μm as known in the art, or less than about 4,000 square μm or 2,500 square μm in other exemplary embodiments, the first LED stack 323 may emit any one of red, green, and blue light, and the second and third LED stacks 333 and 343 may emit a different one of red, green, and blue light, without adversely affecting operation, due to the small form factor of a micro LED.

In addition, the first conductivity type semiconductor layer 323*a*, 333*a*, and 343*a* of each of the LED stacks 323, 333, 343 may be an n-type semiconductor layer, and the second conductivity type semiconductor layer 323*b*, 333*b*, and 343*b* thereof may be a p-type semiconductor layer. According to the illustrated exemplary embodiment, an upper surface of the first LED stack 323 is an n-type semiconductor layer 323*a*, an upper surface of the second LED stack 333 is an n-type semiconductor layer 333*a*, and an upper surface of the third LED stack 343 is a p-type semiconductor layer 343*b*. In particular, only the semiconductor layers of the third LED stack 343 are stacked in a different sequence from those of the first and second LED stacks 323 and 333. The first conductivity type semiconductor layer 343*a* of the third LED stack 343 may be subjected to surface texturing in order to improve light extraction efficiency. In some exemplary embodiments, the first conductivity type semiconductor layer 333*a* of the second LED stack 333 may also be subjected to surface texturing.

The first LED stack 323, the second LED stack 333, and the third LED stack 343 may be stacked to overlap one another, and may have substantially the same luminous area. Further, in each of the LED stacks 323, 333, 343, the first conductivity type semiconductor layer 323*a*, 333*a*, and 343*a* may have substantially the same area as the second conductivity type semiconductor layer 323*b*, 333*b*, and 343*b*. In particular, in each of the first LED stack 323 and the second LED stack 333, the first conductivity type semiconductor layer 323*a* and 333*a* may completely overlap the second conductivity type semiconductor layer 323*b* and 333*b*, respectively. In the third LED stack 343, a hole h5 (see FIG. 45A) is formed on the second conductivity type semiconductor layer 343*b* to expose the first conductivity type semiconductor layer 343*a*, and thus, the first conductivity type semiconductor layer 343*a* has a slightly larger area than the second conductivity type semiconductor layer 343*b*.

The first LED stack 323 is disposed apart from the second substrate 341, the second LED stack 333 is disposed under the first LED stack 323, and the third LED stack 343 is disposed under the second LED stack 333. Since the first LED stack 323 emits light having a longer wavelength than the second and third LED stacks 333 and 343, light generated from the first LED stack 323 may be emitted outside after passing through the second and third LED stacks 333 and 343 and the second substrate 341. In addition, since the second LED stack 333 emits light having a longer wavelength than the third LED stack 343, light generated from the second LED stack 333 may be emitted outside after passing through the third LED stack 343 and the second substrate 341.

The distributed Bragg reflector 322 may be disposed between the first substrate 321 and the first LED stack 323. The distributed Bragg reflector 322 reflects light generated from the first LED stack 323 to prevent the light from being lost through absorption by the first substrate 321. For example, the distributed Bragg reflector 322 may be formed by alternately stacking AlAs and AlGaAs-based semiconductor layers one above another.

The first transparent electrode 325 may be disposed between the first LED stack 323 and the second LED stack 333. The first transparent electrode 325 is in ohmic contact with the second conductivity type semiconductor layer 323_b_ of the first LED stack 323 and transmits light generated from the first LED stack 323. The first transparent electrode 325 may include a metal layer or a transparent oxide layer, such as an indium tin oxide (ITO) layer or others.

The second transparent electrode 335 is in ohmic contact with the second conductivity type semiconductor layer 333_b_ of the second LED stack 333. As shown in the drawings, the second transparent electrode 335 contacts a lower surface of the second LED stack 333 between the second LED stack 333 and the third LED stack 343. The second transparent electrode 335 may include a metal layer or a conductive oxide layer transparent with respect to red light and green light.

The third transparent electrode 345 is in ohmic contact with the second conductivity type semiconductor layer 343_b_ of the third LED stack 343. The third transparent electrode 345 may be disposed between the second LED stack 333 and the third LED stack 343, and contacts the upper surface of the third LED stack 343. The third transparent electrode 345 may include a metal layer or a conductive oxide layer transparent with respect to red light and green light. The third transparent electrode 345 may also be transparent to blue light. Each of the second transparent electrode 335 and the third transparent electrode 345 is in ohmic contact with the p-type semiconductor layer of each of the LED stacks to assist in current spreading. Examples of conductive oxide layers for the second and third transparent electrodes 335 and 345 may include $SnO_2$, $InO_2$, ITO, ZnO, IZO, or others.

The first to third current spreaders 328, 338, and 348 may be disposed to spread current in the second conductivity type semiconductor layers 323_b_, 333_b_, and 343_b_ of the first to third LED stacks 323, 333, and 343. As shown in the drawing, the first current spreader 328 may be disposed on the second conductivity type semiconductor layer 323_b_ exposed through the first transparent electrode 325, the second current spreader 338 may be disposed on the second conductivity type semiconductor layer 333_b_ exposed through the second transparent electrode 335, and the third current spreader 348 may be disposed on the second conductivity type semiconductor layer 343_b_ exposed through the third transparent electrode 345. As shown in FIG. 38A, each of the first to third current spreaders 328, 338, and 348 may be disposed along an edge of each of the first to third LED stacks 323, 333, and 343. Also, each of the first to third current spreaders 328, 338 and 348 may have substantially a ring shape to surround a center of each LED stack, but the inventive concepts are not limited thereto, and may have substantially a straight or a curved shape. Further, the first to third current spreaders 328, 338, and 348 may be disposed to overlap one another, without being limited thereto.

The first to third current spreader 328, 338, and 348 may be separated from the first to third transparent electrode 325, 335, and 345. Accordingly, a gap may be formed between a side surface of the first to third current spreader 328, 338, and 348 and the first to third transparent electrode 325, 335, and 345. However, the inventive concepts are not limited thereto, and at least one of the first to third current spreader 328, 338, and 348 may contact the first to third transparent electrode 325, 335, and 345.

The first to third current spreader 328, 338, and 348 may include a material having a higher electrical conductivity than the first to third transparent electrode 325, 335, and 345. In this manner, current may be evenly spread over wide regions of the second conductivity type semiconductor layers 323_b_, 333_b_, and 343_b_.

The ohmic electrode 346 is in ohmic contact with the first conductivity type semiconductor layer 343_a_ of the third LED stack 343. The ohmic electrode 346 may be disposed on the first conductivity type semiconductor layer 343_a_ exposed through the third transparent electrode 345 and the second conductivity type semiconductor layer 343_b_. The ohmic electrode 346 may be formed of Ni/Au/Ti or Ni/Au/Ti/Ni, for example. When a surface of the ohmic electrode 346 is exposed during the etching process, a Ni layer may be formed on the surface of the ohmic electrode 346 and function as an etching stopper layer. The ohmic electrode 346 may be formed to have various shapes. In an exemplary embodiment, the ohmic electrode 346 may have substantially an elongated shape to function as a current spreader. In some exemplary embodiments, the ohmic electrode 346 may be omitted.

The first color filter 347 may be disposed between the third transparent electrode 345 and the second LED stack 333, and the second color filter 357 may be disposed between the second LED stack 333 and the first LED stack 323. The first color filter 347 transmits light generated from the first and second LED stacks 323 and 333 while reflecting light generated from the third LED stack 343. The second color filter 357 transmits light generated from the first LED stack 323 while reflecting light generated from the second LED stack 333. Accordingly, light generated from the first LED stack 323 may be emitted outside through the second LED stack 333 and the third LED stack 343, and light generated from the second LED stack 333 may be emitted outside through the third LED stack 343. Furthermore, it is possible to prevent light loss by preventing light generated from the second LED stack 333 from entering the first LED stack 323, or light generated from the third LED stack 343 from entering the second LED stack 333.

In some exemplary embodiments, the second color filter 357 may reflect light generated from the third LED stack 343.

The first and second color filters 347, 357 may be, for example, a low pass filter allowing light in a low frequency band, e.g., a long wavelength band to pass therethrough, a band pass filter allowing light in a predetermined wavelength band, or a band stop filter that prevents light in a predetermined wavelength band from passing therethrough. In particular, each of the first and second color filters 347 and 357 may be formed by alternately stacking insulation layers having different refractive indices one above another, such as $TiO_2$ and $SiO_2$, for example. In particular, each of the first and second color filters 347 and 357 may include a distributed Bragg reflector (DBR). In addition, a stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 349 couples the second LED stack 333 to the third LED stack 343. The first bonding layer 349 may couple the first color filter 347 to the second transparent electrode 335 between the first color filter 347 and the second transparent electrode 335. For example, the first bonding layer 349 may be formed of a transparent organic material or a transparent inorganic material. Examples of the organic material may include SUB, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 349 may be formed of spin-on-glass (SOG).

The second bonding layer 359 couples the second LED stack 333 to the first LED stack 323. As shown in the drawings, the second bonding layer 359 may be disposed between the second color filter 357 and the first transparent electrode 325. The second bonding layer 359 may be formed of substantially the same material as the first bonding layer 349.

Holes h1, h2, h3, h4, h5 are formed through the first substrate 321. The hole h1 may be formed through the first substrate 321, the distributed Bragg reflector 322, and the first LED stack 323 to expose the first transparent electrode 325. The hole h2 may be formed through the first substrate 321, the distributed Bragg reflector 322, the first transparent electrode 325, the second bonding layer 359, and the second color filter 357 to expose the first conductivity type semiconductor layer 333*a* of the second LED stack 333.

The hole h3 may be formed through the first substrate 321, the distributed Bragg reflector 322, the first transparent electrode 325, the second bonding layer 359, and the second color filter 357, and the second LED stack 333 to expose the second transparent electrode 335. The hole h4 may be formed through the first substrate 321, the distributed Bragg reflector 322, the first transparent electrode 325, the second bonding layer 359, the second color filter 357, the second LED stack 333, the second transparent electrode 335, the first bonding layer 349, and the first color filter 347 to expose the third transparent electrode 345. The hole h5 may be formed through the first substrate 321, the distributed Bragg reflector 322, the first transparent electrode 325, the second bonding layer 359, the second color filter 357, the second LED stack 333, the second transparent electrode 335, the first bonding layer 349, and the first color filter 347 to expose the ohmic electrode 346. When the ohmic electrode 346 is omitted in some exemplary embodiments, the first conductivity type semiconductor layer 343*a* may be exposed by the hole h5.

Although the holes h1, h3 and h4 are illustrated as being separated from one another to expose the first to third transparent electrodes 325, 335, and 345, respectively, the inventive concepts are not limited thereto, and the first to third transparent electrodes 325, 335, and 345 may be exposed though a single hole.

In addition, although the first to third transparent electrodes 325, 335, and 345 are illustrated as being exposed though the holes h1, h3 and h4, in some exemplary embodiments, the first to third current spreaders 328, 338, and 348 may be exposed.

The lower insulation layer 361 covers side surfaces of the first substrate 321 and the first to third LED stacks 323, 333, 343, while covering an upper surface of the first substrate 321. The lower insulation layer 361 also covers side surfaces of the holes h1, h2, h3, h4, h5. However, the lower insulation layer 361 may be subjected to patterning to expose a bottom of each of the holes h1, h2, h3, h4, h5. Furthermore, the lower insulation layer 361 may also be subjected to patterning to expose the upper surface of the first substrate 321.

The ohmic electrode 363*a* is in ohmic contact with the upper surface of the first substrate 321. The ohmic electrode 363*a* may be formed in an exposed region of the first substrate 321, which is exposed by patterning the lower insulation layer 361. The ohmic electrode 363*a* may be formed of Au—Te alloys or Au—Ge alloys, for example. Each of the through-hole vias 363*b*, 365*b*, and 367*b* may be connected to the first to third transparent electrodes 325, 335, and 345, and may be connected to the first to third current spreaders 328, 338, and 348, respectively.

The through-hole vias 363*b*, 365*a*, 365*b*, 367*a*, 367*b* are disposed in the holes h1, h2, h3, h4, h5. The through-hole via 363*b* may be disposed in the hole h1, and may be connected to the first transparent electrode 325. The through-hole via 365*a* may be disposed in the hole h2, and be in ohmic contact with the first conductivity type semiconductor layer 333*a*. The through-hole via 365*b* may be disposed in the hole h3, and may be electrically connected to the second transparent electrode 335. The through-hole via 367*a* may be disposed in the hole h5, and may be electrically connected to the first conductivity type semiconductor layer 343*a*. For example, the through-hole via 367*a* may be electrically connected to the ohmic electrode 345 through the hole h5. The through-hole via 367*b* may be disposed in the hole h4, and may be connected to the third transparent electrode 345. The through-hole via 363*b*, 365*b*, and 367*b* may be connected to the first to third transparent electrode 325, 335, and 345, or may be connected to the first to third current spreader 328, 338, and 348, respectively.

The upper insulation layer 371 covers the lower insulation layer 361 and the ohmic electrode 363*a*. The upper insulation layer 371 may cover the lower insulation layer 361 at the sides of the first substrate 321, and the first to third LED stacks 323, 333 and 343. Atop surface of the lower insulation layer 361 may be covered by the upper insulation layer 371. The upper insulation layer 371 may have an opening 371*a* for exposing the ohmic electrode 363*a*, and may have openings for exposing the through-hole vias 363*b*, 365*a*, 365*b*, 367*a*, and 367*b*.

The lower insulation layer 361 or the upper insulation layer 371 may be formed of silicon oxide or silicon nitride, but it is not limited thereto. For example, the lower insulation layer 361 or the upper insulation layer 371 may be a distributed Bragg reflector formed by stacking insulation layers having different refractive indices. In particular, the upper insulation layer 371 may be a light reflective layer or a light blocking layer.

The electrode pads 373*a*, 373*b*, 373*c*, 373*d* are disposed on the upper insulation layer 371, and are electrically connected to the first to third LED stacks 323, 333, 343. For example, the first electrode pad 373*a* is electrically connected to the ohmic electrode 363*a* exposed through the opening 371*a* of the upper insulation layer 371, and the second electrode pad 373*b* is electrically connected to the through-hole via 365*a* exposed through the opening of the upper insulation layer 371. In addition, the third electrode pad 373*c* is electrically connected to the through-hole via 367*a* exposed through the opening of the upper insulation layer 371. A common electrode pad 373*d* is commonly electrically connected to the through-hole vias 363*b*, 365*b*, and 367*b*.

Accordingly, the common electrode pad 373*d* is commonly electrically connected to the second conductivity type semiconductor layers 323*b*, 333*b*, 343*b* of the first to third LED stacks 323, 333, 343, and each of the electrode pads 373*a*, 373*b*, 373*c* is electrically connected to the first conductivity type semiconductor layers 323*a*, 333*a*, 343*a* of the first to third LED stacks 323, 333, 343, respectively.

According to the illustrated exemplary embodiment, the first LED stack 323 is electrically connected to the electrode pads 373*d* and 373*a*, the second LED stack 333 is electrically connected to the electrode pads 373*d* and 373*b*, and the third LED stack 343 is electrically connected to the electrode pads 373*d* and 373*c*. Therefore, anodes of the first LED stack 323, the second LED stack 333, and the third LED stack 343 are commonly electrically connected to the electrode pad 373*d*, and the cathodes thereof are electrically connected to the first to third electrode pads 373a, 373b, and 373c, respectively. Accordingly, the first to third LED stacks 323, 333, 343 may be independently driven.

FIGS. 39A, 39B, 40A, 40B, 41A, 41B, 42, 43, 44, 45A, 45B, 46A, 46B, 47A, 47B, 48A, 48B, 49A, and 49B are schematic plan views and cross-sectional views illustrating a method of manufacturing a light emitting device for a display according to an exemplary embodiment. In the drawings, each plan view corresponds to FIG. 38A, and each cross-sectional view is taken along line A-A of the corresponding plan view. FIGS. 39B and 40B are cross-sectional views taken along line B-B of FIGS. 39A and 40A, respectively.

Figure 39A:
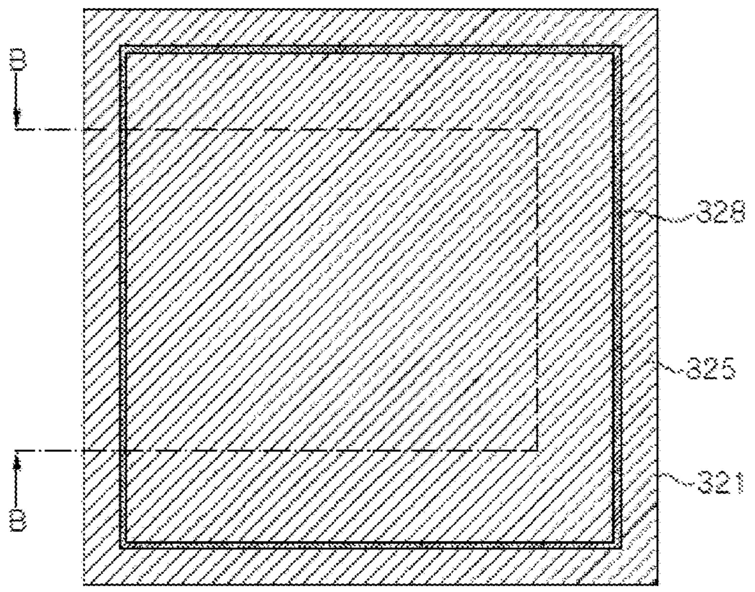
FIGS. 39A, 39B, 40A, 40B, 41A, 41B, 42, 43, 44, 45A, 45B, 46A, 46B, 47A, 47B, 48A, 48B, 49A, and 49B are schematic plan views and cross-sectional views illustrating a method of manufacturing a light emitting device for a display according to an exemplary embodiment.
Figure 39B:
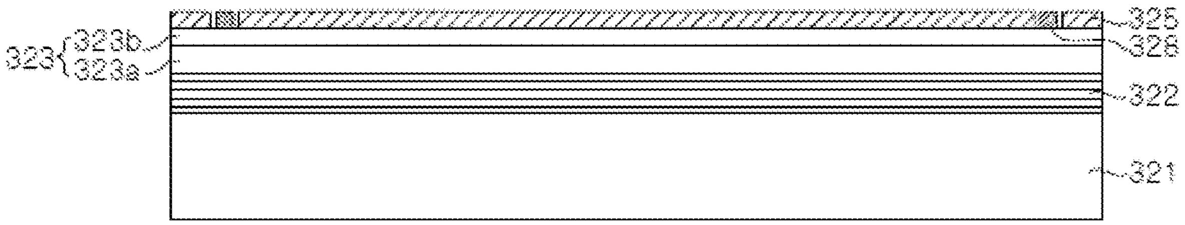

Referring to FIGS. 39A and 39B, a first LED stack 323 is grown on a first substrate 321. The first substrate 321 may be a GaAs substrate, for example. The first LED stack 323 may include AlGaInP-based semiconductor layers, and includes a first conductivity type semiconductor layer 323a, an active layer, and a second conductivity type semiconductor layer 323b. The first conductivity type may be an n-type, and the second conductivity type may be a p-type. A distributed Bragg reflector 322 may be formed prior to the growth of the first LED stack 323. The distributed Bragg reflector 322 may have a stack structure formed by repeatedly stacking AlAs/AlGaAs layers, for example.

A first transparent electrode 325 may be formed on the second conductivity type semiconductor layer 323b. The first transparent electrode 325 may be formed of a transparent oxide layer, such as indium tin oxide (ITO), a transparent metal layer, or others.

The first transparent electrode 325 may be formed to have an opening for exposing the second conductivity type semiconductor layer 323b, and a first current spreader 328 may be formed in the opening. The first transparent electrode 325 may be patterned by photolithography and etching techniques, for example, which may form the opening for exposing the second conductivity type semiconductor layer 323b. The opening of the first transparent electrode 325 may define a region to which the first current spreader 328 may be formed.

Although FIG. 39A shows the first current spreader 328 as having substantially a rectangular shape, the inventive concepts are not limited thereto. For example, the first current spreader 328 may have various shapes, such as an elongated line or a curved line shape. The first current spreader 328 may be formed by the lift-off technique or the like, and a side thereof may be separated from the first transparent electrode 325. The first current spreader 328 may be formed to have the same or similar thickness as the first transparent electrode 325.

Figure 40A:
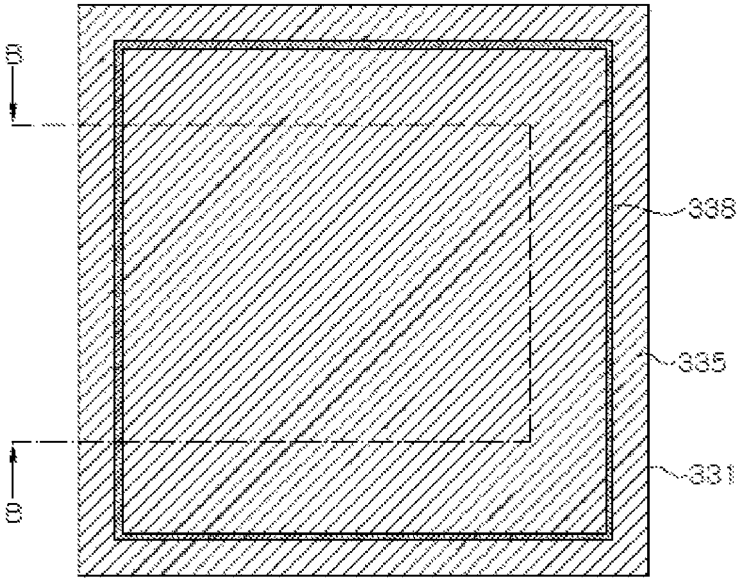
Figure 40B:
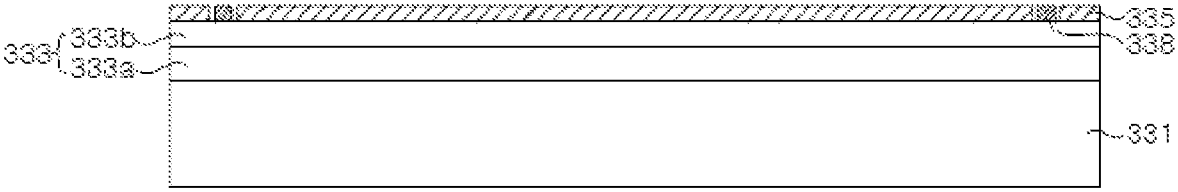

Referring to FIGS. 40A and 40B, a second LED stack 333 is grown on a second substrate 331, and a second transparent electrode 335 is formed on the second LED stack 333. The second LED stack 333 may include AlGaInP-based or AlGaInN-based semiconductor layers, and may include a first conductivity type semiconductor layer 333a, an active layer, and a second conductivity type semiconductor layer 333b. The second substrate 331 may be a substrate capable of growing AlGaInP-based semiconductor layers thereon, for example, a GaAs substrate or a GaP, or a substrate capable of growing AlGaInN-based semiconductor layers thereon, for example, a sapphire substrate. The first conductivity type may be an n-type, and the second conductivity type may be a p-type. A composition ratio of Al, Ga, and In for the second LED stack 333 may be determined so that the second LED stack 333 may emit green light, for example. In addition, when the GaP substrate is used, a pure GaP layer or a nitrogen (N) doped GaP layer is formed on the GaP to realize green light. The second transparent electrode 335 may be in ohmic contact with the second conductivity type semiconductor layer 333b. The second transparent electrode 335 may be formed of a metal layer or a conductive oxide layer, such as $SnO_2$, $InO_2$, ITO, ZnO, IZO, and the like.

The second transparent electrode 335 may be formed to have an opening for exposing the second conductivity type semiconductor layer 333b, and a second current spreader 338 may be formed in the opening. The second transparent electrode 335 may be patterned by photolithography and etching techniques, for example, which may form the opening for exposing the second conductivity type semiconductor layer 333b. The opening of the second transparent electrode 335 may define a region for the second current spreader 338 to be formed.

Although FIG. 40A shows the second current spreader 338 as having a substantially rectangular shape, the inventive concepts are not limited thereto. For example, the second current spreader 338 may have various shapes, such as substantially an elongated or a curved line shape. The second current spreader 338 may be formed by the lift-off technique or the like, and a side thereof may be separated from the second transparent electrode 335. The second current spreader 338 may be formed to have the same or similar thickness as the second transparent electrode 335.

The second current spreader 338 may have the same shape and the same size as the first current spreader 328, without being limited thereto.

Figure 41A:
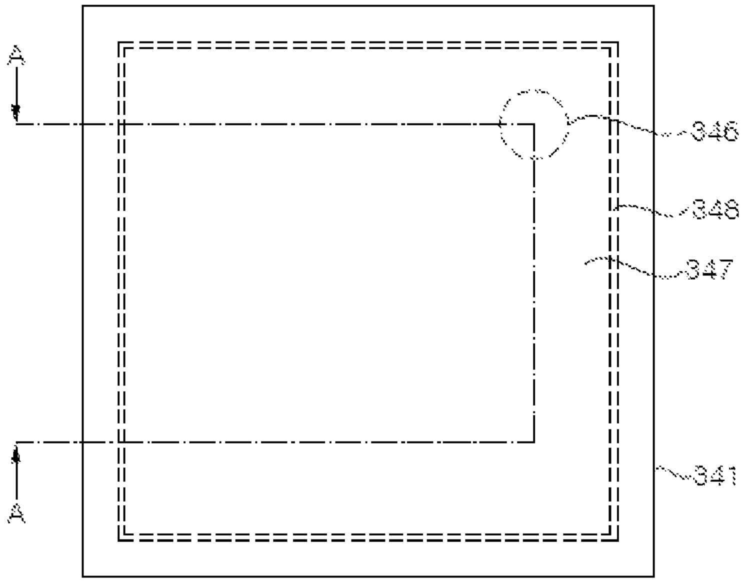
Figure 41B:
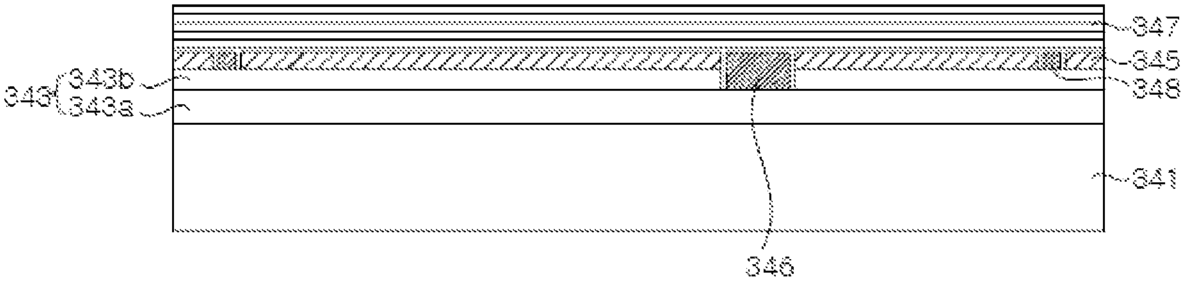

Referring to FIGS. 41A and 41B, a third LED stack 343 is grown on a second substrate 341, and a third transparent electrode 345 is formed on the third LED stack 343. The third LED stack 343 may include AlGaInN-based semiconductor layers, and may include a first conductivity type semiconductor layer 343a, an active layer, and a second conductivity type semiconductor layer 343b. The first conductivity type may be an n-type, and the second conductivity type may be a p-type.

The second substrate 341 is a substrate capable of growing GaN-based semiconductor layers thereon, and may be different from the first substrate 321. A composition ratio of AlGaInN for the third LED stack 343 is determined to allow the third LED stack 343 to emit blue light, for example. The third transparent electrode 345 is in ohmic contact with the second conductivity type semiconductor layer 343b. The third transparent electrode 345 may be formed of a conductive oxide layer, such as $SnO_2$, $InO_2$, ITO, ZnO, IZO, and the like.

The third transparent electrode 345 may be formed to have an opening for exposing the first conductivity type semiconductor layer 343a, and an opening for exposing the second conductivity type semiconductor layer 343b. The opening for exposing the first conductivity type semiconductor layer 343a may define a region to which an ohmic electrode 346 may be formed, and the opening for exposing the second conductivity type semiconductor layer 343b may define a region to which a third current spreader 348 may be formed.

The third transparent electrode 345 may be patterned by photolithography and etching techniques, for example, which may form the openings for exposing the second conductivity type semiconductor layer 343b. Subsequently, the first conductivity type semiconductor layer 343a may be exposed by partially etching the second conductivity type semiconductor layer 343b, and the ohmic electrode 346 may be formed in an exposed region of the first conductivity type semiconductor layer 343a. The ohmic electrode 346 may be formed of a metal layer and in ohmic contact with the first conductivity type semiconductor layer 343*a*. For example, the ohmic electrode 346 may be formed of a multilayer structure of Ni/Au/Ti or Ni/Au/Ti/Ni. The ohmic electrode 346 is electrically separated from the third transparent electrode 345 and the second conductivity type semiconductor layer 343*b*.

The third current spreader 348 is formed in an exposed region of the second conductivity type semiconductor layer 343*b*. Although FIG. 41A shows the third current spreader 348 as having substantially a rectangular shape, the inventive concepts are not limited thereto. For example, the third current spreader 348 may have various shapes, such as substantially an elongated or a curved line shape. The third current spreader 348 may be formed by the lift-off technique or the like, and a side thereof may be separated from the third transparent electrode 345. The third current spreader 348 may be formed to have the same or similar thickness as the third transparent electrode 345.

The third current spreader 348 may have substantially the same shape and the same size as the first or second current spreader 328 or 338, without being limited thereto.

Then, a first color filter 347 is formed on the second transparent electrode 345. Since the first color filter 347 is substantially the same as that described with reference to FIG. 38A and FIG. 38B, detailed descriptions thereof will be omitted to avoid redundancy.

Figure 42:
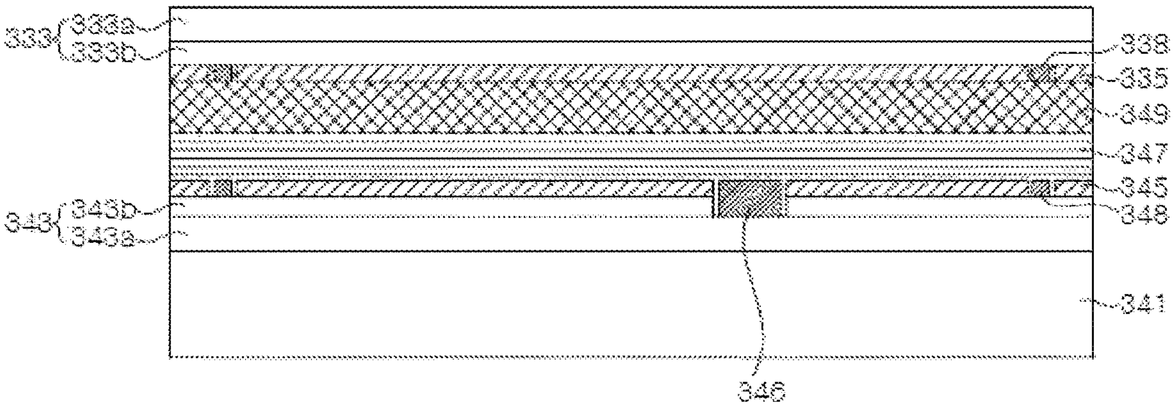

Referring to FIG. 42, the second LED stack 333 of FIG. 40A and FIG. 40B is bonded on the third LED stack 343 of FIG. 41A and FIG. 41B, and the second substrate 331 is removed therefrom.

The first color filter 347 is bonded to the second transparent electrode 335 to face each other. For example, bonding material layers may be formed on the first color filter 347 and the second transparent electrode 335, and are bonded to each other to form a first bonding layer 349. The bonding material layers may be transparent organic material layers or transparent inorganic material layers. Examples of the organic material may include SUB, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 349 may be formed of spin-on-glass (SOG).

Further, the second current spreader 338 may be disposed to overlap the third current spreader 348, without being limited thereto.

Thereafter, the substrate 331 may be removed from the second LED stack 333 by laser lift-off or chemical lift-off. As such, an upper surface of the first conductivity type semiconductor layer 333*a* of the second LED stack 333 is exposed. The exposed surface of the first conductivity type semiconductor layer 333*a* may be subjected to texturing.

Figure 43:
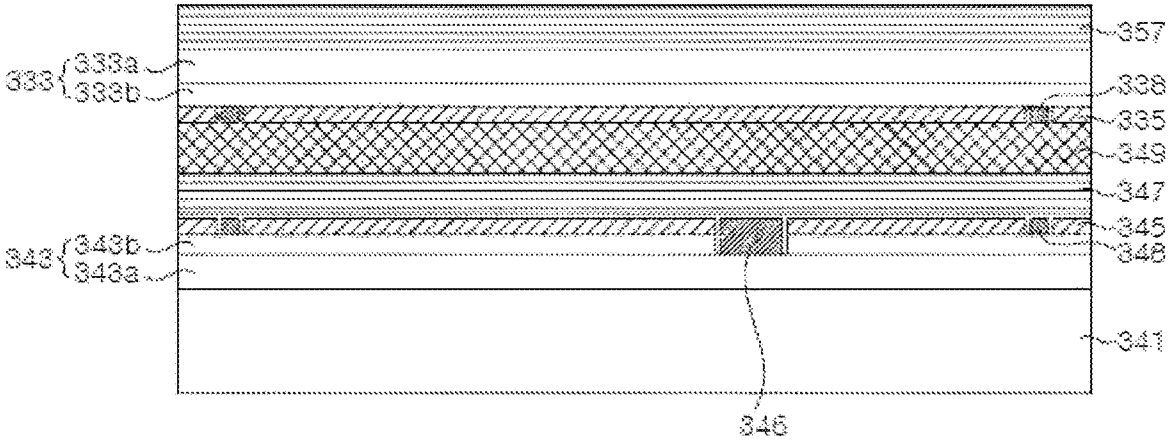

Referring to FIG. 43, a second color filter 357 is formed on the second LED stack 333. The second color filter 357 may be formed by alternately stacking insulation layers having different refractive indices and is substantially the same as that described with reference to FIG. 38A and FIG. 38B, and thus, detailed descriptions thereof will be omitted.

Figure 44:
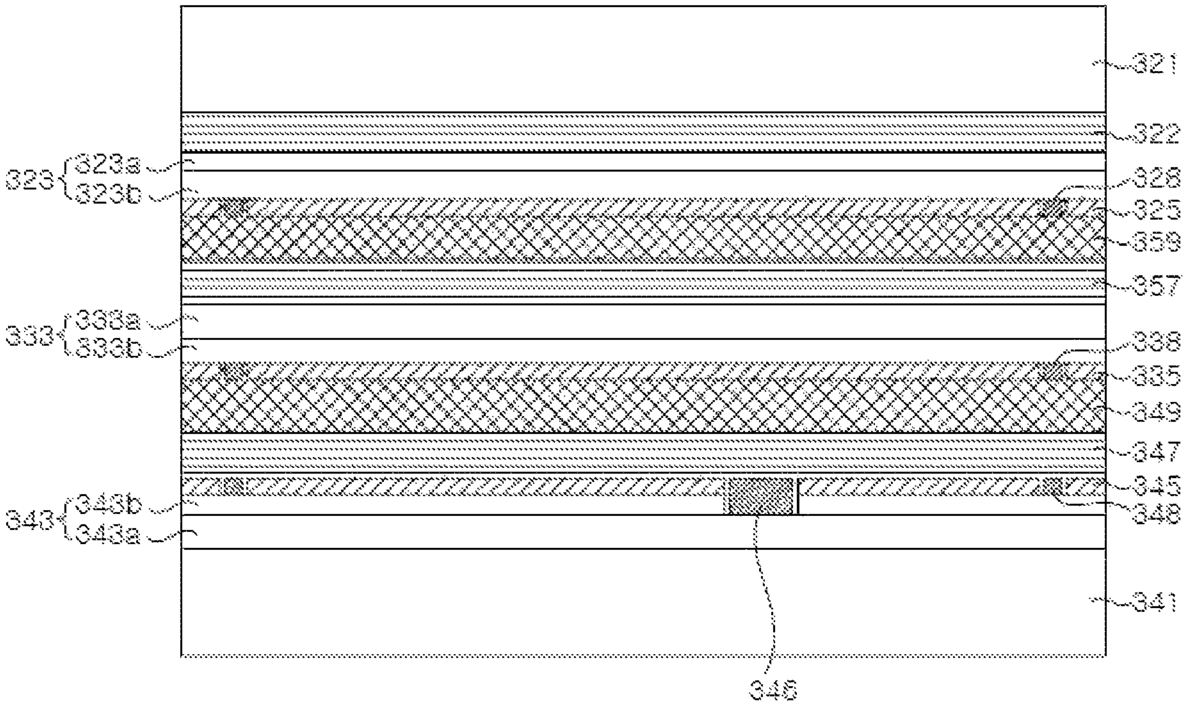

Subsequently, referring to FIG. 44, the first LED stack 323 of FIG. 39 is bonded to the second LED stack 333. The second color filter 357 may be bonded to the first transparent electrode 325 to face each other. For example, bonding material layers may be formed on the second color filter 357 and the first transparent electrode 325, and are bonded to each other to form a second bonding layer 359. The bonding material layers are substantially the same as those described with reference to the first bonding layer 349, and thus, detailed descriptions thereof will be omitted.

Meanwhile, the first current spreader 328 may be disposed to overlap with the second or third current spreader 338 or 348, without being limited thereto.

Figure 45A:
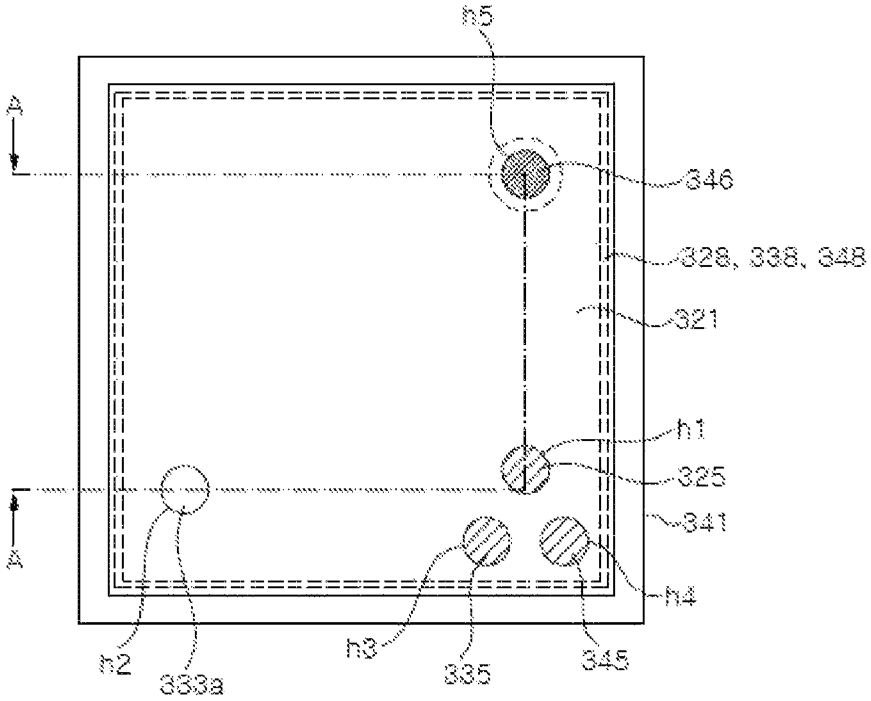
Figure 45B:
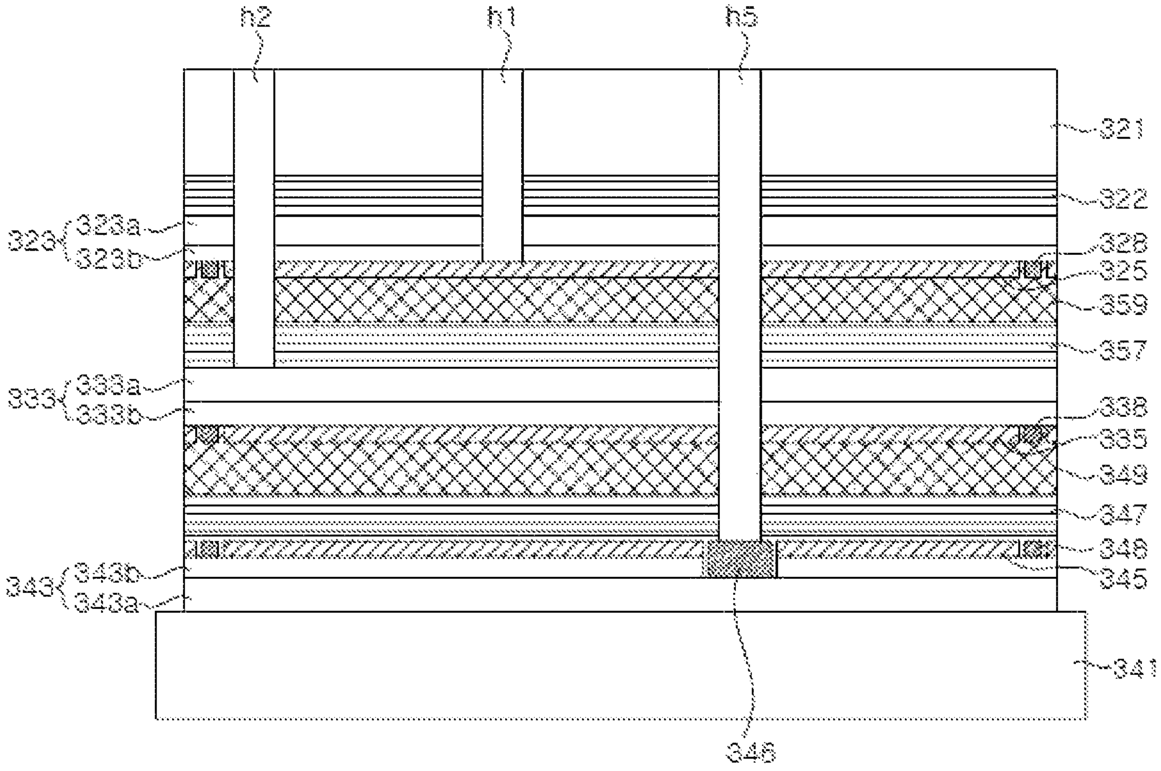

Referring to FIG. 45A and FIG. 45B, holes h1, h2, h3, h4, h5 are formed through the first substrate 321, and isolation trenches defining device regions are also formed to expose the second substrate 341.

The hole h1 exposes the first transparent electrode 325, the hole h2 exposes the first conductivity type semiconductor layer 333*a*, the hole h3 exposes the second transparent electrode 335, the hole h4 exposes the third transparent electrode 345, and the hole h5 exposes an ohmic electrode 346. When the hole h5 exposes the ohmic electrode 346, an upper surface of the ohmic electrode 346 may include an anti-etching layer, for example, a Ni layer. In an exemplary embodiment, the holes h1, h3, and h4 may expose the first to third current spreaders 328, 338, and 348, respectively. In addition, the hole h5 may expose the first conductivity type semiconductor layer 343*a*.

The isolation trench may expose the second substrate 341 along a periphery of each of the first to third LED stacks 323, 333, and 343. Although FIG. 45B shows the isolation trench being formed to expose the second substrate 341, in some exemplary embodiments, the isolation trench may be formed to expose the first conductivity type semiconductor layer 343*a*. The hole h5 may be formed together with the isolation trench by the etching technique or the like, without being limited thereto.

The holes h1, h2, h3, h4, h5 and the isolation trenches may be formed by photolithography and etching techniques, and the sequence of formation is not particularly limited. For example, a shallower hole may be formed prior to a deeper hole, or vice versa. The isolation trench may be formed after or before formation of the holes h1, h2, h3, h4, h5. Alternatively, the isolation trench may be formed together with the hole h5, as described above.

Figure 46A:
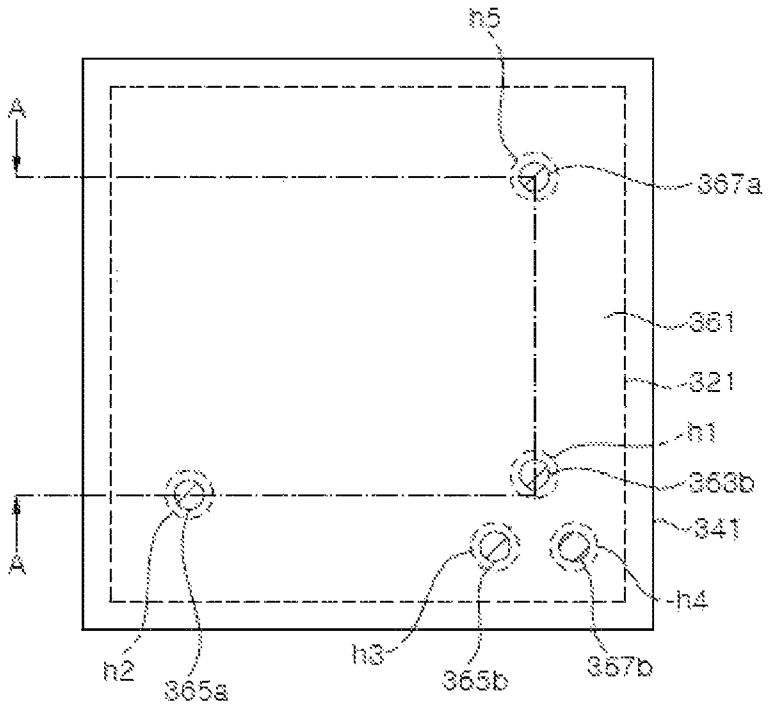
Figure 46B:
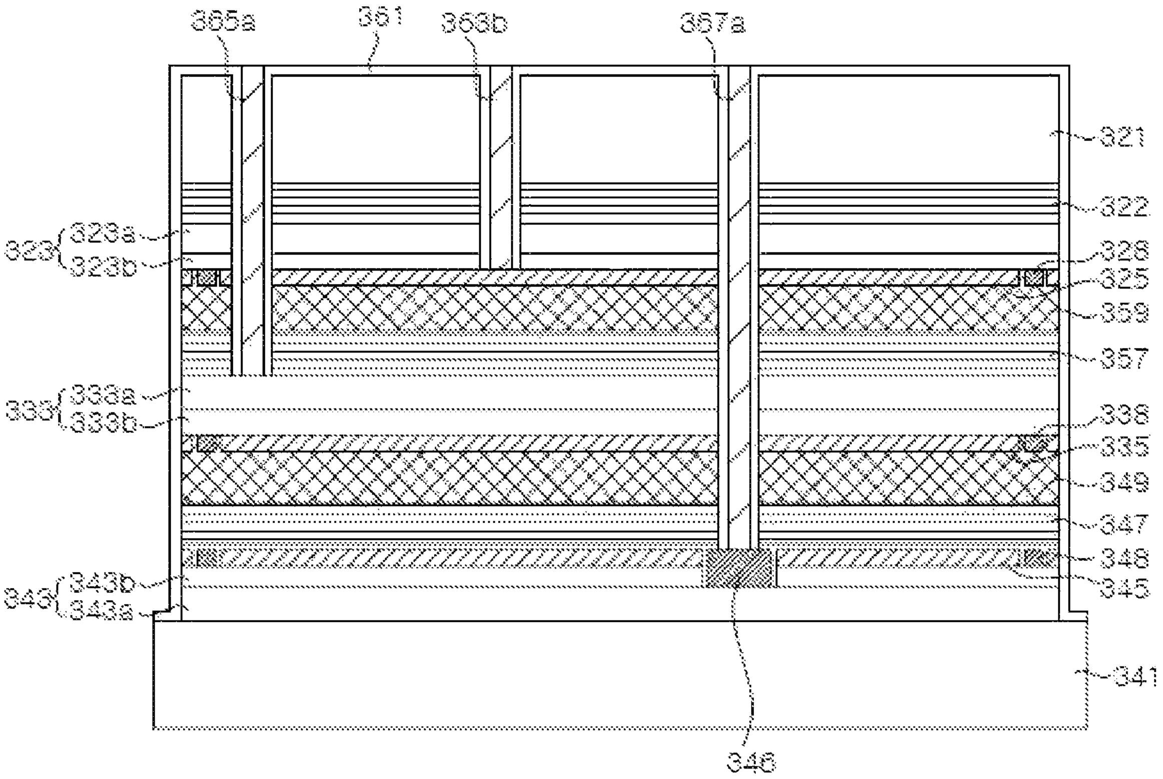

Referring to FIG. 46A and FIG. 46B, a lower insulation layer 361 is formed on the first substrate 321. The lower insulation layer 361 may cover side surfaces of the first substrate 321, and side surfaces of the first to third LED stacks 323, 333, 343, which are exposed through the isolation trench.

The lower insulation layer 361 may also cover side surfaces of the holes h1, h2, h3, h4, h5. The lower insulation layer 361 is subjected to patterning so as to expose a bottom of each of the holes h1, h2, h3, h4, h5.

The lower insulation layer 361 may be formed of silicon oxide or silicon nitride, but the inventive concepts are not limited thereto. The lower insulation layer 361 may be a distributed Bragg reflector.

Subsequently, through-hole vias 363*b*, 365*a*, 365*b*, 367*a*, 367*b* are formed in the holes h1, h2, h3, h4, h5. The through-hole vias 363*b*, 365*a*, 365*b*, 367*a*, 367*b* may be formed by electric plating or the like. For example, a seed layer may be first formed inside the holes h1, h2, h3, h4, h5 and the through-hole vias 363*b*, 365*a*, 365*b*, 367*a*, 367*b* may be formed by plating with copper using the seed layer. The seed layer may be formed of Ni/Al/Ti/Cu, for example.

Figure 47A:
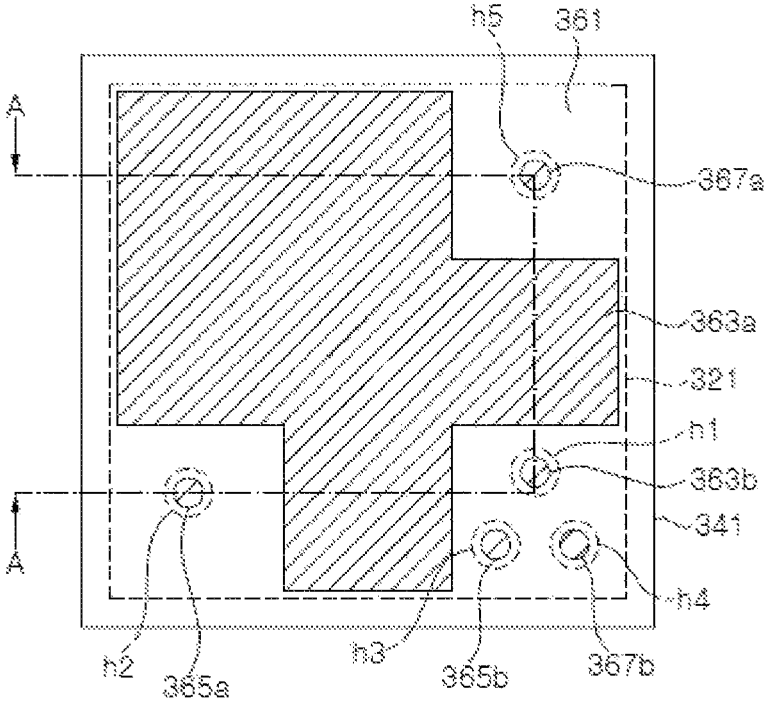
Figure 47B:
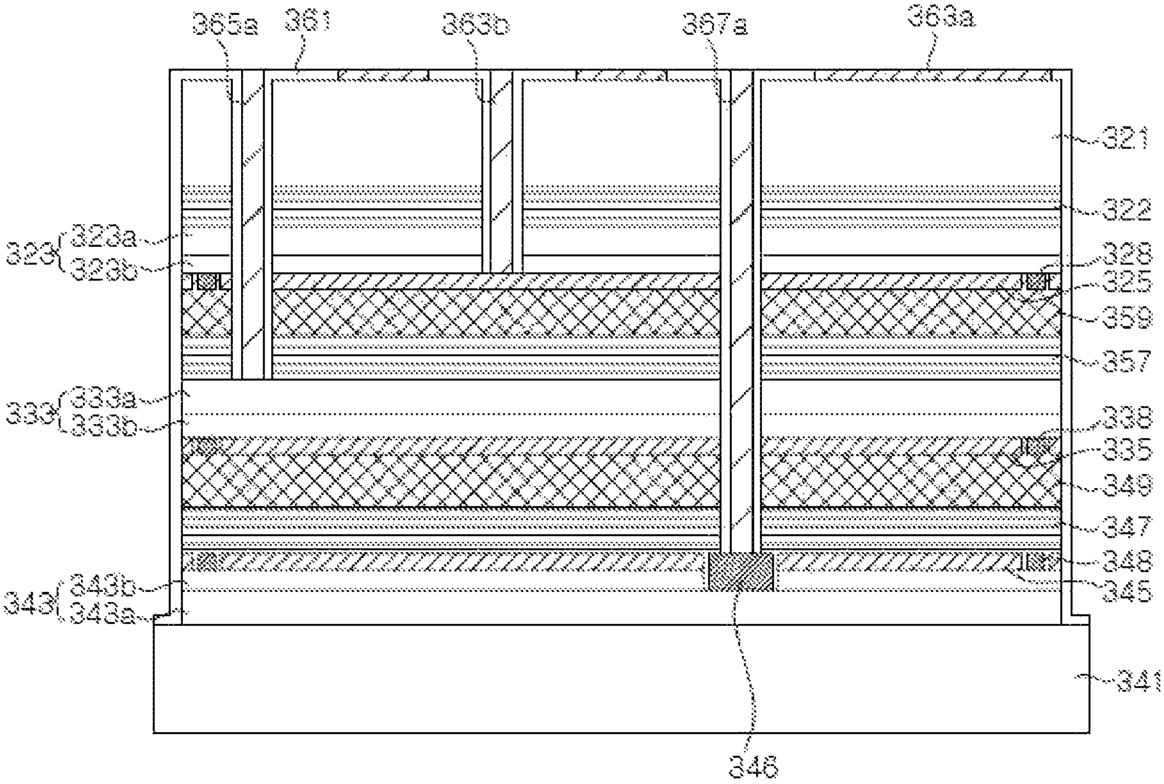

Referring to FIG. 47A and FIG. 47B, the upper surface of the first substrate 321 may be exposed by patterning the lower insulation layer 361. The process of patterning the lower insulation layer 361 to expose the upper surface of the first substrate 321 may be performed upon patterning the lower insulation layer 361 to expose the bottoms of the holes h1, h2, h3, h4, h5.

A substantial portion of the upper surface of the first substrate 321 may be exposed, for example, at least half the area of the light emitting device.

Thereafter, an ohmic electrode 363*a* is formed on the exposed upper surface of the first substrate 321. The ohmic electrode 363*a* may be formed of a conductive layer, such as Au—Te alloys or Au—Ge alloys, for example, and be in ohmic contact with the first substrate 321.

As shown in FIG. 47A, the ohmic electrode 363*a* is separated from the through-hole vias 363*b*, 365*a*, 365*b*, 367*a*, 367*b*.

Figure 48A:
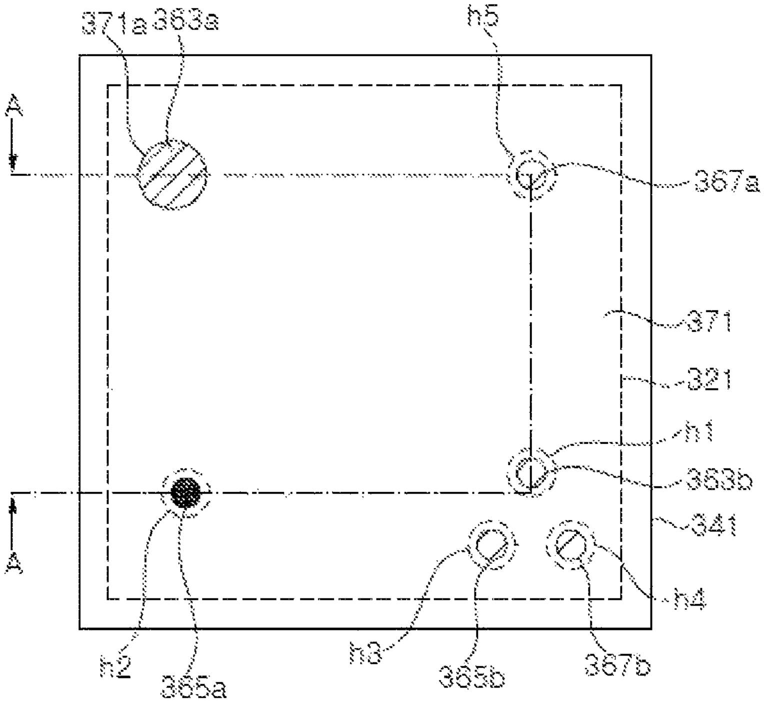
Figure 48B:
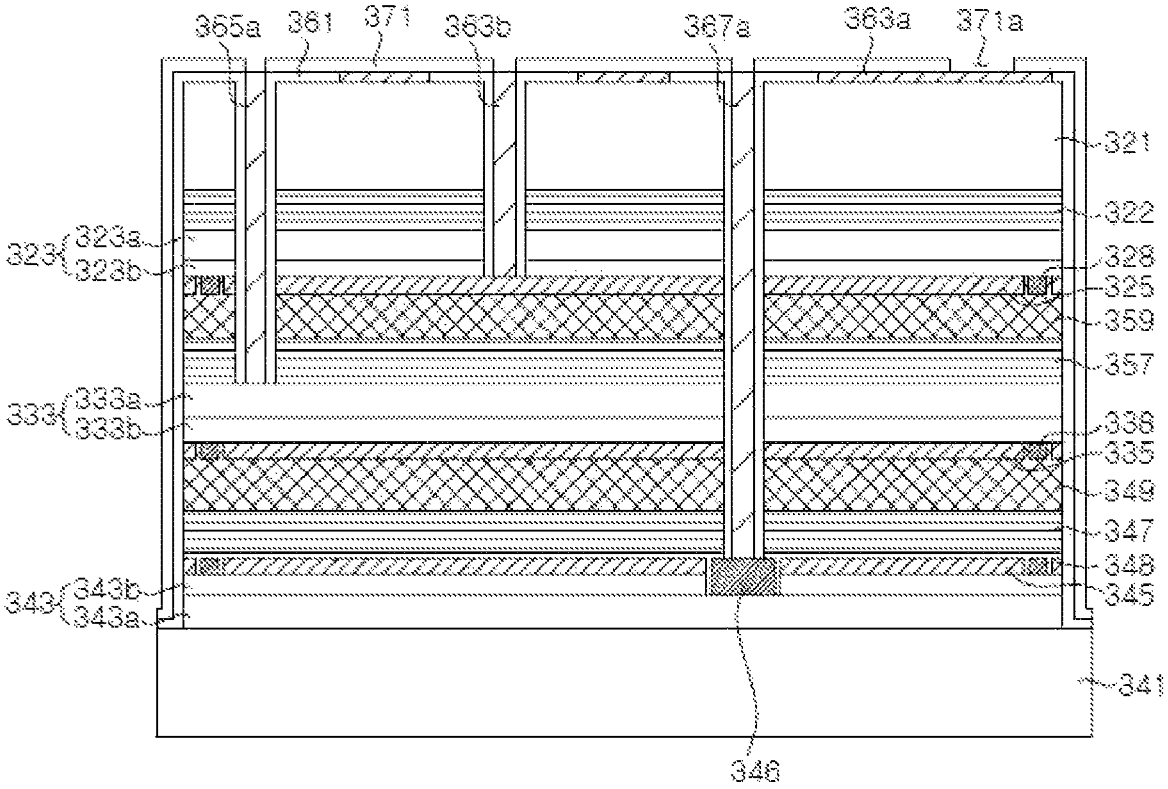

Referring to FIG. 48A and FIG. 48B, an upper insulation layer 371 is formed to cover the lower insulation layer 361 and the ohmic electrode 363*a*. The upper insulation layer 371 may also cover the lower insulation layer 361 at the side surfaces of the first to third LED stacks 323, 333, 343 and the first substrate 321. The upper insulation layer 371 may be patterned to form openings exposing the through-hole vias 363*b*, 365*a*, 365*b*, 367*a*, 367*b* together with an opening 371*a* exposing the ohmic electrode 363*a*.

The upper insulation layer 371 may be formed of a transparent oxide layer, such as silicon oxide or silicon nitride, but the inventive concepts are not limited thereto. For example, the upper insulation layer 371 may be a light reflective insulation layer, for example, a distributed Bragg reflector, or a light blocking layer such as a light absorption layer.

Figure 49A:
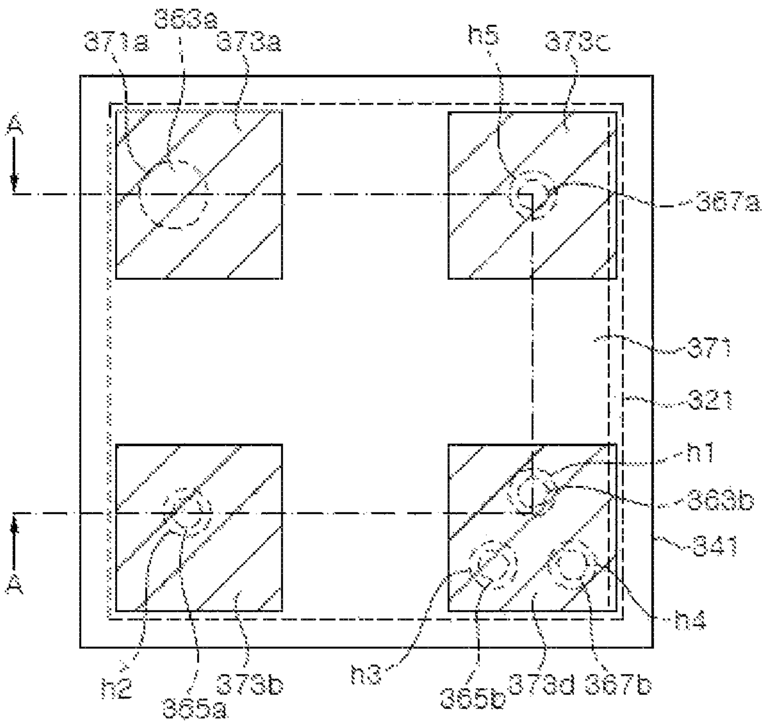
Figure 49B:
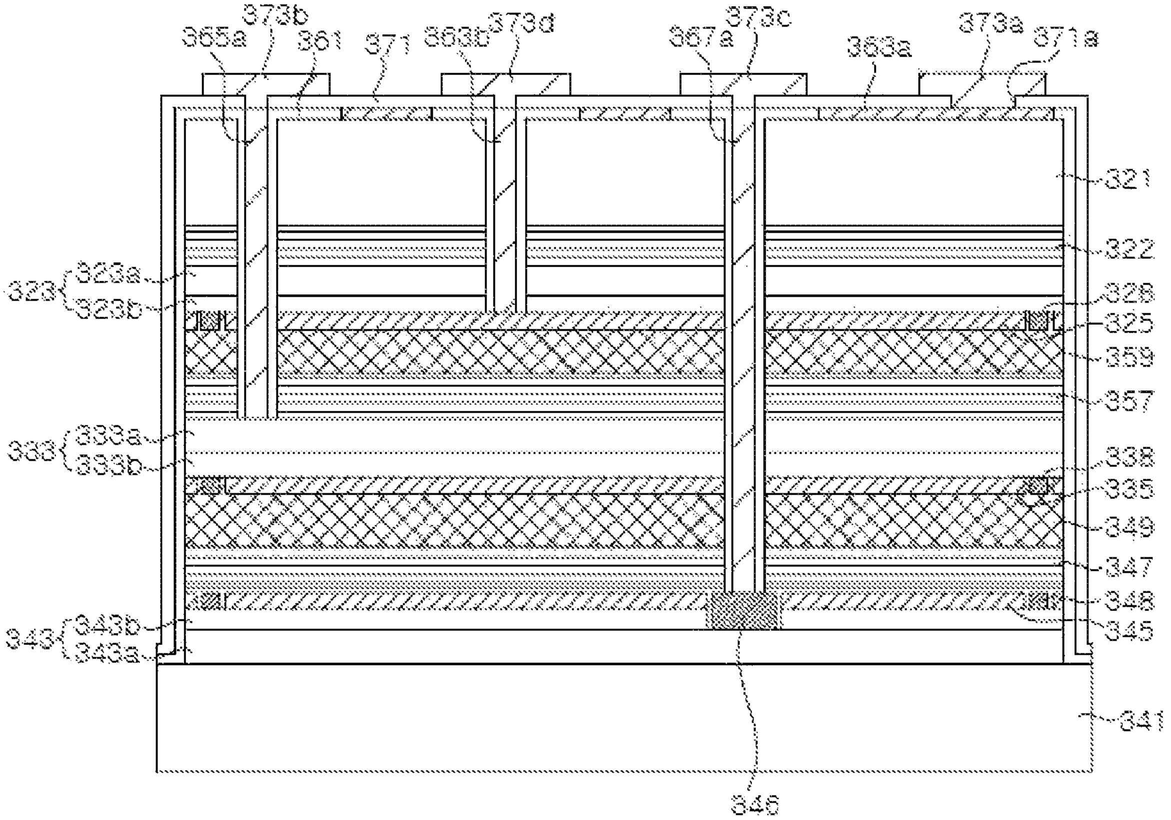

Referring to FIG. 49A and FIG. 49B, electrode pads 373*a*, 373*b*, 373*c*, 373*d* are formed on the upper insulation layer 371. The electrode pads 373*a*, 373*b*, 373*c*, 373*d* may include first to third electrode pads 373*a*, 373*b*, 373*c* and a common electrode pad 373*d*.

The first electrode pad 373*a* may be connected to the ohmic electrode 363*a* exposed through the opening 371*a* of the upper insulation layer 371, the second electrode pad 373*b* may be connected to the through-hole via 365*a*, and the third electrode pad 373*c* may be connected to the through-hole via 367*a*. The common electrode pad 373*d* may be commonly connected to the through-hole vias 363*b*, 365*b*, 367*b*.

The electrode pads 373*a*, 373*b*, 373*c*, 373*d* are electrically separated from one another, and thus, each of the first to third LED stacks 323, 333, 343 is electrically connected to two electrode pads to be independently driven.

Thereafter, the second substrate 341 is divided into regions for each light emitting device, thereby completing the light emitting device 300. As shown in FIG. 49A, the electrode pads 373*a*, 373*b*, 373*c*, 373*d* may be disposed at four corners of each light emitting device 300. The electrode pads 373*a*, 373*b*, 373*c*, 373*d* may have substantially a rectangular shape, but the inventive concepts are not limited thereto.

Although the second substrate 341 is described as being divided, in some exemplary embodiments, the second substrate 341 may be removed. In this case, an exposed surface of the first conductivity type semiconductor layer 343*a* may be subjected to texturing.

Figure 50A:
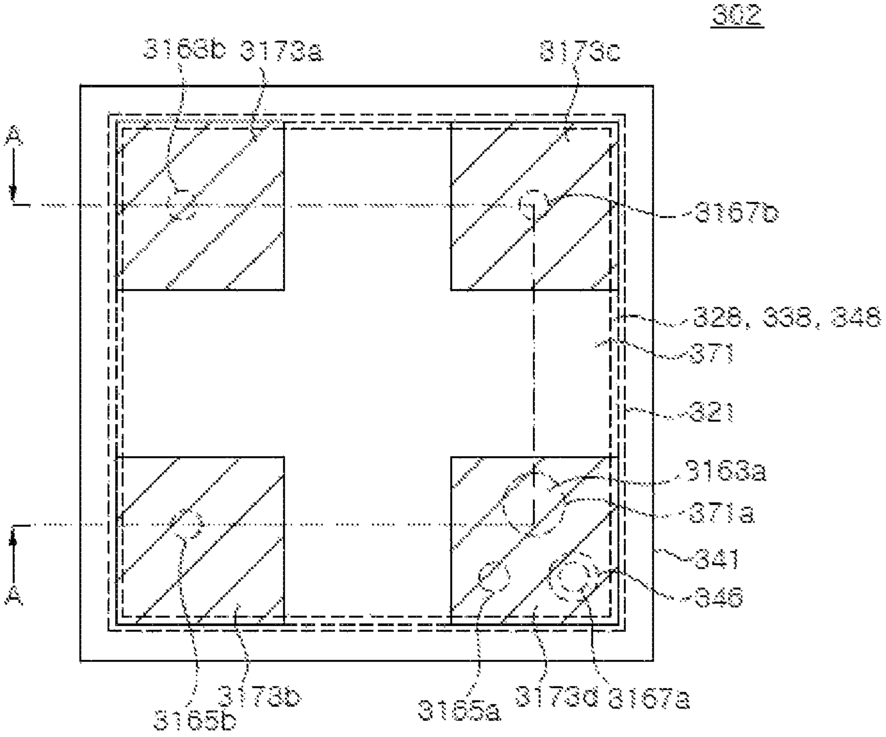
FIG. 50A and FIG. 50B are a schematic plan view and a cross-sectional view of a light emitting device for a display according to another exemplary embodiment, respectively.
Figure 50B:
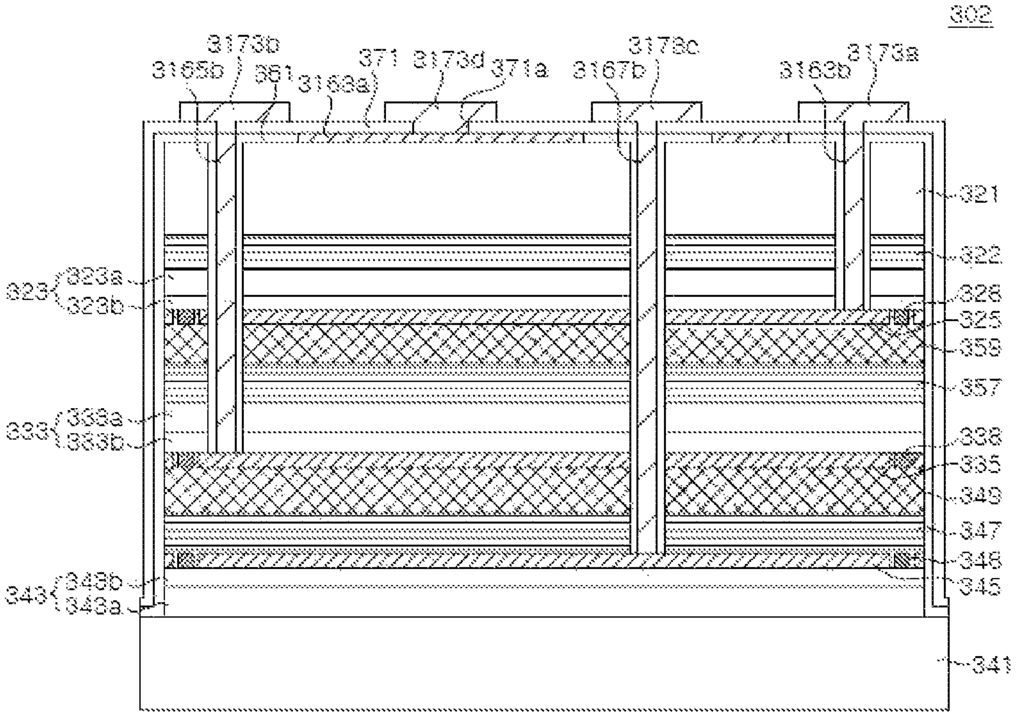

FIG. 50A and FIG. 50B are a schematic plan view and a cross-sectional view of a light emitting device 302 for a display according to another exemplary embodiment, respectively.

Referring to FIG. 50A and FIG. 50B, the light emitting device 302 according to an exemplary embodiment is substantially similar to the light emitting device 300 described with reference to FIG. 38A and FIG. 38B, except that the anodes of the first to third LED stacks 323, 333, 343 are independently connected to first to third electrode pads 3173*a*, 3173*b*, 3173*c*, and the cathodes thereof are electrically connected to a common electrode pad 3173*d*.

More particularly, the first electrode pad 3173*a* is electrically connected to the first transparent electrode 325 through a through-hole via 3163*b*, the second electrode pad 3173*b* is electrically connected to the second transparent electrode 335 through a through-hole via 3165*b*, and the third electrode pad 3173*c* is electrically connected to the third transparent electrode 345 through a through-hole via 3167*b*. The common electrode pad 3173*d* is electrically connected to an ohmic electrode 3163*a* exposed through the opening 371*a* of the upper insulation layer 371, and is also electrically connected to the first conductivity type semiconductor layers 333*a* and 343*a* of the second LED stack 333 and the third LED stack 343 through the through-hole vias 3165*a*, 3167*a*. For example, the through-hole via 3165*a* may be connected to the first conductivity type semiconductor layer 333*a*, and the through-hole via 3175*a* may be connected to the ohmic electrode 346 in ohmic contact with the first conductivity type semiconductor layer 343*a*.

Each of the light emitting devices 300, 302 according to the exemplary embodiments includes the first to third LED stacks 323, 333, 343, which emit red, green and blue light, respectively, and thus can be used as one pixel in a display apparatus. As described in FIG. 37, the display apparatus may be realized by arranging a plurality of light emitting devices 300 or 302 on the circuit board 301. Since each of the light emitting devices 300, 302 includes the first to third LED stacks 323, 333, 343, it is possible to increase the area of a subpixel in one pixel. Furthermore, the first to third LED stacks 323, 333, 343 can be mounted on the circuit board by mounting one light emitting device, thereby reducing the number of mounting processes.

As described in FIG. 37, the light emitting devices mounted on the circuit board 301 can be driven in a passive matrix or active matrix driving manner.

Figure 51:
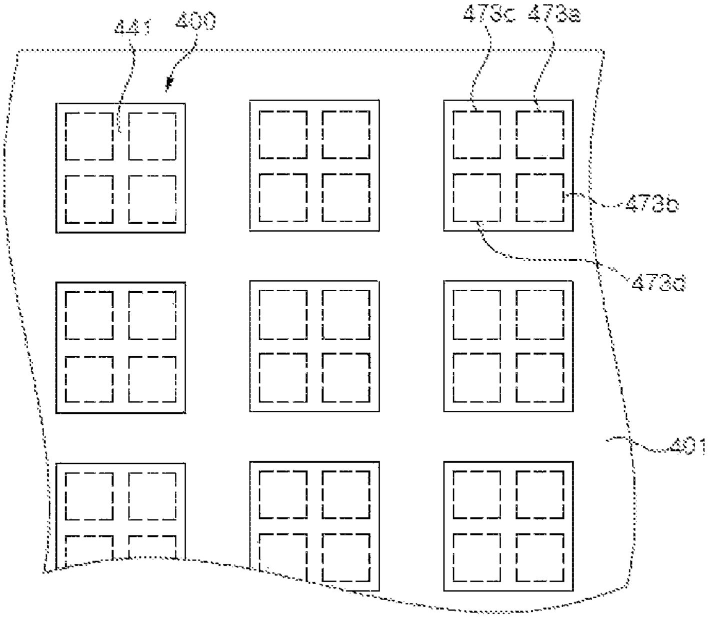
FIG. 51 is a schematic plan view of a display apparatus according to an exemplary embodiment.

FIG. 51 is a schematic plan view of a display apparatus according to an exemplary embodiment.

Referring to FIG. 51, the display apparatus according to an exemplary embodiment includes a circuit board 401 and a plurality of light emitting devices 400.

The circuit board 401 may include a circuit for passive matrix driving or active matrix driving. In an exemplary embodiment, the circuit board 401 may include interconnection lines and resistors. In another exemplary embodiment, the circuit board 401 may include interconnection lines, transistors and capacitors. The circuit board 401 may also have electrode pads disposed on an upper surface thereof to allow electrical connection to the circuit therein.

The light emitting devices 400 are arranged on the circuit board 401. Each of the light emitting devices 400 may constitute one pixel. The light emitting device 400 may include electrode pads 473*a*, 473*b*, 473*c*, and 473*d*, which are electrically connected to the circuit board 401. In addition, the light emitting device 400 may include a substrate 441 disposed at an upper surface thereof. Since the light emitting devices 400 are separated from one another, the substrates 441 disposed at the upper surfaces of the light emitting devices 400 are also separated from one another.

Figure 52A:
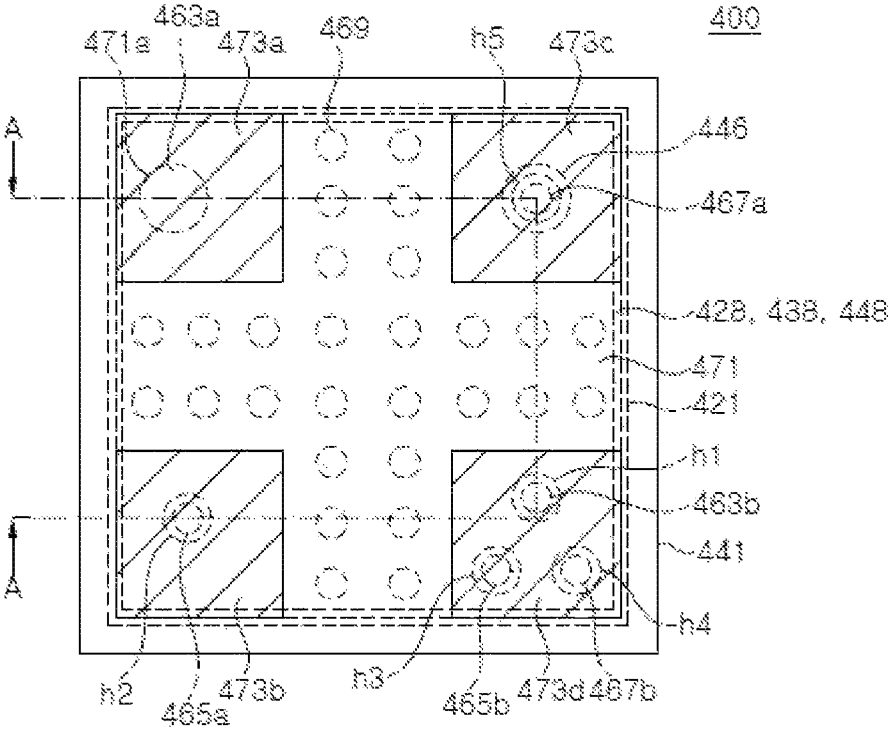
FIG. 52A is a schematic plan view of a light emitting device for a display according to an exemplary embodiment.
Figure 52B:
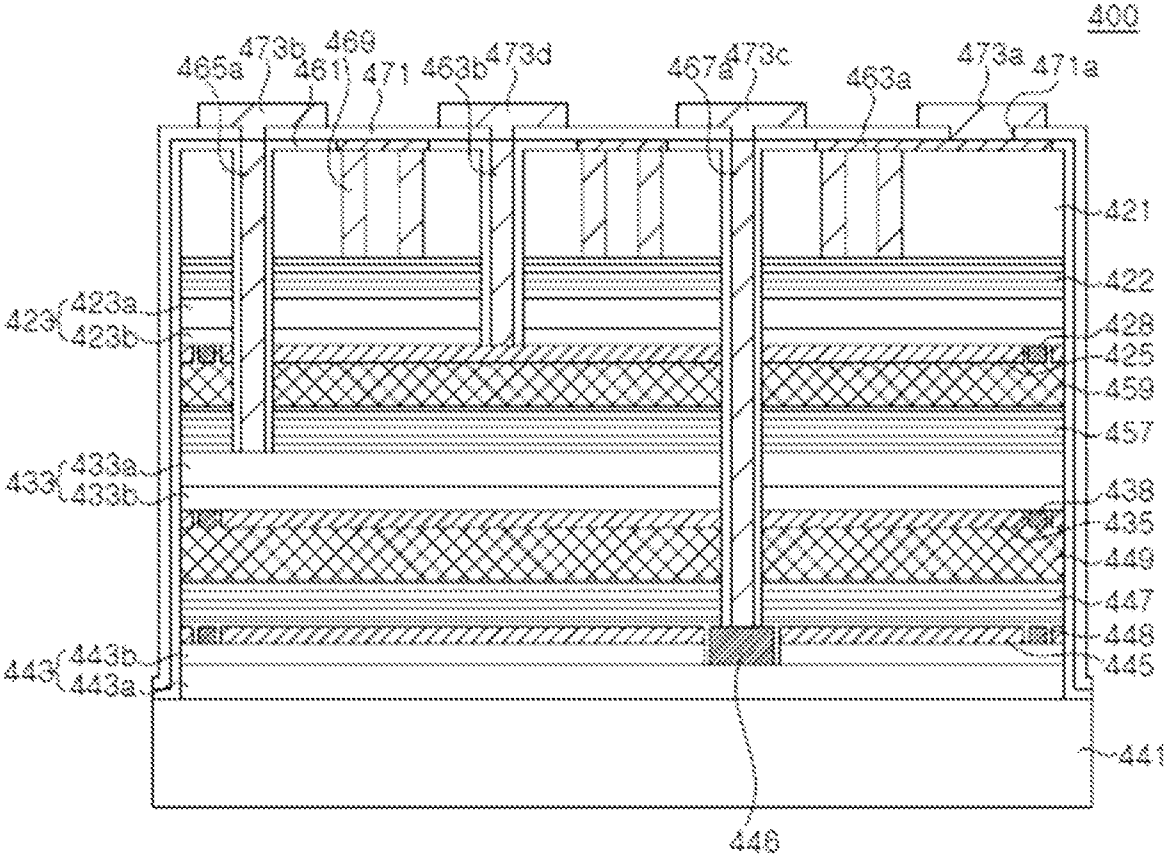
FIG. 52B is a schematic cross-sectional view taken along the line A-A of FIG. 52A.

Details of the light emitting device 400 will be described with reference to FIG. 52A and FIG. 52B. FIG. 52A is a schematic plan view of the light emitting device 400 for a display according to an exemplary embodiment, and FIG. 52B is a schematic cross-sectional view taken along line A-A of FIG. 52A. Although the electrode pads 473*a*, 473*b*, 473*c*, and 473*d* are illustrated and described as being disposed at an upper side of the light emitting device, in some exemplary embodiments, the light emitting device 400 may be flip-bonded on the circuit board 401, in this case, the electrode pads 473*a*, 473*b*, 473*c*, and 473*d* may be disposed at a lower side thereof.

Referring to FIG. 52A and FIG. 52B, the light emitting device 400 may include a first substrate 421, a second substrate 441, a distributed Bragg reflector 422, a first LED stack 423, a second LED stack 433, a third LED stack 443, a first transparent electrode 425, a second transparent electrode 435, a third transparent electrode 445, an ohmic electrode 446, a first current spreader 428, a second current spreader 438, a third current spreader 448, a first color filter 447, a second color filter 457, a first bonding layer 449, a second bonding layer 459, a lower insulation layer 461, an upper insulation layer 471, an ohmic electrode 463*a*, through-hole vias 463*b*, 465*a*, 465*b*, 467*a*, and 467*b*, heat pipes 469, and electrode pads 473*a*, 473*b*, 473*c*, and 473*d*.

The first substrate 421 may support the LED stacks 423, 433, and 443. The first substrate 421 may be a growth substrate for growing the first LED stack 423, for example, a GaAs substrate. In particular, the first substrate 421 may have conductivity.

The second substrate 441 may support the LED stacks 423, 433, and 443. The LED stacks 423, 433, and 443 are disposed between the first substrate 421 and the second substrate 441. The second substrate 441 may be a growth substrate for growing the third LED stack 443. For example, the second substrate 441 may be a sapphire substrate or a GaN substrate, more particularly a patterned sapphire substrate. The first to third LED stacks are disposed on the second substrate 441 in the order of the third LED stack 443, the second LED stack 433, and the first LED stack 423 from the second substrate 441. In an exemplary embodiment, a single third LED stack may be disposed on a single second substrate 441. The second LED stack 433, the first LED stack 423, and the first substrate 421 are disposed on the third LED stack 443. Accordingly, the light emitting device 400 may have a single chip structure of a single pixel.

In another exemplary embodiment, a plurality of third LED stacks 43 may be disposed on a single second substrate 441. The second LED stack 433, the first LED stack 423, and the first substrate 421 are disposed on each of the third LED stacks 43, whereby the light emitting device 400 has a single chip structure of a plurality of pixels.

In some exemplary embodiments, the second substrate 441 may be omitted and a lower surface of the third LED stack 443 may be exposed. In this case, a roughened surface may be formed on the lower surface of the third LED stack 443 by surface texturing.

Each of the first LED stack 423, the second LED stack 433, and the third LED stack 443 includes a first conductivity type semiconductor layer 423*a*, 433*a*, and 443*a*, a second conductivity type semiconductor layer 423*b*, 433*b*, and 443*b*, and an active layer interposed therebetween, respectively. The active layer may have a multi-quantum well structure.

The LED stacks may emit light having a shorter wavelength as being disposed closer to the second substrate 441. For example, the first LED stack 423 may be an inorganic light emitting diode adapted to emit red light, the second LED stack 433 may be an inorganic light emitting diode adapted to emit green light, and the third LED stack 443 may be an inorganic light emitting diode adapted to emit blue light. The first LED stack 423 may include an AlGaInP-based well layer, the second LED stack 433 may include an AlGaInP or AlGaInN-based well layer, and the third LED stack 443 may include an AlGaInN-based well layer. However, the inventive concepts are not limited thereto. When the light emitting device 400 includes a micro LED, which has a surface area less than about 10,000 square μm as known in the art, or less than about 4,000 square μm or 2,500 square μm in other exemplary embodiments, the first LED stack 423 may emit any one of red, green, and blue light, and the second and third LED stacks 433 and 443 may emit a different one of red, green, and blue light, without adversely affecting operation, due to the small form factor of a micro LED In addition, the first conductivity type semiconductor layer 423*a*, 433*a*, and 443*a* of each of the LED stacks 423, 433, and 443 may be an n-type semiconductor layer, and the second conductivity type semiconductor layer 423*b*, 433*b*, and 443*b* thereof may be a p-type semiconductor layer. In the illustrated exemplary embodiment, an upper surface of the first LED stack 423 is an n-type semiconductor layer 423*a*, an upper surface of the second LED stack 433 is an n-type semiconductor layer 433*a*, and an upper surface of the third LED stack 443 is a p-type semiconductor layer 443*b*. In particular, only the semiconductor layers of the third LED stack 443 are stacked in a different sequence from those of the first and second LED stacks 423 and 433. The first conductivity type semiconductor layer 443*a* of the third LED stack 443 may be subjected to surface texturing to improve light extraction efficiency. In some exemplary embodiments, the first conductivity type semiconductor layer 433*a* of the second LED stack 433 may also be subjected to surface texturing.

The first LED stack 423, the second LED stack 433, and the third LED stack 443 may be stacked to overlap one another, and may have substantially the same luminous area. Further, in each of the LED stacks 423, 433, and 443, the first conductivity type semiconductor layer 423*a*, 433*a*, and 443*a* may have substantially the same area as the second conductivity type semiconductor layer 423*b*, 433*b*, 443*b*, respectively. In particular, in each of the first LED stack 423 and the second LED stack 433 according to an exemplary embodiment, the first conductivity type semiconductor layer 423*a* or 433*a* may completely overlap the second conductivity type semiconductor layer 423*b* or 433*b*. In the third LED stack 443, a hole h5 is formed on the second conductivity type semiconductor layer 443*b* to expose the first conductivity type semiconductor layer 443*a*, and thus, the first conductivity type semiconductor layer 443*a* has a slightly larger area than the second conductivity type semiconductor layer 443*b*.

The first LED stack 423 is disposed apart from the second substrate 441, the second LED stack 433 is disposed under the first LED stack 423, and the third LED stack 443 is disposed under the second LED stack 433. Since the first LED stack 423 may emit light having a longer wavelength than the second and third LED stacks 433 and 443, light generated from the first LED stack 423 may be emitted outside after passing through the second and third LED stacks 433 and 443 and the second substrate 441. In addition, since the second LED stack 433 may emit light having a longer wavelength than the third LED stack 443, light generated from the second LED stack 433 may be emitted outside after passing through the third LED stack 443 and the second substrate 441.

The distributed Bragg reflector 422 may be disposed between the first substrate 421 and the first LED stack 423. The distributed Bragg reflector 422 reflects light generated from the first LED stack 423 to prevent the light from being lost through absorption by the substrate 421. For example, the distributed Bragg reflector 422 may be formed by alternately stacking AlAs and AlGaAs-based semiconductor layers one above another.

The first transparent electrode 425 may be disposed between the first LED stack 423 and the second LED stack 433. The first transparent electrode 425 is in ohmic contact with the second conductivity type semiconductor layer 423*b* of the first LED stack 423, and transmits light generated from the first LED stack 423. The first transparent electrode 425 may include a metal layer or a transparent oxide layer, such as an indium tin oxide (ITO) layer or others.

The second transparent electrode 435 is in ohmic contact with the second conductivity type semiconductor layer 433*b* of the second LED stack 433. As shown in the drawings, the second transparent electrode 435 contacts a lower surface of the second LED stack 433 between the second LED stack 433 and the third LED stack 443. The second transparent electrode 435 may include a metal layer or a conductive oxide layer that is transparent to red light and green light.

The third transparent electrode 445 is in ohmic contact with the second conductivity type semiconductor layer 443*b* of the third LED stack 443. The third transparent electrode 445 may be disposed between the second LED stack 433 and the third LED stack 443, and contacts the upper surface of the third LED stack 443. The third transparent electrode 445 may include a metal layer or a conductive oxide layer transparent to red light and green light. The third transparent electrode 445 may also be transparent to blue light. Each of the second transparent electrode 435 and the third transparent electrode 445 is in ohmic contact with the p-type semiconductor layer of each of the LED stacks to assist in current spreading. Examples of conductive oxide layers for the second and third transparent electrodes 435 and 445 may include $SnO_2$, $InO_2$, ITO, ZnO, IZO, or others.

The first to third current spreaders 428, 438, and 448 may be disposed to spread current in the second conductivity type semiconductor layers 423*b*, 433*b*, and 443*b* of the first to third LED stacks 423, 433, and 443. As shown in the drawing, the first current spreader 428 may be disposed on the second conductivity type semiconductor layer 423*b* exposed through the first transparent electrode 425, the second current spreader 438 may be disposed on the second conductivity type semiconductor layer 433*b* exposed through the second transparent electrode 435, and the third current spreader 448 may be disposed on the second conductivity type semiconductor layer 443*b* exposed through the third transparent electrode 445. As shown in FIG. 52A, each of the first to third current spreaders 428, 438, and 448 may be disposed along an edge of each of the first to third LED stacks 423, 433, and 443. Also, each of the first to third current spreaders 428, 438 and 448 may have substantially a rectangular shape to surround a center of each LED stack, but the inventive concepts are not limited thereto, and the current spreaders may have various shapes, such as substantially an elongated or a curved line shape. Further, the first to third current spreaders 428, 438, and 448 may be disposed to overlap one another, without being limited thereto.

The first to third current spreader 428, 438, and 448 may be separated from the first to third transparent electrode 425, 435, and 445. Accordingly, a gap may be formed between a side surface of the first to third current spreader 428, 438, and 448 and the first to third transparent electrode 425, 435, and 445. However, the inventive concepts are not limited thereto, and at least one of the first to third current spreader 428, 438, and 448 may contact the first to third transparent electrode 425, 435, and 445.

The first to third current spreader 428, 438, and 448 may be formed of a material having a higher electrical conductivity than the first to third transparent electrode 425, 435, and 445, and thus, current may be evenly spread over wide regions of the second conductivity type semiconductor layers 423*b*, 433*b*, and 443*b*.

The ohmic electrode 446 is in ohmic contact with the first conductivity type semiconductor layer 443*a* of the third LED stack 443. The ohmic electrode 446 may be disposed on the first conductivity type semiconductor layer 443*a* exposed through the third transparent electrode 445 and the second conductivity type semiconductor layer 443*b*. The ohmic electrode 446 may be formed of Ni/Au/Ti or Ni/Au/Ti/Ni, for example. When a surface of the ohmic electrode 446 is exposed during the etching process, a Ni layer may be formed on the surface of the ohmic electrode 446 to function as an etching stopper layer. The ohmic electrode 446 may be formed to have various shapes, and in particular, it may be formed to have substantially an elongated shape to function as a current spreader. In some exemplary embodiments, the ohmic electrode 446 may be omitted.

The first color filter 447 may be disposed between the third transparent electrode 445 and the second LED stack 433, and the second color filter 457 may be disposed between the second LED stack 433 and the first LED stack 423. The first color filter 447 transmits light generated from the first and second LED stacks 423 and 433 while reflecting light generated from the third LED stack 443. The second color filter 457 transmits light generated from the first LED stack 423 while reflecting light generated from the second LED stack 433. Accordingly, light generated from the first LED stack 423 may be emitted outside through the second LED stack 433 and the third LED stack 443, and light generated from the second LED stack 433 may be emitted outside through the third LED stack 443. Furthermore, it is possible to prevent light loss by preventing light generated from the second LED stack 433 from entering the first LED stack 423, or light generated from the third LED stack 443 from entering the second LED stack 433.

In some exemplary embodiments, the second color filter 457 may reflect light generated from the third LED stack 443.

The first and second color filters 447 and 457 may be, for example, a low pass filter allowing light in a low frequency band, e.g., in a long wavelength band to pass therethrough, a band pass filter allowing light in a predetermined wavelength band, or a band stop filter that prevents light in a predetermined wavelength band from passing therethrough. In particular, each of the first and second color filters 447 and 457 may be formed by alternately stacking insulation layers having different refractive indices one above another, such as $TiO_2$ and $SiO_2$, for example. In particular, each of the first and second color filters 447 and 457 may include a distributed Bragg reflector (DBR). In addition, a stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 449 couples the second LED stack 433 to the third LED stack 443. The first bonding layer 449 may couple the first color filter 447 to the second transparent electrode 435 between the first color filter 447 and the second transparent electrode 435. For example, the first bonding layer 449 may be formed of a transparent organic material or a transparent inorganic material. Examples of the organic material may include SUB, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 449 may be formed of spin-on-glass (SOG).

The second bonding layer 459 couples the second LED stack 433 to the first LED stack 423. As shown in the drawings, the second bonding layer 459 may be disposed between the second color filter 457 and the first transparent electrode 425. The second bonding layer 459 may be formed of substantially the same material as the first bonding layer 449.

Holes h1, h2, h3, h4, and h5 are formed through the first substrate 421. The hole h1 may be formed through the first substrate 421, the distributed Bragg reflector 422, and the first LED stack 423 to expose the first transparent electrode 425. The hole h2 may be formed through the first substrate 421, the distributed Bragg reflector 422, the first transparent electrode 425, the second bonding layer 459, and the second color filter 457 to expose the first conductivity type semiconductor layer 433*a* of the second LED stack 433.

The hole h3 may be formed through the first substrate 421, the distributed Bragg reflector 422, the first transparent electrode 425, the second bonding layer 459, and the second color filter 457, and the second LED stack 433 to expose the second transparent electrode 435. The hole h4 may be formed through the first substrate 421, the distributed Bragg reflector 422, the first transparent electrode 425, the second bonding layer 459, the second color filter 457, the second LED stack 433, the second transparent electrode 435, the first bonding layer 449, and the first color filter 447 to expose the third transparent electrode 445. In addition, the hole h5 may be formed through the first substrate 421, the distributed Bragg reflector 422, the first transparent electrode 425, the second bonding layer 459, the second color filter 457, the second LED stack 433, the second transparent electrode 435, the first bonding layer 449, and the first color filter 447 to expose the ohmic electrode 446. When the ohmic electrode 446 is omitted in some exemplary embodiments, the first conductivity type semiconductor layer 443*a* may be exposed by the hole h5.

Although the holes h1, h3 and h4 are illustrated as being separated from one another to expose the first to third transparent electrodes 425, 435, and 445, respectively, the inventive concepts are not limited thereto, and the first to third transparent electrodes 425, 435, and 445 may be exposed though a single hole.

In addition, the first to third transparent electrodes 425, 435, and 445 are illustrated as being exposed though the holes h1, h3 and h4, but in some exemplary embodiments, the first to third current spreaders 428, 438, and 448 may be exposed.

The lower insulation layer 461 covers side surfaces of the first substrate 421 and the first to third LED stacks 423, 433, and 443 while covering an upper surface of the first substrate 421. The lower insulation layer 461 also covers side surfaces of the holes h1, h2, h3, h4, and h5. However, the lower insulation layer 461 may be subjected to patterning to expose a bottom of each of the holes h1, h2, h3, h4, and h5. Furthermore, the lower insulation layer 461 may also be subjected to patterning to expose the upper surface of the first substrate 421.

The ohmic electrode 463*a* is in ohmic contact with the upper surface of the first substrate 421. The ohmic electrode 463*a* may be formed in an exposed region of the first substrate 421, which is exposed by patterning the lower insulation layer 461. The ohmic electrode 463*a* may be formed of Au—Te alloys or Au—Ge alloys, for example. Each of the through-hole vias 463*b*, 465*b*, and 467*b* may be connected to the first to third transparent electrodes 425, 435, and 445, and may be connected to the first to third current spreaders 428, 438, and 448.

The through-hole vias 463*b*, 465*a*, 465*b*, 467*a*, and 467*b* are disposed in the holes h1, h2, h3, h4, and h5. The through-hole via 463*b* may be disposed in the hole h1, and may be connected to the first transparent electrode 425. The through-hole via 465*a* may be disposed in the hole h2, and be in ohmic contact with the first conductivity type semiconductor layer 433*a*. The through-hole via 465*b* may be disposed in the hole h3, and may be electrically connected to the second transparent electrode 435. The through-hole via 467*a* may be disposed in the hole h5, and may be electrically connected to the first conductivity type semiconductor layer 443*a*. For example, the through-hole via 467*a* may be electrically connected to the ohmic electrode 446 through the hole h5. The through-hole via 467*b* may be disposed in the hole h4, and may be connected to the third transparent electrode 445. The through-hole via 463*b*, 465*b*, and 467*b* may be connected to the first to third transparent electrode 425, 435, and 445, or may be connected to the first to third current spreader 428, 438, and 448.

The through-hole vias 463*b*, 465*a*, 465*b*, 467*a*, and 467*b* may be separated and insulted from the substrate 421 inside the holes by the lower insulation layer 461. The through-hole vias 463*b*, 465*a*, 465*b*, 467*a*, and 467*b* may pass through the substrate 421 and may also pass through the distributed Bragg reflector 422.

At least a portion of each of the heat pipes 469 is disposed inside the substrate 421. In particular, the heat pipes 469 may be disposed over the first LED stack 423, and may be disposed on the distributed Bragg reflector 422. The heat pipes 469 may contact the distributed Bragg reflector 422, or may be separated from the distributed Bragg reflector 422. As the heat pipes 469 are disposed on the distributed Bragg reflector 422, the distributed Bragg reflector 422 may not be damaged by the heat pipes 469, and thus, reduction of the reflectance in the distributed Bragg reflector 422 by the heat pipes 469 may be prevented. However, the inventive concepts are not limited thereto, and a portion of the heat pipes 469 may be disposed in the distributed Bragg reflector 422.

As shown in FIG. 52B, the heat pipes 469 may be connected to the ohmic electrode 463*a*.

However, the inventive concepts are not limited thereto, and the heat pipes 469 may be separated from the ohmic electrode 463*a*. Further, an upper surface of the heat pipes 469 may be substantially flush with an upper surface of the substrate 421, but in some exemplary embodiments, the upper surface of the heat pipes 469 may protrude above the upper surface of the substrate 421.

The upper insulation layer 471 covers the lower insulation layer 461 and the ohmic electrode 463*a*. The upper insulation layer 471 may cover the lower insulation layer 461 at the sides of the first substrate 421, the first to third LED stacks 423, 433 and 443. The top surface of the lower insulation layer 461 may be covered by the upper insulation layer 471. The upper insulation layer 471 may have an opening 471*a* for exposing the ohmic electrode 463*a*, and may have openings for exposing the through-hole vias 463*b*, 465*a*, 465*b*, 467*a*, and 467*b*.

The upper insulation layer 471 may cover the upper portion of the heat pipes 469, but in some exemplary embodiments, the upper insulation layer 471 may expose the upper surface of the heat pipes 469.

The lower insulation layer 461 or the upper insulation layer 471 may be formed of silicon oxide or silicon nitride, without being limited thereto. For example, the lower insulation layer 461 or the upper insulation layer 471 may be a distributed Bragg reflector formed by stacking insulation layers having different refractive indices. In particular, the upper insulation layer 471 may be a light reflective layer or a light blocking layer.

The electrode pads 473*a*, 473*b*, 473*c*, and 473*d* are disposed on the upper insulation layer 471, and are electrically connected to the first to third LED stacks 423, 433, and 443. For example, the first electrode pad 473*a* is electrically connected to the ohmic electrode 463*a* exposed through the opening 471*a* of the upper insulation layer 471, and the second electrode pad 473*b* is electrically connected to the through-hole via 465*a* exposed through the opening of the upper insulation layer 471. In addition, the third electrode pad 473*c* is electrically connected to the through-hole via 467*a* exposed through the opening of the upper insulation layer 471. A common electrode pad 473*d* is electrically connected to the through-hole vias 463*b*, 465*b*, and 467*b* in common.

Accordingly, the common electrode pad 473*d* is electrically connected to the second conductivity type semiconductor layers 423*b*, 433*b*, and 443*b* of the first to third LED stacks 423, 433, and 443, and each of the electrode pads 473*a*, 473*b*, and 473*c* is electrically connected to the first conductivity type semiconductor layers 423*a*, 433*a*, and 443*a* of the first to third LED stacks 423, 433, and 443, respectively.

According to the illustrated exemplary embodiment, the first LED stack 423 is electrically connected to the electrode pads 473*d* and 473*a*, the second LED stack 433 is electrically connected to the electrode pads 473*d* and 473*b*, and the third LED stack 443 is electrically connected to the electrode pads 473*d* and 473*c*. As such, anodes of the first LED stack 423, the second LED stack 433, and the third LED stack 443 are electrically connected to the electrode pad 473*d*, and the cathodes thereof are electrically connected to the first to third electrode pads 473*a*, and 473*b*, and 473*c*, respectively. Accordingly, the first to third LED stacks 423, 433, and 443 may be independently driven.

The heat pipes 469 may be electrically connected to the first electrode pad 473*a* through the ohmic electrode 463*a*. In some exemplary embodiments, a portion of the heat pipes 469 may be disposed in a lower region of the first electrode pad 473*a*.

FIGS. 53A, 53B, 54A, 54B, 55A, 55B, 56, 57, 58, 59A, 59B, 60A, 60B, 61A, 61B, 62A, 62B, 63A, 63B, 64A, 64B, 65A, and 65B are schematic plan views and cross-sectional views illustrating a method of manufacturing a light emitting device for a display according to an exemplary embodiment of the present disclosure. In the drawings, each plan view corresponds to FIG. 52A, and each cross-sectional view is taken along line A-A of corresponding plan view. FIGS. 53B and 54B are cross-sectional views taken along line B-B of FIGS. 53A and 54A, respectively.

Figure 53A:
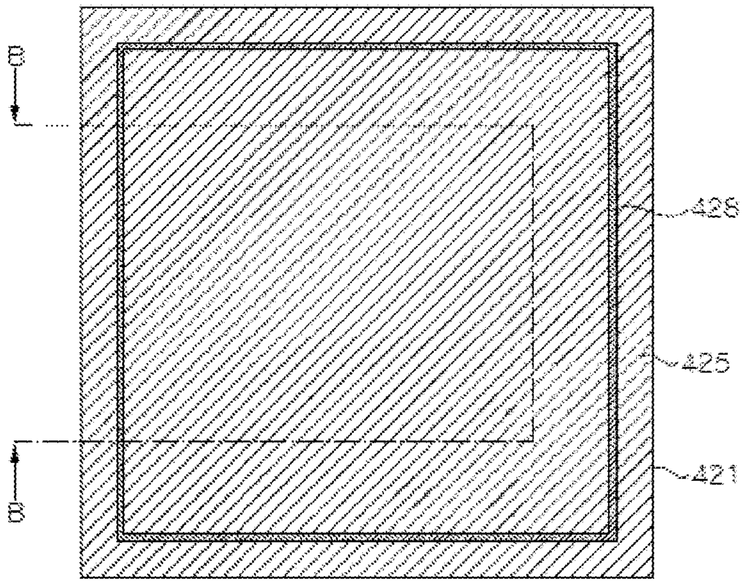
FIGS. 53A, 53B, 54A, 54B, 55A, 55B, 56, 57, 58, 59A, 59B, 60A, 60B, 61A, 61B, 62A, 62B, 63A, 63B, 64A, 64B, 65A, and 65B are schematic plan views and cross-sectional views illustrating a method of manufacturing a light emitting device for a display according to an exemplary embodiment.
Figure 53B:
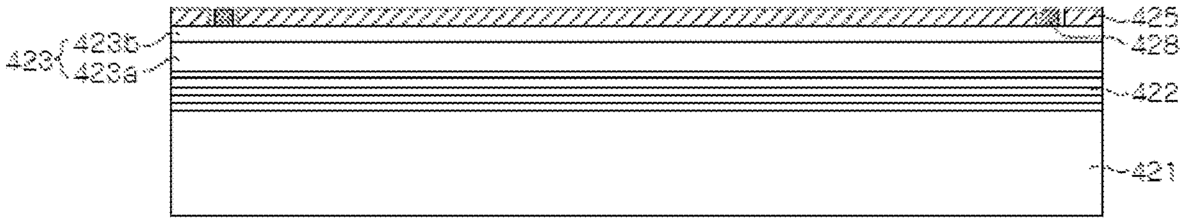

First, referring to FIGS. 53A and 53B, a first LED stack 423 is grown on a first substrate 421. The first substrate 421 may be a GaAs substrate, for example. In addition, the first LED stack 423 may include AlGaInP-based semiconductor layers, and includes a first conductivity type semiconductor layer 423*a*, an active layer, and a second conductivity type semiconductor layer 423*b*. The first conductivity type may be an n-type, and the second conductivity type may be a p-type. A distributed Bragg reflector 422 may be formed prior to growth of the first LED stack 423. The distributed Bragg reflector 422 may have a stack structure formed by repeatedly stacking AlAs/AlGaAs layers, for example.

A first transparent electrode 425 may be formed on the second conductivity type semiconductor layer 423*b*. The first transparent electrode 425 may be formed of a transparent oxide layer, such as indium tin oxide (ITO), a transparent metal layer, or others.

The first transparent electrode 425 may be formed to have an opening for exposing the second conductivity type semiconductor layer 423*b*, and a first current spreader 428 may be formed in the opening. The first transparent electrode 425 may be patterned by photolithography and etching techniques, for example, which may form the opening for exposing the second conductivity type semiconductor layer 423*b*. The opening of the first transparent electrode 425 may define a region to which the first current spreader 428 may be formed.

Although FIG. 53A shows the first current spreader 428 as having substantially a rectangular shape, the inventive concepts are not limited thereto. For example, the first current spreader 428 may have various shapes, such as substantially an elongated or a curved line shape. The first current spreader 428 may be formed by the lift-off technique or the like, and a side thereof may be separated from the first transparent electrode 425. The first current spreader 428 may be formed to have the same or similar thickness as the first transparent electrode 425.

Figure 54A:
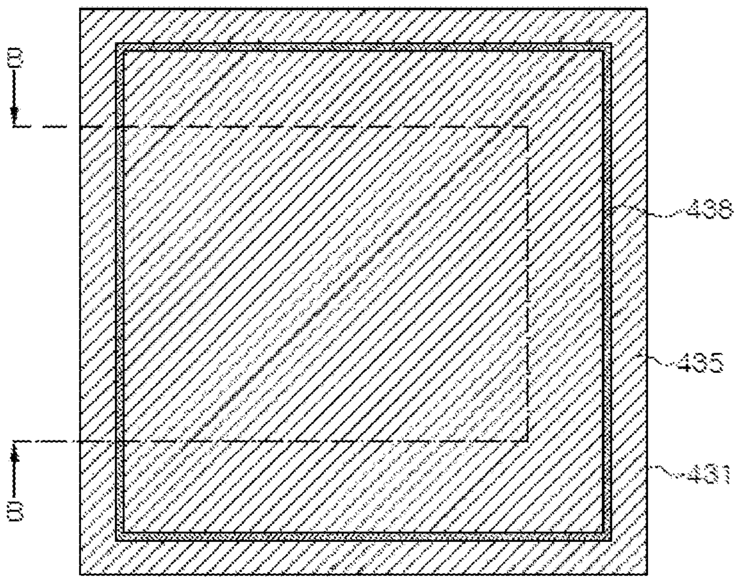
Figure 54B:
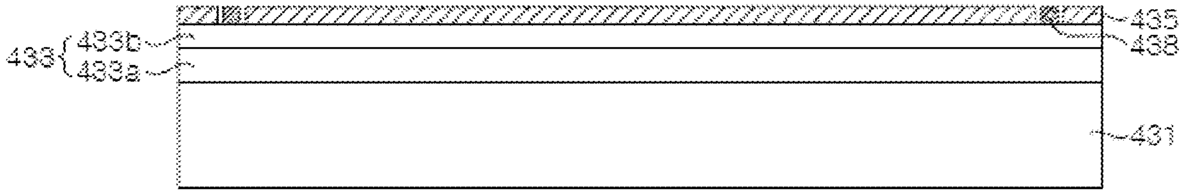

Referring to FIGS. 54A and 54B, a second LED stack 433 is grown on a substrate 431, and a second transparent electrode 435 is formed on the second LED stack 433. The second LED stack 433 may include AlGaInP-based or AlGaInN-based semiconductor layers, and may include a first conductivity type semiconductor layer 433*a*, an active layer, and a second conductivity type semiconductor layer 433*b*. The substrate 431 may be a substrate capable of growing AlGaInP-based semiconductor layers thereon, for example, a GaAs substrate or a GaP substrate, or a substrate capable of growing AlGaInN-based semiconductor layers thereon, for example, a sapphire substrate. The first conductivity type may be an n-type, and the second conductivity type may be a p-type. A composition ratio of Al, Ga, and In for the second LED stack 433 may be determined so that the second LED stack 433 may emit green light, for example. In addition, when the GaP substrate is used, a pure GaP layer or a nitrogen (N) doped GaP layer is formed on the GaP to emit green light. The second transparent electrode 435 is in ohmic contact with the second conductivity type semiconductor layer 433*b*. The second transparent electrode 435 may be formed of a metal layer or a conductive oxide layer, such as $SnO_2$, $InO_2$, ITO, ZnO, IZO, and the like.

The second transparent electrode 435 may be formed to have an opening for exposing the second conductivity type semiconductor layer 433*b*, and a second current spreader 438 may be formed in the opening. The second transparent electrode 435 may be patterned by photolithography and etching techniques, for example, which may form the opening for exposing the second conductivity type semiconductor layer 433*b*. The opening of the second transparent electrode 435 may define a region to which the second current spreader 438 may be formed.

Although FIG. 54A shows the second current spreader 438 as having substantially a rectangular shape, the inventive concepts are not limited thereto. For example, the second current spreader 438 may have various shapes, such as substantially an elongated or a curved line shape. The second current spreader 438 may be formed by the lift-off technique or the like, and a side thereof may be separated from the second transparent electrode 435. The second current spreader 438 may be formed to have the same or similar thickness as the second transparent electrode 435.

The second current spreader 438 may have substantially the same shape and the same size as the first current spreader 428, but the inventive concepts are not limited thereto.

Figure 55A:
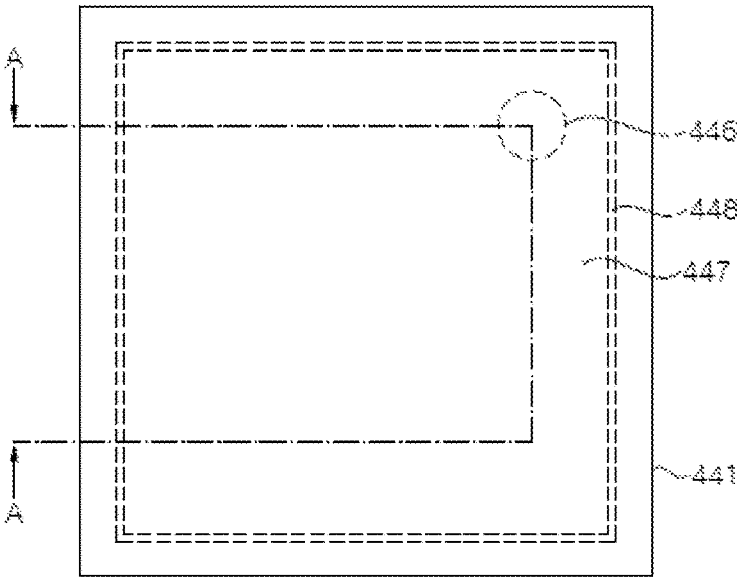
Figure 55B:
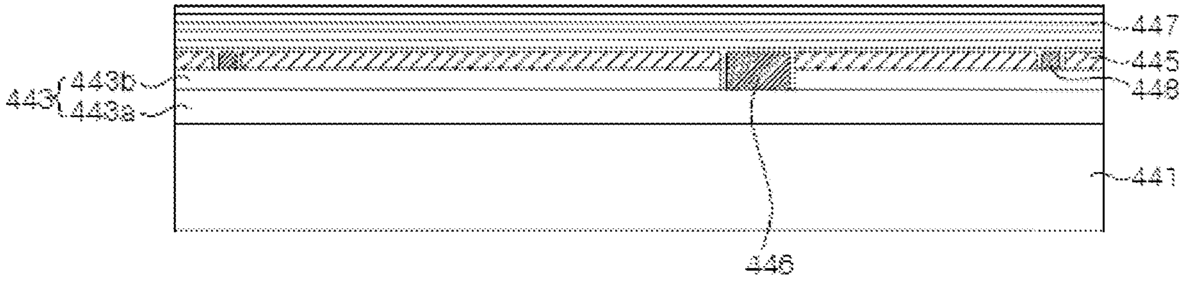

Referring to FIGS. 55A and 55B, a third LED stack 443 is grown on a second substrate 441, and a third transparent electrode 445 is formed on the third LED stack 443. The third LED stack 443 may include AlGaInN-based semiconductor layers, and may include a first conductivity type semiconductor layer 443*a*, an active layer, and a second conductivity type semiconductor layer 443*b*. The first conductivity type may be an n-type, and the second conductivity type may be a p-type.

The second substrate 441 is a substrate capable of growing GaN-based semiconductor layers thereon, and may be different from the first substrate 421. A composition ratio of AlGaInN for the third LED stack 443 is determined to allow the third LED stack 443 to emit blue light, for example.

The third transparent electrode 445 is in ohmic contact with the second conductivity type semiconductor layer 443*b*. The third transparent electrode 445 may be formed of a conductive oxide layer, such as $SnO_2$, $InO_2$, ITO, ZnO, IZO, and the like.

The third transparent electrode 445 may be formed to have an opening for exposing the first conductivity type semiconductor layer 443*a*, and an opening for exposing the second conductivity type semiconductor layer 443*b*. The opening for exposing the first conductivity type semiconductor layer 443*a* may define a region to which an ohmic electrode 446 may be formed, and the opening for exposing the second conductivity type semiconductor layer 443*b* may define a region to which a third current spreader 448 may be formed.

The third transparent electrode 445 may be patterned by photolithography and etching techniques, for example, which may form the openings for exposing the second conductivity type semiconductor layer 443*b*. Subsequently, the first conductivity type semiconductor layer 443*a* may be exposed by partially etching the second conductivity type semiconductor layer 443*b*, and the ohmic electrode 446 may be formed in an exposed region of the first conductivity type semiconductor layer 443*a*. The ohmic electrode 446 may be formed of a metal layer and be in ohmic contact with the first conductivity type semiconductor layer 443*a*. For example, the ohmic electrode 446 may be formed of a multilayer structure of Ni/Au/Ti or Ni/Au/Ti/Ni. The ohmic electrode 446 is electrically separated from the third transparent electrode 445 and the second conductivity type semiconductor layer 443*b*.

The third current spreader 448 is formed in an exposed region of the second conductivity type semiconductor layer 443*b*. Although FIG. 55A shows that the third current spreader 448 has substantially a rectangular shape, the inventive concepts are not limited thereto. For example, the third current spreader 448 may have various shapes, such as substantially an elongated or a curved line shape. The third current spreader 448 may be formed by the lift-off technique or the like, and a side thereof may be separated from the third transparent electrode 445. The third current spreader 448 may be formed to have the same or similar thickness as the third transparent electrode 445.

The third current spreader 448 may have substantially the same shape and the same size as the first or second current spreader 428 or 438, but the inventive concepts are not limited thereto.

Then, a first color filter 447 is formed on the third transparent electrode 445. Since the first color filter 447 is substantially the same as that described with reference to FIG. 52A and FIG. 52B, detailed descriptions thereof will be omitted to avoid redundancy.

Figure 56:
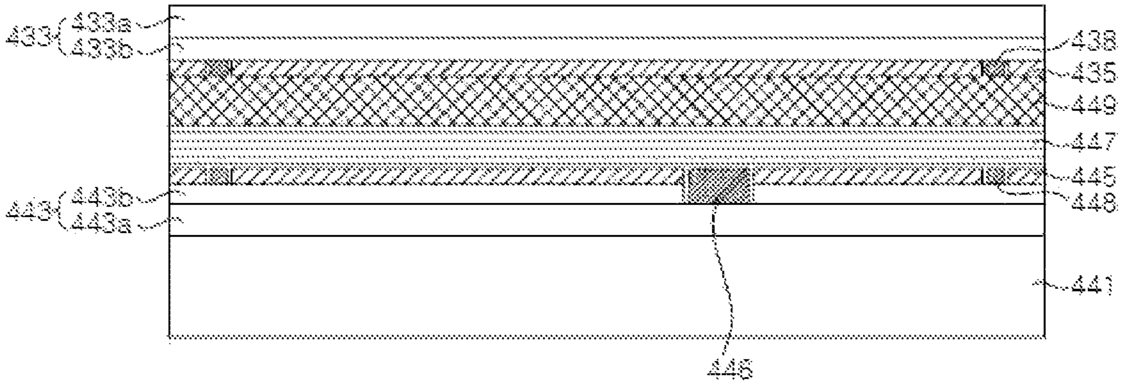

Referring to FIG. 56, the second LED stack 433 of FIG. 54A and FIG. 54B is bonded on the third LED stack 443 of FIG. 55A and FIG. 55B, and the second substrate 431 is removed therefrom.

The first color filter 447 is bonded to the second transparent electrode 435 to face each other. For example, bonding material layers may be formed on the first color filter 447 and the second transparent electrode 435, and are bonded to each other to form a first bonding layer 449. The bonding material layers may be transparent organic material layers or transparent inorganic material layers, for example. Examples of the organic material may include SUB, poly (methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 449 may be formed of spin-on-glass (SOG).

The second current spreader 438 may be disposed to overlap the third current spreader 448, but the inventive concepts are not limited thereto.

Thereafter, the substrate 431 may be removed from the second LED stack 433 by laser lift-off or chemical lift-off. As such, an upper surface of the first conductivity type semiconductor layer 433*a* of the second LED stack 433 is exposed. The exposed surface of the first conductivity type semiconductor layer 433*a* may be subjected to texturing.

Figure 57:
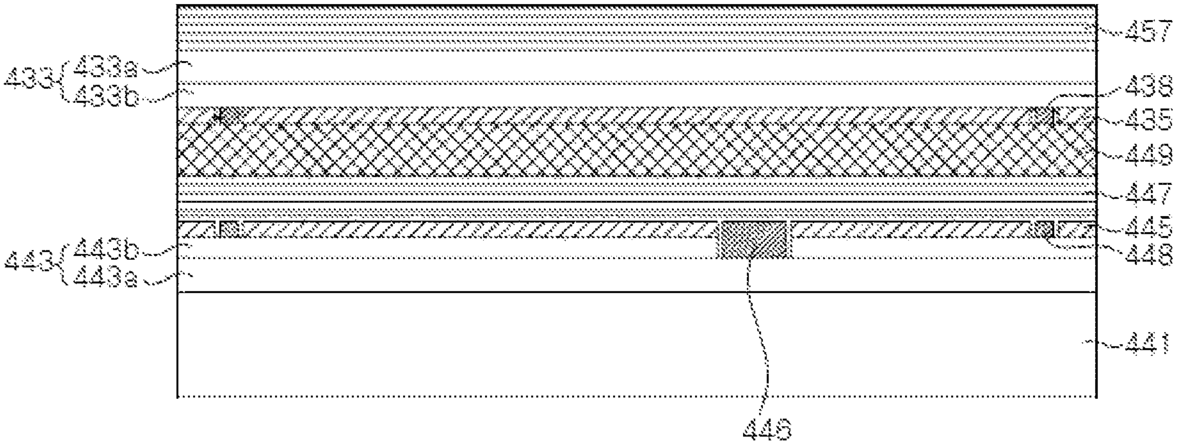

Referring to FIG. 57, a second color filter 457 is formed on the second LED stack 433. The second color filter 457 may be formed by alternately stacking insulation layers having different refractive indices and is substantially the same as that described with reference to FIG. 52A and FIG. 52B, and thus, detailed descriptions thereof will be omitted to avoid redundancy.

Figure 58:
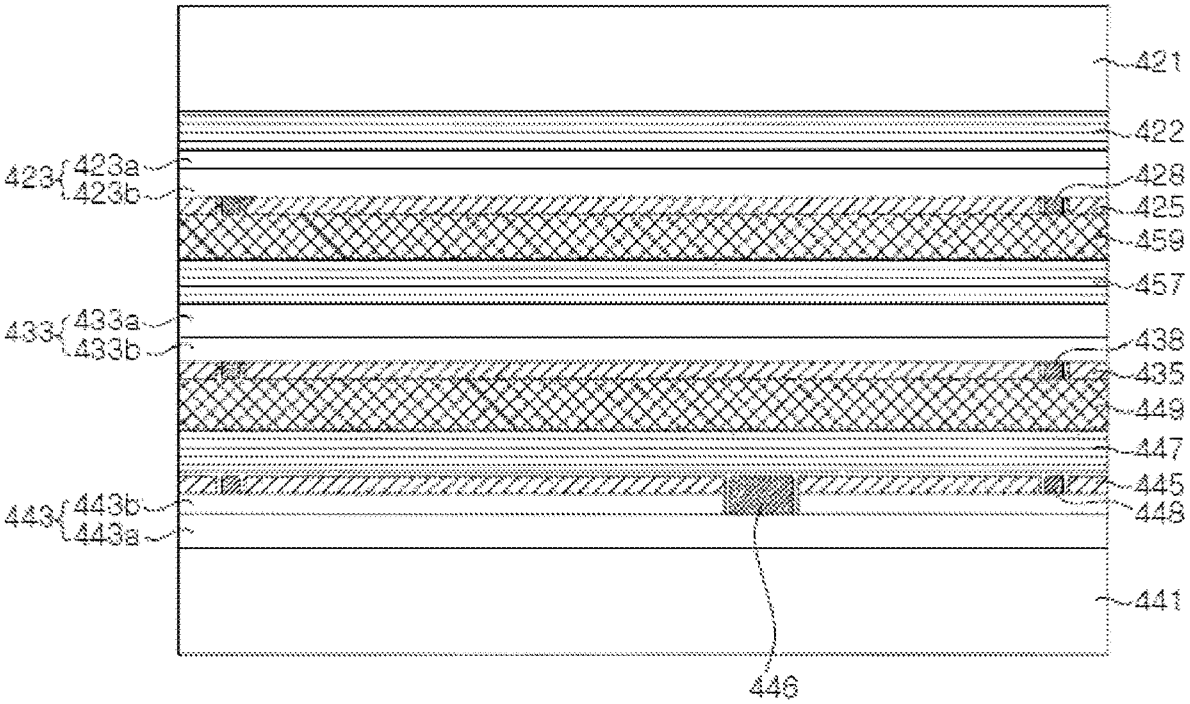

Subsequently, referring to FIG. 58, the first LED stack 423 of FIGS. 53A and 53B is bonded to the second LED stack 433. The second color filter 457 may be bonded to the first transparent electrode 425 to face each other. For example, bonding material layers may be formed on the second color filter 457 and the first transparent electrode 425, and are bonded to each other to form a second bonding layer 459. The bonding material layers are substantially the same as those described with reference to the first bonding layer 449, and thus, detailed descriptions thereof will be omitted.

The first current spreader 428 may be disposed to overlap the second or third current spreader 438 or 448, but the inventive concepts are not limited thereto.

Figure 59A:
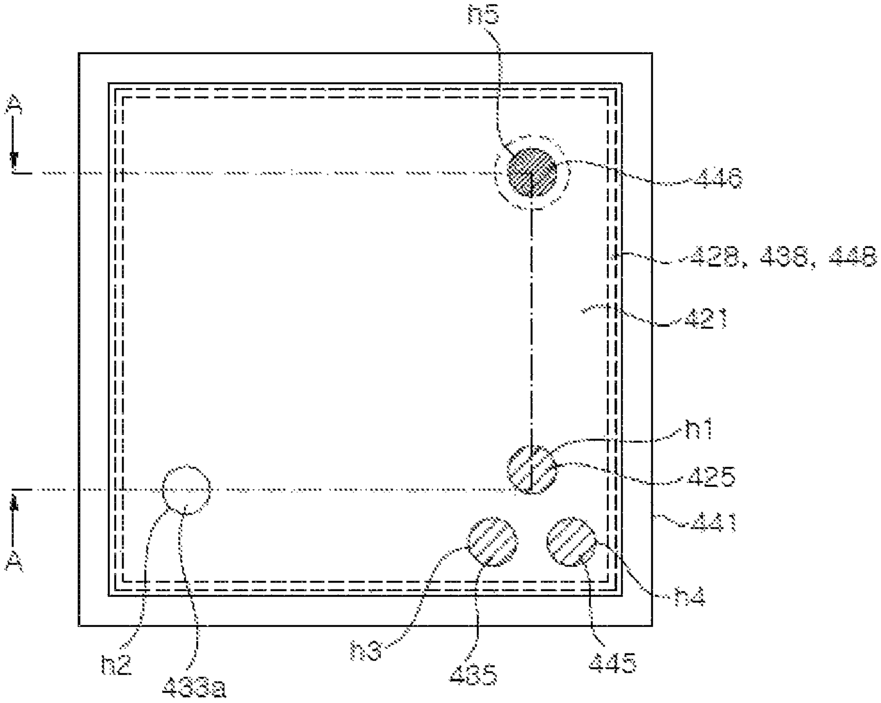
Figure 59B:
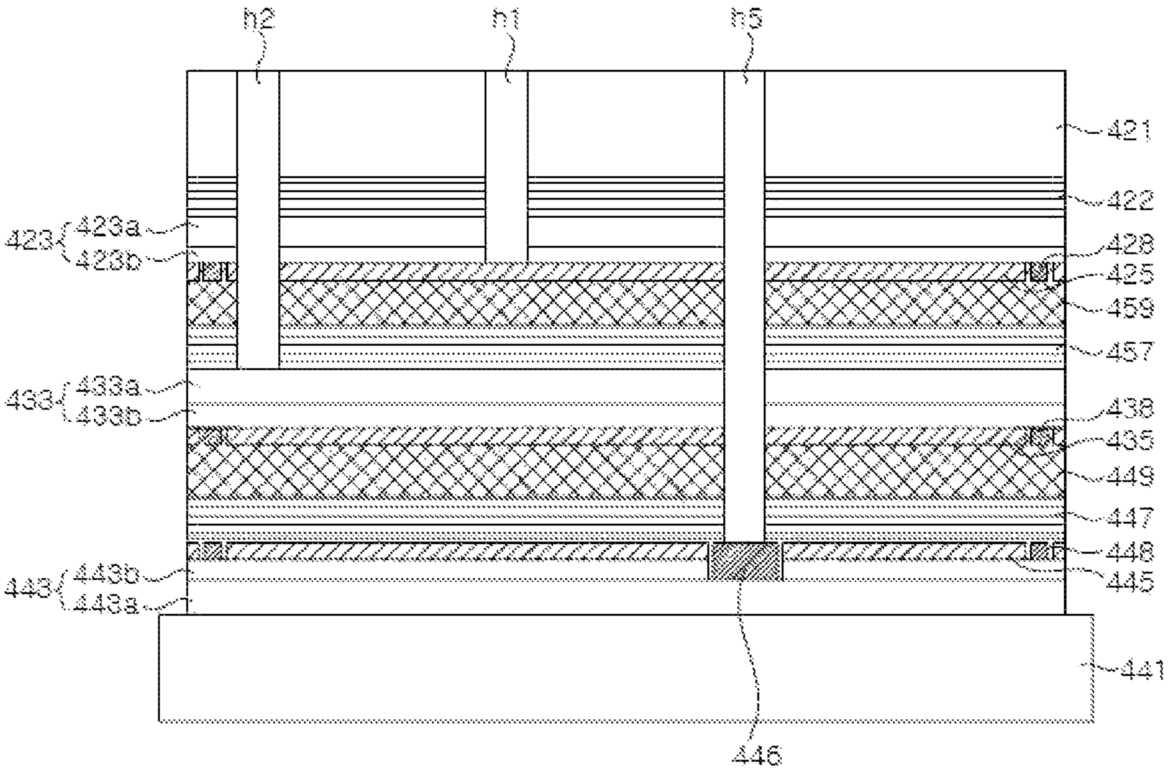

Referring to FIG. 59A and FIG. 59B, the holes h1, h2, h3, h4, and h5 are formed through the first substrate 421, and isolation trenches defining device regions are formed to expose the second substrate 441.

The hole h1 exposes the first transparent electrode 425, the hole h2 exposes the first conductivity type semiconductor layer 433*a*, the hole h3 exposes the second transparent electrode 435, the hole h4 exposes the third transparent electrode 445, and the hole h5 exposes an ohmic electrode 446. When the hole h5 exposes the ohmic electrode 446, an upper surface of the ohmic electrode 446 may include an anti-etching layer, for example, a Ni layer. In an exemplary embodiment, the holes h1, h3, and h4 may expose the first to third current spreaders 428, 438, and 448, respectively. In addition, the hole h5 may expose the first conductivity type semiconductor layer 443*a*.

The isolation trench may expose the second substrate 441 along a periphery of each of the first to third LED stacks 423, 433, and 443. Although the isolation trench is illustrated as being formed to expose the second substrate 441 in the illustrated exemplary embodiment, in some exemplary embodiments, the isolation trench may be formed to expose the first conductivity type semiconductor layer 443*a*. The hole h5 may be formed together with the isolation trench by the etching technique or the like, but the inventive concepts are not limited thereto.

The holes h1, h2, h3, h4, and h5 and the isolation trenches may be formed by photolithography and etching techniques, and are not limited to a particular formation sequence. For example, a shallower hole may be formed prior to a deeper hole, or vice versa. The isolation trench may be formed before or after forming the holes h1, h2, h3, h4, and h5. Alternatively, the isolation trench may be formed together with the hole h5, as described above.

Figure 60A:
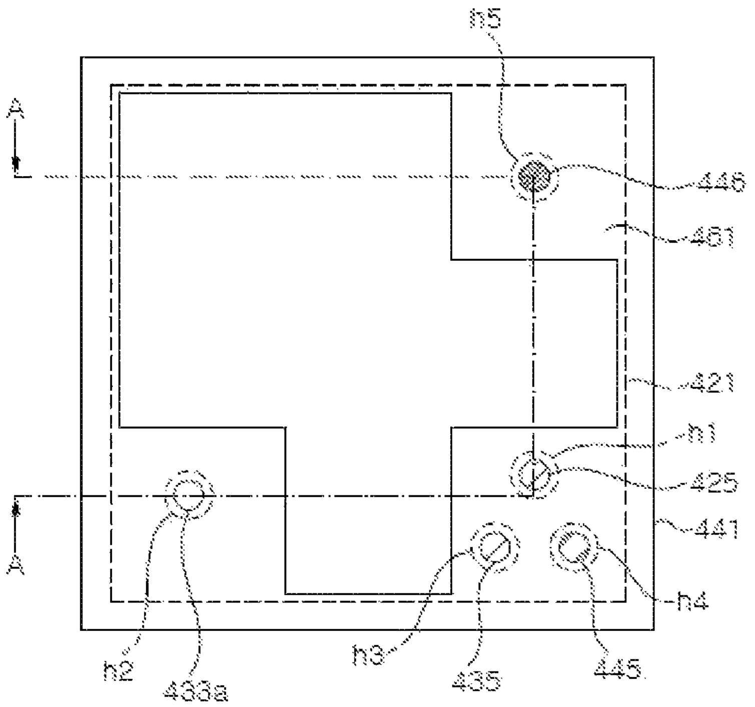
Figure 60B:
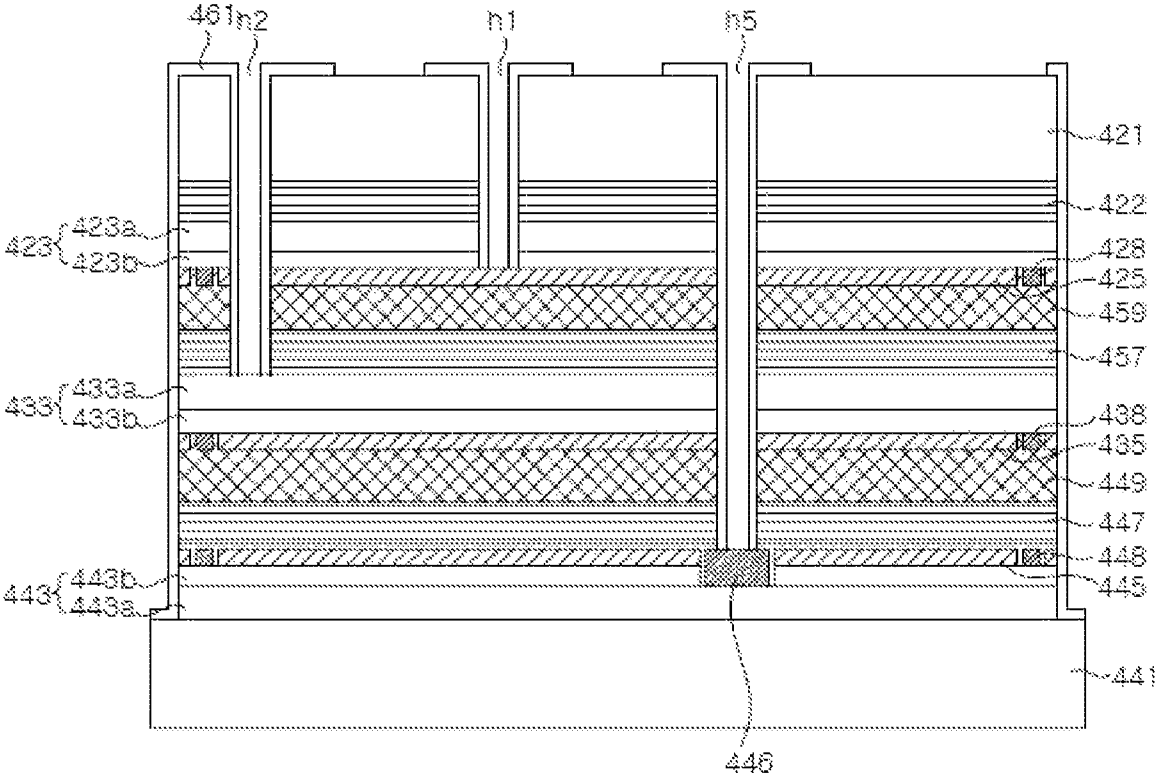

Referring to FIG. 60A and FIG. 60B, a lower insulation layer 461 is formed on the first substrate 421. The lower insulation layer 461 may cover side surfaces of the first substrate 421, and side surfaces of the first to third LED stacks 423, 433, and 443, which are exposed through the isolation trench.

The lower insulation layer 461 may also cover side surfaces of the holes h1, h2, h3, h4, and h5. The lower insulation layer 461 may be patterned to expose a bottom of each of the holes h1, h2, h3, h4, and h5. In addition, the lower insulation layer 461 may be patterned to expose the upper surface of the substrate 421. The first substrate 421 may be exposed over a relatively large area, which may exceed more than half of the light emitting device area, for example.

A process of exposing the bottoms of the holes h1, h2, h3, h4, and h5 and a process of exposing the upper surface of the substrate 421 may be performed in the same process or in a separate process.

The lower insulation layer 461 may be formed of silicon oxide or silicon nitride, without being limited thereto. The lower insulation layer 461 may be a distributed Bragg reflector.

Figure 61A:
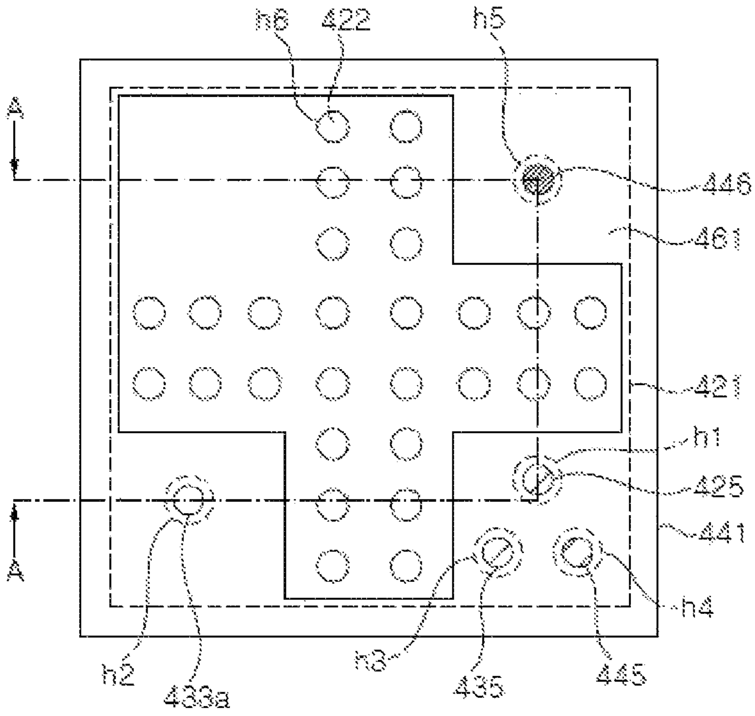
Figure 61B:
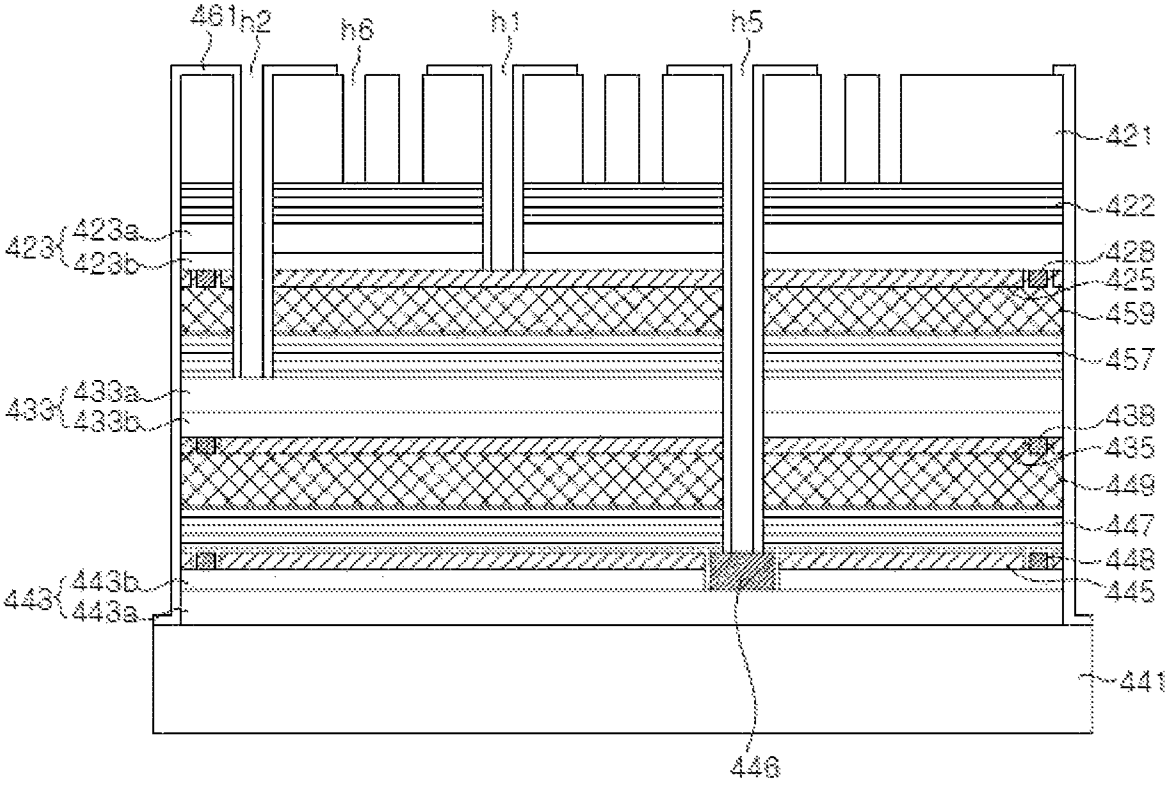

Referring to FIGS. 61A and 61B, holes h6 are formed in the substrate 421. The holes h6 may be disposed across the substrate 421. The holes h6 may expose a distributed Bragg reflector 422 through the substrate 421 as shown in FIG. 61B, but the inventive concepts are not limited thereto. For example, the bottom surfaces of the holes h6 formed inside the substrate 421, such that the holes h6 may be separated from the distributed Bragg reflector 422 and disposed over the distributed Bragg reflector 422. In another exemplary embodiment, the holes h6 may be extended into the distributed Bragg reflector 422.

Figure 62A:
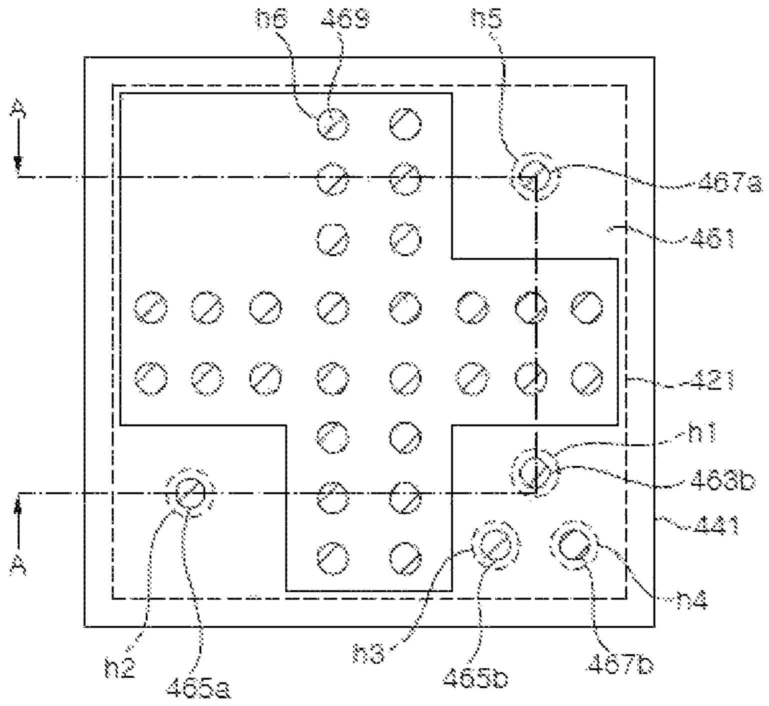
Figure 62B:
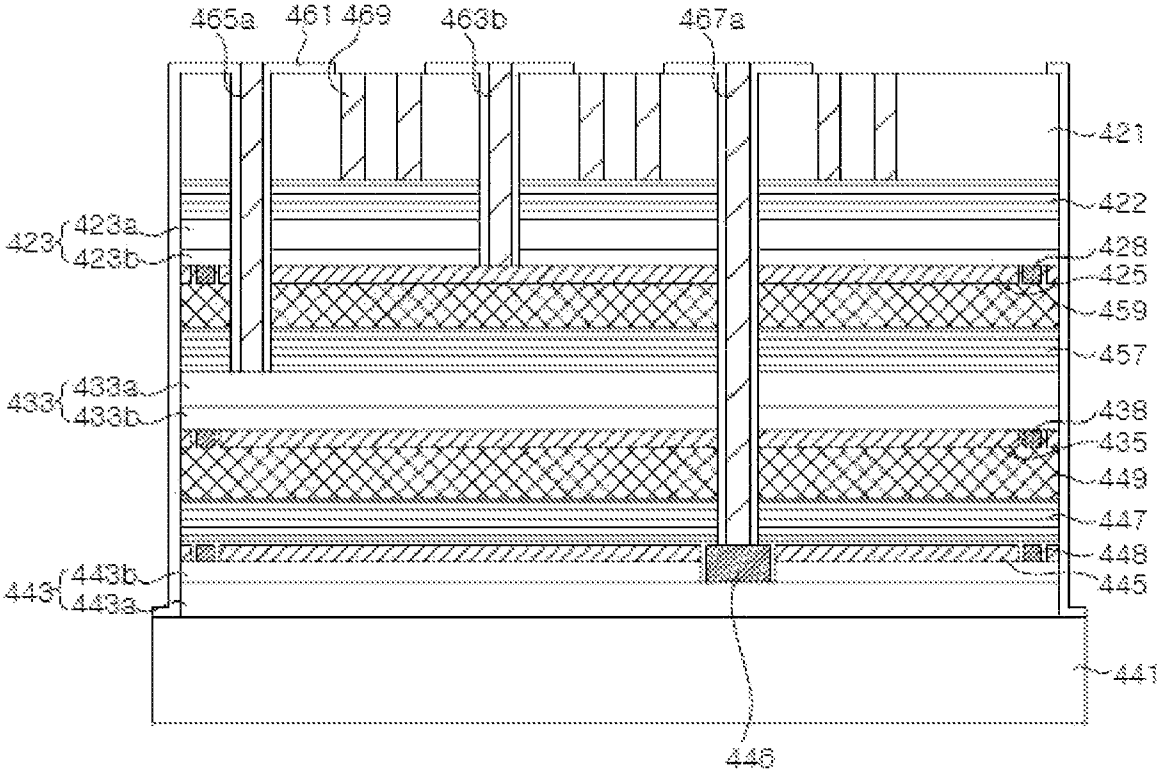

Referring to FIGS. 62A and 62B, through-hole vias 463*b*, 465*a*, 465*b*, 467*a*, and 467*b* are formed inside the holes h1, h2, h3, h4, and h5, and heat pipes 469 are formed inside the holes h6. The through-hole vias 463*b*, 465*a*, 465*b*, 467*a*, and 467*b*, and the heat pipes 469 may be formed by electric plating or the like. For example, a seed layer may be first formed inside the holes h1, h2, h3, h4, h5, and h6, and the through-hole vias 463*b*, 465*a*, 465*b*, 467*a*, and 467*b*, and the heat pipes 469 may be formed by plating with copper using the seed layer. The seed layer may be formed of Ni/Al/Ti/Cu, for example.

In the illustrated exemplary embodiment, the through-hole vias 463*b*, 465*a*, 465*b*, 467*a*, and 467*b* are separated from the substrate 421 by the lower insulation layer 461. The heat pipes 469, however, may contact the substrate 421 inside the substrate 421. Accordingly, heat exchange may occur between the heat pipes 469 and the substrate 421, such that heat generated in the LED stacks 423, 433, and 443 may be easily spread into the substrate 421 and/or to the outside.

Figure 63A:
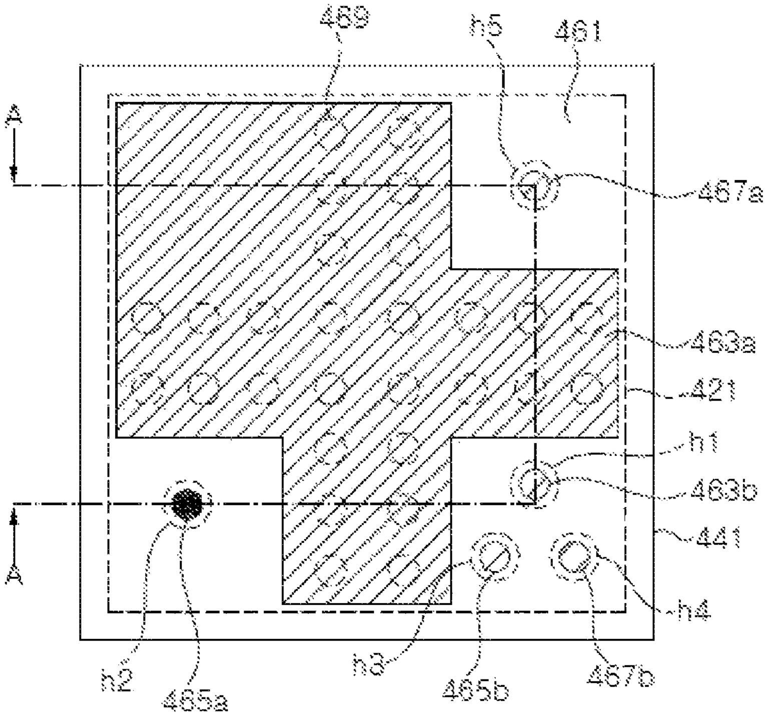
Figure 63B:
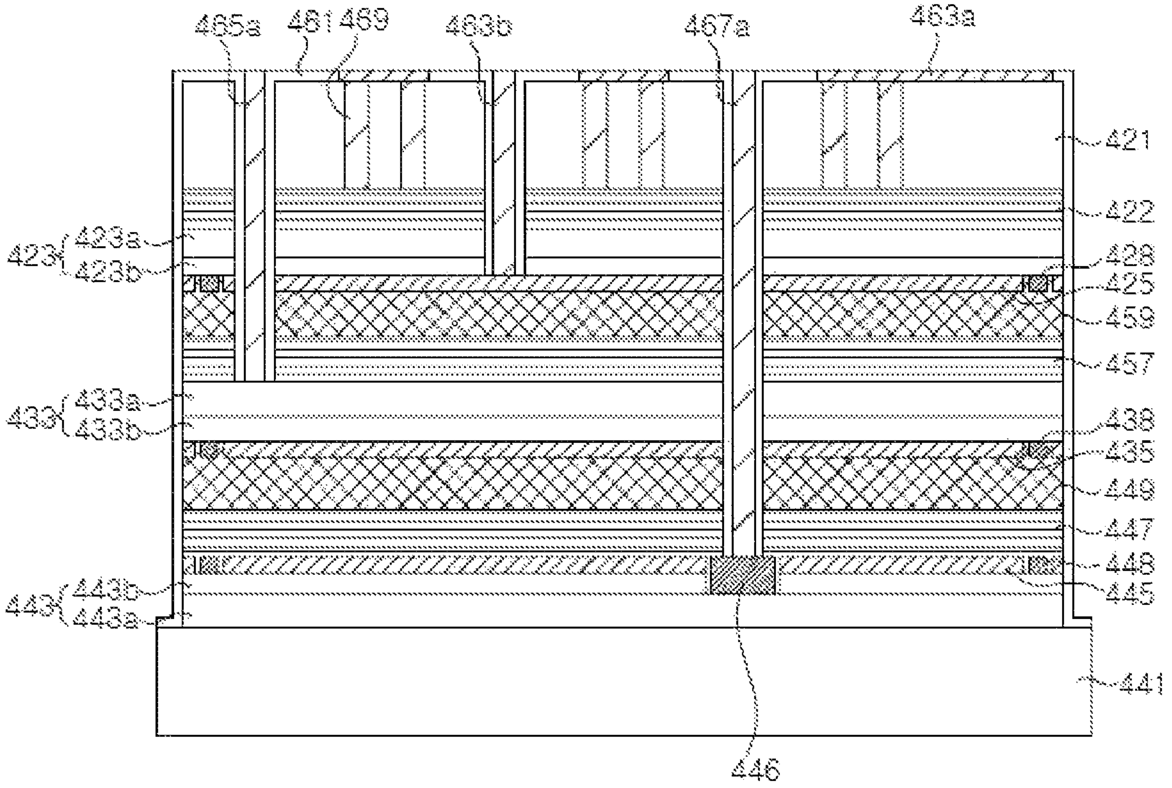

Referring to FIGS. 63A and 63B, an ohmic electrode 463*a* is formed on the first substrate 421. The ohmic electrode 463*a* may be formed in an exposed region of the first substrate 421, which is exposed by patterning the lower insulation layer 461. The ohmic electrode 463*a* may be formed as a conductive layer in ohmic contact with the first substrate 421, and may be formed of Au—Te alloys or AuGe alloys, for example.

As shown in FIG. 63A, the ohmic electrode 463*a* may be separated from the through-hole vias 463*b*, 465*a*, 465*b*, 467*a* and 467*b*, and may cover the heat pipes 469. However, the inventive concepts are not limited thereto, and the ohmic electrode 463*a* may be separated from the heat pipes 469.

Figure 64A:
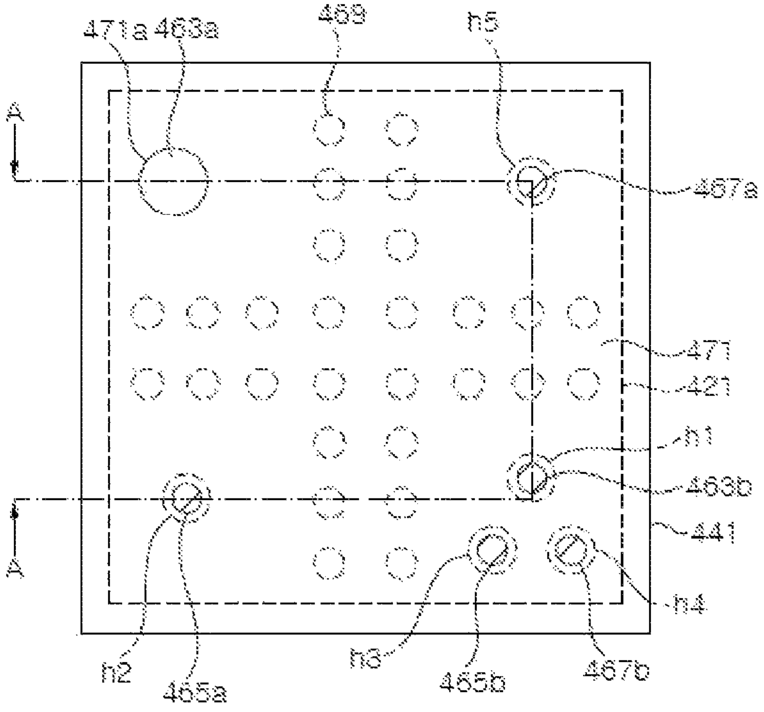
Figure 64B:
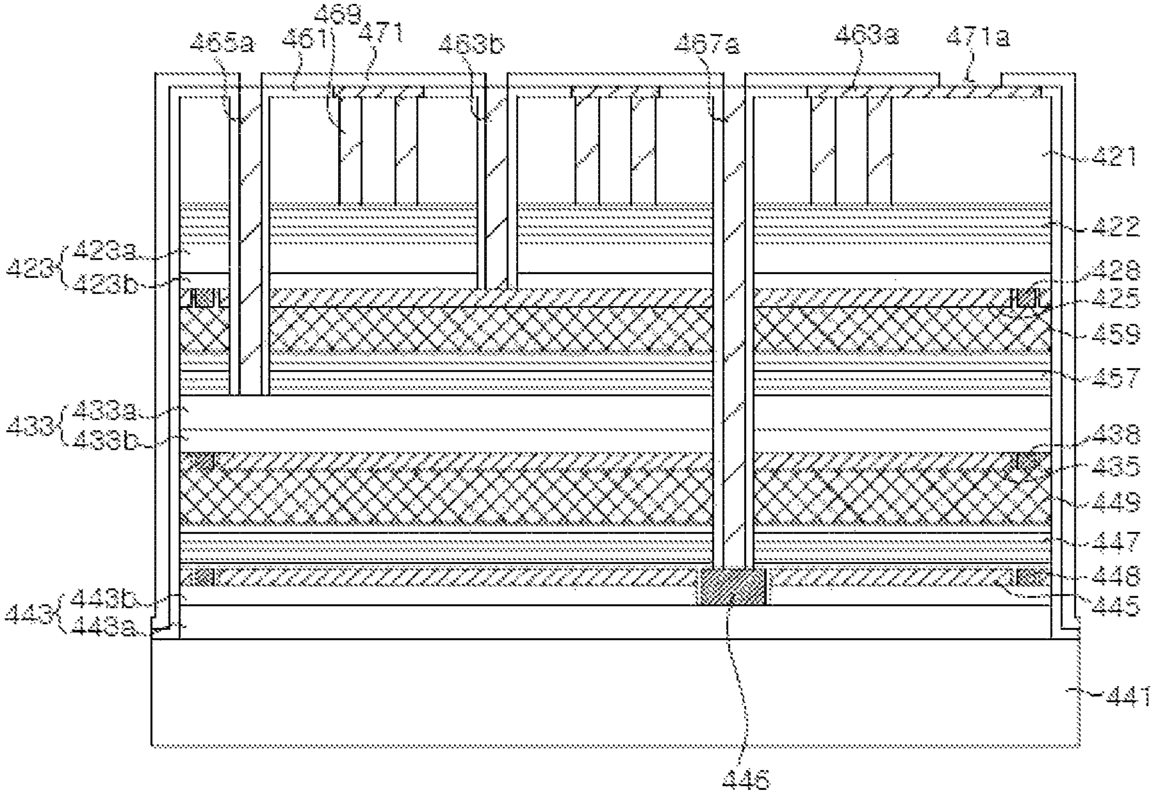

Referring to FIGS. 64A and 64B, an upper insulation layer 471 is formed to cover the lower insulation layer 461 and the ohmic electrode 463*a*. The upper insulation layer 471 may also cover the lower insulation layer 461 at the side surfaces of the first to third LED stacks 423, 433, and 443, and the first substrate 421. The upper insulation layer 471 may be patterned to form openings exposing the through-hole vias 463*b*, 465*a*, 465*b*, 467*a*, 467*b* together with an opening 471*a* exposing the ohmic electrode 463*a*.

The upper insulation layer 471 may be formed of a transparent oxide layer such as silicon oxide or silicon nitride, without being limited thereto. For example, the upper insulation layer 471 may be a light reflective insulation layer, for example, a distributed Bragg reflector, or a light blocking layer such as a light absorption layer.

Figure 65A:
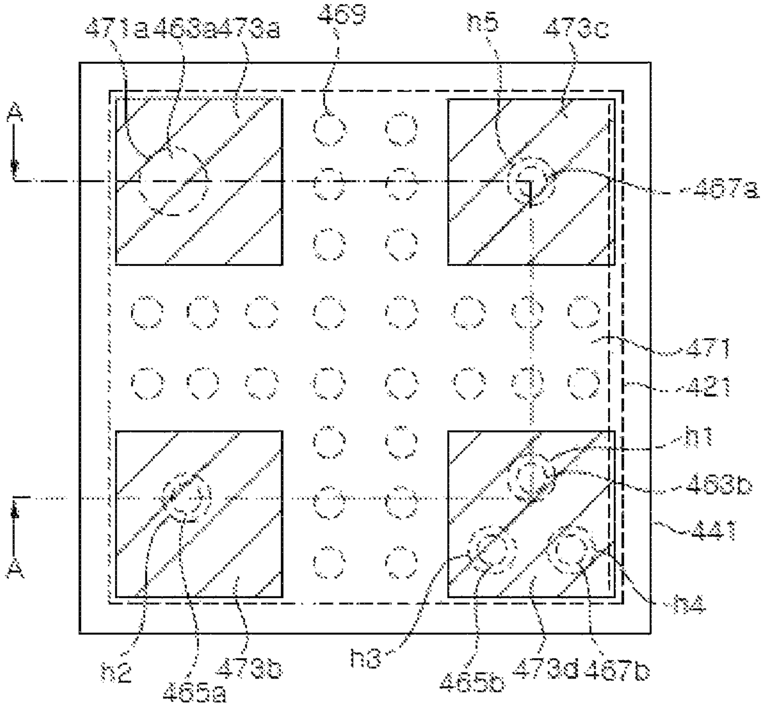
Figure 65B:
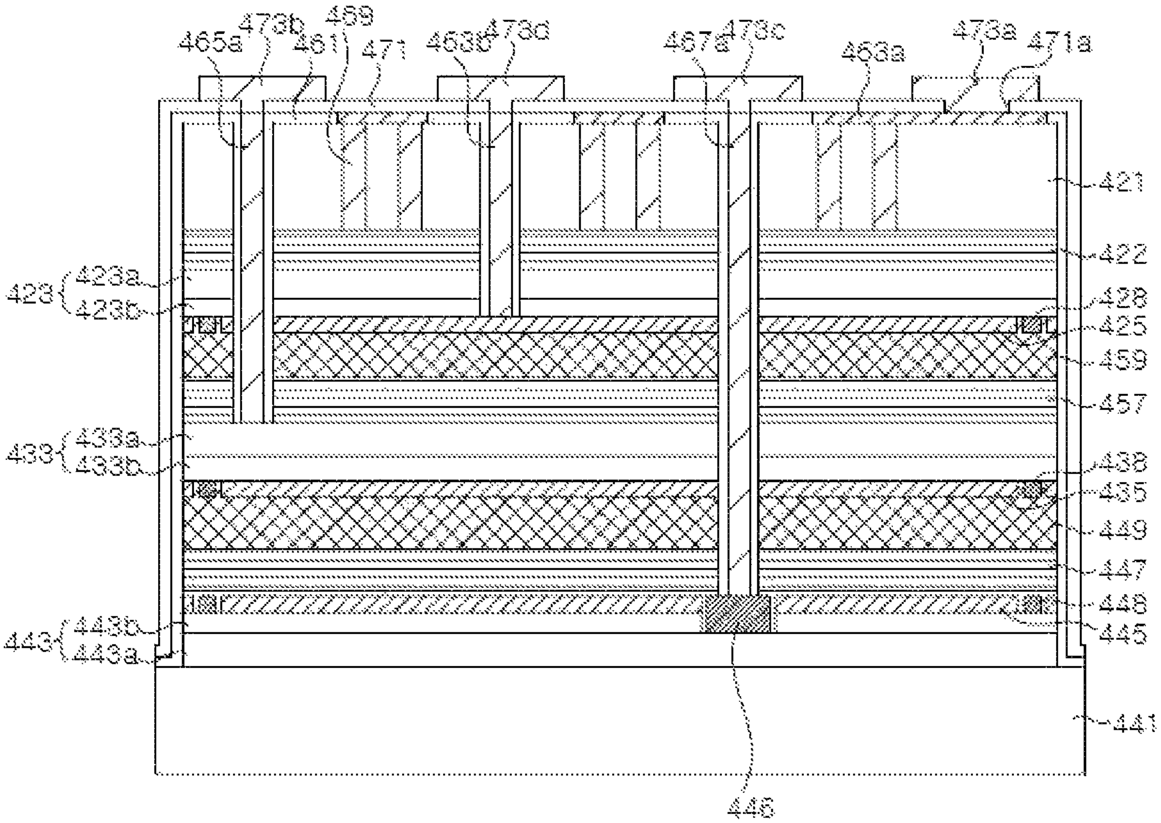

Referring to FIGS. 65A and 65B, electrode pads 473*a*, 473*b*, 473*c*, and 473*d* are formed on the upper insulation layer 471. The electrode pads 473*a*, 473*b*, 473*c*, and 473*d* may include first to third electrode pads 473*a*, 473*b*, and 473*c*, and a common electrode pad 473*d*.

The first electrode pad 473*a* may be connected to the ohmic electrode 463*a* exposed through the opening 471*a* of the upper insulation layer 471, the second electrode pad 473*b* may be connected to the through-hole via 465*a*, and the third electrode pad 473*c* may be connected to the through-hole via 467*a*. The common electrode pad 473*d* may be commonly connected to the through-hole vias 463*b*, 465*b*, and 467*b*.

The electrode pads 473*a*, 473*b*, 473*c*, and 473*d* are electrically separated from one another, and thus, each of the first to third LED stacks 423, 433, and 443 is electrically connected to two electrode pads to be independently driven.

Thereafter, the second substrate 441 is divided into regions for each light emitting device, thereby completing the light emitting device 400. As shown in FIG. 65A, the electrode pads 473*a*, 473*b*, 473*c*, and 473*d* may be disposed near four corners of each light emitting device 400. Furthermore, the electrode pads 473*a*, 473*b*, 473*c*, and 473*d* may have substantially a rectangular shape, but the inventive concepts are not limited thereto.

Although the second substrate 441 is illustrated as being divided, in some exemplary embodiments, the second substrate 441 may be removed. In this case, an exposed surface of the first conductivity type semiconductor layer 443 may be subjected to texturing.

Figure 66A:
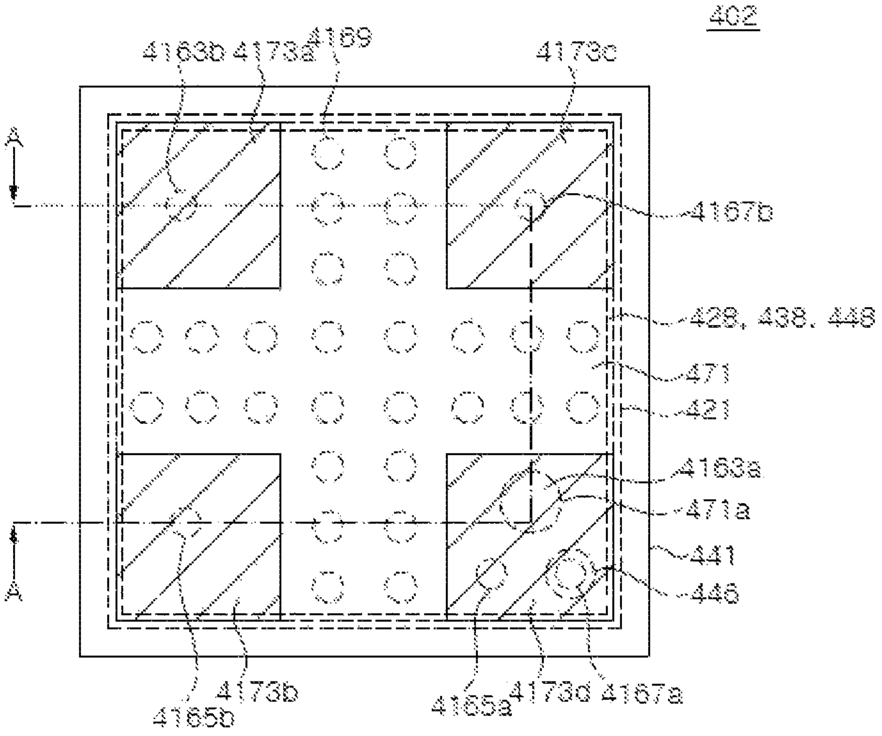
FIGS. 66A and 66B are a schematic plan view and a cross-sectional views illustrating a light emitting device for a display according to another exemplary embodiment.
Figure 66B:
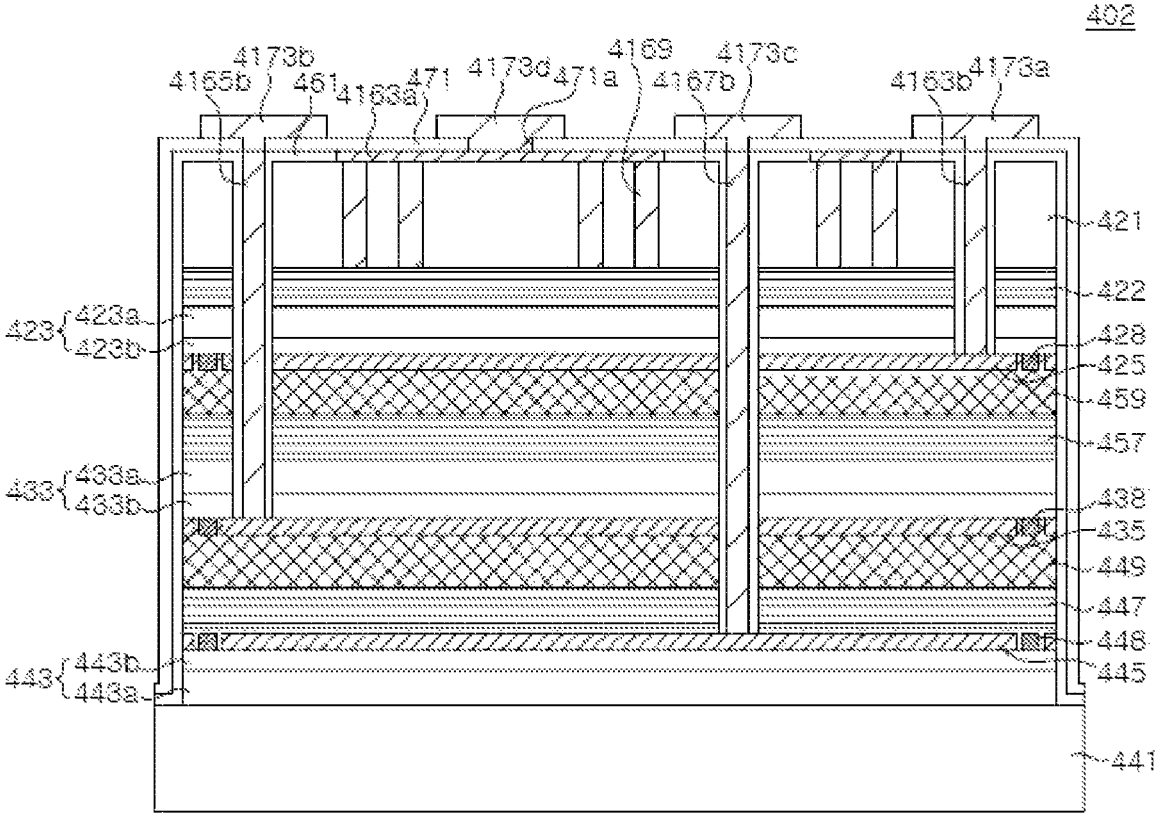

FIG. 66A and FIG. 66B are a schematic plan view and a cross-sectional view of a light emitting device 402 for a display according to another exemplary embodiment.

Referring to FIGS. 66A and 66B, the light emitting device 402 according to the illustrated exemplary embodiment is generally similar to the light emitting device 400 described with reference to FIG. 52A and FIG. 52B, except that the anodes of the first to third LED stacks 423, 433, and 443 are independently connected to first to third electrode pads 4173*a*, 4173*b*, 4173*c*, and the cathodes thereof are electrically connected to a common electrode pad 4173*d*.

In particular, the first electrode pad 4173*a* is electrically connected to the first transparent electrode 425 through a through-hole via 4163*b*, the second electrode pad 4173*b* is electrically connected to the second transparent electrode 435 through a through-hole via 4165*b*, and the third electrode pad 4173*c* is electrically connected to the third transparent electrode 445 through a through-hole via 4167*b*. The common electrode pad 4173*d* is electrically connected to an ohmic electrode 4163*a* exposed through the opening 471*a* of the upper insulation layer 471, and is also electrically connected to the first conductivity type semiconductor layers 433*a* and 443*a* of the second LED stack 433 and the third LED stack 443 through the through-hole vias 4165*a*, 4167*a*. For example, the through-hole via 4165*a* may be connected to the first conductivity type semiconductor layer 433*a*, and the through-hole via 4167*a* may be connected to the ohmic electrode 446 in ohmic contact with the first conductivity type semiconductor layer 443*a*.

The heat pipes 4169 are disposed as described with reference to FIGS. 52A and 52B.

However, in the illustrated exemplary embodiment, the heat pipes 4169 are connected to the ohmic electrode 4163*a*, and thus, may be electrically connected to the common electrode pad 4173*d*.

Figure 67A:
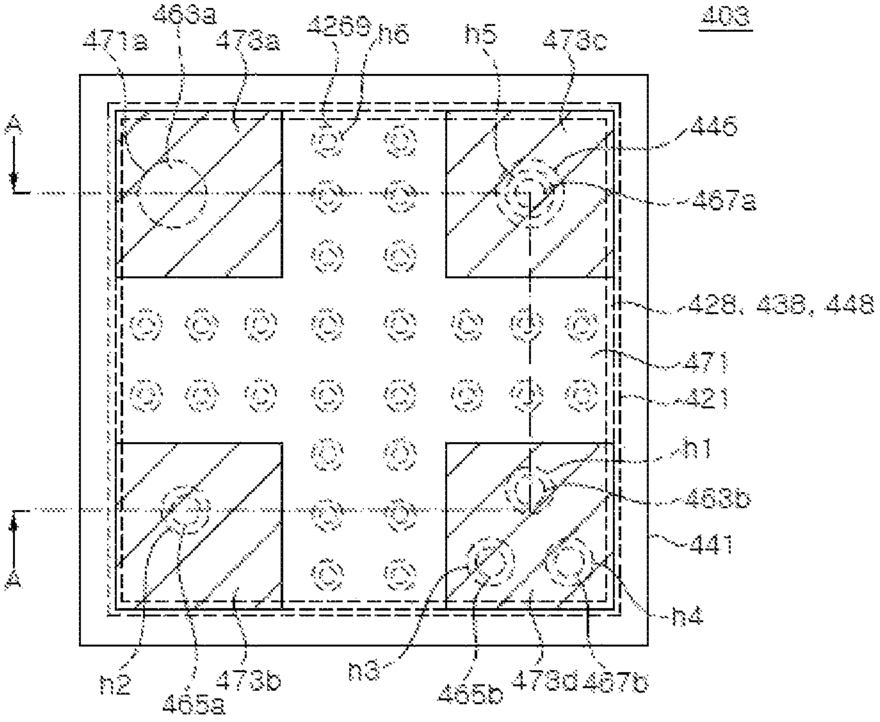
FIGS. 67A and 67B are a schematic plan view and a cross-sectional view illustrating a light emitting device for a display according to another exemplary embodiment.
Figure 67B:
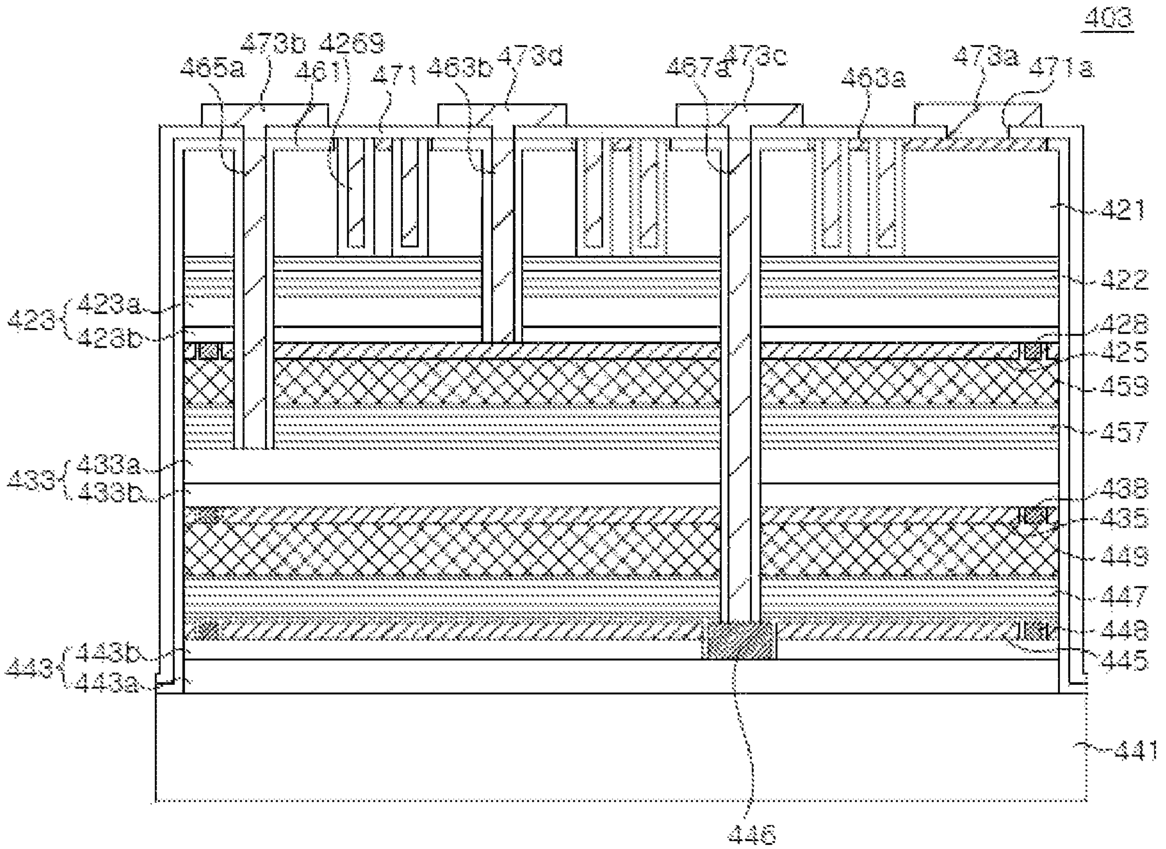

FIG. 67A and FIG. 67B are a schematic plan view and a cross-sectional view of a light emitting device 403 for a display according to another exemplary embodiment, respectively.

Referring to FIGS. 67A and 67B, the light emitting device 403 according to the illustrated exemplary embodiment is generally similar to the light emitting device 400 described with reference to FIGS. 52A and 52B, except that heat pipes 4269 are insulated from the substrate 421 by the lower insulation layer 461.

More particularly, the lower insulation layer 461 covers sidewalls of through holes h1, h2, h3, h4, and h5, and further covers sidewalls of the holes h6 where the heat pipes 4269 are formed.

The lower insulation layer 461 may also cover bottoms of the holes h6.

In addition, the heat pipes 4269 may be separated from the ohmic electrode 463*a*.

Accordingly, the heat pipes 4269 may be electrically isolated from the substrate 421. However, the inventive concepts are not limited thereto, and the ohmic electrode 463*a* may cover the heat pipes 4269 and be connected to the heat pipes 4269.

Referring back to FIGS. 60A to 60B, the holes h6 were formed after forming the lower insulation layer 461 in the light emitting device 400. However, according to the illustrated exemplary embodiment, since the heat pipes 4269 are separated from the substrate 421 by the lower insulation layer 461 inside the holes h6, the lower insulation layer 461 is also formed inside the holes h6. Accordingly, the lower insulation layer 461 may be formed after the through holes h1, h2, h3, h4, and h5 and the holes h6 are formed. For example, after the through holes h1, h2, h3, h4, and h5 and the holes h6 are formed, sidewalls of the through holes h1, h2, h3, h4, and h5 and holes h6 are then covered with the lower insulation layer 461. Then, when patterning the lower insulation layer 461 inside the through holes h1, h2, h3, h4 and h5 to form an opening, the lower insulation layer 461 formed on bottoms of the holes h6 may not be patterned by covering the holes h6 with a mask, for example.

Figure 68A:
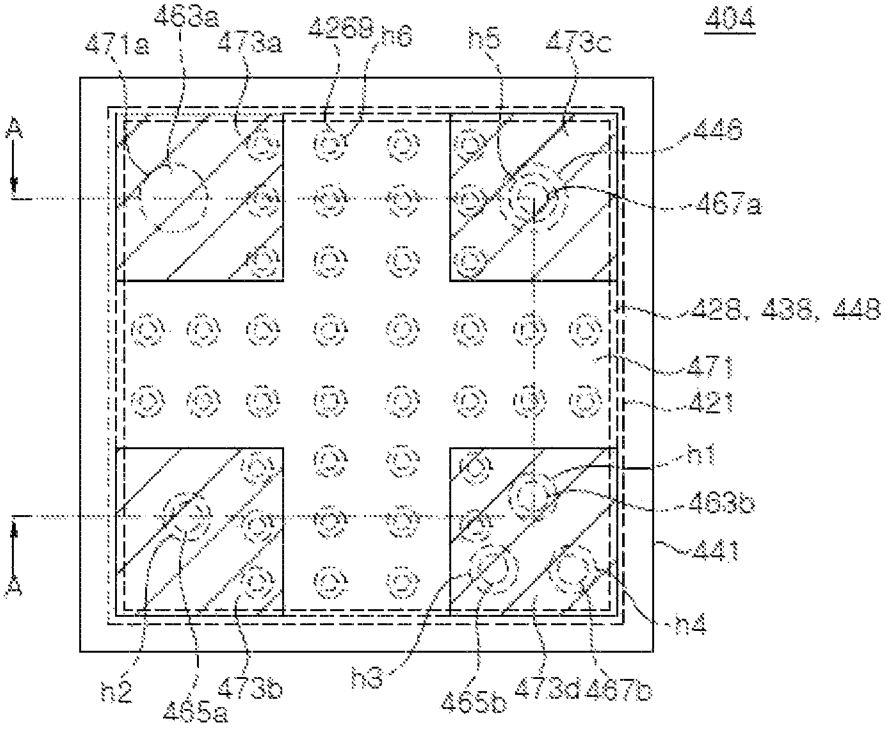
FIGS. 68A and 68B are a schematic plan view and a cross-sectional view illustrating a light emitting device for a display according to another exemplary embodiment.
Figure 68B:
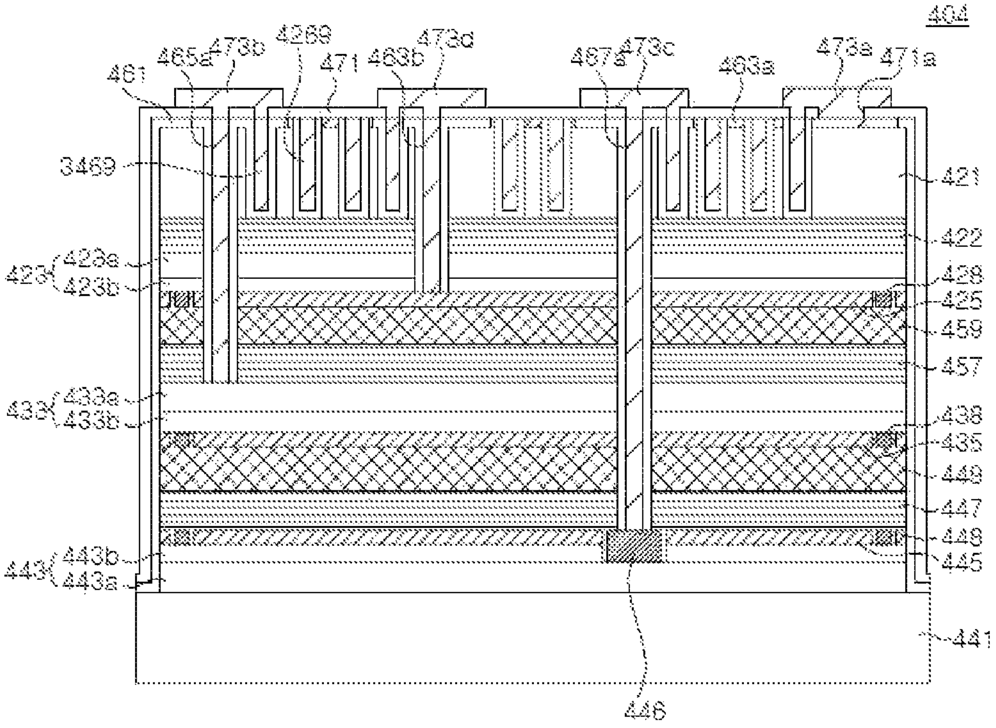

FIG. 68A and FIG. 68B are a schematic plan view and a cross-sectional view of a light emitting device 404 for a display according to another exemplary embodiment.

Referring to FIGS. 68A and 68B, the light emitting device 404 according to the illustrated exemplary embodiment is generally similar to the light emitting device 403 described with reference to FIGS. 67A and 67B, except that heat pipes 4369 are further disposed under electrode pads 4173*a*, 4173*b*, 4173*c*, and 4173*d*.

The heat pipes 4369 may be connected to the electrode pads 4173*a*, 4173*b*, 4173*c*, and 4173*d*, and thus, heat may be quickly discharged to the outside of the light emitting device 404 through the heat pipes 4369 and the electrode pads 4173*a*, 4173*b*, 4173*c*, and 4173*d*.

Each of the light emitting devices 400, 402, 403, and 404 according to the exemplary embodiments includes the first to third LED stacks 423, 433, and 443, which emits red, green and blue light, respectively, and thus, can be used as one pixel in a display apparatus. As shown in FIG. 51, the display apparatus may be realized by arranging a plurality of light emitting devices 400, 402, 403, or 404 on the circuit board 401. Since each of the light emitting devices 400, 402, 403 and 404 includes the first to third LED stacks 423, 433, and 443, it is possible to increase the area of a subpixel in one pixel. Furthermore, the first to third LED stacks 423, 433, and 443 can be mounted on the circuit board by mounting one light emitting device, thereby reducing the number of mounting processes.

As described in FIG. 51, the light emitting devices mounted on the circuit board 401 can be driven in a passive matrix or active matrix driving manner.

Figure 69:
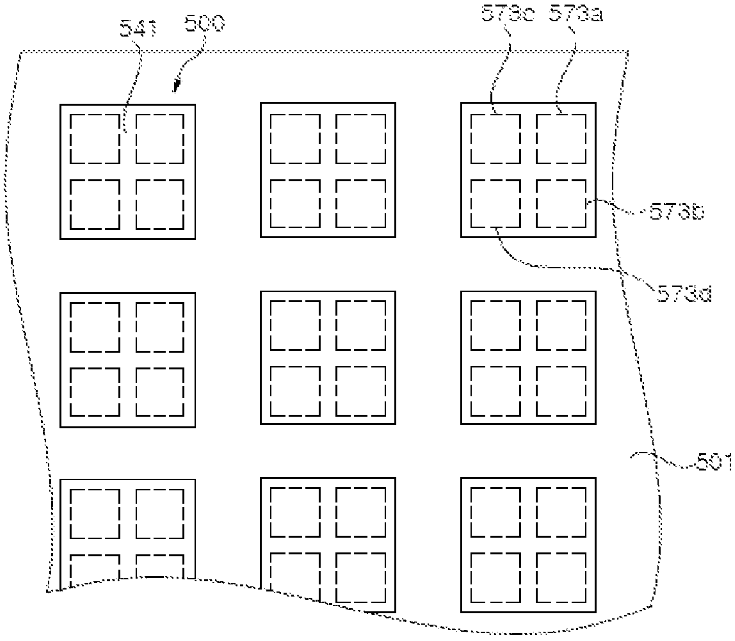
FIG. 69 is a schematic plan view of a display apparatus according to an exemplary embodiment.

FIG. 69 is a schematic plan view of a display apparatus according to an exemplary embodiment.

Referring to FIG. 69, the display apparatus according to an exemplary embodiment includes a circuit board 501 and a plurality of light emitting devices 500.

The circuit board 501 may include a circuit for passive matrix driving or active matrix driving. In an exemplary embodiment, the circuit board 501 may include interconnection lines and resistors. In another exemplary embodiment, the circuit board 501 may include interconnection lines, transistors, and capacitors. The circuit board 501 may also have electrode pads disposed on an upper surface thereof to allow electrical connection to the circuit therein.

The light emitting devices 500 are arranged on the circuit board 501. Each of the light emitting devices 500 may constitute one pixel. The light emitting device 500 includes electrode pads 573*a*, 573*b*, 573*c*, 573*d*, which are electrically connected to the circuit board 501. In addition, the light emitting device 500 may include a substrate 541 at an upper surface thereof. Since the light emitting devices 500 are separated from one another, the substrates 541 disposed at the upper surfaces of the light emitting devices 500 are also separated from one another.

Figure 70A:
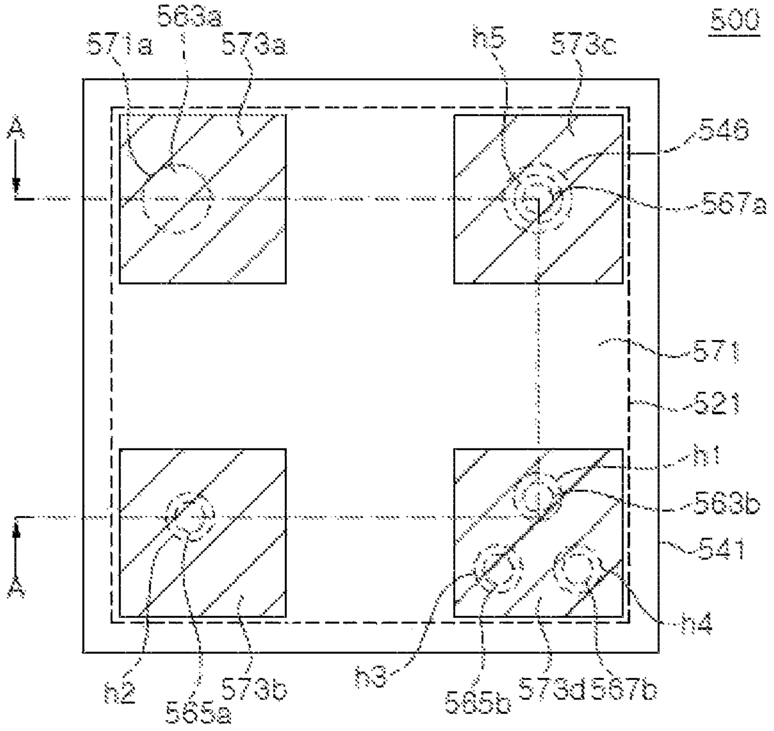
FIG. 70A is a schematic plan view of a light emitting device for a display according to an exemplary embodiment.
Figure 70B:
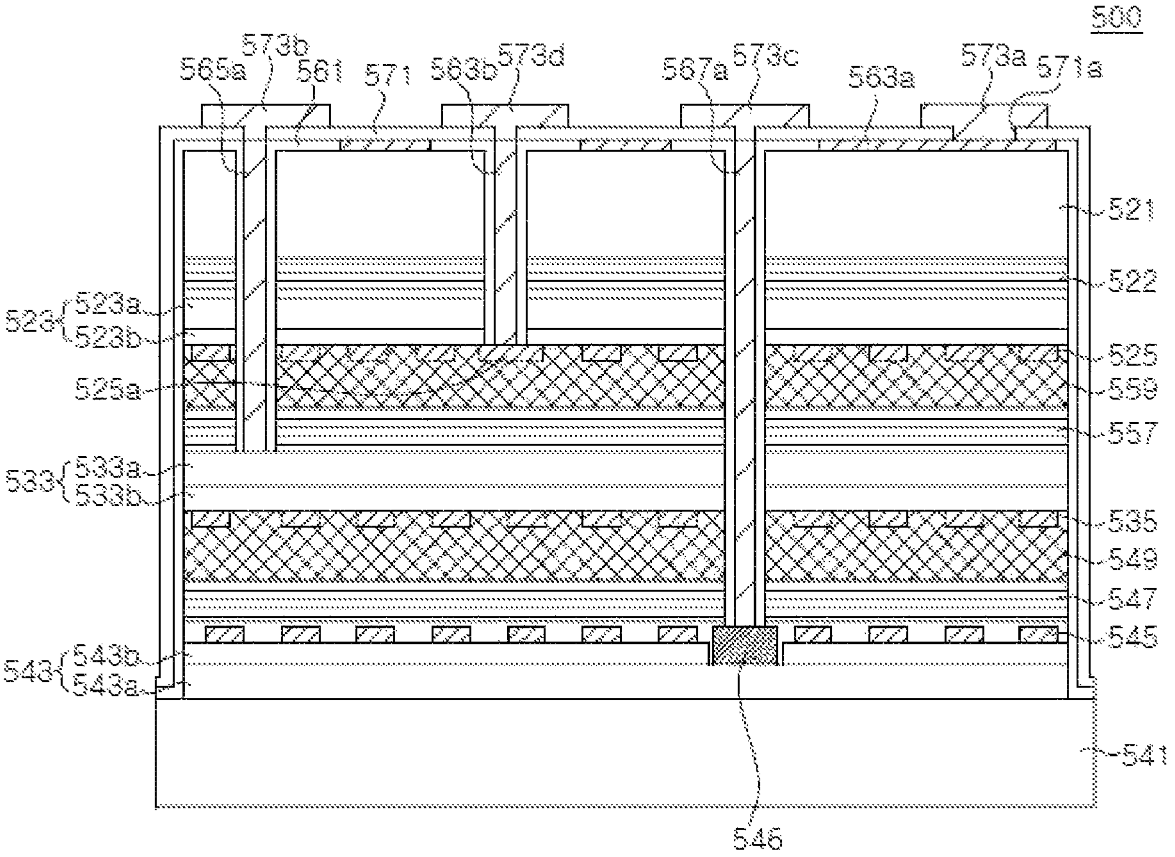
FIG. 70B is a schematic cross-sectional view taken along the line A-A of FIG. 70A.

Details of the light emitting device 500 will be described with reference to FIG. 70A and FIG. 70B. FIG. 70A is a schematic plan view of the light emitting device 500 for a display according to an exemplary embodiment, and FIG. 70B is a schematic cross-sectional view taken along line A-A of FIG. 70A. Although the electrode pads 573*a*, 573*b*, 573*c*, and 573*d* are illustrated and described as being disposed at an upper side of the light emitting device 500, in some exemplary embodiments, the light emitting device 500 may be flip-bonded on the circuit board 501 shown in FIG. 69, and thus, the electrode pads 573*a*, 573*b*, 573*c*, and 573*d* may be disposed at a lower side thereof.

Referring to FIG. 70A and FIG. 70B, the light emitting device 500 may include a first substrate 521, a second substrate 541, a distributed Bragg reflector 522, a first LED stack 523, a second LED stack 533, a third LED stack 543, a first ohmic electrode 525, a second ohmic electrode 535, a third ohmic electrode 545, an ohmic electrode 546, a first color filter 547, a second color filter 557, a first bonding layer 549, a second bonding layer 559, a lower insulation layer 561, an upper insulation layer 571, an ohmic electrode 563*a*, through-hole vias 563*b*, 565*a*, 565*b*, 567*a*, and 567*b*, and electrode pads 573*a*, 573*b*, 573*c*, 573*d*.

The first substrate 521 may support the LED stacks 523, 533, and 543. The first substrate 521 may be a growth substrate for growing the first LED stack 523, for example, a GaAs substrate.

In particular, the first substrate 521 may have conductivity.

The second substrate 541 may support the LED stacks 523, 533, and 543. The LED stacks 523, 533, and 543 are disposed between the first substrate 521 and the second substrate 541. The second substrate 541 may be a growth substrate for growing the third LED stack 543. For example, the second substrate 541 may be a sapphire substrate or a GaN substrate, particularly a patterned sapphire substrate. The first to third LED stacks are disposed on the second substrate 541 in the order of the third LED stack 543, the second LED stack 533, and the first LED stack 523 from the second substrate 541. In an exemplary embodiment, a single third LED stack 543 may be disposed on a single second substrate 541. The second LED stack 533, the first LED stack 523, and the first substrate 521 are disposed on the third LED stack 543. Accordingly, the light emitting device 500 may have a single chip structure of a single pixel.

In another exemplary embodiment, a plurality of third LED stacks 543 may be disposed on a single second substrate 541. The second LED stack 533, the first LED stack 523 and the first substrate 521 may be disposed on each of the third LED stacks 543, whereby the light emitting device 500 has a single chip structure of a plurality of pixels.

In some exemplary embodiments, the second substrate 541 may be omitted, and a lower surface of the third LED stack 543 may be exposed. In this case, a roughened surface may be formed on the lower surface of the third LED stack 543 by surface texturing.

Each of the first LED stack 523, the second LED stack 533, and the third LED stack 543 includes a first conductivity type semiconductor layer 523*a*, 533*a*, and 543*a*, a second conductivity type semiconductor layer 523*b*, 533*b*, and 543*b*, and an active layer interposed therebetween. The active layer may have a multi-quantum well structure.

The LED stacks may emit light having a shorter wavelength as being disposed closer to the second substrate 541. For example, the first LED stack 523 may be an inorganic light emitting diode adapted to emit red light, the second LED stack 533 may be an inorganic light emitting diode adapted to emit green light, and the third LED stack 543 may be an inorganic light emitting diode adapted to emit blue light. The first LED stack 523 may include an AlGaInP-based well layer, the second LED stack 533 may include an AlGaInP or AlGaInN-based well layer, and the third LED stack 543 may include an AlGaInN-based well layer. However, the inventive concepts are not limited thereto. When the light emitting device 500 includes a micro LED, which has a surface area less than about 10,000 square μm as known in the art, or less than about 4,000 square μm or 2,500 square μm in other exemplary embodiments, the first LED stack 523 may emit any one of red, green, and blue light, and the second and third LED stacks 533 and 543 may emit a different one of red, green, and blue light, without adversely affecting operation, due to the small form factor of a micro LED.

The first conductivity type semiconductor layer 523*a*, 533*a*, and 543*a* of each of the LED stacks 523, 533, and 543 may be an n-type semiconductor layer, and the second conductivity type semiconductor layer 523*b*, 533*b*, and 543*b* thereof may be a p-type semiconductor layer. In the illustrated exemplary embodiment, an upper surface of the first LED stack 523 is an n-type semiconductor layer 523*a*, an upper surface of the second LED stack 533 is an n-type semiconductor layer 533*a*, and an upper surface of the third LED stack 543 is a p-type semiconductor layer 543*b*. More particularly, only the semiconductor layers of the third LED stack 543 are stacked in a different sequence from those of the first and second LED stacks 523 and 533. The first conductivity type semiconductor layer 543*a* of the third LED stack 543 may be subjected to surface texturing in order to improve light extraction efficiency. In some exemplary embodiments, the first conductivity type semiconductor layer 533*a* of the second LED stack 533 may also be subjected to surface texturing.

The first LED stack 523, the second LED stack 533, and the third LED stack 543 may be stacked to overlap one another, and may have substantially the same luminous area. Further, in each of the LED stacks 523, 533, and 543, the first conductivity type semiconductor layer 523*a*, 533*a*, and 543*a* may have substantially the same area as the second conductivity type semiconductor layer 523*b*, 533*b*, and 543*b*. In particular, in each of the first LED stack 523 and the second LED stack 533, the first conductivity type semiconductor layer 523*a* or 533*a* may completely overlap the second conductivity type semiconductor layer 523*b* and 533*b*. In the third LED stack 543, a hole h5 is formed on the second conductivity type semiconductor layer 543*b* to expose the first conductivity type semiconductor layer 543*a*, and thus, the first conductivity type semiconductor layer 543*a* has a slightly larger area than the second conductivity type semiconductor layer 543*b*.

The first LED stack 523 is disposed apart from the second substrate 541, the second LED stack 533 is disposed under the first LED stack 523, and the third LED stack 543 is disposed under the second LED stack 533. Since the first LED stack 523 may emit light having a longer wavelength than the second and third LED stacks 533 and 543, light generated from the first LED stack 523 may be emitted outside after passing through the second and third LED stacks 533 and 543 and the second substrate 541. In addition, since the second LED stack 533 may emit light having a longer wavelength than the third LED stack 543, light generated from the second LED stack 533 may be emitted outside after passing through the third LED stack 543 and the second substrate 541.

The distributed Bragg reflector 522 may be disposed between the first substrate 521 and the first LED stack 523. The distributed Bragg reflector 522 reflects light generated from the first LED stack 523 to prevent light from being lost through absorption by the substrate 521. For example, the distributed Bragg reflector 522 may be formed by alternately stacking AlAs and AlGaAs-based semiconductor layers one above another.

The first ohmic electrode 525 is disposed between the first LED stack 523 and the second LED stack 533. The first ohmic electrode 525 is in ohmic contact with the second conductivity type semiconductor layer 523*b* of the first LED stack 523, and transmits light generated from the first LED stack 523. The first ohmic electrode 525 may be formed as a mesh electrode. For example, the first ohmic electrode 525 may include the mesh electrode formed of an Au—Zn or Au—Be metal layer. As shown in FIG. 71B, the first ohmic electrode 525 may include a pad region 525*a*, and the through-hole via 563*b* may be connected to the pad region 525*a*.

As used herein, the term "mesh electrode" may refer to a conductor or a conductive structure having a mesh shape, which may be formed on lines connected to one another and openings surrounded by the lines. In some exemplary embodiments, the lines connected to one another may be straight lines or curved lines, without being limited thereto. In addition, the lines may have the same or different thicknesses from each other, and the openings surrounded by the lines may have the same or different areas from each other. The mesh electrode may generally form a regular pattern in a plan view, but in some exemplary embodiments, the pattern formed by the mesh electrode may be irregular. The first ohmic electrode 525 may have openings, to which the through-hole vias 565*a*, 565*b*, 567*a*, and 567*b* pass through without contacting the first ohmic electrode 525.

The second ohmic electrode 535 is in ohmic contact with the second conductivity type semiconductor layer 533*b* of the second LED stack 533. As shown in the drawings, the second ohmic electrode 535 contacts a lower surface of the second LED stack 533 between the second LED stack 533 and the third LED stack 543. The second ohmic electrode 535 may be formed as the mesh electrode. For example, the second ohmic electrode 535 may include the mesh electrode including Pt or Rh, and may have a multilayer structure of Ni/Ag/Pt, for example. The second ohmic electrode 535 may include a pad region (see 535*a* of FIG. 72A) to connect the through-hole via 565*b*.

The third ohmic electrode 545 is in ohmic contact with the second conductivity type semiconductor layer 543*b* of the third LED stack 543. The third ohmic electrode 545 may be disposed between the second LED stack 533 and the third LED stack 543, and contacts the upper surface of the third LED stack 543. In an exemplary embodiment, the third ohmic electrode 545 may be formed of a metal layer or a conductive oxide layer, such as ZnO, which is transparent to red light and green light. The third ohmic electrode 545 may also be transparent to blue light. In another exemplary embodiment, the third ohmic electrode 545 may be formed as a mesh electrode. For example, the third ohmic electrode 545 may include the mesh electrode including Pt or Rh, and may have, for example, a multilayer structure of Ni/Ag/Pt. The third ohmic electrode 545 may include a pad region (see 545*a* of FIG. 73A) to connect the through-hole via 567*b*.

Each of the first ohmic electrode 525, the second ohmic electrode 535, and the third ohmic electrode 545 is in ohmic contact with the p-type semiconductor layer of each of the LED stacks to assist in current spreading. In addition, the mesh electrode includes the openings to transmit light generated from the first to third LED stacks 523, 533, and 543.

The first color filter 547 may be disposed between the third ohmic electrode 545 and the second LED stack 533, and the second color filter 557 may be disposed between the second LED stack 533 and the first LED stack 523. The first color filter 547 transmits light generated from the first and second LED stacks 523 and 533, while reflecting light generated from the third LED stack 543. The second color filter 557 transmits light generated from the first LED stack 523 while reflecting light generated from the second LED stack 533. Accordingly, light generated from the first LED stack 523 may be emitted outside through the second LED stack 533 and the third LED stack 543, and light generated from the second LED stack 533 may be emitted outside through the third LED stack 543. Furthermore, it is possible to prevent light loss by preventing light generated from the second LED stack 533 from entering the first LED stack 523 or light generated from the third LED stack 543 from entering the second LED stack 533.

In some exemplary embodiments, the second color filter 557 may reflect light generated from the third LED stack 543.

The first and second color filters 547 and 557 may be, for example, a low pass filter allowing light in a low frequency band, e.g., a long wavelength band to pass therethrough, a band pass filter allowing light in a predetermined wavelength band, or a band stop filter that prevents light in a predetermined wavelength band from passing therethrough. In particular, each of the first and second color filters 547 and 557 may be formed by alternately stacking insulation layers having different refractive indices one above another, such as $TiO_2$ and $SiO_2$, for example. In particular, each of the first and second color filters 547 and 557 may include a distributed Bragg reflector (DBR). In addition, a stop band of the distributed Bragg reflector can be controlled by adjusting the thicknesses of $TiO_2$ and $SiO_2$ layers. The low pass filter and the band pass filter may also be formed by alternately stacking insulation layers having different refractive indices one above another.

The first bonding layer 549 couples the second LED stack 533 to the third LED stack 543.

The first bonding layer 549 may couple the first color filter 547 to the second ohmic electrode 535 between the first color filter 547 and the second ohmic electrode 535. For example, the first bonding layer 549 may be formed of a transparent organic material or a transparent inorganic material.

Examples of the organic material may include SUB, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 549 may be formed of spin-on-glass (SOG).

The second bonding layer 559 couples the second LED stack 533 to the first LED stack 523.

As shown in the drawings, the second bonding layer 559 may be disposed between the second color filter 557 and the first ohmic electrode 525. The second bonding layer 559 may be formed of substantially the same material as the first bonding layer 549.

The holes h1, h2, h3, h4, and h5 are formed through the first substrate 521. The hole h1 may be formed through the first substrate 521, the distributed Bragg reflector 522, and the first LED stack 523 to expose the first ohmic electrode 525. For example, the hole h1 may expose the pad region 525*a*. The hole h2 may be formed through the first substrate 521, the distributed Bragg reflector 522, the first ohmic electrode 525, the second bonding layer 559, and the second color filter 557 to expose the first conductivity type semiconductor layer 533*a* of the second LED stack 533.

The hole h3 may be formed through the first substrate 521, the distributed Bragg reflector 522, the first ohmic electrode 525, the second bonding layer 559, the second color filter 557, and the second LED stack 533 to expose the second ohmic electrode 535. For example, the hole h3 may expose the pad region 535*a*. The hole h4 may be formed through the first substrate 521, the distributed Bragg reflector 522, the first ohmic electrode 525, the second bonding layer 559, the second color filter 557, the second LED stack 533, the second ohmic electrode 535, the first bonding layer 549, and the first color filter 547 to expose the third ohmic electrode 545. For example, the hole h4 may expose the pad region 545*a*. Furthermore, the hole h5 may be formed through the first substrate 521, the distributed Bragg reflector 522, the first ohmic electrode 525, the second bonding layer 559, the second color filter 557, the second LED stack 533, the second ohmic electrode 535, the first bonding layer 549, and the first color filter 547 to expose the ohmic electrode 546. When the ohmic electrode 546 is omitted in some exemplar embodiments, the first conductivity type semiconductor layer 543*a* may be exposed by the hole h5.

Although the holes h1, h3, and h4 are illustrated as being separated from one another to expose the first to third ohmic electrodes 525, 535, and 545, respectively, however, the inventive concepts are not limited thereto, and the first to third ohmic electrodes 525, 535, and 545 may be exposed though a single hole.

The lower insulation layer 561 covers side surfaces of the first substrate 521 and the first to third LED stacks 523, 533, and 543, while covering an upper surface of the first substrate 521. The lower insulation layer 561 also covers side surfaces of the holes h1, h2, h3, h4, and h5. The lower insulation layer 561 may be subjected to patterning to expose a bottom of each of the holes h1, h2, h3, h4, and h5. Furthermore, the lower insulation layer 561 may also be subjected to patterning to expose the upper surface of the first substrate 521.

The ohmic electrode 563*a* is in ohmic contact with the upper surface of the first substrate 521. The ohmic electrode 563*a* may be formed in an exposed region of the first substrate 521, which is exposed by patterning the lower insulation layer 561. The ohmic electrode 563*a* may be formed of Au—Te alloys or Au—Ge alloys, for example.

The through-hole vias 563*b*, 565*a*, 565*b*, 567*a*, and 567*b* are disposed in the holes h1, h2, h3, h4, and h5. The through-hole via 563*b* may be disposed in the hole h1, and may be electrically connected to the first ohmic electrode 525. The through-hole via 565*a* may be disposed in the hole h2, and be in ohmic contact with the first conductivity type semiconductor layer 533*a*. The through-hole via 565*b* may be disposed in the hole h3, and may be electrically connected to the second ohmic electrode 535. The through-hole via 567*a* may be disposed in the hole h5, and may be electrically connected to the first conductivity type semiconductor layer 543*a*. For example, the through-hole via 567*a* may be electrically connected to the ohmic electrode 546 through the hole h5. The through-hole via 567*b* may be disposed in the hole h4, and may be connected to the third ohmic electrode 545. The through-hole vias 563*b*, 565*b*, and 567*b* may be directly connected to the first to third ohmic electrodes 525, 535, and 545, respectively, but the inventive concepts are not limited thereto. For example, in addition to the ohmic electrodes 525, 535, and 545, a current spreader for current spreading may be formed together with the ohmic electrodes, and the through-hole vias 563*b*, 565*b*, or 567*b* may be directly connected to the current spreader. The current spreader may be formed of a metallic material having a higher electrical conductivity than the ohmic electrodes. In particular, when the third ohmic electrode 545 is formed of a transparent electrode, such as ZnO, the current spreader formed of a metallic material may be additionally formed to assist in current spreading. In this case, after patterning the transparent electrode to expose the second conductivity type semiconductor layer 543*b*, the current spreader may be formed on the exposed second conductivity type semiconductor layer 543*b*. The current spreader may be formed to have various shapes, such as substantially a linear, a curved, or a ring shape to surround a central region of the second conductivity type semiconductor layer 543*b*, for example.

The upper insulation layer 571 covers the lower insulation layer 561, and covers the ohmic electrode 563*a*. The upper insulation layer 571 may cover the lower insulation layer 561 at the side surfaces of the first substrate 521 and the first to third LED stacks 523, 533, and 543, and may cover the lower insulation layer 561 over the first substrate 521. The upper insulation layer 571 may have an opening 571*a* exposing the ohmic electrode 563*a*, and may also have openings exposing the through-hole vias 563*b*, 565*a*, 565*b*, 567*a*, and 567*b*.

The lower insulation layer 561 or the upper insulation layer 571 may be formed of silicon oxide or silicon nitride, but it is not limited thereto. For example, the lower insulation layer 561 or the upper insulation layer 571 may be a distributed Bragg reflector formed by stacking insulation layers having different refractive indices. In particular, the upper insulation layer 571 may be a light reflective layer or a light blocking layer.

The electrode pads 573*a*, 573*b*, 573*c*, and 573*d* are disposed on the upper insulation layer 571, and are electrically connected to the first to third LED stacks 523, 533, and 543. For example, the first electrode pad 573*a* is electrically connected to the ohmic electrode 563*a* exposed through the opening 571*a* of the upper insulation layer 571, and the second electrode pad 573*b* is electrically connected to the through-hole via 565*a* exposed through the opening of the upper insulation layer 571. The third electrode pad 573*c* is electrically connected to the through-hole via 567*a* exposed through the opening of the upper insulation layer 571. A common electrode pad 573*d* is commonly electrically connected to the through-hole vias 563*b*, 565*b*, and 567*b*.

Accordingly, the common electrode pad 573*d* is commonly electrically connected to the second conductivity type semiconductor layers 523*b*, 533*b*, and 543*b* of the first to third LED stacks 523, 533, and 543, and each of the electrode pads 573*a*, 573*b*, 573*c* is electrically connected to the first conductivity type semiconductor layers 523*a*, 533*a*, and 543*a* of the first to third LED stacks 523, 533, and 543, respectively.

According to an exemplary embodiment, the first LED stack 523 is electrically connected to the electrode pads 573*d* and 573*a*, the second LED stack 533 is electrically connected to the electrode pads 573*d* and 573*b*, and the third LED stack 543 is electrically connected to the electrode pads 573*d* and 573*c*. As such, anodes of the first LED stack 523, the second LED stack 533, and the third LED stack 543 are commonly electrically connected to the common electrode pad 573*d*, and the cathodes thereof are electrically connected to the first to third electrode pads 573*a*, 573*b*, and 573*c*, respectively. Accordingly, the first to third LED stacks 523, 533, and 543 may be independently driven.

FIGS. 71A, 71B, 72A, 72B, 73A, 73B, 74, 75, 76, 77A, 77B, 78A, 78B, 79A, 79B, 80A, 80B, 81A, and 81B are schematic plan views and cross-sectional views illustrating a method of manufacturing a light emitting device for a display according to an exemplary embodiment. In the drawings, each plan view corresponds to FIG. 70A, and each cross-sectional view is taken along line A-A of corresponding plan view. FIGS. 71B and 72B are cross-sectional views taken along line B-B of FIGS. 71A and 72A, respectively.

Figure 71A:
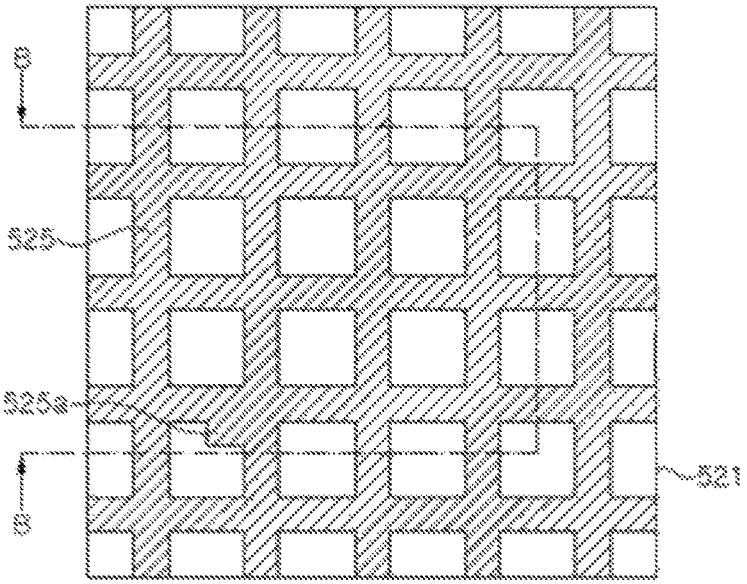
FIGS. 71A, 71B, 72A, 72B, 73A, 73B, 74, 75, 76, 77A, 77B, 78A, 78B, 79A, 79B, 80A, 80B, 81A, and 81B are schematic plan views and cross-sectional views illustrating a method of manufacturing a light emitting device for a display according to an exemplary embodiment.
Figure 71B:
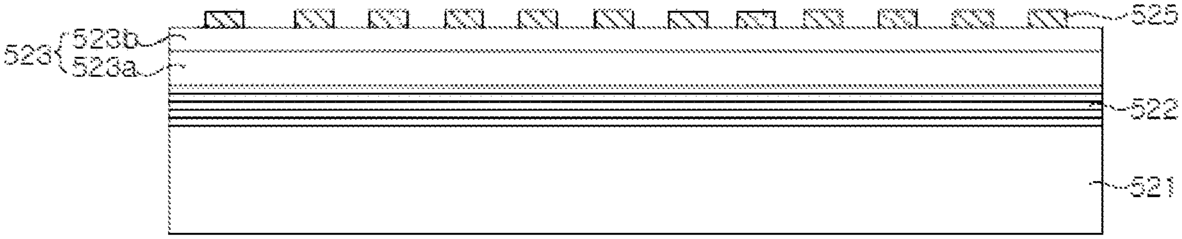

First, referring to FIGS. 71A and 71B, a first LED stack 523 is grown on a first substrate 521. The first substrate 521 may be a GaAs substrate, for example. The first LED stack 523 may include AlGaInP-based semiconductor layers, and includes a first conductivity type semiconductor layer 523*a*, an active layer, and a second conductivity type semiconductor layer 523*b*. Here, the first conductivity type may be an n-type, and the second conductivity type may be a p-type. A distributed Bragg reflector 522 may be formed prior to the growth of the first LED stack 523. The distributed Bragg reflector 522 may have a stack structure formed by repeatedly stacking AlAs/AlGaAs layers, for example.

A first ohmic electrode 525 may be formed on the second conductivity type semiconductor layer 523*b*. The first ohmic electrode 525 may be formed of an ohmic metal layer, such as Au—Zn or Au—Be using E-Beam Evaporation technique, for example. The ohmic metal layer may be patterned by photolithography and etching techniques to be formed as the mesh electrode having openings as shown in FIG. 71A. Furthermore, the first ohmic electrode 525 may be formed to have a pad region 525*a*.

Figure 72A:
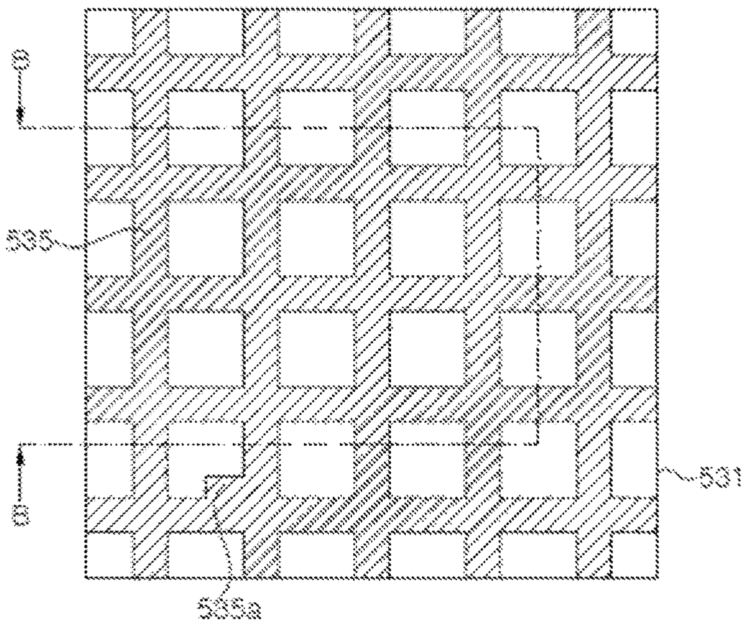
Figure 72B:
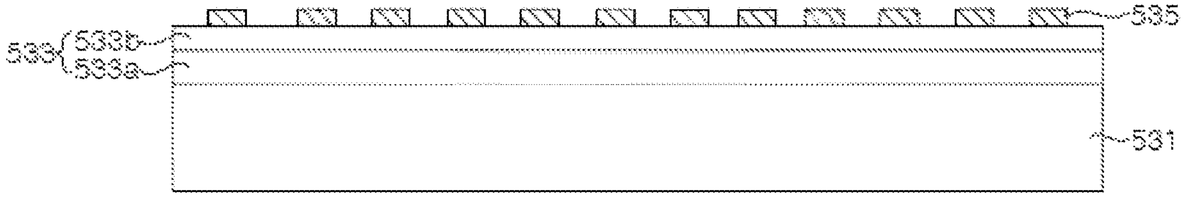

Referring to FIGS. 72A and 72B, a second LED stack 533 is grown on a substrate 531, and a second ohmic electrode 535 is formed on the second LED stack 533. The second LED stack 533 may include AlGaInP-based or AlGaInN-based semiconductor layers, and may include a first conductivity type semiconductor layer 533*a*, an active layer, and a second conductivity type semiconductor layer 533*b*. The substrate 531 may be a substrate capable of growing AlGaInP-based semiconductor layers thereon, for example, a GaAs substrate or a GaP substrate, or a substrate capable of growing AlGaInN-based semiconductor layers thereon, for example, a sapphire substrate. The first conductivity type may be an n-type, and the second conductivity type may be a p-type. A composition ratio of Al, Ga, and In for the second LED stack 533 may be determined so that the second LED stack 533 may emit green light, for example. In addition, when the GaP substrate is used, a pure GaP layer or a nitrogen (N) doped GaP layer is formed on the GaP to generate green light. The second ohmic electrode 535 is in ohmic contact with the second conductivity type semiconductor layer 533*b*. For example, the second ohmic electrode 535 may include Pt or Rh, and may be, for example, formed of Ni/Ag/Pt. The second ohmic electrode 535 may also be formed as the mesh electrode by photolithography and etching techniques, and may include a pad region 535*a*.

Figure 73A:
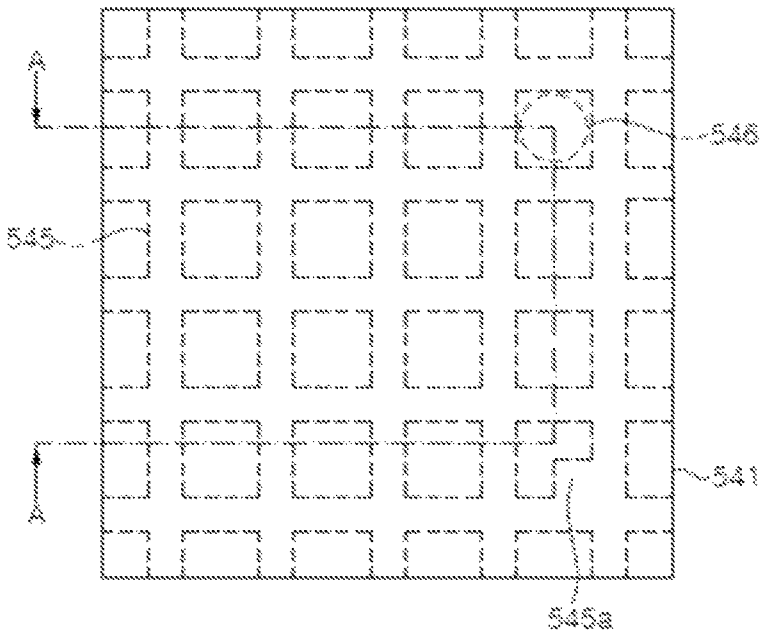
Figure 73B:
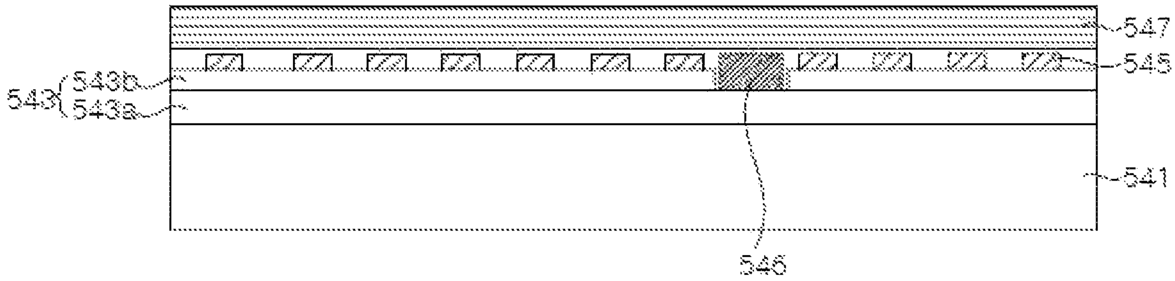

Referring to FIG. 73A and FIG. 73B, a third LED stack 543 is grown on a second substrate 541, and a third ohmic electrode 545 is formed on the third LED stack 543. The third LED stack 543 may include AlGaInN-based semiconductor layers, and may include a first conductivity type semiconductor layer 543*a*, an active layer, and a second conductivity type semiconductor layer 543*b*. The first conductivity type may be an n-type, and the second conductivity type may be a p-type.

The second substrate 541 is a substrate capable of growing GaN-based semiconductor layers thereon, and may be different from the first substrate 521. A composition ratio of AlGaInN for the third LED stack 543 is determined to allow the third LED stack 543 to emit blue light, for example. The third ohmic electrode 545 is in ohmic contact with the second conductivity type semiconductor layer 543*b*. The third ohmic electrode 545 may be formed of a conductive oxide layer, such as $SnO_2$, ZnO, IZO, or others. Alternatively, the third ohmic electrode 545 may be formed as a mesh electrode. For example, the third ohmic electrode 545 may be formed as the mesh electrode including Pt or Rh, and may have, for example, a multilayer structure of Ni/Ag/Pt. The third ohmic electrode 545 may also be formed as the mesh electrode patterned by photolithography and etching techniques, and may include a pad region 545*a*.

After openings are formed to expose the second conductivity type semiconductor layer 543*b* by patterning the third ohmic electrode 545, the first conductivity type semiconductor layer 543*a* may be exposed by partially etching the second conductivity type semiconductor layer 543*b*. Subsequently, an ohmic electrode 546 may be formed in an exposed region of the first conductivity type semiconductor layer 543*a*. The ohmic electrode 546 may be formed of a metal layer in ohmic contact with the first conductivity type semiconductor layer 543*a*. For example, the ohmic electrode 546 may have a multilayer structure of Ni/Au/Ti or Ni/Au/Ti/Ni. However, the ohmic electrode 546 is electrically separated from the third ohmic electrode 545 and the second conductivity type semiconductor layer 543*b*.

In some exemplary embodiments, a current spreader may be formed along with the third ohmic electrode 545 to improve the current spreading performance. More particularly, when the third ohmic electrode 545 is formed of a conductive oxide layer, the conductive oxide layer is etched to partially expose the second conductivity type semiconductor layer 543*b*, and the current spreader may be additionally formed as a metal layer having high electrical conductivity in an exposed region of the second conductivity type semiconductor layer 543*b*.

Then, a first color filter 547 is formed on the second ohmic electrode 545. Since the first color filter 547 is substantially the same as that described with reference to FIG. 70A and FIG. 70B, detailed descriptions thereof will be omitted.

Figure 74:
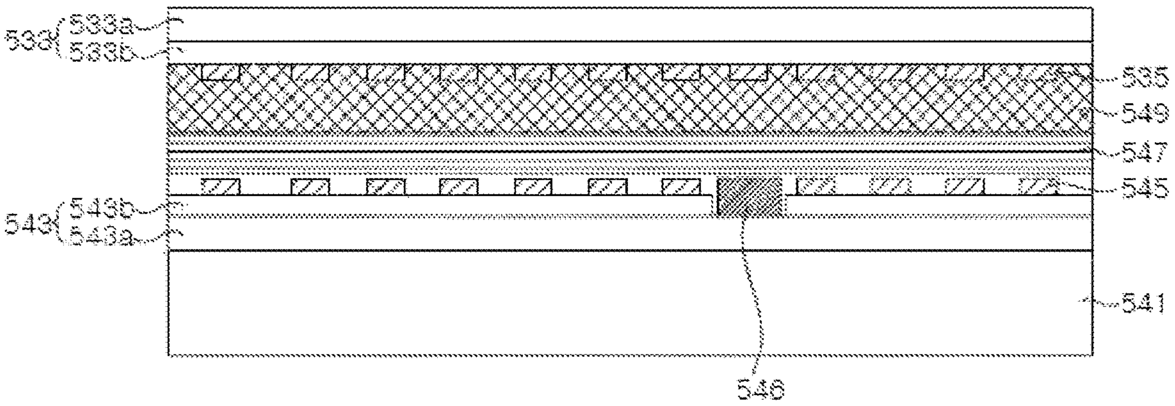

Referring to FIG. 74, the second LED stack 533 of FIG. 72A and FIG. 72B is bonded on the third LED stack 543 of FIG. 73A and FIG. 73B, and the second substrate 531 is removed therefrom.

The first color filter 547 is bonded to the second ohmic electrode 535 to face each other. For example, bonding material layers may be formed on the first color filter 547 and the second ohmic electrode 535, and are bonded to each other to form a first bonding layer 549. The bonding material layers may be transparent organic material layers or transparent inorganic material layers, for example. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 549 may be formed of spin-on-glass (SOG).

Thereafter, the substrate 531 may be removed from the second LED stack 533 by laser lift-off or chemical lift-off. As such, an upper surface of the first conductivity type semiconductor layer 533*a* of the second LED stack 533 is exposed. In an exemplary embodiment, the exposed surface of the first conductivity type semiconductor layer 533*a* may be subjected to texturing.

Figure 75:
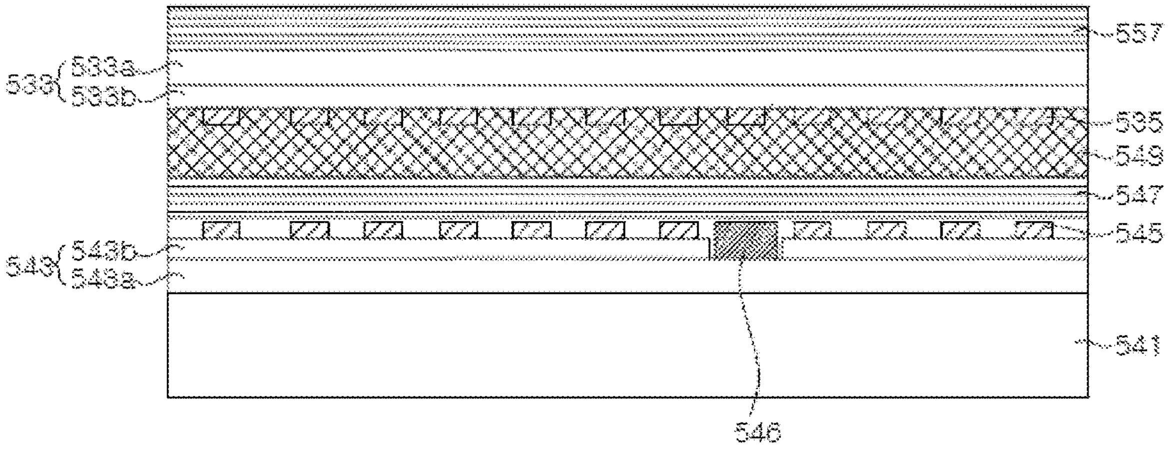

Referring to FIG. 75, a second color filter 557 is formed on the second LED stack 533. The second color filter 557 may be formed by alternately stacking insulation layers having different refractive indices and is substantially the same as that described with reference to FIG. 70A and FIG. 70B, and thus, detailed descriptions thereof will be omitted to avoid repetition.

Figure 76:
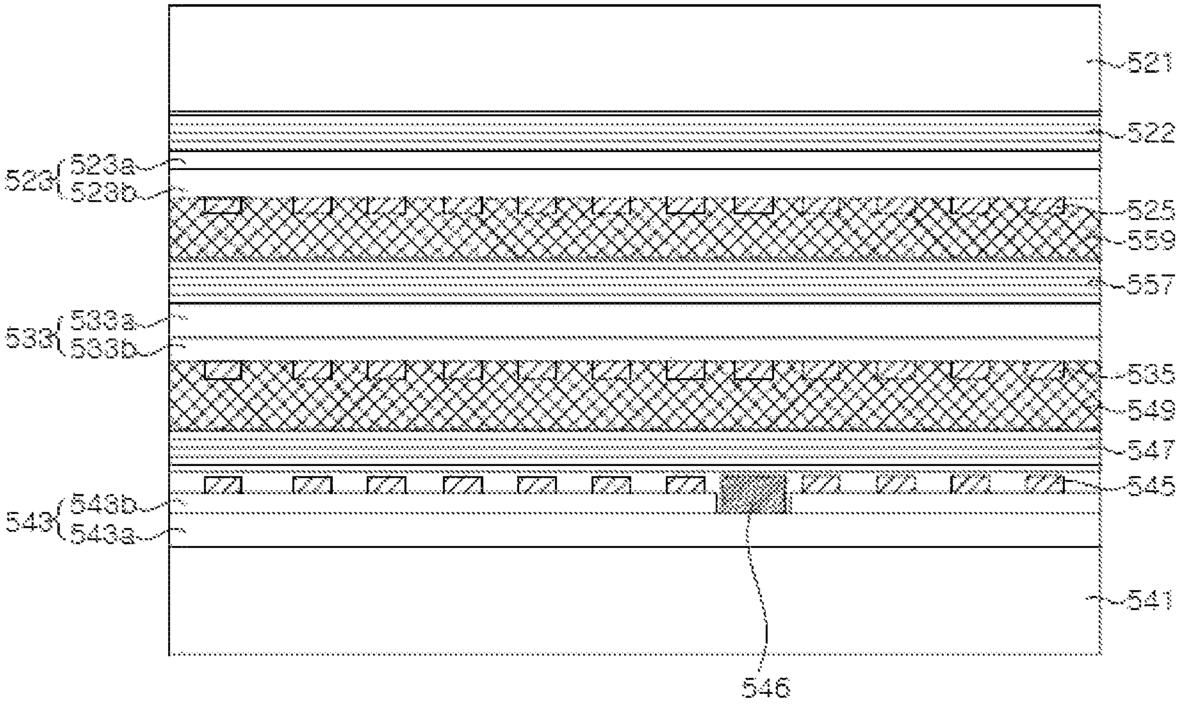

Subsequently, referring to FIG. 76, the first LED stack 523 of FIG. 71 is bonded to the second LED stack 533. The second color filter 557 may be bonded to the first ohmic electrode 525 to face each other. For example, bonding material layers may be formed on the second color filter 557 and the first ohmic electrode 525, and are bonded to each other to form a second bonding layer 559. The bonding material layers are substantially the same as those described with reference to the first bonding layer 549, and thus, detailed descriptions thereof will be omitted.

Figure 77A:
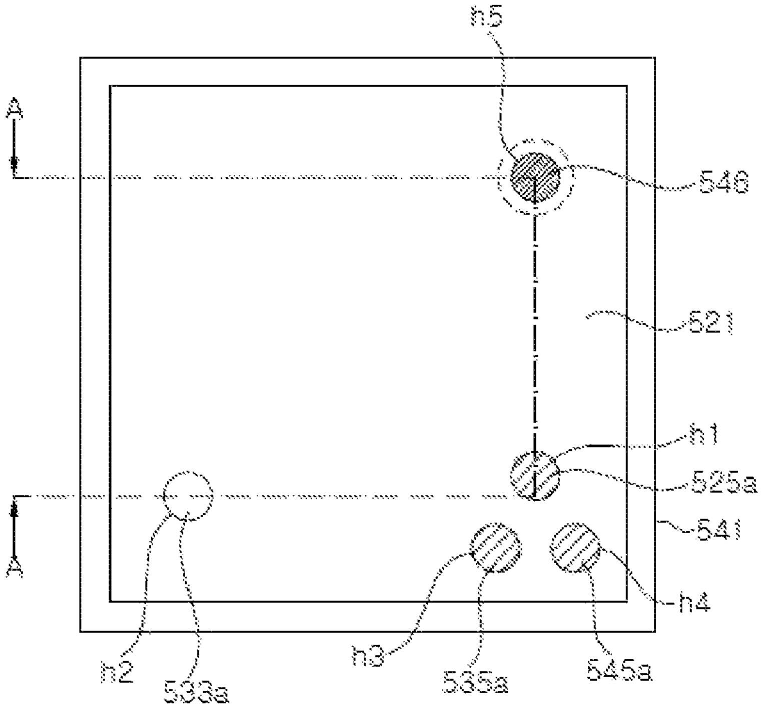
Figure 77B:
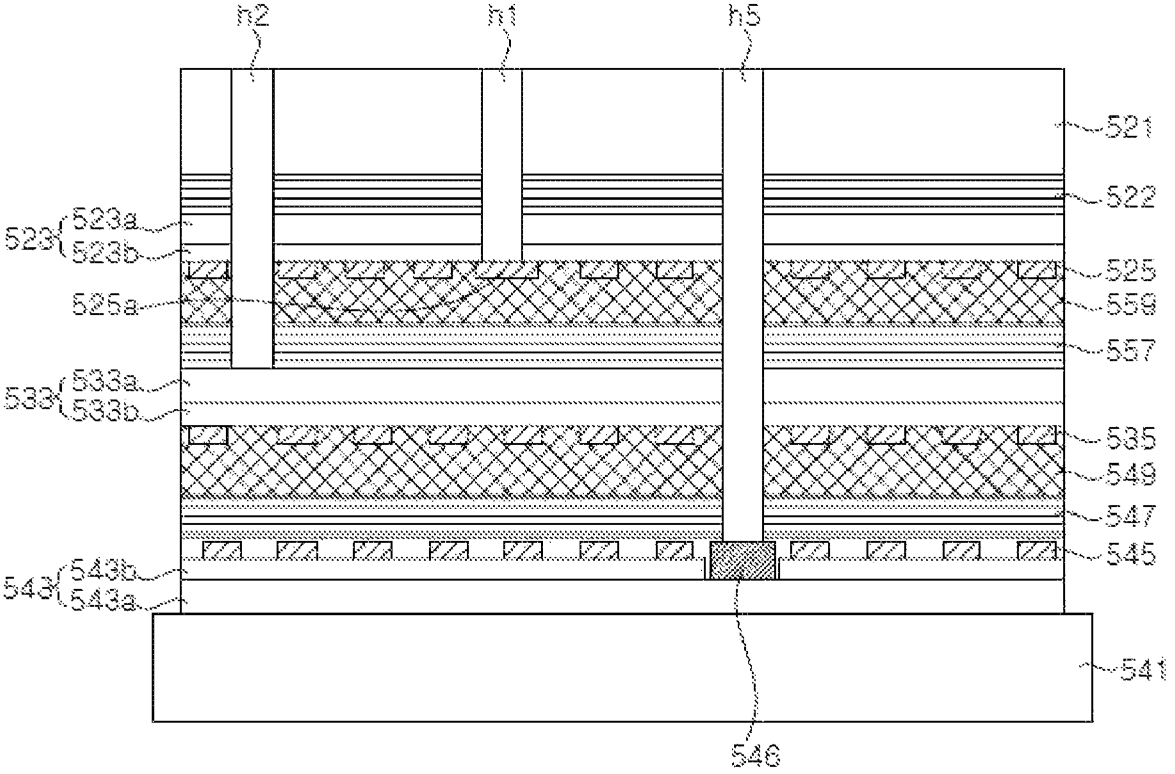

Referring to FIG. 77A and FIG. 77B, holes h1, h2, h3, h4, and h5 are formed through the first substrate 521, and isolation trenches defining device regions are also formed to expose the second substrate 541.

The hole h1 may expose the pad region 525*a* of the first ohmic electrode 525, the hole h2 may expose the first conductivity type semiconductor layer 533*a*, the hole h3 may expose the pad region 535*a* of the second ohmic electrode 535, the hole h4 may expose the pad region 545*a* of the third ohmic electrode 545, and the hole h5 may expose the ohmic electrode 546. When the hole h5 exposes the ohmic electrode 546, an upper surface of the ohmic electrode 546 may include an anti-etching layer, for example, a Ni layer.

The isolation trench may expose the second substrate 541 along a periphery of each of the first to third LED stacks 523, 533, and 543. Although FIGS. 77A and 77B show the isolation trench as being formed to expose the second substrate 541, in some exemplary embodiments, the isolation trench may be formed to expose the first conductivity type semiconductor layer 543*a*. The hole h5 may be formed together with the isolation trench by the etching technique, however, the inventive concepts are not limited thereto.

The holes h1, h2, h3, h4, and h5 and the isolation trenches may be formed by photolithography and etching techniques, and are not limited to a particular formation sequence. For example, a shallower hole may be formed prior to a deeper hole, or vice versa. The isolation trench may be formed before or after forming the holes h1, h2, h3, h4, and h5. Alternatively, the isolation trench may be formed together with the hole h5, as described above.

Figure 78A:
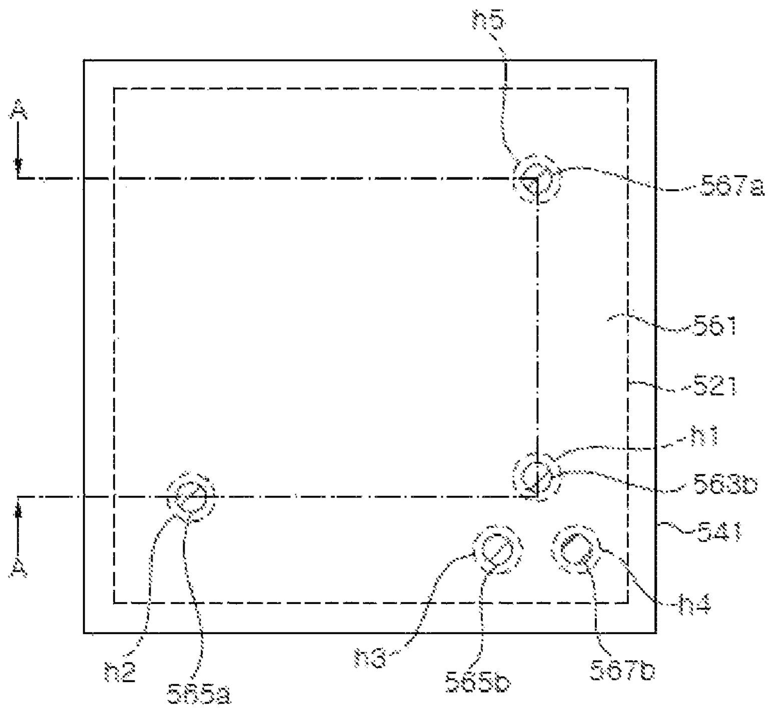
Figure 78B:
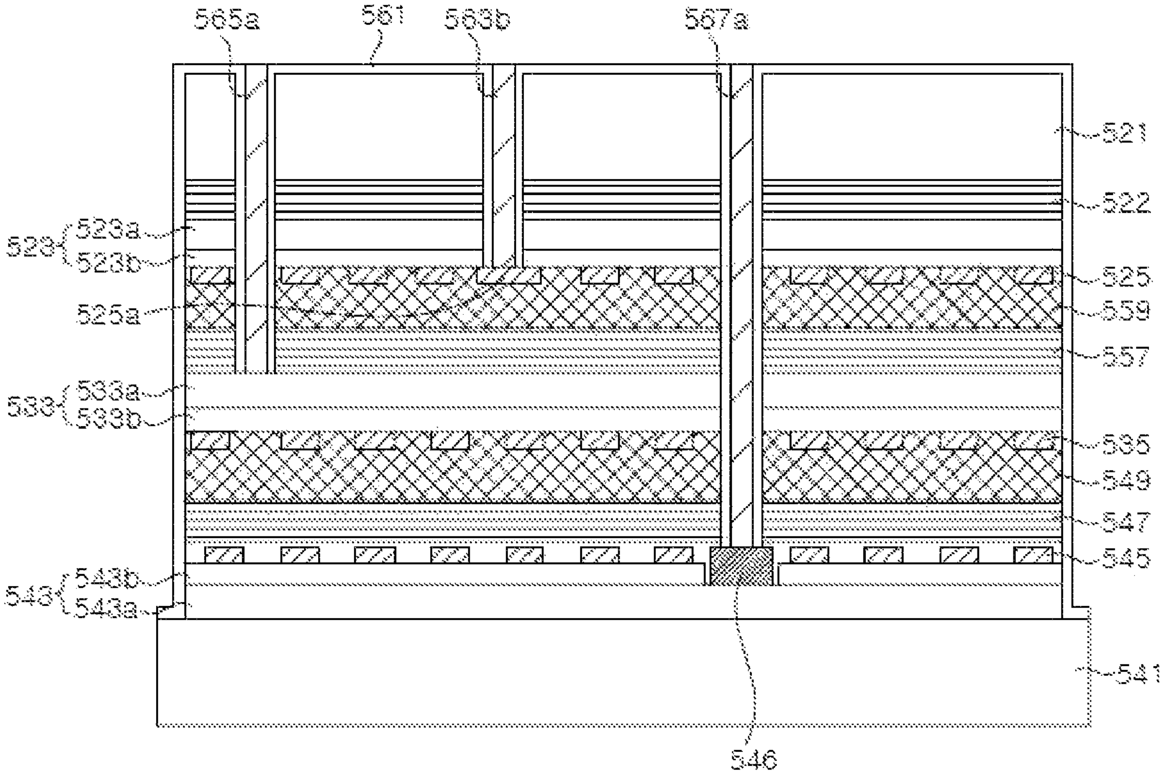

Referring to FIG. 78A and FIG. 78B, a lower insulation layer 561 is formed on the first substrate 521. The lower insulation layer 561 may cover side surfaces of the first substrate 521, and side surfaces of the first to third LED stacks 523, 533, and 543, which are exposed through the isolation trench.

The lower insulation layer 561 may also cover side surfaces of the holes h1, h2, h3, h4, and h5. The lower insulation layer 561 is subjected to patterning to expose a bottom of each of the holes h1, h2, h3, h4, and h5.

The lower insulation layer 561 may be formed of silicon oxide or silicon nitride, but it is not limited thereto. The lower insulation layer 561 may be a distributed Bragg reflector.

Subsequently, the through-hole vias 563*b*, 565*a*, 565*b*, 567*a*, and 567*b* are formed in the holes h1, h2, h3, h4, and h5. The through-hole vias 563*b*, 565*a*, 565*b*, 567*a*, and 567*b* may be formed by electric plating or the like. For example, a seed layer may be first formed inside the holes h1, h2, h3, h4, and h5 and the through-hole vias 563*b*, 565*a*, 565*b*, 567*a*, and 567*b* may be formed by plating with copper using the seed layer. The seed layer may be formed of Ni/Al/Ti/Cu, for example. The through-hole vias 563*b*, 565*b*, and 567*b* may be connected to the pad regions 525*a*, 535*a*, and 545*a*, respectively, and the through-hole vias 565*a* and 567*a* may be connected to the first conductivity type semiconductor layer 533*a* and the ohmic electrode 546, respectively.

Figure 79A:
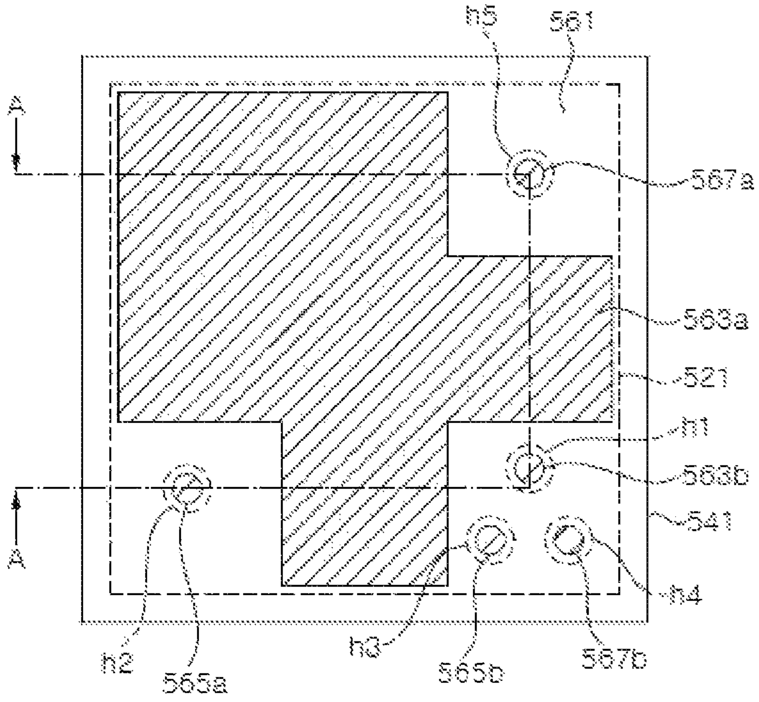
Figure 79B:
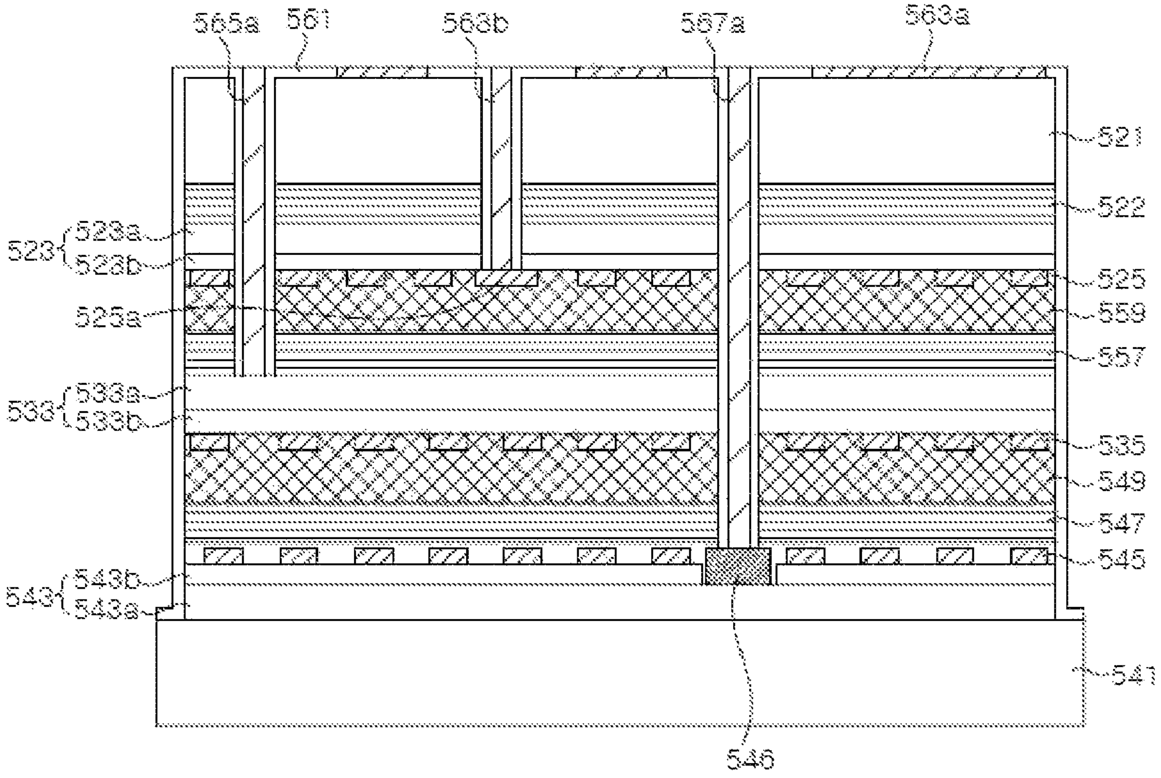

Referring to FIG. 79A and FIG. 79B, the upper surface of the first substrate 521 may be exposed by patterning the lower insulation layer 561. The process of patterning the lower insulation layer 561 to expose the upper surface of the first substrate 521 may be performed upon patterning the lower insulation layer 561 to expose the bottoms of the holes h1, h2, h3, h4, and h5.

The upper surface of the first substrate 521 may be exposed in a broad area, and may exceed, for example, half the area of the light emitting device.

Thereafter, an ohmic electrode 563*a* is formed on the exposed upper surface of the first substrate 521. The ohmic electrode 563*a* may be formed of a conductive layer and in ohmic contact with the first substrate 521. The ohmic electrode 563*a* may include Au—Te alloys or Au—Ge alloys, for example.

As shown in FIG. 79A, the ohmic electrode 563*a* is separated from the through-hole vias 563*b*, 565*a*, 565*b*, 567*a*, and 567*b*.

Figure 80A:
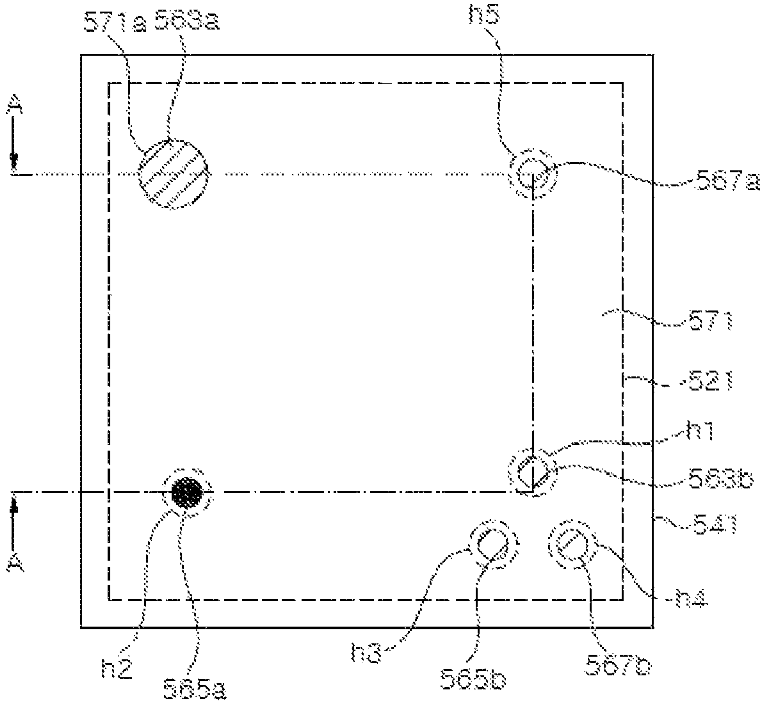
Figure 80B:
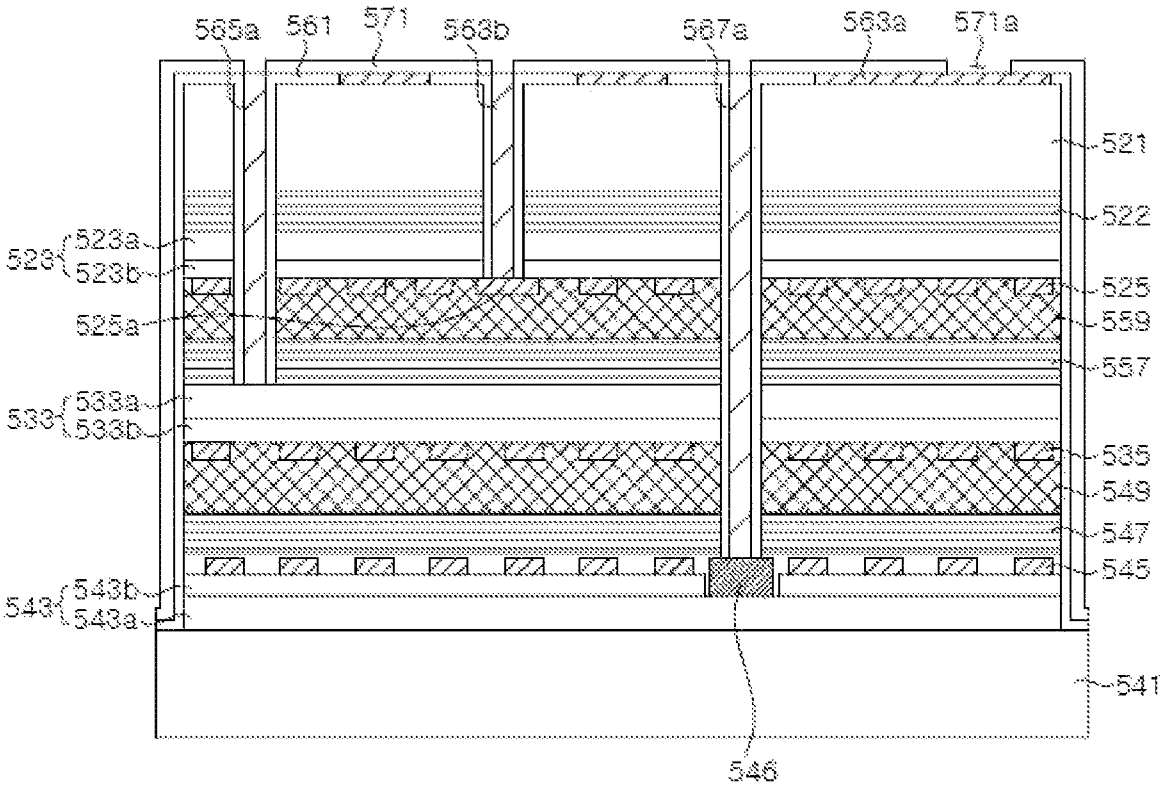

Referring to FIG. 80A and FIG. 80B, an upper insulation layer 571 is formed to cover the lower insulation layer 561 and the ohmic electrode 563*a*. The upper insulation layer 571 may also cover the lower insulation layer 561 at the side surfaces of the first to third LED stacks 523, 533, and 543 and the first substrate 521. However, the upper insulation layer 571 may be subjected to patterning so as to form openings exposing the through-hole vias 563*b*, 565*a*, 565*b*, 567*a*, and 567*b* together with an opening 571*a* exposing the ohmic electrode 563*a*.

The upper insulation layer 571 may be formed of a transparent oxide layer such as silicon oxide or silicon nitride, but it is not limited thereto. For example, the upper insulation layer 571 may be a light reflective insulation layer, for example, a distributed Bragg reflector, or a light blocking layer such as a light absorption layer.

Figure 81A:
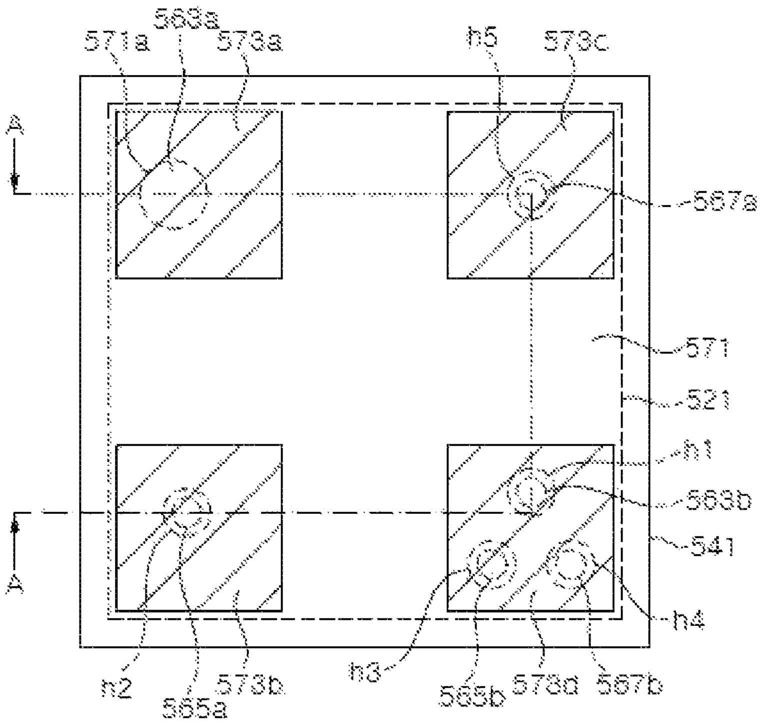
Figure 81B:
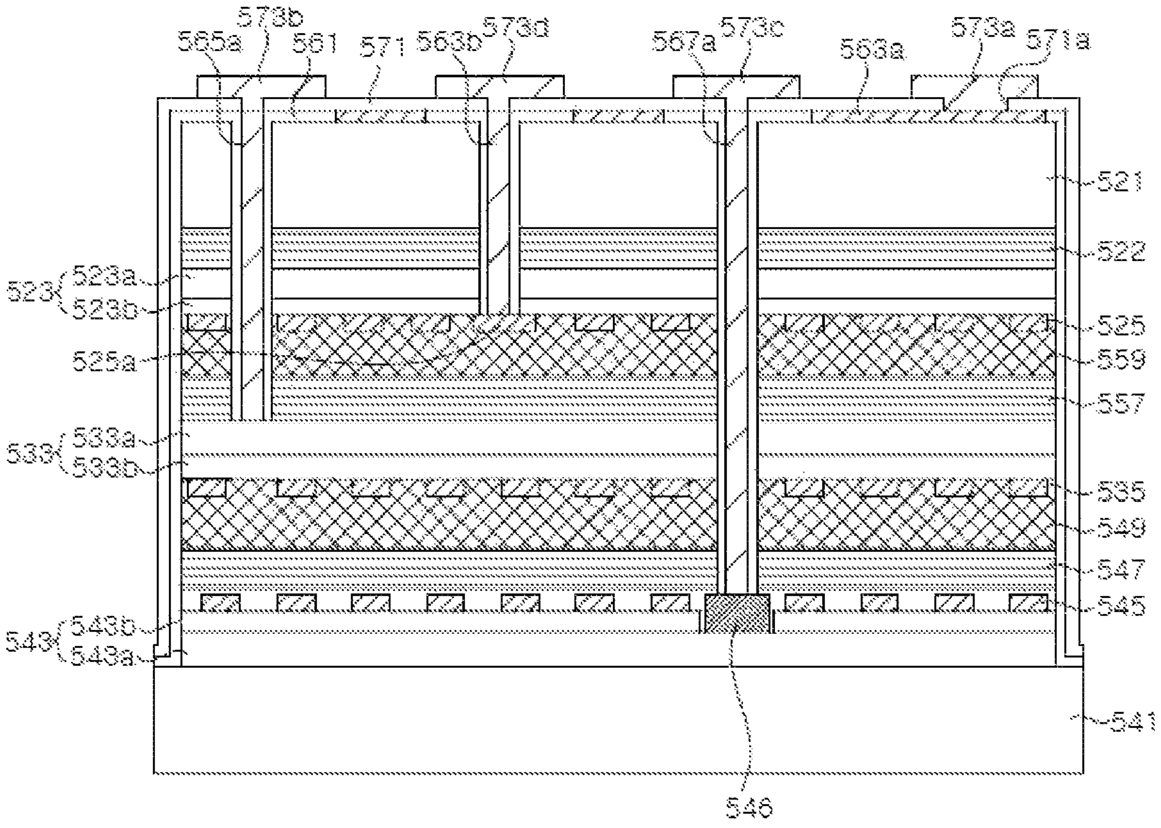

Referring to FIG. 81A and FIG. 81B, electrode pads 573*a*, 573*b*, 573*c*, and 573*d* are formed on the upper insulation layer 571. The electrode pads 573*a*, 573*b*, 573*c*, and 573*d* may include first to third electrode pads 573*a*, 573*b*, and 573*c*, and a common electrode pad 573*d*.

The first electrode pad 573*a* may be connected to the ohmic electrode 563*a* exposed through the opening 571*a* of the upper insulation layer 571, the second electrode pad 573*b* may be connected to the through-hole via 565*a*, and the third electrode pad 573*c* may be connected to the through-hole via 567*a*. The common electrode pad 573*d* may be commonly connected to the through-hole vias 563*b*, 565*b*, and 567*b*.

The electrode pads 573*a*, 573*b*, 573*c*, and 573*d* are electrically separated from one another, and thus, each of the first to third LED stacks 523, 533, and 543 is electrically connected to two electrode pads to be independently driven.

Thereafter, the second substrate 541 is divided into regions for each light emitting device, thereby completing the light emitting device 500. As shown in FIG. 81A, the electrode pads 573*a*, 573*b*, 573*c*, and 573*d* may be disposed around four corners of each light emitting device 500. Furthermore, the electrode pads 573*a*, 573*b*, 573*c*, and 573*d* may have substantially a rectangular shape, but the inventive concepts are not limited thereto.

Although the second substrate 541 is illustrated as being divided, in some exemplary embodiments, the second substrate 541 may be removed. In this case, an exposed surface of the first conductivity type semiconductor layer 543*a* may be subjected to texturing.

Figure 82A:
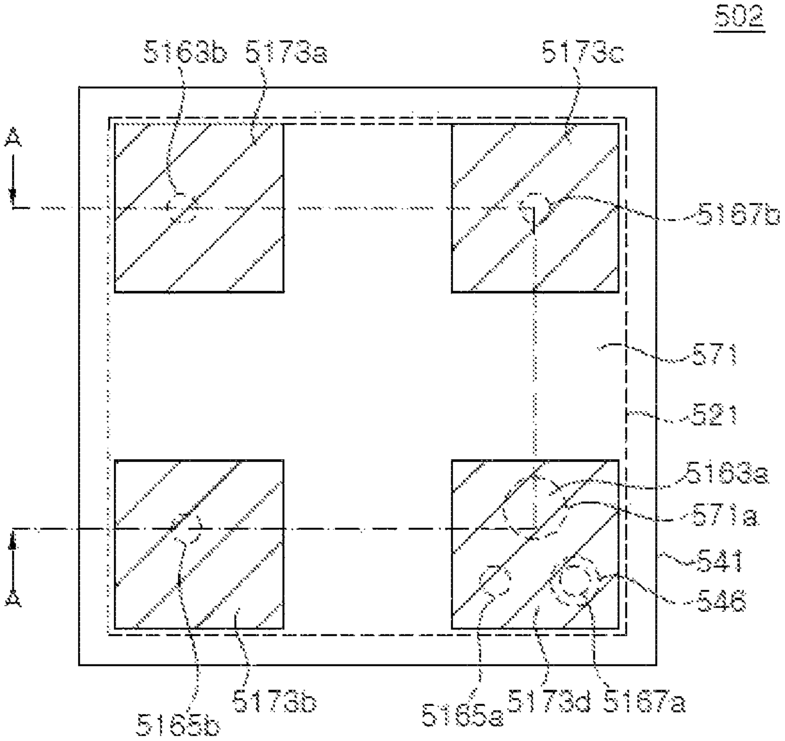
FIG. 82A and FIG. 82B are a schematic plan view and a cross-sectional view of a light emitting device for a display according to another exemplary embodiment, respectively.
Figure 82B:
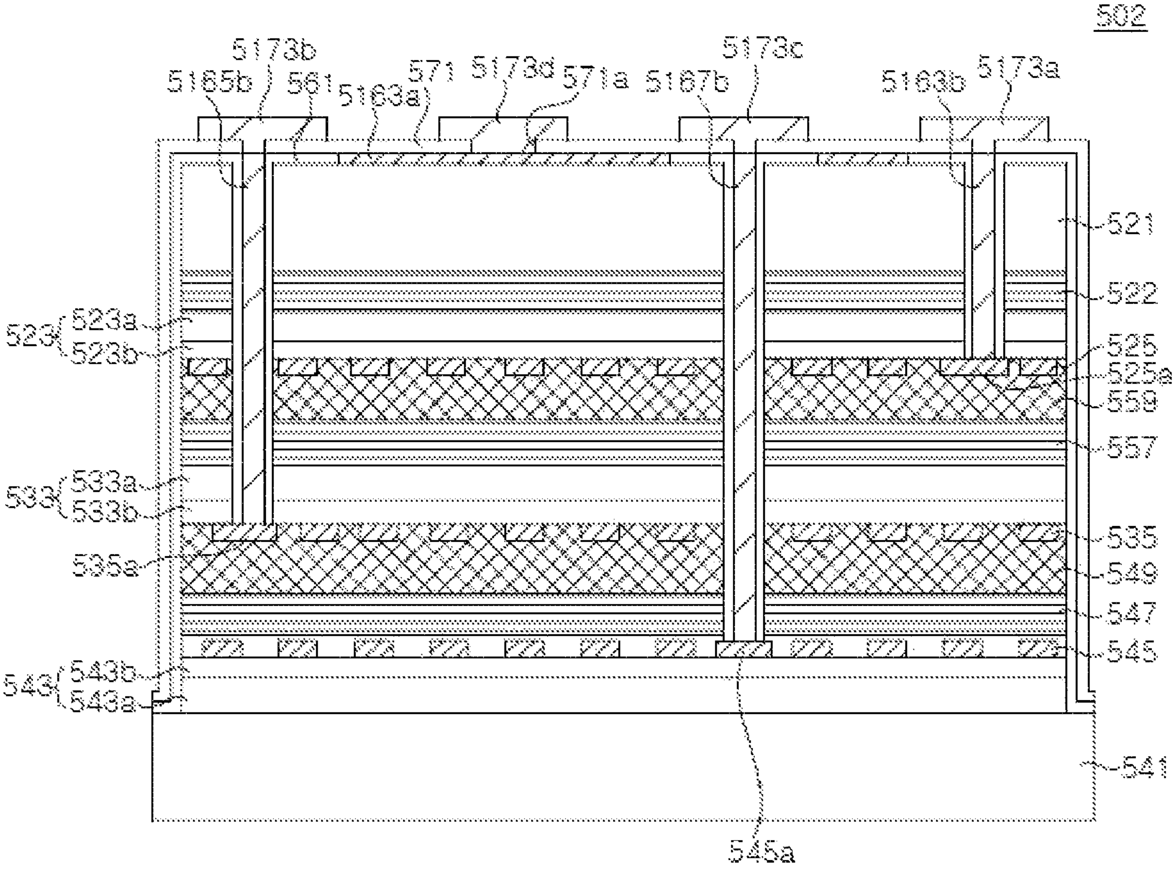

FIG. 82A and FIG. 82B are a schematic plan view and a cross-sectional view of a light emitting device 502 for a display according to another exemplary embodiment.

Referring to FIG. 82A and FIG. 82B, the light emitting device 502 according to the illustrated exemplary embodiment is generally similar to the light emitting device 500 described with reference to FIG. 70A and FIG. 70B, except that the anodes of the first to third LED stacks 523, 533, and 543 are independently connected to first to third electrode pads 5173*a*, 5173*b*, and 5173*c*, and the cathodes thereof are electrically connected to a common electrode pad 5173*d*.

More particularly, the first electrode pad 5173*a* is electrically connected to the pad region 525*a* of the first ohmic electrode 525 through a through-hole via 5163*b*, the second electrode pad 5173*b* is electrically connected to the pad region 535*a* of the second ohmic electrode 535 through a through-hole via 5165*b*, and the third electrode pad 5173*c* is electrically connected to the pad region 545*a* of the third ohmic electrode 545 through a through-hole via 5167*b*. The common electrode pad 5173*d* is electrically connected to an ohmic electrode 5163*a* exposed through the opening 571*a* of the upper insulation layer 571, and is also electrically connected to the first conductivity type semiconductor layers 533*a* and 543*a* of the second LED stack 533 and the third LED stack 543 through the through-hole vias 5165*a* and 5167*a*. For example, the through-hole via 5165*a* may be connected to the first conductivity type semiconductor layer 533*a*, and the through-hole via 5175*a* may be connected to the ohmic electrode 546 in ohmic contact with the first conductivity type semiconductor layer 543*a*.

Each of the light emitting devices 500, 502 according to the exemplary embodiments includes the first to third LED stacks 523, 533, and 543, which may emit red, green, and blue light, respectively, and thus can be used as one pixel in a display apparatus. As described in FIG. 69, the display apparatus may be realized by arranging a plurality of light emitting devices 500 or 502 on the circuit board 501. Since each of the light emitting devices 500, 502 includes the first to third LED stacks 523, 533, and 543, it is possible to increase the area of a subpixel in one pixel. Furthermore, the first to third LED stacks 523, 533, and 543 can be mounted on the circuit board 501 by mounting one light emitting device, thereby reducing the number of mounting processes.

As described in FIG. 69, the light emitting devices mounted on the circuit board 501 can be driven in a passive matrix or active matrix driving manner.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light module, comprising:

a circuit substrate;

a first LED sub-unit disposed on the circuit substrate;

a second LED sub-unit disposed on the first LED sub-unit;

a third LED sub-unit disposed on the second LED sub-unit;

an insulator disposed on the third LED sub-unit;

a first electrode interposed between the circuit substrate and the second LED sub-unit, and electrically connected to the first LED sub-unit;

a second electrode interposed between the first LED sub-unit and the third LED sub-unit, and electrically connected to the second LED sub-unit;

a third electrode interposed between the second electrode and the insulator, and electrically connected to the third LED sub-unit; and a first bonder disposed between the first LED sub-unit and the third LED sub-unit;

wherein at least one of: the first electrode, the second electrode, or the third electrode, includes a shaped region, and wherein the first bonder covers the shaped region, and wherein the shaped region includes a straight region or a curved region.

2. The light module of claim 1, wherein the shaped region comprises at least one of: Rh, Pt, Ni, Ag, $SnO_2$, $InO_2$, ITO, ZnO, or IZO.

3. The light module of claim 1, further comprising a second bonder disposed between the first LED sub-unit and the third LED sub-unit.

4. The light module of claim 3, wherein the first bonder and the second bonder include a same material.

5. The light module of claim 1, wherein:

the first LED sub-unit, the second LED sub-unit, and the third LED sub-unit are independently drivable from each other and are configured to emit light having peak wavelengths different from each other.

6. The light module of claim 1, further comprising a first color filter disposed between the first LED sub-unit and the third LED sub-unit.

7. A light module, comprising:

a circuit substrate;

a first LED sub-unit disposed on the circuit substrate;

a second LED sub-unit disposed on the first LED sub-unit;

a third LED sub-unit disposed on the second LED sub-unit;

an insulator disposed on the third LED sub-unit;

a first electrode interposed between the circuit substrate and the second LED sub-unit, and electrically connected to the first LED sub-unit;

a second electrode interposed between the first LED sub-unit and the third LED sub-unit, and electrically connected to the second LED sub-unit; and a third electrode interposed between the second electrode and the insulator, and electrically connected to the third LED sub-unit;

wherein each of the first electrode, the second electrode, and the third electrode includes a patterned structure having a shape, and wherein the patterned structure is configured to have conductivity.

8. The light module of claim 7, wherein the patterned structure includes a straight region or a curved region.

9. The light module of claim 7, wherein:

the first LED sub-unit, the second LED sub-unit, and the third LED sub-unit are independently drivable from each other;

light generated from the first LED sub-unit is configured to be emitted to the outside through the second LED sub-unit, the third LED sub-unit, and the insulator; and light generated from the second LED sub-unit is configured to be emitted to the outside through the third LED sub-unit and the insulator.

10. The light module of claim 7, wherein the first LED sub-unit, the second LED sub-unit, and the third LED sub-unit are configured to emit light having peak wavelengths different from each other.

11. The light module of claim 7, further comprising a bonder disposed between the first LED sub-unit and third LED sub-unit.

12. The light module of claim 11, wherein the bonder comprises at least one of: SU8, poly(methyl methacrylate) (PMMA), polyimide, Parylene, benzocyclobutene (BCB), $Al_2O_3$, $SiO_2$, $SiN_x$, or spin-on-glass (SOG).

13. The light module of claim 7, further comprising a first color filter disposed between the first LED sub-unit and the third LED sub-unit.

14. A light module, comprising:

a circuit substrate;

a first LED sub-unit disposed on the circuit substrate;

a second LED sub-unit disposed on the first LED sub-unit;

a third LED sub-unit disposed on the second LED sub-unit;

an insulator disposed on the third LED sub-unit;

a first electrode interposed between the circuit board substrate and the second LED sub-unit, and electrically connected to the first LED sub-unit;

a second electrode interposed between the first LED sub-unit and the third LED sub-unit, and electrically connected to the second LED sub-unit; and a third electrode interposed between the second electrode and the insulator, and electrically connected to the third LED sub-unit;

wherein at least one of: the first electrode, the second electrode, or the third electrode, includes a shape, and wherein at least one of: the first electrode, the second electrode, or the third electrode, is configured to have conductivity.

15. The light module of claim 14, wherein the shape includes a straight region or a curved region.

16. The light module of claim 14, wherein:

the first LED sub-unit, the second LED sub-unit, and the third LED sub-unit are independently drivable from each other;

light generated from the first LED sub-unit is configured to be emitted to the outside through the second LED sub-unit, the third LED sub-unit, and the insulator; and light generated from the second LED sub-unit is configured to be emitted to the outside through the third LED sub-unit and the insulator.

17. The light module of claim 14, wherein the first LED sub-unit, the second LED sub-unit, and the third LED sub-unit are configured to emit light having peak wavelengths different from each other.

18. The light module of claim 14, further comprising a first bonder disposed between the first LED sub-unit and the second LED sub-unit.

19. The light module of claim 18, further comprising a second bonder disposed between the second LED sub-unit and the third LED sub-unit.

20. The light module of claim 14, further comprising a first color filter disposed between the first LED sub-unit and the third LED sub-unit.

* * * * *